US012647701B2

(12) United States Patent (10) Patent No.: US 12,647,701 B2

Naganokawa et al. (45) Date of Patent: Jun. 2, 2026

(54) IMAGING DEVICE AND ELECTRONIC APPARATUS

(71) Applicant: Sony Semiconductor Solutions Corporation, Kanagawa (JP)

(72) Inventors: Haruhisa Naganokawa, Kanagawa (JP); Kengo Umeda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 203 days.

(21) Appl. No.: 18/553,809

(22) PCT Filed: Mar. 29, 2022

(86) PCT No.: PCT/JP2022/015276

§ 371 (c)(1),
(2) Date: Oct. 3, 2023

(87) PCT Pub. No.: WO2022/249731

PCT Pub. Date: Dec. 1, 2022

(65) Prior Publication Data

US 2024/0187759 A1 Jun. 6, 2024

(30) Foreign Application Priority Data

May 25, 2021 (JP) ................................. 2021-087988

(51) Int. Cl.
*H04N 25/78* (2023.01)
*H01L 23/00* (2006.01)
(Continued)

(52) U.S. Cl.
CPC ............ *H04N 25/78* (2023.01); *H01L 24/08* (2013.01); *H04N 25/76* (2023.01); *H04N 25/77* (2023.01);
(Continued)

(58) Field of Classification Search
CPC ...... H04N 25/76; H04N 25/77; H04N 25/772; H04N 25/778; H04N 25/78; H04N 25/79;
(Continued)

(56) References Cited

U.S. PATENT DOCUMENTS

| | | | | |
|---|---|---|---|---|
| 2011/0149104 | A1* | 6/2011 | Mabuchi | ............... H10F 39/803 |
| | | | | 257/E31.124 |
| 2019/0253659 | A1* | 8/2019 | Kobayashi | ............. H04N 25/79 |

(Continued)

FOREIGN PATENT DOCUMENTS

| | | |
|---|---|---|
| JP | 2018148528 A | 9/2018 |
| JP | 2019216379 A | 12/2019 |

(Continued)

OTHER PUBLICATIONS

International Search Report (PCT/ISA/210), International Application No. PCT/JP2022/015276, dated Jun. 21, 2022.

*Primary Examiner* — Lin Ye
*Assistant Examiner* — Chriss S Yoder, III
(74) *Attorney, Agent, or Firm* — Michael Best & Friedrich LLP

(57) ABSTRACT

[Problem] To reduce the number of signals transmitted and received between a plurality of stacked substrates and a plurality of layers.
[Solution] An imaging device includes: a plurality of pixels each having a photoelectric converter; an analog-to-digital converter provided for each area pixel composed of two or more of the pixels in the plurality of pixels to convert a signal corresponding to a charge photoelectrically converted by the two or more pixels into a digital signal; a floating diffusion that outputs the charge photoelectrically converted by the photoelectric converter in the pixel; a plurality of stacked areas in which the plurality of photoelectric converters, the plurality of the analog-to-digital converters, and the plurality of the floating diffusions in the plurality of
(Continued)

pixels are arranged; and a signal transmitter that transmits and receives signals between the plurality of areas. An area in which the plurality of photoelectric converters in the area pixel are arranged and an area in which the analog-to-digital converter is arranged transmit and receive a charge of the plurality of floating diffusions via the same signal transmitter.

12 Claims, 111 Drawing Sheets

(51) Int. Cl.

| | |
|---|---|
| *H04N 25/76* | (2023.01) |
| *H04N 25/77* | (2023.01) |
| *H04N 25/772* | (2023.01) |
| *H04N 25/778* | (2023.01) |
| *H04N 25/79* | (2023.01) |
| *H10F 39/00* | (2025.01) |
| *H10K 39/32* | (2026.01) |

(52) U.S. Cl.
CPC ......... *H04N 25/772* (2023.01); *H04N 25/778* (2023.01); *H04N 25/79* (2023.01); *H10F 39/809* (2025.01); *H10K 39/32* (2023.02); *H01L 2224/08145* (2013.01)

(58) Field of Classification Search
CPC ........... H01L 24/08; H01L 2224/08145; H10F 39/8037; H10F 39/809; H10F 39/811; H10K 39/32
See application file for complete search history.

(56) References Cited

U.S. PATENT DOCUMENTS

| | | | | |
|---|---|---|---|---|
| 2022/0021826 | A1* | 1/2022 | Ejiri ...................... | H10F 39/014 |
| 2022/0368848 | A1* | 11/2022 | Kitano .................. | H04N 25/77 |

FOREIGN PATENT DOCUMENTS

| | | |
|---|---|---|
| JP | 2020096225 A | 6/2020 |
| WO | WO-2019239661 A1 | 12/2019 |
| WO | 2020045122 A1 | 3/2020 |
| WO | WO-2020122010 A1 | 6/2020 |

* cited by examiner

| EMBODIMENT | FIRST TO THIRD EXAMPLES | FIRST EXAMPLE | SECOND EXAMPLE | THIRD EXAMPLE |
|---|---|---|---|---|
| IRRADIATION SURFACE | BACK SURFACE | FIRST AREA | FIRST AREA | FIRST AREA |
| PHOTOELECTRIC CONVERTER | Si | FIRST AREA | FIRST AREA | FIRST AREA |
| STORAGE UNIT | — | — | — | — |
| AD CONVERTER | Si | SECOND AREA | SECOND AREA THIRD AREA | SECOND AREA THIRD AREA |
| FIRST TO SECOND AREA CONNECTION | — | FD | FD | FD |
| SECOND TO THIRD AREA CONNECTION | — | — | DIFFERENTIAL PAIR DRAIN | COMPARISON RESULT OUTPUT |

190a

190b

FIRST DIVIDED AD
CONVERTER

91

190a

SECOND DIVIDED AD
CONVERTER

| EMBODIMENT | FOURTH EXAMPLE | FIFTH TO SIXTH EXAMPLES | FIFTH EXAMPLE | SIXTH EXAMPLE |
|---|---|---|---|---|
| IRRADIATION SURFACE | FRONT SURFACE | BACK SURFACE | FIRST AREA | FIRST AREA |
| PHOTOELECTRIC CONVERTER | NON-Si | NON-Si | FIRST AREA | FIRST AREA |
| STORAGE UNIT | — | — | — | — |
| AD CONVERTER | Si | Si | SECOND AREA THIRD AREA | SECOND AREA THIRD AREA |
| FIRST TO SECOND AREA CONNECTION | — | — | FD | FD |
| SECOND TO THIRD AREA CONNECTION | — | — | DIFFERENTIAL PAIR DRAIN | COMPARISON RESULT OUTPUT |

Fig. 37

| EMBODIMENT | SEVENTH EXAMPLE | SEVENTH EXAMPLE | EIGHTH EXAMPLE | EIGHTH EXAMPLE |
|---|---|---|---|---|
| IRRADIATION SURFACE | BACK SURFACE | FIRST AREA | BACK SURFACE | FIRST AREA |
| FIRST PHOTOELECTRIC CONVERTER | NON-Si | FIRST AREA | NON-Si | FIRST AREA |
| SECOND PHOTOELECTRIC CONVERTER | Si | SECOND AREA | Si | SECOND AREA |
| FIRST STORAGE UNIT | — | — | — | — |
| SECOND STORAGE UNIT | — | — | — | — |
| FIRST AD CONVERTER | Si | THIRD AREA | Si | THIRD AREA |
| SECOND AD CONVERTER | — | — | Si | THIRD AREA |
| FIRST TO SECOND AREA CONNECTION | — | — | — | — |
| SECOND TO THIRD AREA CONNECTION | — | FD | — | FD |
| FIRST TO THIRD AREA CONNECTION | — | FD | — | FD |

| EMBODIMENT | NINTH EXAMPLE | NINTH EXAMPLE | TENTH EXAMPLE | TENTH EXAMPLE | ELEVENTH EXAMPLE | ELEVENTH EXAMPLE |
|---|---|---|---|---|---|---|
| IRRADIATION SURFACE | BACK SURFACE | FIRST AREA | FRONT SURFACE | FIRST AREA | BACK SURFACE | FIRST AREA |
| FIRST PHOTOELECTRIC CONVERTER | Si | FIRST AREA | NON-Si | FIRST AREA | NON-Si | FIRST AREA |
| SECOND PHOTOELECTRIC CONVERTER | Si | FIRST AREA | NON-Si | FIRST AREA | NON-Si | FIRST AREA |
| FIRST STORAGE UNIT | — | — | — | — | — | — |
| SECOND STORAGE UNIT | — | — | — | — | — | — |
| FIRST AD CONVERTER | Si | SECOND AREA | Si | SECOND AREA | Si | SECOND AREA |
| SECOND AD CONVERTER | — | — | — | — | Si | SECOND AREA |
| FIRST TO SECOND AREA CONNECTION | — | FD | — | FD | — | FD |
| SECOND TO THIRD AREA CONNECTION | — | — | — | — | — | DIFFERENTIAL PAIR DRAIN |
| FIRST TO THIRD AREA CONNECTION | — | — | — | — | — | — |

110          113

190

SECOND DIVIDED AD CONVERTER          ~190b 113    110

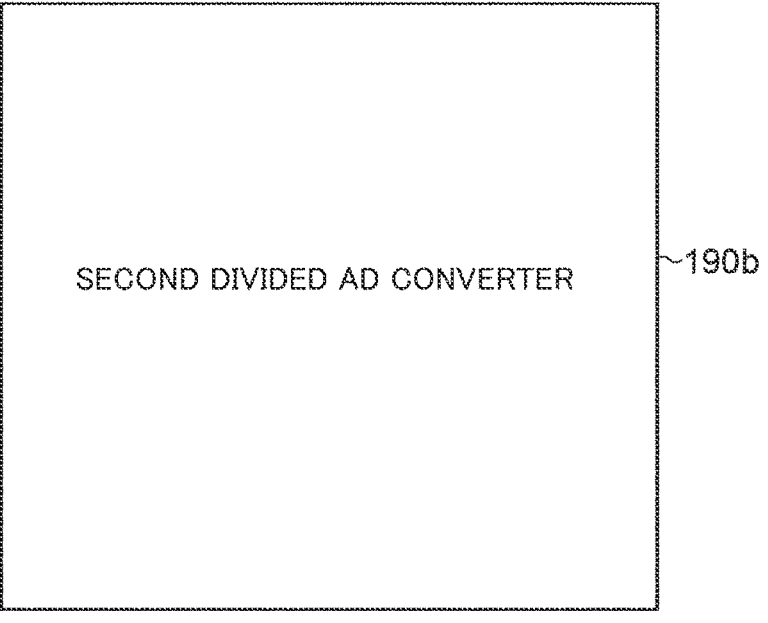

SECOND DIVIDED AD CONVERTER     ~190b

Fig. 57

| EMBODIMENT | 12TH TO 14TH EXAMPLES | 12TH EXAMPLE | 13TH EXAMPLE | 14TH EXAMPLE |
|---|---|---|---|---|
| IRRADIATION SURFACE | BACK SURFACE | FIRST AREA | FIRST AREA | FIRST AREA |
| PHOTOELECTRIC CONVERTER | Si | FIRST AREA | FIRST AREA | FIRST AREA |
| STORAGE UNIT | Si-PLANE DIRECTION | FIRST AREA | FIRST AREA | FIRST AREA |
| AD CONVERTER | Si | SECOND AREA | SECOND AREA THIRD AREA | SECOND AREA THIRD AREA |
| FIRST TO SECOND AREA CONNECTION | — | FD | FD | FD |
| SECOND TO THIRD AREA CONNECTION | — | — | DIFFERENTIAL PAIR DRAIN | COMPARISON RESULT OUTPUT |

110

113

190

110

113

190a

SECOND DIVIDED
AD CONVERTER

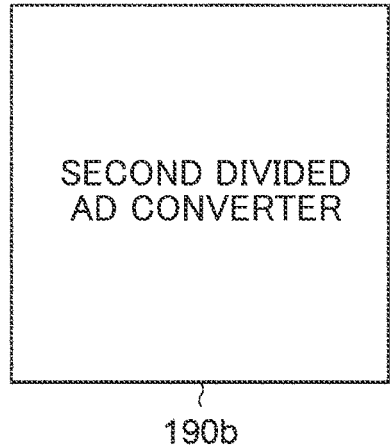

SECOND DIVIDED
AD CONVERTER

| EMBODIMENT | 15TH TO 17TH EXAMPLES | 15TH EXAMPLE | 16TH EXAMPLE | 17TH EXAMPLE |
|---|---|---|---|---|
| IRRADIATION SURFACE | BACK SURFACE | FIRST AREA | FIRST AREA | FIRST AREA |
| PHOTOELECTRIC CONVERTER | Si | FIRST AREA | FIRST AREA | FIRST AREA |
| STORAGE UNIT | Si-STACKING DIRECTION | FIRST AREA | FIRST AREA | FIRST AREA |
| AD CONVERTER | Si | SECOND AREA | SECOND AREA THIRD AREA | SECOND AREA THIRD AREA |
| FIRST TO SECOND AREA CONNECTION | — | FD | FD | FD |
| SECOND TO THIRD AREA CONNECTION | — | — | DIFFERENTIAL PAIR DRAIN | COMPARISON RESULT OUTPUT |

110,113

190

190a

190b

FIRST DIVIDED AD
CONVERTER

91

190a

SECOND DIVIDED
AD CONVERTER

| EMBODIMENT | 18TH EXAMPLE | 18TH EXAMPLE | 19TH TO 20TH EXAMPLES | 19TH EXAMPLE | 20TH EXAMPLE |
|---|---|---|---|---|---|
| IRRADIATION SURFACE | FRONT SURFACE | FIRST AREA | BACK SURFACE | FIRST AREA | FIRST AREA |
| PHOTOELECTRIC CONVERTER | NON-Si | FIRST AREA | NON-Si | FIRST AREA | FIRST AREA |
| STORAGE UNIT | Si-STACKING DIRECTION | FIRST AREA | NON-Si-STACKING DIRECTION | FIRST AREA | FIRST AREA |
| AD CONVERTER | Si | SECOND AREA | Si | SECOND AREA THIRD AREA | SECOND AREA THIRD AREA |
| FIRST TO SECOND AREA CONNECTION | — | FD | — | FD | FD |
| SECOND TO THIRD AREA CONNECTION | — | — | — | DIFFERENTIAL PAIR DRAIN | COMPARISON RESULT OUTPUT |

91

110b

190

AD CONVERTER

| EMBODIMENT | 21ST EXAMPLE | 21ST EXAMPLE | 22ND EXAMPLE | 22ND EXAMPLE | 23RD EXAMPLE | 23RD EXAMPLE |
|---|---|---|---|---|---|---|
| IRRADIATION SURFACE | BACK SURFACE | FIRST AREA | BACK SURFACE | FIRST AREA | BACK SURFACE | FIRST AREA |
| FIRST PHOTOELECTRIC CONVERTER | NON-Si | FIRST AREA | NON-Si | FIRST AREA | NON-Si | FIRST AREA |
| SECOND PHOTOELECTRIC CONVERTER | Si | SECOND AREA | Si | SECOND AREA | Si | SECOND AREA |
| FIRST STORAGE UNIT | NON-Si-STACKING DIRECTION | FIRST AREA | NON-Si-STACKING DIRECTION | FIRST AREA | NON-Si-STACKING DIRECTION | FIRST AREA |
| SECOND STORAGE UNIT | – | – | Si-PLANE DIRECTION | SECOND AREA | Si-STACKING DIRECTION | SECOND AREA |
| AD CONVERTER | Si | THIRD AREA | Si | THIRD AREA | Si | THIRD AREA |
| FIRST TO SECOND AREA CONNECTION | – | – | – | – | – | – |
| SECOND TO THIRD AREA CONNECTION | – | FD | – | FD | – | FD |
| FIRST TO THIRD AREA CONNECTION | – | FD | – | FD | – | FD |

| EMBODIMENT | 24TH EXAMPLE | 13TH EXAMPLE | 25TH EXAMPLE | 14TH EXAMPLE |
|---|---|---|---|---|
| IRRADIATION SURFACE | BACK SURFACE | FIRST AREA | BACK SURFACE | FIRST AREA |
| FIRST PHOTOELECTRIC CONVERTER | NON-Si | FIRST AREA | NON-Si | FIRST AREA |
| SECOND PHOTOELECTRIC CONVERTER | Si | SECOND AREA | Si | SECOND AREA |
| FIRST STORAGE UNIT | NON-Si-STACKING DIRECTION | FIRST AREA | NON-Si-STACKING DIRECTION | FIRST AREA |
| SECOND STORAGE UNIT | Si-PLANE DIRECTION | SECOND AREA | Si-STACKING DIRECTION | SECOND AREA |
| FIRST AD CONVERTER | Si | THIRD AREA | Si | THIRD AREA |
| SECOND AD CONVERTER | Si | THIRD AREA | Si | THIRD AREA |
| FIRST TO SECOND AREA CONNECTION | — | — | — | — |
| SECOND TO THIRD AREA CONNECTION | — | FD | — | FD |
| FIRST TO THIRD AREA CONNECTION | — | FD | — | FD |

| EMBODIMENT | 26TH EXAMPLE | 26TH EXAMPLE | 27TH EXAMPLE | 27TH EXAMPLE | 28TH EXAMPLE | 28TH EXAMPLE |
|---|---|---|---|---|---|---|
| IRRADIATION SURFACE | BACK SURFACE | FIRST AREA | FRONT SURFACE | FIRST AREA | BACK SURFACE | FIRST AREA |
| FIRST PHOTOELECTRIC CONVERTER | Si | FIRST AREA | NON-Si | FIRST AREA | NON-Si | FIRST AREA |
| SECOND PHOTOELECTRIC CONVERTER | Si | FIRST AREA | NON-Si | FIRST AREA | NON-Si | FIRST AREA |
| FIRST STORAGE UNIT | Si | FIRST AREA | NON-Si | FIRST AREA | NON-Si | FIRST AREA |
| SECOND STORAGE UNIT | Si | FIRST AREA | NON-Si | FIRST AREA | NON-Si | FIRST AREA |
| FIRST AD CONVERTER | Si | SECOND AREA | Si | SECOND AREA | Si | FIRST AREA |
| SECOND AD CONVERTER | — | — | — | — | Si | SECOND AREA |
| FIRST TO SECOND AREA CONNECTION | — | FD | — | FD | — | FD |
| SECOND TO THIRD AREA CONNECTION | — | — | — | — | — | DIFFERENTIAL PAIR DRAIN |
| FIRST TO THIRD AREA CONNECTION | — | — | — | — | — | — |

IMAGING DEVICE AND ELECTRONIC APPARATUS

TECHNICAL FIELD

The present disclosure relates to an imaging device and an electronic apparatus.

BACKGROUND ART

In conventional image sensors, the imaging signal photoelectrically converted by a photoelectric converter of each pixel is subjected to analog-to-digital conversion (hereinafter referred to as AD conversion) in units of columns. Therefore, there is a problem that it takes time to read out all the pixels in a pixel array unit. In view of this, a pixel AD-type imaging device in which an AD converter is provided for each of the pixels and AD conversion is performed for each pixel has been proposed (see PTL 1).

CITATION LIST

Patent Literature

[PTL 1]
JP 2018-148528A

SUMMARY

Technical Problem

However, in the pixel AD-type imaging device, since the AD converter is provided for each of the pixels, the number of wirings increases and the power consumption also increases, making it difficult to manufacture a high-resolution imaging device.

Therefore, an imaging device in which a substrate on which a photoelectric converter is arranged and a substrate on which an AD converter is arranged are separately provided and these substrates are stacked has been practically used. Various signals are transmitted and received between the two stacked substrates through bumps, vias, and the like. However, if the number of signals transmitted and received between the two substrates is large, the wiring area provided on each substrate becomes large, which may reduce the area ratio of the photoelectric converter and reduce the aperture ratio.

Accordingly, the present disclosure provides an imaging device and an electronic apparatus capable of reducing the number of signals transmitted and received between a plurality of stacked substrates and a plurality of layers.

Solution to Problem

In order to solve the problem, according to the present technology, there is provided an imaging device including:
a plurality of pixels each having a photoelectric converter;
an analog-to-digital converter provided for each area pixel composed of two or more of the pixels in the plurality of pixels to convert a signal corresponding to a charge photoelectrically converted by the two or more pixels into a digital signal;
a floating diffusion that outputs the charge photoelectrically converted by the photoelectric converter in the pixel;
a plurality of stacked areas in which the plurality of photoelectric converters, the plurality of the analog-todigital converters, and the plurality of the floating diffusions in the plurality of pixels are arranged; and
a signal transmitter that transmits and receives signals between the plurality of areas, wherein
among the plurality of areas, an area in which the plurality of photoelectric converters are arranged is provided separately from an area in which the analog-to-digital converter is arranged, and
the area in which the plurality of photoelectric converters in the area pixel are arranged and the area in which the analog-to-digital converter is arranged transmit and receive a charge of the plurality of floating diffusions via the same signal transmitter.

The photoelectric converter may have a silicon semiconductor layer, or may have a non-silicon semiconductor layer.

The non-silicon semiconductor layer may be a semiconductor layer containing an organic semiconductor material.

The imaging device may further include: a storage unit provided for each of the pixels to store the charge photoelectrically converted by the photoelectric converter;
a first transfer transistor provided for each of the pixels to perform switching control of whether or not to store the charge photoelectrically converted by the photoelectric converter in the storage unit; and
a second transfer transistor provided for each of the pixels to perform switching control of whether or not to transfer the charge stored in the storage unit to the floating diffusion.

The storage unit may be arranged in the area in which the photoelectric converter is arranged among the plurality of areas.

The storage unit may be arranged in the same layer as the photoelectric converter, or arranged in a layer stacked on a layer in which the photoelectric converter is arranged.

The storage unit may be arranged in an area different from the area in which the analog-to-digital converter is arranged among the plurality of areas.

The different area may have a wiring layer electrically connected to the floating diffusion, and
the storage unit may be arranged in the same layer as the wiring layer.
The analog-to-digital converter may include:
a comparator that compares an analog signal corresponding to the charge with a reference signal;
a comparison output processor that outputs a comparison result of the comparator;
a waveform shaping unit that shapes a waveform of an output signal of the comparison output processor; and
the comparator, the comparison output processor, and the waveform shaping unit may be arranged in the same area among the plurality of areas.
The analog-to-digital converter may include:
a comparator that compares an analog signal corresponding to the charge with a reference signal;
a comparison output processor that outputs a comparison result of the comparator; and
a waveform shaping unit that shapes a waveform of an output signal of the comparison output processor, and
the comparator, the comparison output processor, and the waveform shaping unit are arranged in mutually different areas among the plurality of areas.
The analog-to-digital converter may include:
a comparator that compares an analog signal corresponding to the charge with a reference signal;
a comparison output processor that outputs a comparison result of the comparator; and

a waveform shaping unit that shapes a waveform of an output signal of the comparison output processor, and the comparator, the comparison output processor, and the waveform shaping unit are arranged in mutually different areas among the plurality of areas.

The imaging device may further include:

a first area in which the photoelectric converter is arranged; and a second area in which at least a portion of the analog-to-digital converter is arranged, and the signal transmitter may transmit and receive the charge of the floating diffusion between the first area and the second area.

The photoelectric converter may include:

a first photoelectric converter; and a second photoelectric converter, the floating diffusion may include:

a first floating diffusion that stores a charge photoelectrically converted by the first photoelectric converter; and a second floating diffusion that stores a charge photoelectrically converted by the second photoelectric converter, the plurality of areas may include:

a first area in which the first photoelectric converter is arranged;

a second area in which the second photoelectric converter is arranged; and a third area in which at least a portion of the analog-to-digital converter is arranged, and the signal transmitter may include:

a first signal transmitter that transmits and receives the charge of the first floating diffusion between the first area and the third area; and a second signal transmitter that transmits and receives the charge of the second floating diffusion between the second area and the third area.

One of the first photoelectric converter and the second photoelectric converter may have a silicon semiconductor layer, and the other of the first photoelectric converter and the second photoelectric converter may have a non-silicon semiconductor layer.

The imaging device may further include: a first storage unit provided for each of the pixels to store the charge photoelectrically converted by the first photoelectric converter; and a second storage unit provided for each of the pixels to store the charge photoelectrically converted by the second photoelectric converter, wherein the first storage unit may be arranged in the first area, the second storage unit may be arranged in the second area, the first floating diffusion may store a charge corresponding to the charge stored in the first storage unit, and the second floating diffusion may store a charge corresponding to the charge stored in the second storage unit.

The imaging device may further include a storage unit provided for each of the pixels to store the charge photoelectrically converted by either the first photoelectric converter or the second photoelectric converter, wherein the storage unit may be arranged in the second area, either one of the first floating diffusion and the second floating diffusion may store the charge corresponding to the charge stored in the storage unit, and the other of the first floating diffusion and the second floating diffusion may store the charge photoelectrically converted by the first photoelectric converter or the second photoelectric converter without storing the charge in the storage unit.

Both the first photoelectric converter and the second photoelectric converter may have a silicon semiconductor layer, or may have a non-silicon semiconductor layer.

The imaging device may further include: a first storage unit provided for each of the pixels to store the charge photoelectrically converted by the first photoelectric converter; and a second storage unit provided for each of the pixels to store the charge photoelectrically converted by the second photoelectric converter.

At least one of the first storage unit and the second storage unit may be provided across the first area and the second area.

According to the present disclosure, there is provided an electronic apparatus including: an imaging device that outputs a photoelectrically converted digital signal for each pixel; and a signal processor that performs signal processing on the digital signal, wherein the imaging device includes:

a plurality of pixels each having a photoelectric converter;

an analog-to-digital converter provided for each area pixel composed of two or more of the pixels in the plurality of pixels to convert a signal corresponding to a charge photoelectrically converted by the two or more pixels into a digital signal;

a floating diffusion that outputs the charge photoelectrically converted by the photoelectric converter in the pixels a plurality of stacked areas in which the plurality of pixels, the plurality of the analog-to-digital converters, and the plurality of the floating diffusions are arranged; and a signal transmitter that transmits and receives signals between the plurality of areas, wherein among the plurality of areas, an area in which the plurality of photoelectric converters are arranged is provided separately from an area in which the analog-to-digital converter is arranged, and the signal transmitter transmits and receives a charge of the floating diffusion between the area in which the photoelectric converter is arranged and the area in which the analog-to-digital converter is arranged.

BRIEF DESCRIPTION OF DRAWINGS

FIG. 20 is a diagram summarizing the features of the area pixels according to the first to third examples.

FIG. 30 is a diagram summarizing the features of the area pixels according to the fourth to sixth examples.

FIG. 37 is a diagram summarizing the features of the area pixels according to the seventh and eighth examples.

FIG. 47 is a diagram summarizing the features of the area pixels according to the ninth to 11th examples.

FIG. 56C is a plan view taken along line C-C of FIG. 55.

FIG. 57 is a diagram summarizing the features of the area pixels according to the 12th to 14th examples.

FIG. 66D is a plan view taken along line D-D of FIG. 65.

FIG. 67 is a diagram summarizing the features of the area pixels according to the 15th to 17th examples.

FIG. 77 is a diagram summarizing the features of the area pixels according to the 18th to 20th examples.

FIG. 79 is a cross-sectional view of an area pixel according to the 21st example.

FIG. 80A is a plan view taken along line A-A in FIG. 79.

FIG. 80B is a plan view taken along line B-B in FIG. 79.

FIG. 80C is a plan view taken along line C-C of FIG. 79.

FIG. 81 is a circuit diagram of an area pixel according to the 22nd example.

FIG. 82 is a cross-sectional view of an area pixel according to the 22nd example.

FIG. 83A is a plan view taken along line A-A in FIG. 82.

FIG. 83B is a plan view taken along line B-B of FIG. 82.

FIG. 83C is a plan view taken along line C-C of FIG. 82.

FIG. 84 is a circuit diagram of an area pixel according to the 23rd example.

FIG. 85 is a cross-sectional view of an area pixel according to the 23rd example.

FIG. 86A is a plan view taken along line A-A in FIG. 85.

Figure 85:
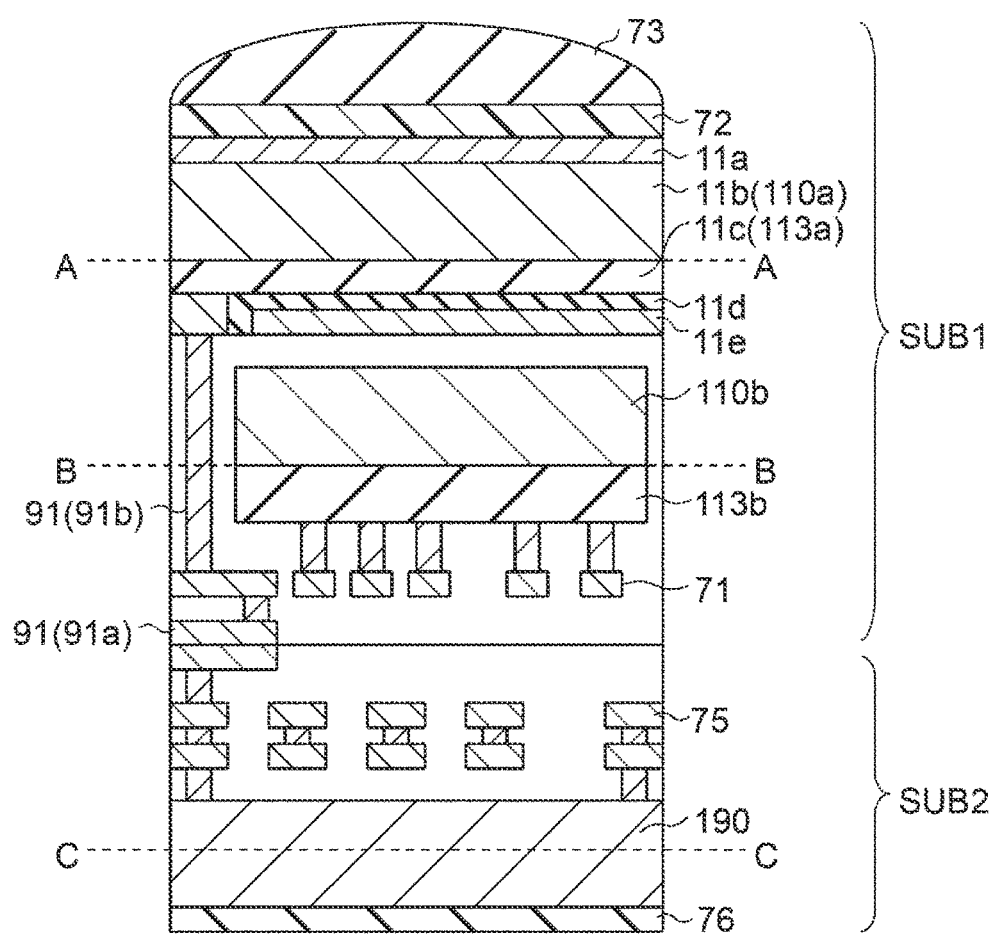
Figure 86A:
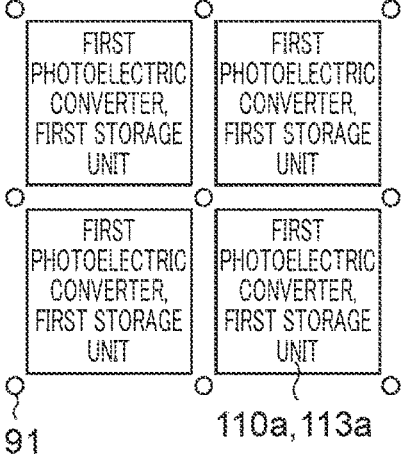
Figure 86B:
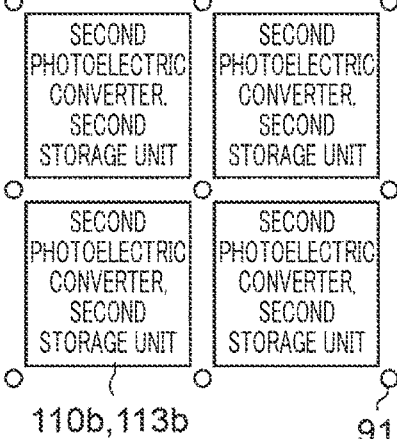

FIG. 86B is a plan view taken along line B-B in FIG. 85.

Figure 86C:
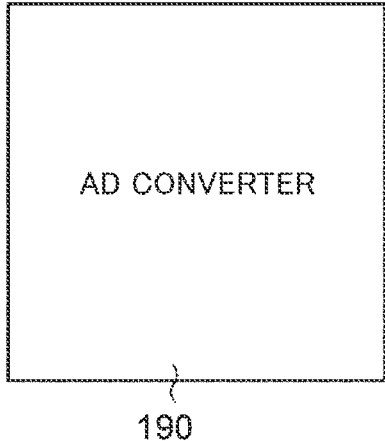

FIG. 86C is a plan view taken along line C-C in FIG. 85.

FIG. 87 is a diagram summarizing the features of the area pixels according to the 21st to 23rd examples.

Figure 88:
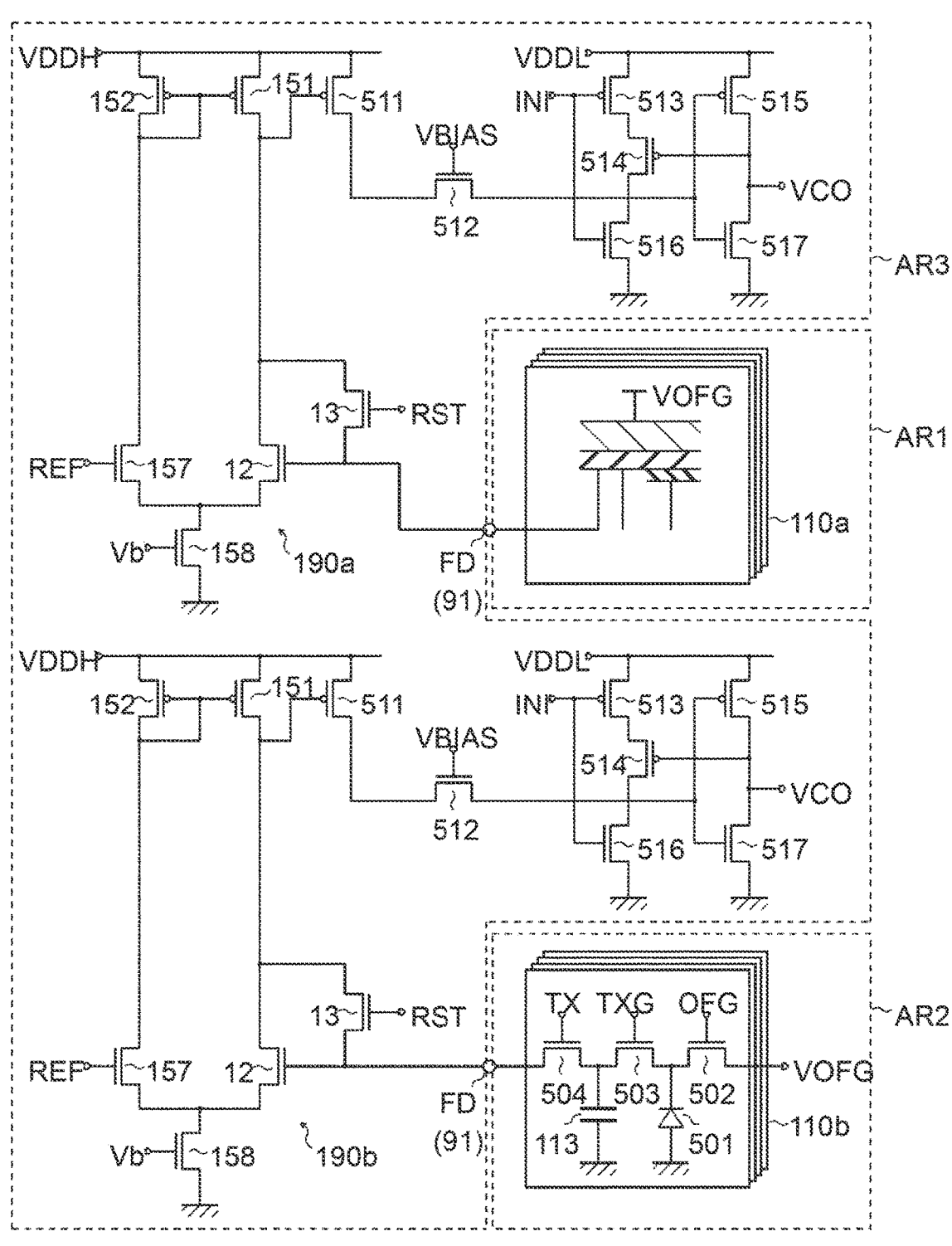

FIG. 88 is a circuit diagram of an area pixel according to the 24th example.

Figure 89:
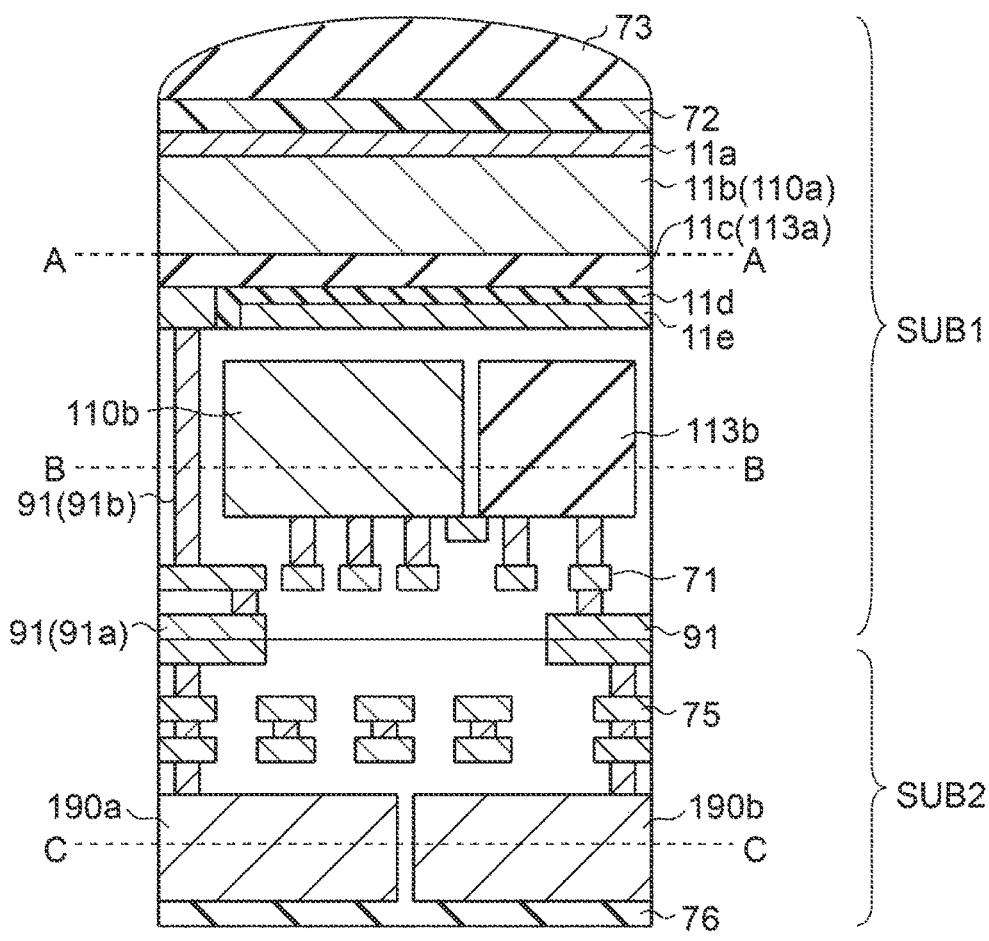

FIG. 89 is a cross-sectional view of an area pixel according to the 24th example.

Figure 90A:
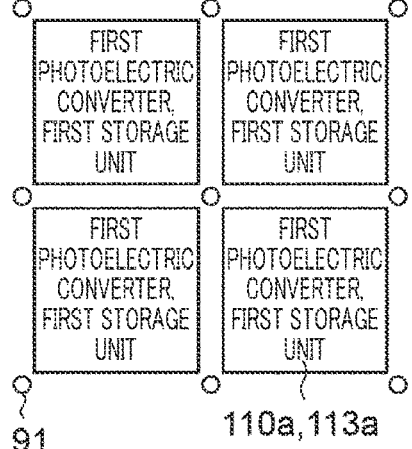

FIG. 90A is a plan view taken along line A-A in FIG. 89.

Figure 90B:
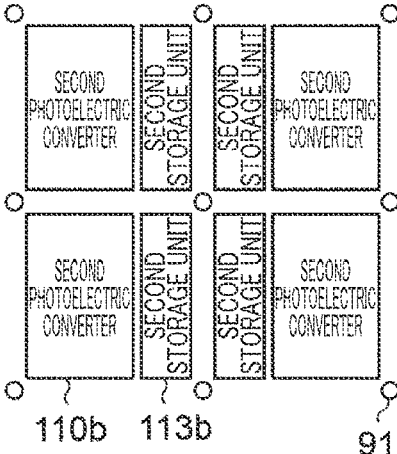

FIG. 90B is a plan view taken along line B-B in FIG. 89.

Figure 90C:
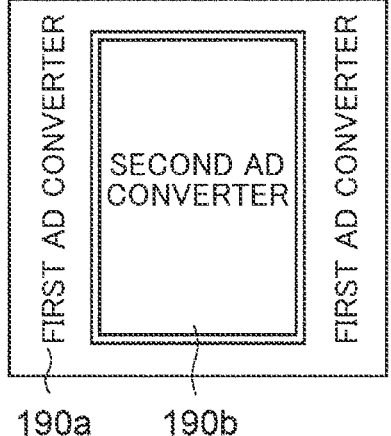

FIG. 90C is a plan view taken along line C-C of FIG. 89.

Figure 91:
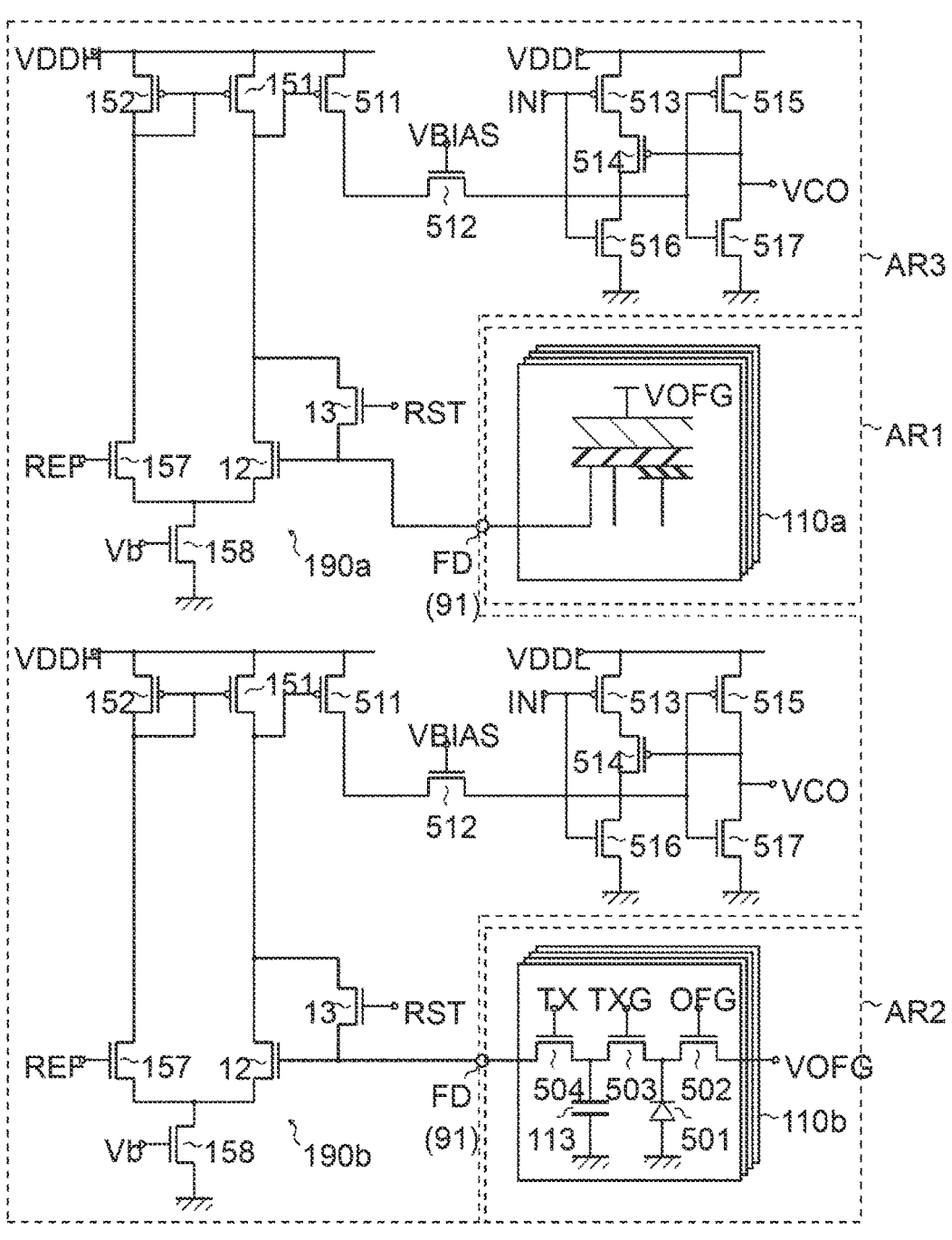

FIG. 91 is a circuit diagram of an area pixel according to the 25th example.

Figure 92:
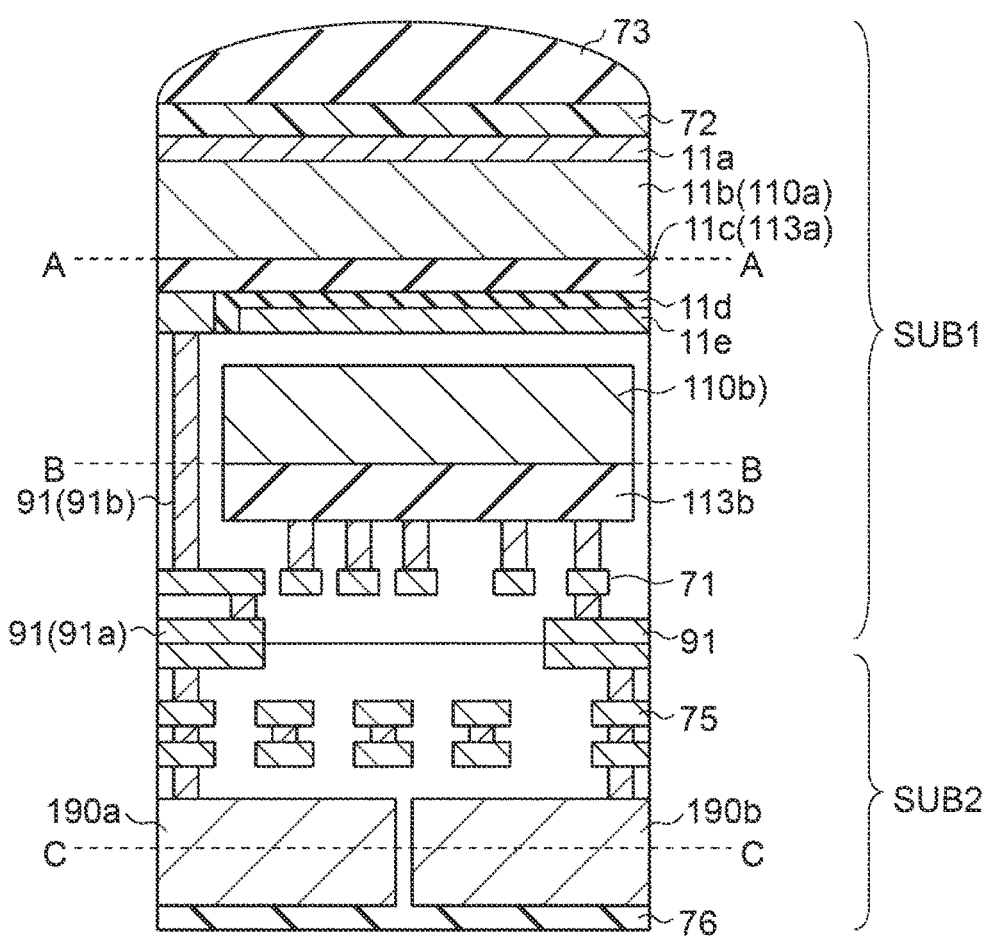

FIG. 92 is a cross-sectional view of an area pixel according to the 25th example.

Figure 93A:
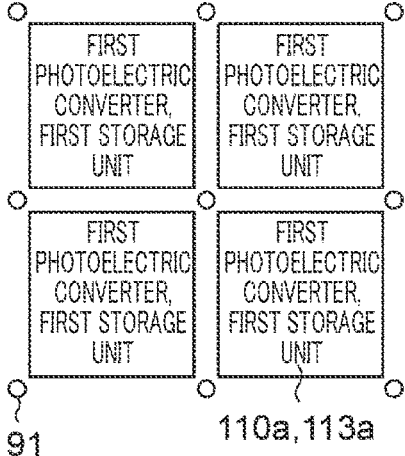

FIG. 93A is a plan view in the direction of line A-A in FIG. 92.

Figure 93B:
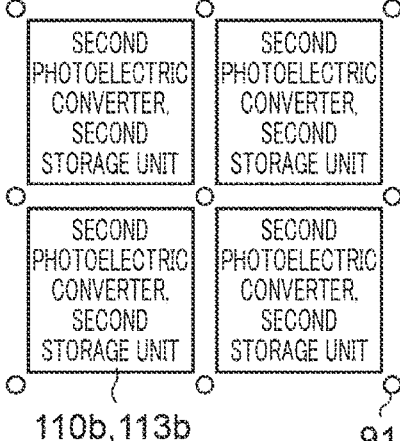

FIG. 93B is a plan view taken along line B-B of FIG. 92.

Figure 93C:
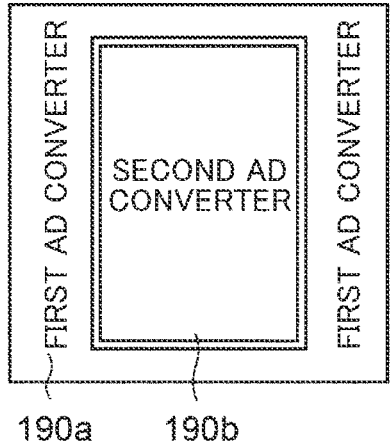

FIG. 93C is a plan view taken along line C-C of FIG. 92.

FIG. 94 is a diagram summarizing the features of the area pixels according to the 24th and 25th examples.

Figure 95:
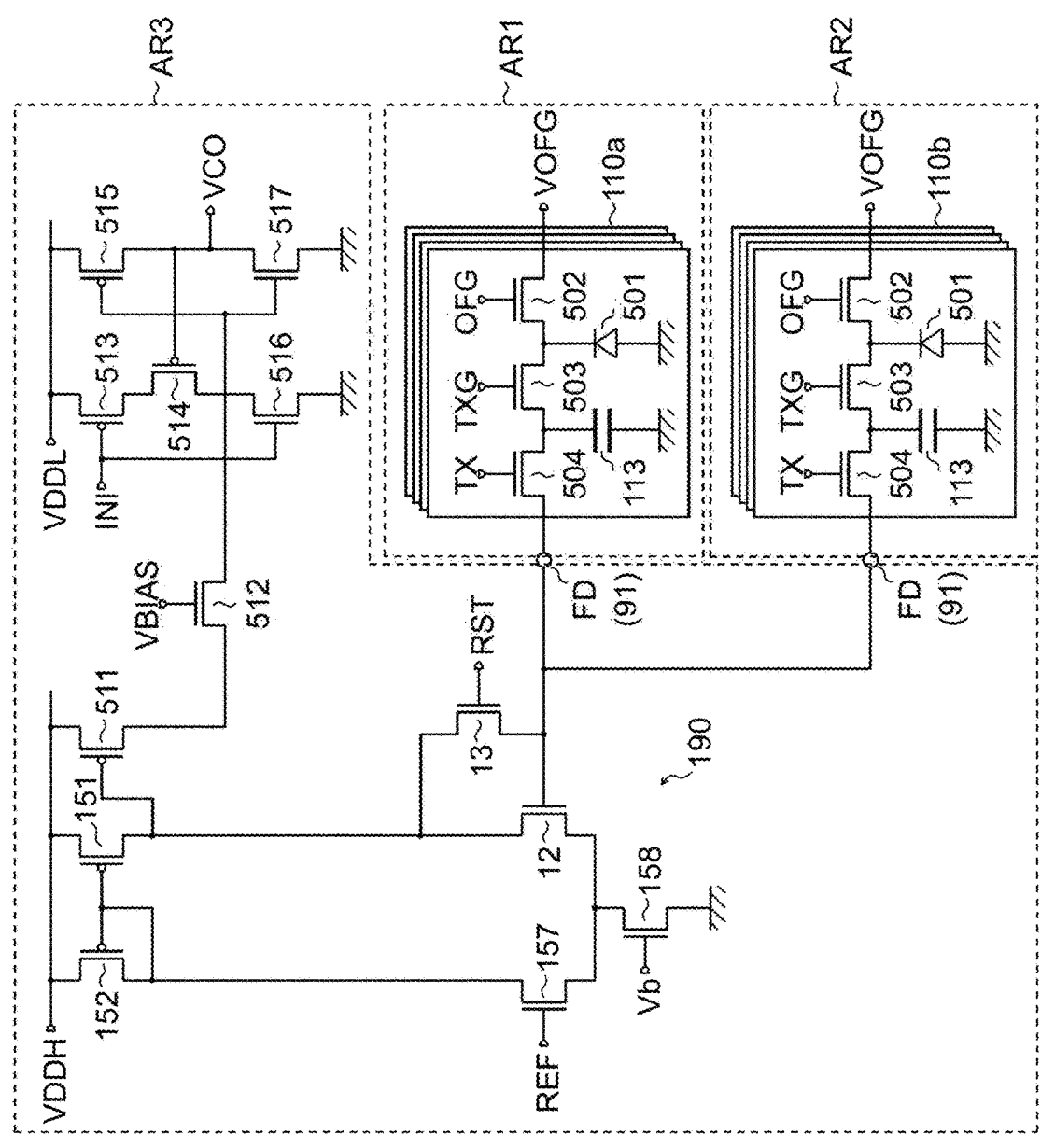

FIG. 95 is a circuit diagram of an area pixel according to the 23rd example.

Figure 96:
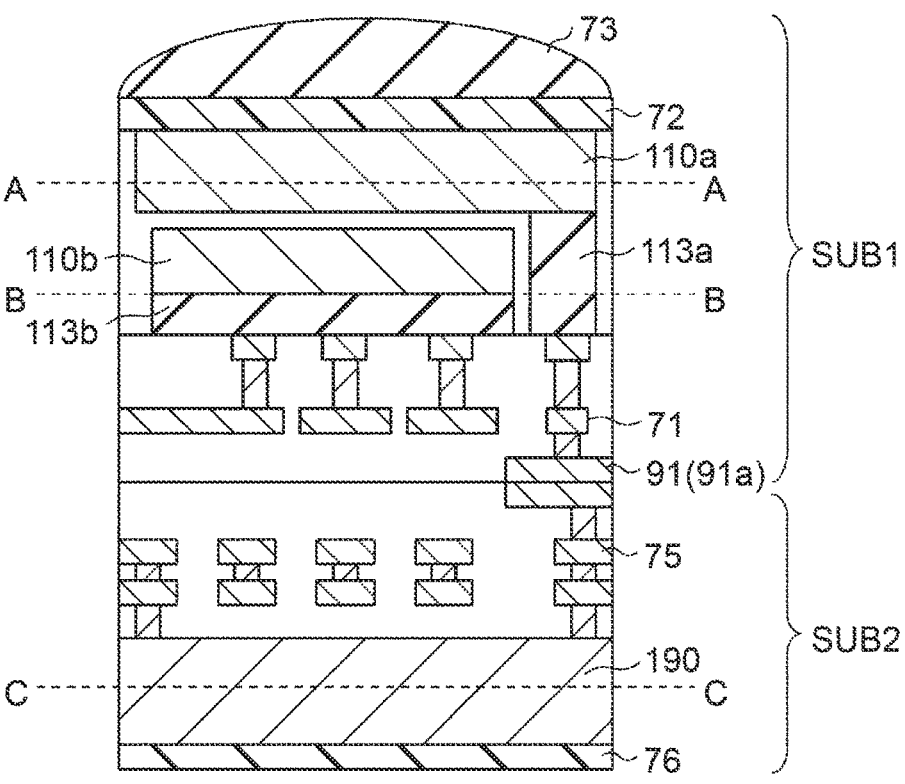

FIG. 96 is a cross-sectional view of an area pixel according to the 23rd example.

Figure 97A:
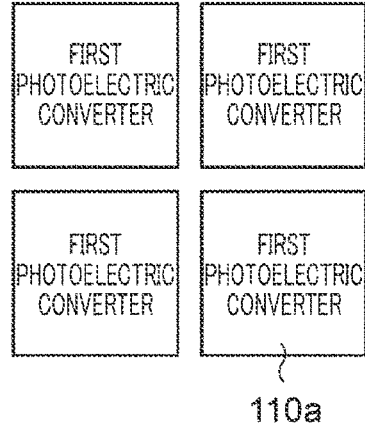

FIG. 97A is a plan view taken along line A-A in FIG. 96.

Figure 97B:
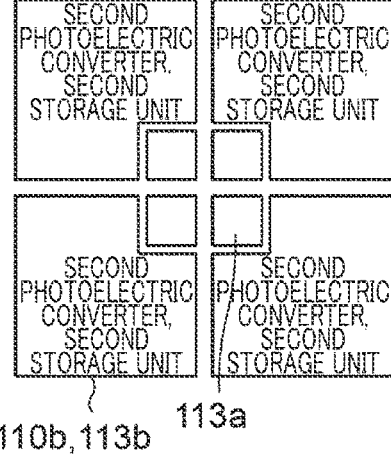

FIG. 97B is a plan view taken along line B-B of FIG. 96.

Figure 97C:
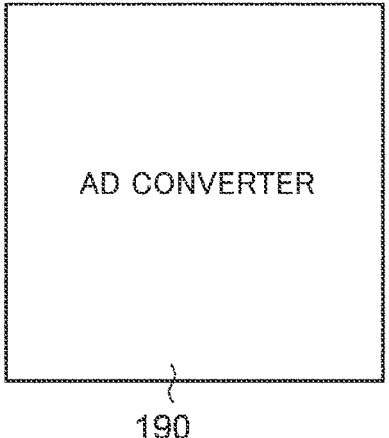

FIG. 97C is a plan view taken along line C-C of FIG. 96.

Figure 98:
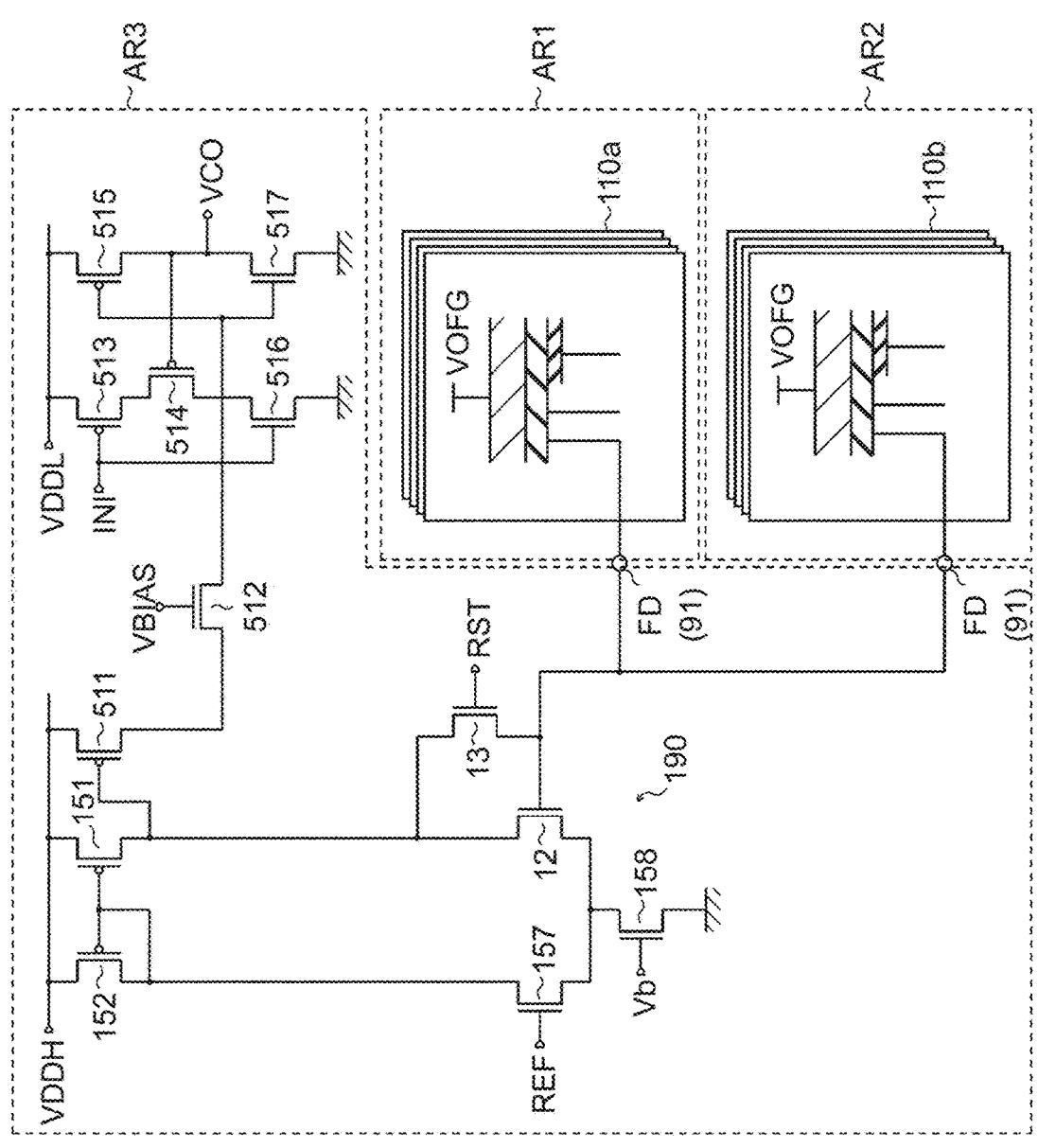

FIG. 98 is a circuit diagram of an area pixel according to the 27th example.

Figure 99:
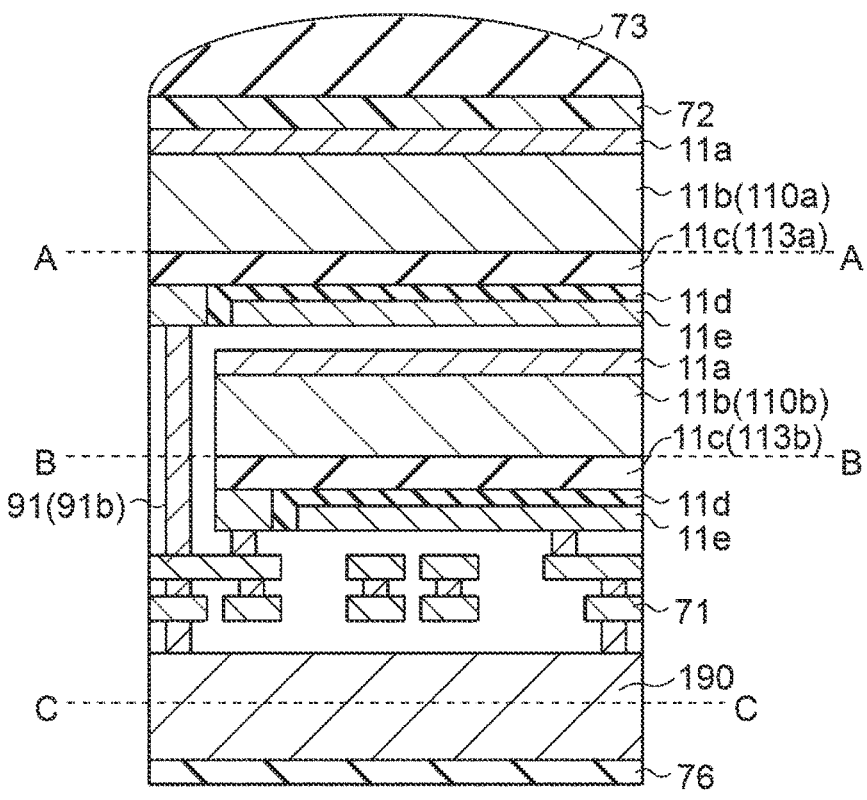

FIG. 99 is a cross-sectional view of an area pixel according to the 27th example.

Figure 100A:
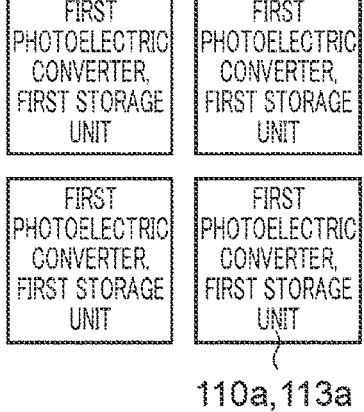

FIG. 100A is a plan view taken along line A-A in FIG. 99.

Figure 100B:
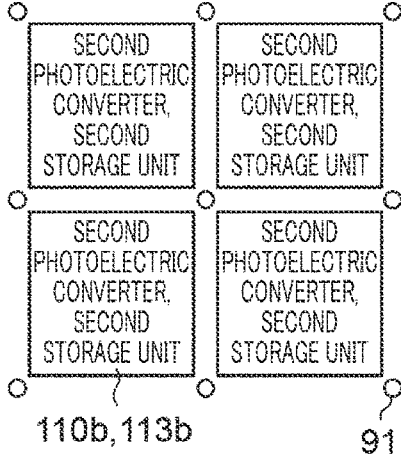

FIG. 100B is a plan view taken along line B-B in FIG. 99.

Figure 100C:
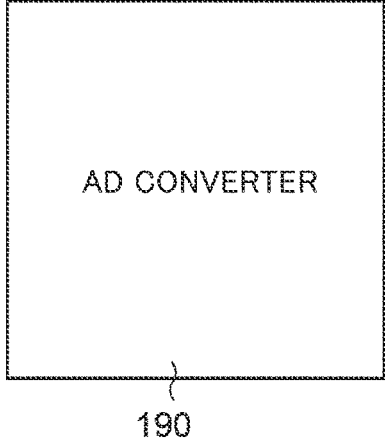

FIG. 100C is a plan view taken along line C-C of FIG. 99.

Figure 101:
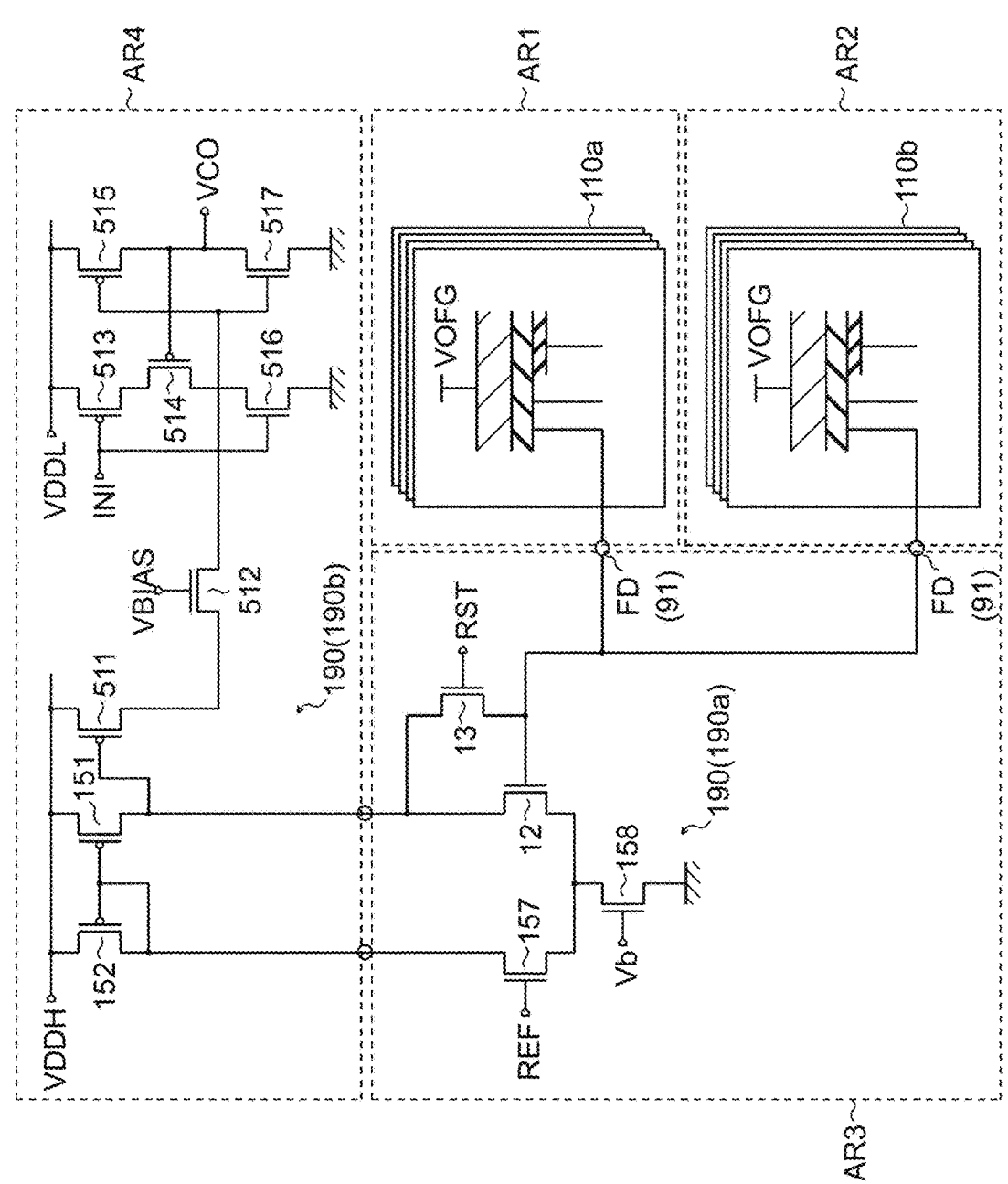

FIG. 101 is a circuit diagram of an area pixel according to the 28th example.

Figure 102:
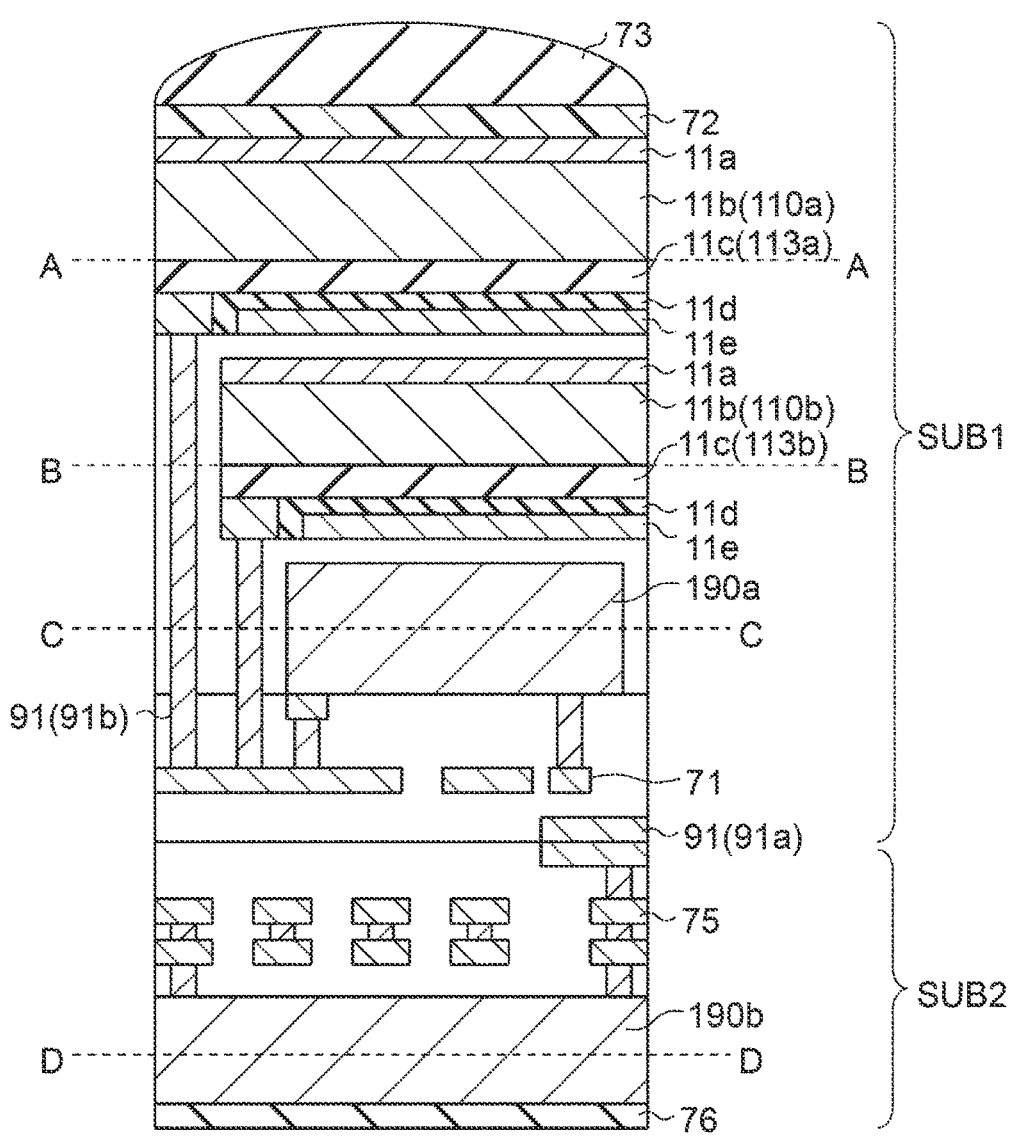

FIG. 102 is a cross-sectional view of an area pixel according to the 28th example.

Figure 103A:
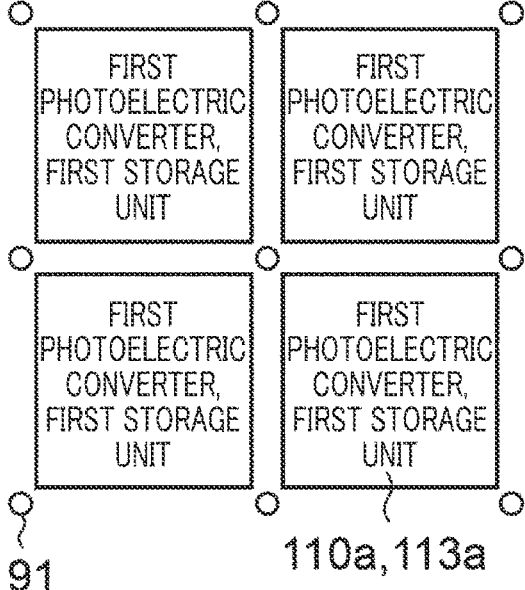

FIG. 103A is a plan view in the direction of line A-A in FIG. 99.

Figure 103B:
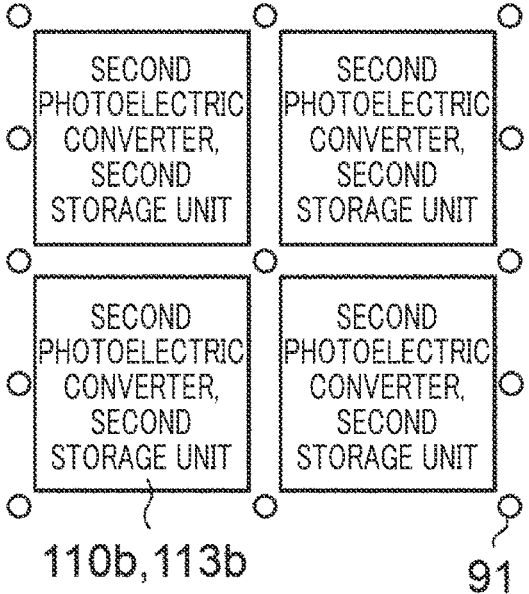

FIG. 103B is a plan view taken along line B-B in FIG. 99.

Figure 103C:
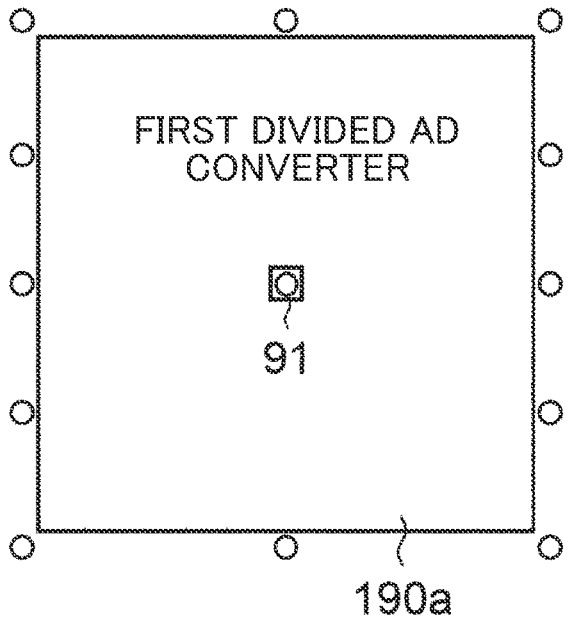

FIG. 103C is a plan view taken along line C-C of FIG. 99.

Figure 103D:
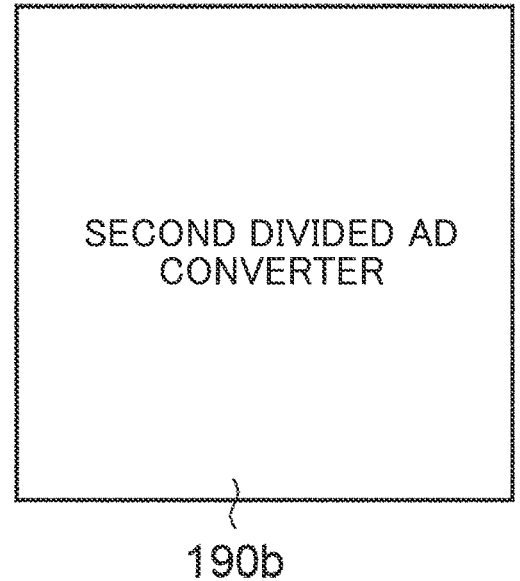

FIG. 103D is a plan view taken along line D-D of FIG. 102.

FIG. 104 is a diagram summarizing the features of the area pixels according to the 26th to 28th examples.

Figure 105:
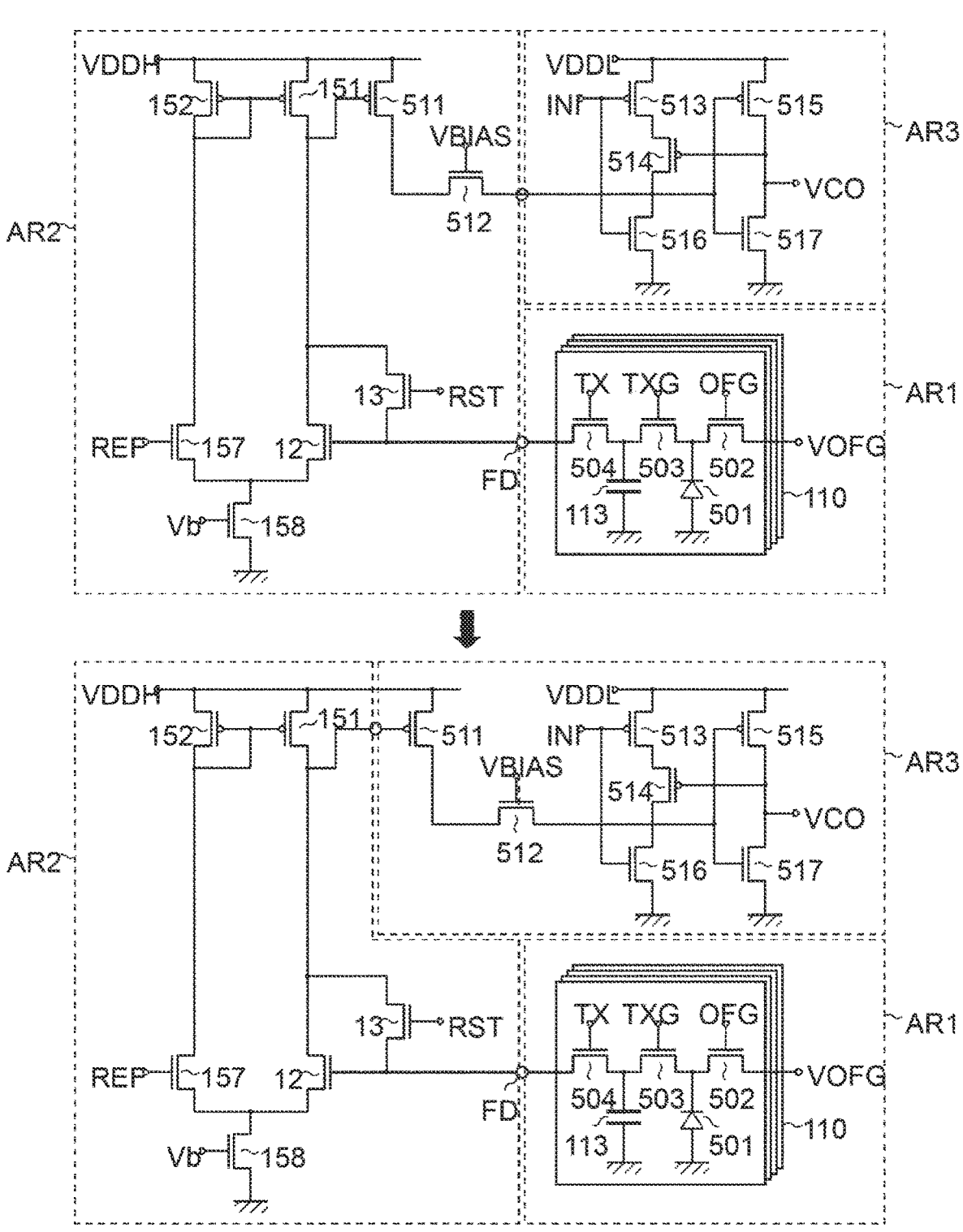

FIG. 105 is a circuit diagram illustrating a comparison result output signal in the AD converter.

Figure 106:
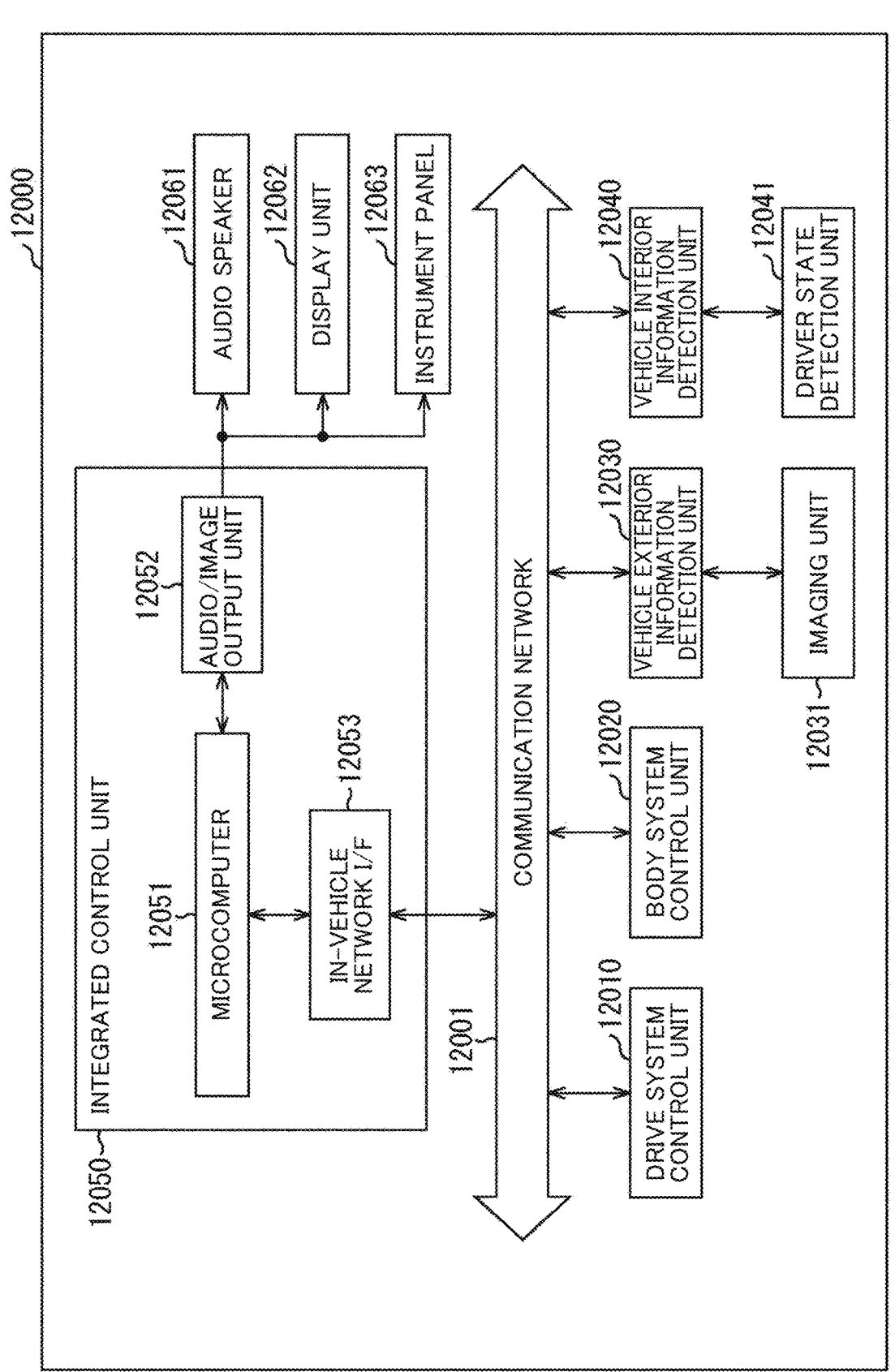

FIG. 106 is a block diagram illustrating an example of an overall configuration of a vehicle control system.

Figure 107:
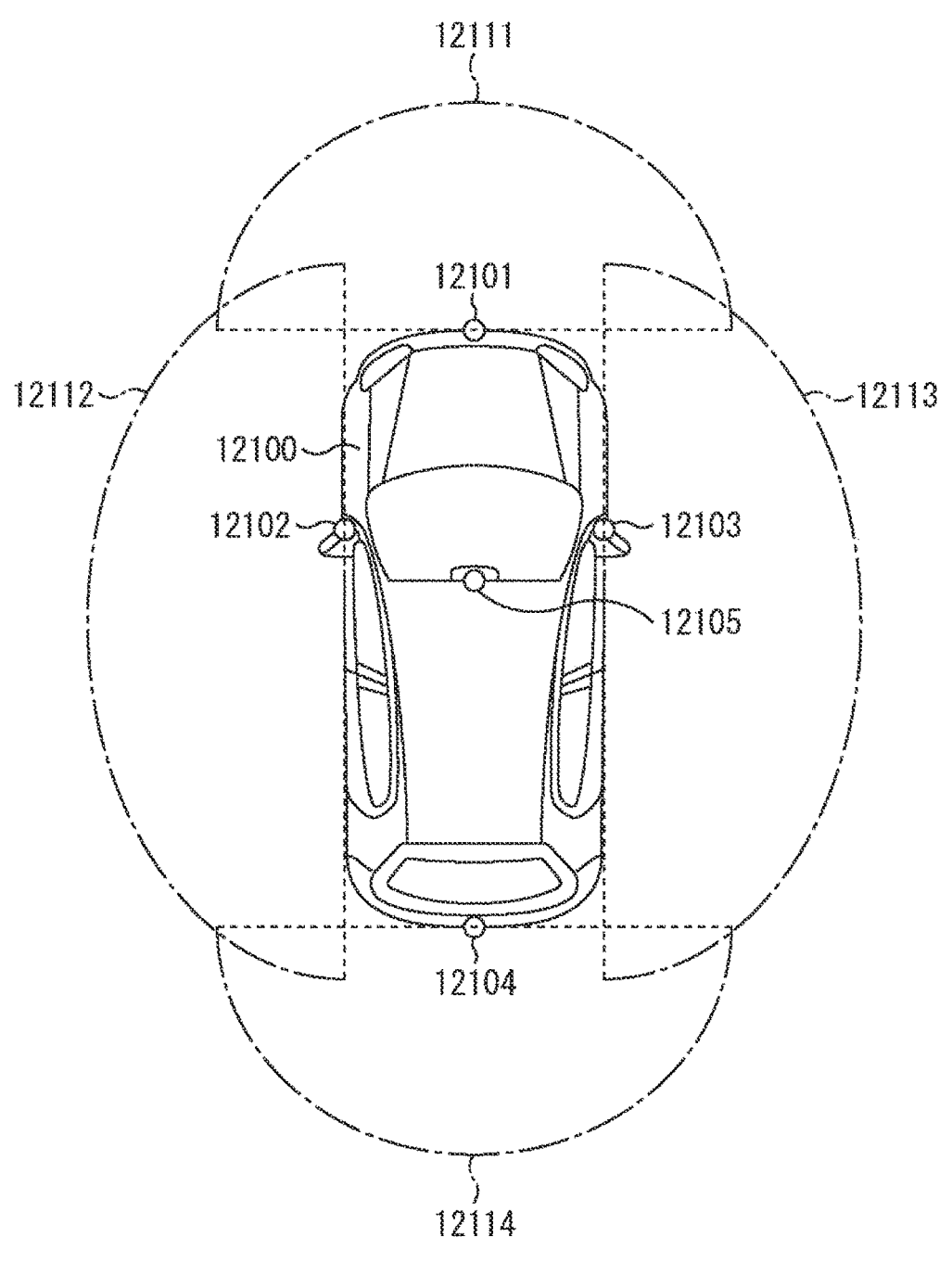

FIG. 107 is an explanatory diagram illustrating an example of positions at which a vehicle exterior information detection unit and an imaging unit are installed.

DESCRIPTION OF EMBODIMENTS

Hereinafter, embodiments of an imaging device and electronic apparatus will be described with reference to the drawings. Although main components of the imaging device and the electronic apparatus will be mainly described below, the imaging device and the electronic apparatus may include components and functions that are not illustrated or explained. The following description does not exclude components or functions which are not illustrated or mentioned.

[Configuration of Imaging Device]

Figure 1:
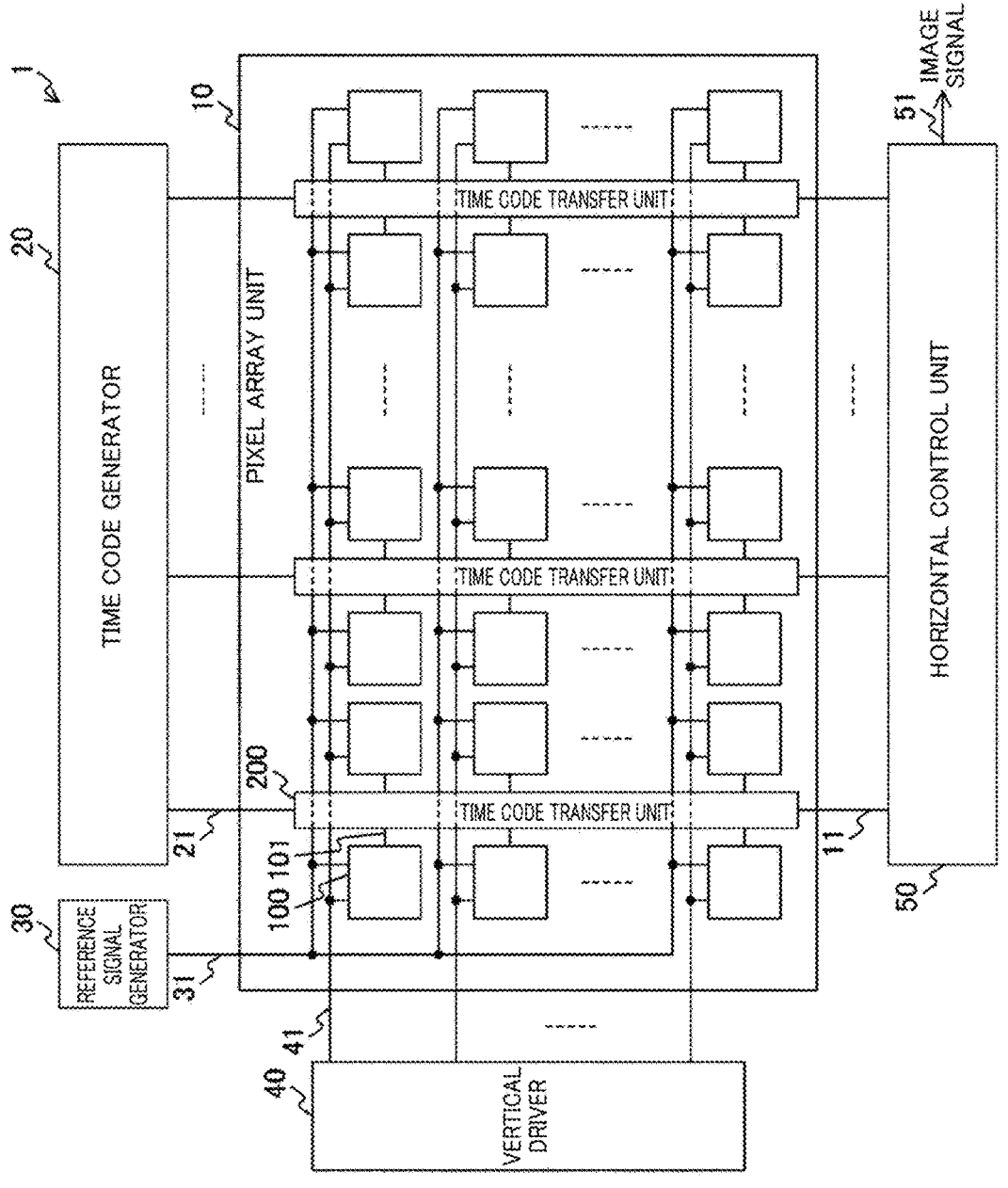
FIG. 1 is a diagram illustrating a configuration example of an imaging device according to an embodiment of the present technology.

FIG. 1 is a diagram illustrating a configuration example of an imaging device 1 according to an embodiment of the present technology. This imaging device 1 includes a pixel array unit 10, a time code generator 20, a reference signal generator 30, a vertical driver 40 and a horizontal control unit 50.

The pixel array unit 10 includes a plurality of area pixels 100, and pixel signals are analog-to-digital converted (hereinafter referred to as AD conversion) for each area pixel 100. The area pixel 100 has a plurality of pixels. Each pixel has a photoelectric converter. As will be described later, the area pixel 100 has one analog-to-digital converter (hereinafter referred to as AD converter). The AD converter sequentially AD-converts analog pixel signals captured by each pixel in the area pixel 100 and outputs corresponding digital signals. Note that the area pixel 100 can be also referred to as a pixel, and each photoelectric converter in the pixel can be referred to as a sub-pixel or a color pixel.

The pixel array unit 10 includes area pixels 100 arranged in a two-dimensional matrix to generate pixel signals, and a plurality of time code transfer units 200 arranged between the plurality of area pixels 100 arranged in the column direction. The area pixel 100 outputs a time code that is the result of AD-converting the analog pixel signal of each pixel. The time code transfer unit 200 sequentially transfers the time code in the column direction. The transferred time code is input to the horizontal control unit 50. A signal line 101 is a signal line that connects the area pixels 100 and the time code transfer unit 200. Details of the configurations of the area pixels 100 and the time code transfer unit 200 will be described later.

The time code generator 20 generates a time code and outputs it to the time code transfer unit 200. Here, the time code is a code indicating elapsed time from the start of AD conversion in the area pixel 100. This time code has a size equal to the number of bits of the digital pixel signal after conversion, and a Gray code, for example, can be used. The time code is output to the time code transfer unit 200 via the signal line 21.

The reference signal generator 30 generates a reference signal and outputs it to the area pixels 100. This reference signal is a reference signal for AD conversion in the area pixel 100, and for example, a signal (ramp signal) whose voltage linearly decreases with time can be used. This reference signal is output via the signal line 31. The generation and output of the time code by the time code generator 20 are executed in synchronization with the generation and output of the reference signal by the reference signal generator 30. As a result, the time code and the reference signal output from the time code generator 20 and the reference signal generator 30 correspond on a one-to-one basis, and the voltage of the reference signal can be obtained from the time code. A time code decoder 52, which will be described later, performs decoding by acquiring the voltage of the reference signal from the time code.

The vertical driver 40 generates and outputs control signals and the like for the area pixels 100. This control signal is output to the area pixels 100 via the signal line 41. The details of the configuration of the vertical driver 40 will be described later.

The horizontal control unit 50 processes the time code transferred by the time code transfer unit 200. The time code is input to the horizontal control unit 50 via the signal line 11. Details of the configuration of the horizontal control unit 50 will be described later. Note that the horizontal control unit 50 is an example of the processing circuit described in the claims.

[Configuration of Vertical Driver]

Figure 2:
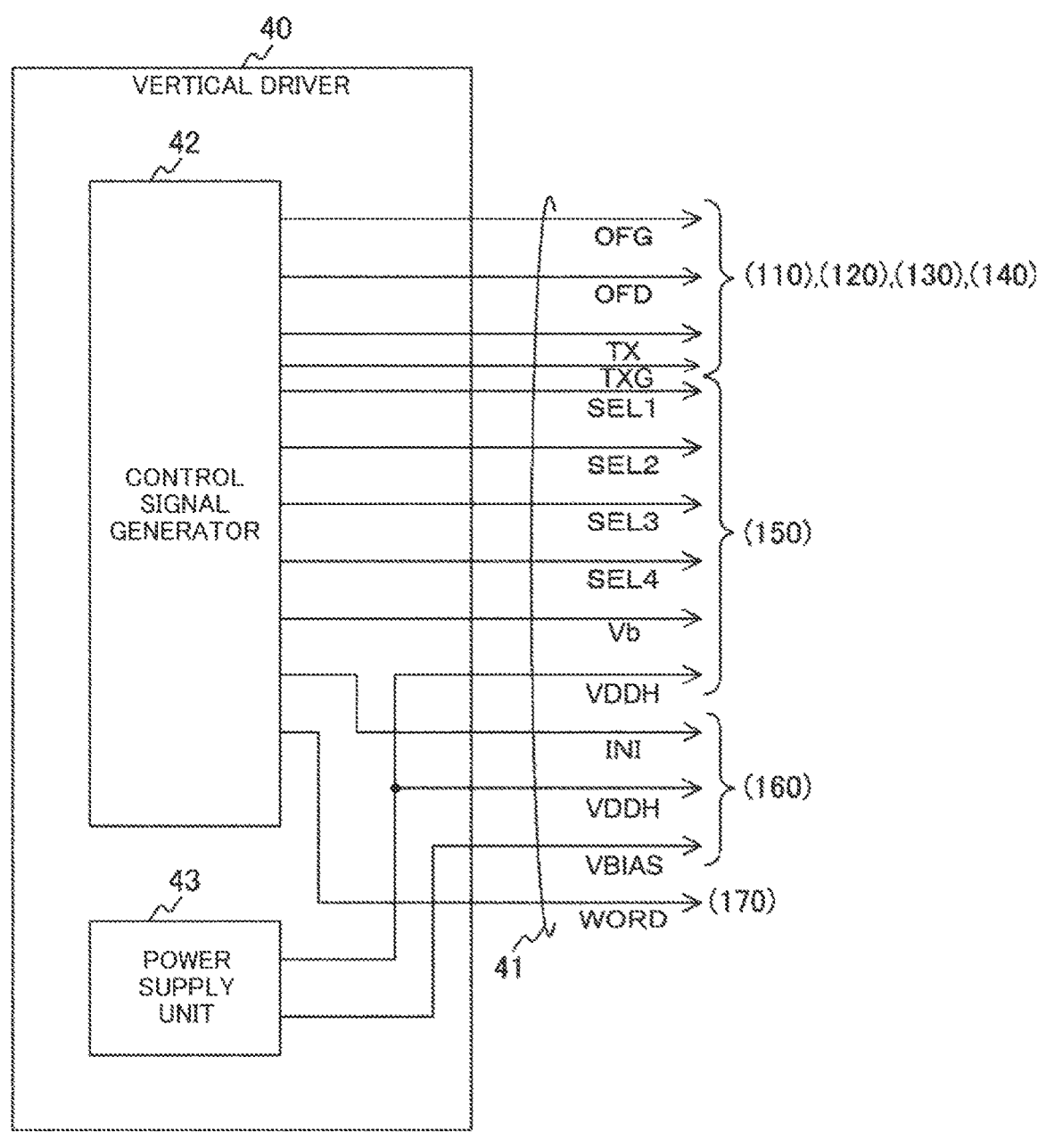
FIG. 2 is a diagram illustrating a configuration example of a vertical driver according to an embodiment of the present technology.

FIG. 2 is a diagram illustrating a configuration example of the vertical driver 40 according to an embodiment of the present technology. The vertical driver 40 includes a control signal generator 42 and a power supply unit 43.

The control signal generator 42 generates and outputs control signals for the area pixels 100. The power supply unit 43 supplies power necessary for the operation of the area pixels 100. These control signals and power are transmitted by the signal line 41. As illustrated in the figure, the signal line 41 is composed of a plurality of signal lines (OFG, OFD, TX, SEL1, SEL2, SEL3, SEL4, Vb, INI, WORD) and a plurality of power supply lines (VDDH, VBIAS). The signal lines (OFG, OFD, TX, SEL1, SEL2, SEL3, SEL4, Vb, INI, WORD) are connected to the control signal generator 42 and transmit control signals for the area pixels 100. On the other hand, the power supply lines (VDDH, VBIAS) are connected to the power supply unit 43 and used for power supply. Details of these signal lines will be described later.

[Configuration of Horizontal Control Unit]

Figure 3:
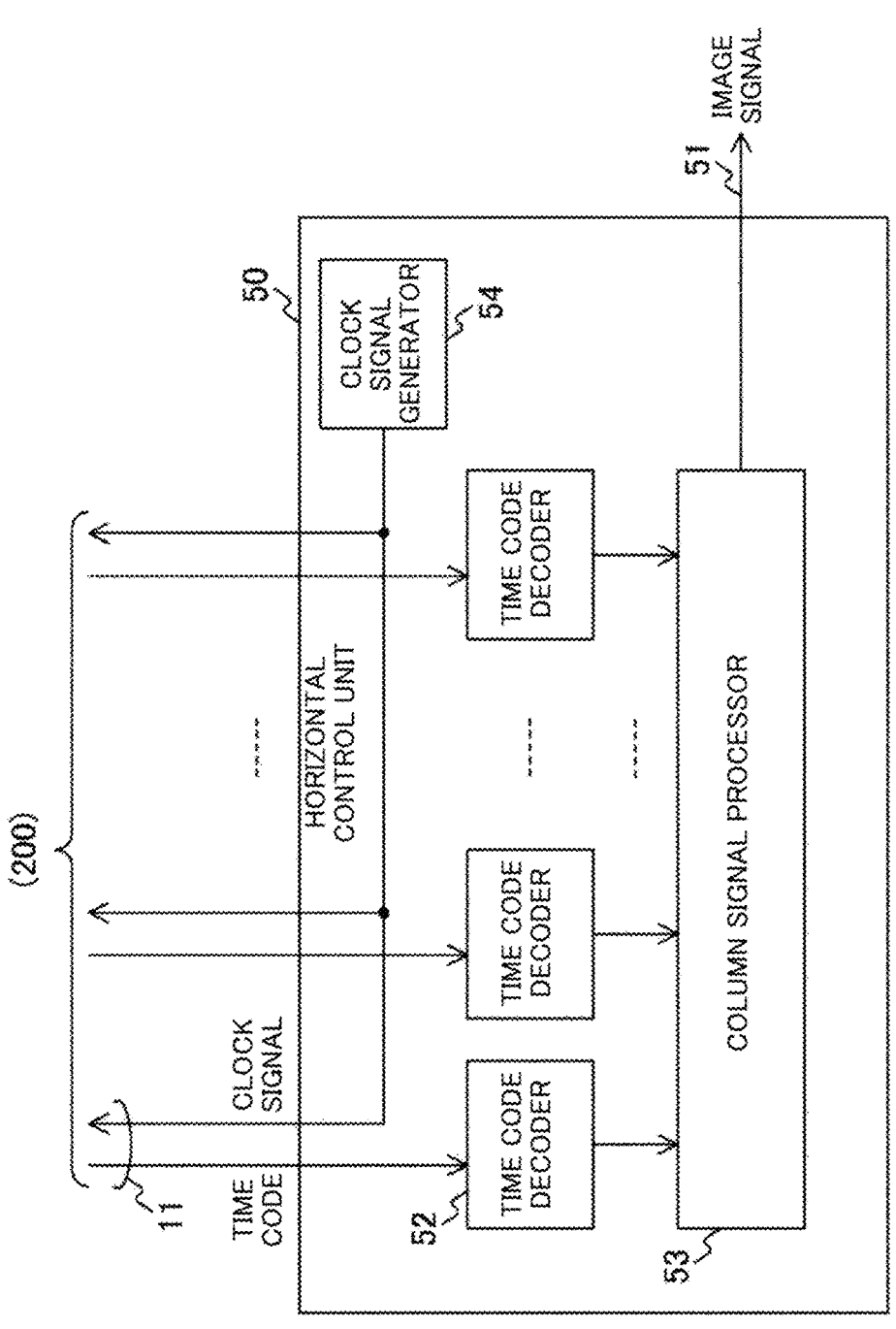
FIG. 3 is a diagram illustrating a configuration example of a horizontal control unit according to an embodiment of the present technology.

FIG. 3 is a diagram illustrating a configuration example of the horizontal control unit 50 in one embodiment of the present technology. The horizontal control unit 50 includes a time code decoder 52, a column signal processor 53 and a clock signal generator 54.

The time code decoder 52 decodes the time code. By this decoding, a digital pixel signal that is the result of AD conversion is generated. A plurality of time code decoders 52 are arranged in the horizontal control unit 50 and correspond to the time code transfer units 200 arranged in the pixel array unit 10 on a one-to-one basis. Time codes are simultaneously input to these time code decoders 52 from the corresponding time code transfer units 200. Decoding of the input time codes is performed concurrently by these time code decoders 52. After that, the plurality of decoded digital pixel signals are input to the column signal processor 53.

The column signal processor 53 processes the digital pixel signals output from the time code decoder 52. Correlated Double Sampling (CDS), which will be described later, can be performed as this processing. The column signal processor 53 horizontally transfers the processed digital pixel signals. The column signal processor 53 sequentially transfers and outputs processed pixel signals corresponding to a plurality of digital pixel signals simultaneously input by a plurality of time code decoders 52. The pixel signal output from the column signal processor 53 is an output signal of the imaging device 1 and corresponds to a digital pixel signal.

[Pixel Configuration]

Figure 4A:
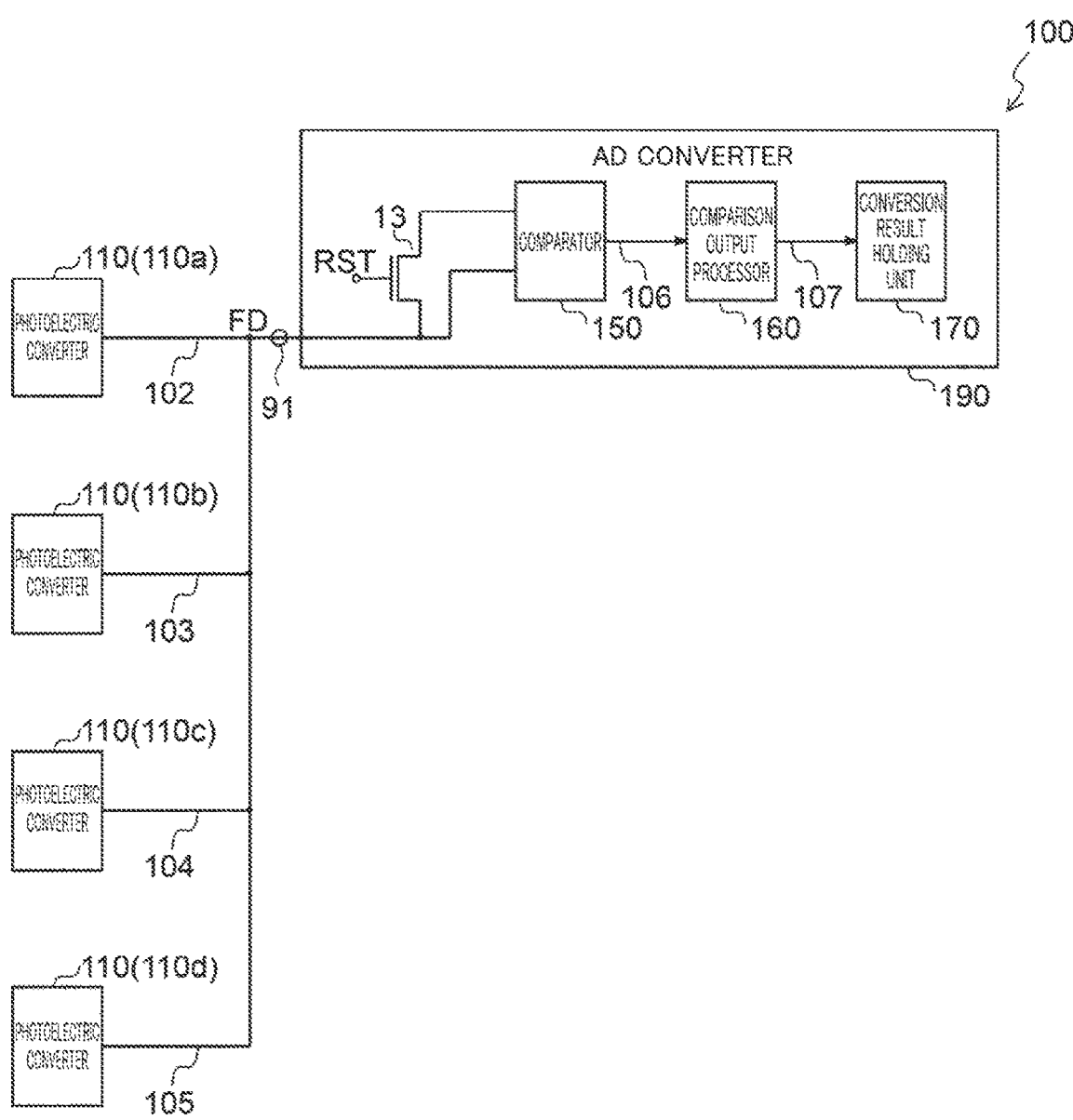
FIG. 4A is a diagram illustrating a configuration example of an area pixel according to an embodiment of the present technology.

FIG. 4A is a diagram illustrating a configuration example of the area pixel 100 according to an embodiment of the present technology. The area pixel 100 includes four photoelectric converters 110 (110a, 110b, 110c, 110d) corresponding to four pixels and an AD converter 190. Floating diffusions FD that are the output of the four photoelectric converters 110 are connected to a common input node of the AD converter 190. As a result, the number of signal transmitters 91 for four photoelectric converters 110 and AD converters 190 can be reduced.

The photoelectric converter 110 performs photoelectric conversion for each pixel to generate and hold an analog pixel signal corresponding to incident light. Further, the photoelectric converter 110 is controlled by the vertical driver 40 and holds the held analog pixel signal in the floating diffusion FD in the state of charge. This charge is supplied to the comparator 150 of the AD converter 190 through the signal transmitter 91. Details of the configuration of the photoelectric converter 110 and the like will be described later. The floating diffusions FD of the four photoelectric converters 110 are gathered in one place and the charge is transmitted and received to and from the AD converter 190, so that the number of signal transmitters 91 can be reduced.

The AD converter 190 AD-converts the analog pixel signals generated by the photoelectric converter 110 and the like. The AD converter 190 includes a comparator 150, a comparison output processor 160 and a conversion result holding unit 170.

The comparator 150 compares the reference signal generated by the reference signal generator 30 and the analog pixel signal output by the photoelectric converter 110 or the like. The comparison result is output to the comparison output processor 160 via the signal line 106. The comparator 150 compares one of a plurality of analog pixel signals output from the photoelectric converter 110 and the like with a reference signal. That is, the voltage of the analog pixel signal transmitted through one of the signal lines 102 to 105 is compared with the voltage of the reference signal. The comparison result is output as an electrical signal. For example, when the voltage of the analog pixel signal is lower than the voltage of the reference signal, a signal with a value of "1" can be output. When the voltage of the analog pixel signal is higher than the voltage of the reference signal, a signal with a value of "0" can be output. The details of the configuration of the comparator 150 will be described later.

The comparison output processor 160 processes the comparison result output by the comparator 150 and outputs the processed comparison result to the conversion result holding unit 170. The processed comparison result is output to the conversion result holding unit 170 via the signal line 107. As this processing, for example, level conversion and waveform shaping can be performed.

The conversion result holding unit 170 holds the time code output from the time code transfer unit 200 based on the processed comparison result output from the comparison output processor 160 as the AD conversion result. The conversion result holding unit 170 holds the time code output from the time code transfer unit 200 when the comparison result changes from "1" to "0", for example. The time code at this time is the time code generated by the time code generator 20 and transferred to the area pixels 100 by the time code transfer unit 200. After that, the conversion result holding unit 170 outputs the held time code to the time code transfer unit 200 under the control of the vertical driver 40. The time code transfer unit 200 transfers the output time code to the time code decoder 52 of the horizontal control unit 50.

As described above, a signal whose voltage changes from a high voltage to a low voltage in a ramp form is used as the reference signal, and the time code when the voltage of this reference signal transitions from a higher state to a lower state than the voltage of the analog pixel signal can be held in the conversion result holding unit 170. That is, the conversion result holding unit 170 holds the time code when the analog pixel signal and the reference signal are approximately equal. The held time code is converted by the time code decoder 52 into a digital signal representing the voltage of the reference signal at the corresponding time. In this way, AD conversion of the analog pixel signal generated by the photoelectric converter 110 can be performed.

Figure 4B:
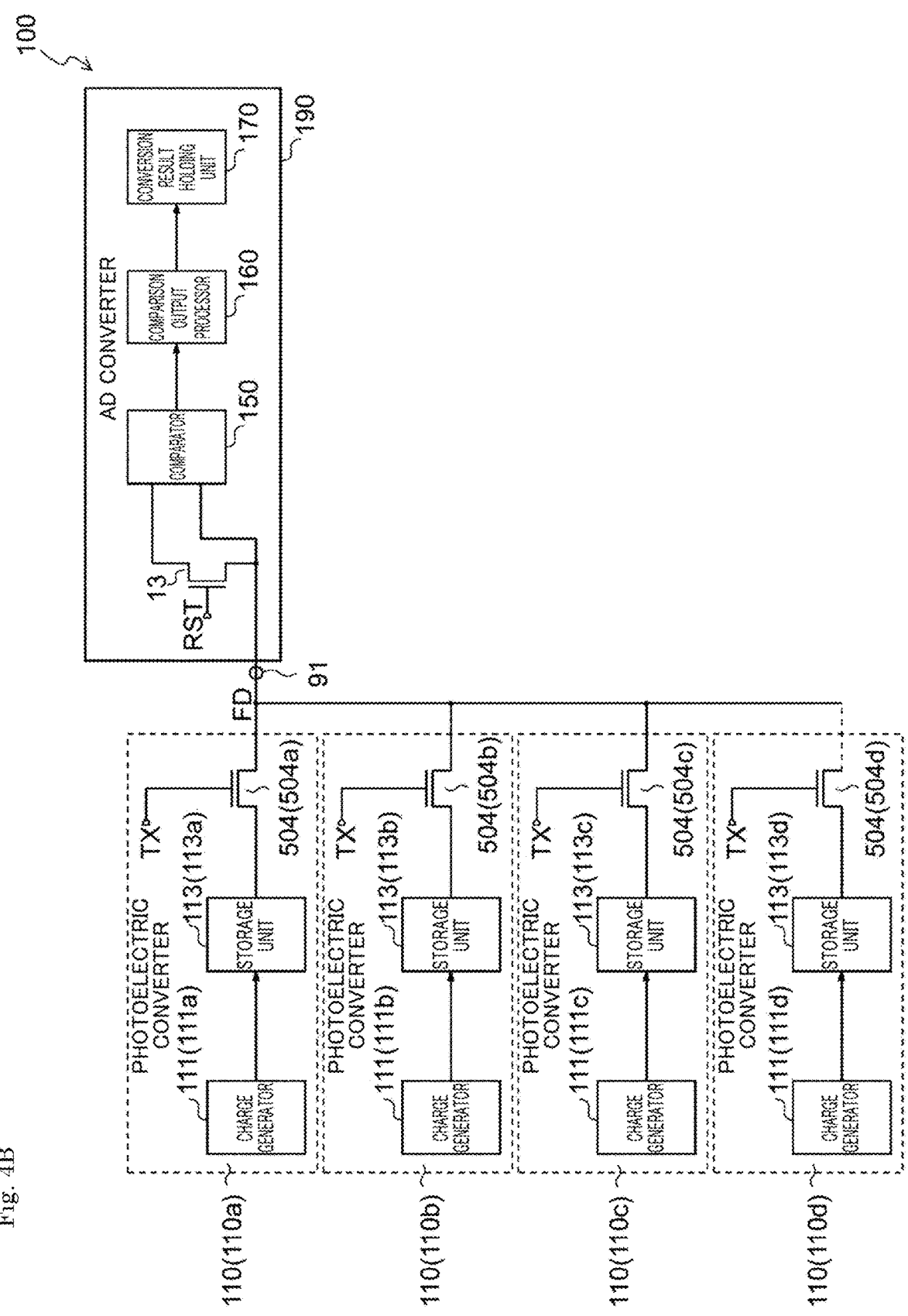
FIG. 4B is a block diagram illustrating a schematic configuration of an area pixel corresponding to a global shutter method.

The area pixel 100 in FIG. 4A corresponds to the rolling shutter method, but a configuration of the area pixel 100 corresponding to the global shutter method may be adopted in which the pixel signals of all the pixels are stored in the storage unit 113 and then sequentially transferred to the AD converter 190 for AD conversion. FIG. 4B is a block diagram illustrating a schematic configuration of the area pixel 100 corresponding to the global shutter method. The area pixel 100 in FIG. 4B differs from the area pixel 100 in FIG. 4A in the internal configuration of the photoelectric converter 110. The photoelectric converter 110 in FIG. 4B includes charge generators 111 (111a, 111b, 111c, 111d), storage units 113 (113a, 113b, 113c, 113d), and transfer transistors 504 (504a, 504b, 504c, 504d).

Pixel signals photoelectrically converted by the four photoelectric converters 110 in the area pixel 100 are stored in the storage unit 113 simultaneously for all pixels. After that, the transfer transistors 504 of the respective pixels are sequentially turned on, and the charge corresponding to the pixel signal stored in the storage unit 113 is input to the AD converter 190 via the floating diffusion FD and the signal transmitter 91. The internal configuration of the AD converter 190 is the same as in FIG. 4A.

[Configuration of Photoelectric Converter]

Figure 5A:
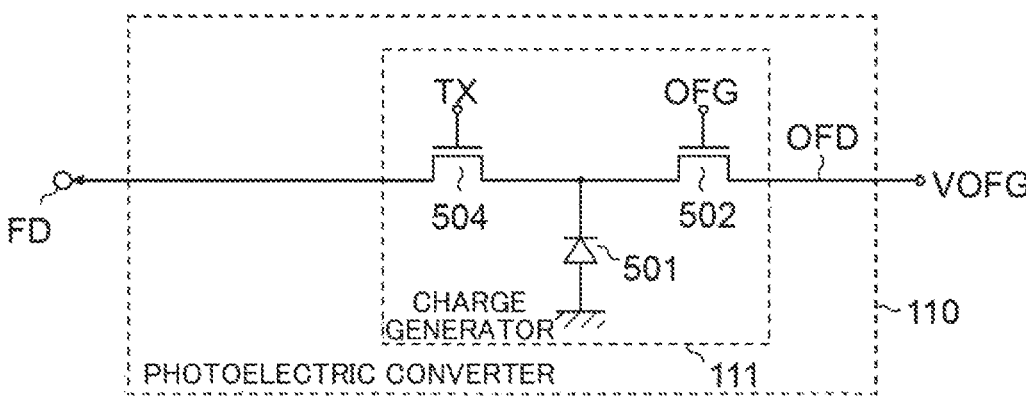
FIG. 5A is a diagram illustrating a configuration example of a photoelectric converter according to an embodiment of the present technology.

FIG. 5A is a diagram illustrating a configuration example of the photoelectric converter 110 according to an embodiment of the present technology. This photoelectric converter 110 has a charge generator 111. The charge generator 111 includes MOS transistors 502 and 504 and a photodiode 501. Here, N-channel MOS transistors can be used as the MOS transistors 502 and 504. A plurality of signal lines (OFD, OFG, TX) are connected to the photoelectric converter 110. An overflow drain signal line OFD (Overflow Drain) is a signal line that supplies a reset voltage VOFG for the photodiode 501. An overflow gate signal line OFG (Overflow Gate) is a signal line for transmitting a control signal to the MOS transistor 502. A transfer signal line TX is a signal line for transmitting a control signal to the MOS transistor 504. As illustrated in the figure, the overflow gate signal line OFG and the transfer signal line TX are connected to the gates of the MOS transistors 502 and 504, respectively. When a voltage equal to or higher than a threshold voltage between the gate and source (hereinafter referred to as an ON signal) is input through these signal lines, the corresponding MOS transistor becomes conductive.

The drain and gate of the MOS transistor 502 are connected to the overflow drain signal line OFD and the overflow gate signal line OFG, respectively. The source of the MOS transistor 502 is connected to the cathode of the photodiode 501 and the source of the MOS transistor 503. The anode of the photodiode 501 is grounded. The MOS transistor 504 has a gate connected to the transfer signal line TX and a drain connected to the cathode of the photodiode 501 and the floating diffusion FD.

The photodiode 501 generates a charge according to the amount of light irradiated and holds the generated charge. The MOS transistor 502 discharges the excessive charge generated in the photodiode 501. The MOS transistor 502 further discharges the charge stored in the photodiode 501 by conducting between the photodiode 501 and the overflow drain signal line OFD. That is, the photodiode 501 is further reset. The MOS transistor 504 transfers the charge generated by the photodiode 501 to the floating diffusion FD.

The configurations of the photoelectric converters 110b, 110c, and 110d are the same as the configuration of the photoelectric converter 110a, so description thereof will be omitted. The charges corresponding to the analog pixel signals generated by the photoelectric converters 110 (110a to 110d) are supplied to the floating diffusion FD common to four pixels.

Figure 5B:
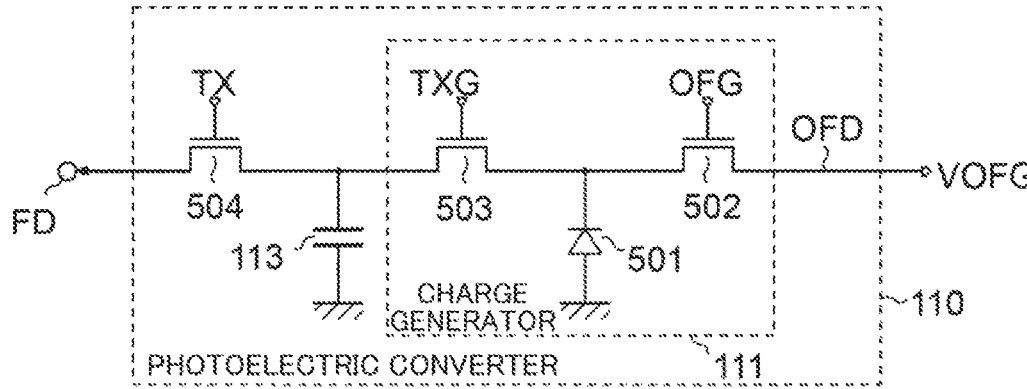
FIG. 5B is a circuit diagram of a photoelectric converter in the global shutter method.

FIG. 5B is a circuit diagram of the photoelectric converter 110 in the global shutter method. The photoelectric converter 110 in FIG. 5B has a transistor (first transfer transistor) 503 and a storage unit 113 in addition to the circuit configuration in FIG. 5A. The transistor 503 is provided inside the charge generator 111. A transistor (second transfer transistor) 504 is connected between the floating diffusion FD and the transistor 503. The pixel signals photoelectrically converted by the photodiodes 501 of the respective pixel are stored in the storage unit 113 through the transistor 503 simultaneously for all pixels. After that, the charges stored in the storage unit 113 are sequentially sent to the AD converter 190 via the transistor 504 and the floating diffusion FD for each pixel.

[Configuration of Comparator]

Figure 6:
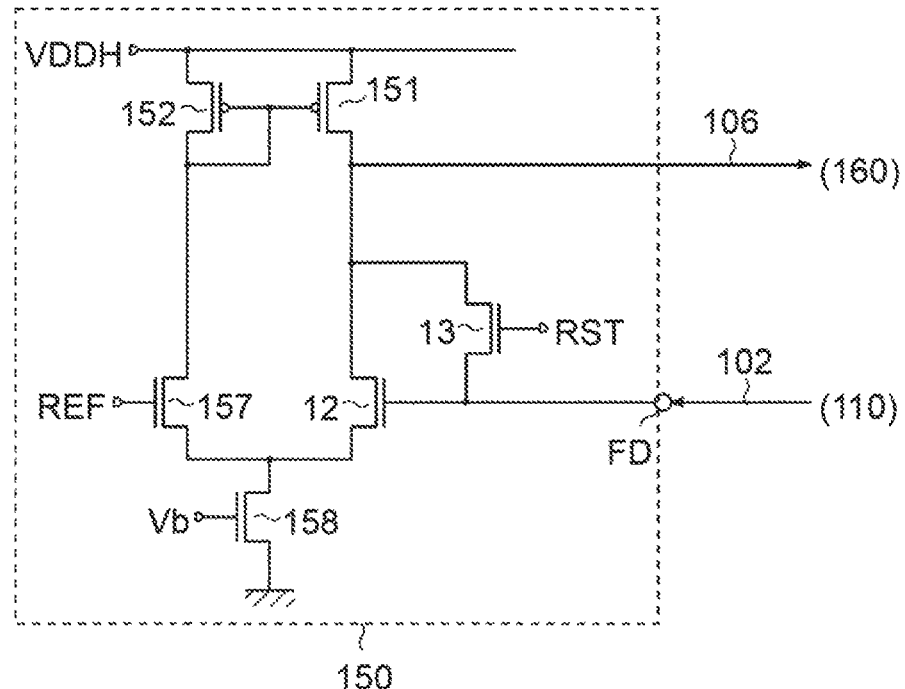
FIG. 6 is a diagram illustrating a configuration example of a comparator according to an embodiment of the present technology.

FIG. 6 is a diagram illustrating a configuration example of the comparator 150 according to an embodiment of the present technology. The comparator 150 includes a signal input transistor 12, a reference input transistor 157 and the MOS transistors 13, 151 and 152. Here, P-channel MOS transistors can be used as the MOS transistors 151 and 152. N-channel MOS transistors can be used as MOS transistors 12 and 157.

In addition to the afore-mentioned signal line 102 and the like, a plurality of signal lines (Vb, REF) and a power supply line VDDH are connected to the comparator 150. A bias signal line Vb (Bias) is a signal line that supplies a bias voltage to the MOS transistor 158. A reference signal line REF (Reference) is a signal line that transmits a reference signal to the reference input transistor 157. The power supply line VDDH is a power supply line that supplies power to the comparator 150.

The sources of the MOS transistors 151 and 152 are commonly connected to the power supply line VDDH. The gate of the MOS transistor 151 is connected to the gate and drain of the MOS transistor 152 and the drain of the reference input transistor 157. The drain of the MOS transistor 151 is connected to the drain of the signal input transistor 12 and the signal line 106. The source of the signal input transistor 12 and the source of the reference input transistor 157 are commonly connected to the drain of the MOS transistor 158. The MOS transistor 158 has a gate connected to the bias signal line Vb and a source grounded. The gate of the MOS transistor 12 is connected to the signal line 102. The MOS transistor 13 short-circuits the gate and drain of the MOS transistor 12 when the reset signal RST is at a high level. A gate of the reference input transistor 157 is connected to the reference signal line REF.

The signal input transistor 12 is a MOS transistor in which an input signal is input to a gate, which is a control terminal. An analog pixel signal is input as an input signal to the signal input transistor 12 in the figure.

The reference input transistor 157 is a MOS transistor in which a reference signal is input to a gate, which is a control terminal. This reference input transistor 157 forms a differential pair with the signal input transistor 12. This differential pair compares the input signal and the reference signal. Specifically, when the input signal is smaller than the reference signal, the current flowing through the reference input transistor 157 is larger than the current flowing through the signal input transistor 12. Conversely, when the input signal is greater than the reference signal, the current flowing through the reference input transistor 157 is smaller than the current flowing through the signal input transistor 12. Thus, a current corresponding to the difference between the input signal and the reference signal flows through the signal input transistor 12 and the reference input transistor 157 forming a differential pair.

When the current flowing through one of the signal input transistor 12 and the reference input transistor 157 changes according to the difference between the input signal and the reference signal, the MOS transistor 151 converts this current change into a voltage change. The MOS transistor 152 converts changes in current flowing through the reference input transistor 157 into changes in voltage. These MOS transistors 151 and 152 form a current mirror circuit. This current mirror circuit operates so that a current equal to the current flowing through the reference input transistor 157 flows through the signal input transistor 12. In this way, the input signal and the reference signal can be compared at a high speed.

The MOS transistor 158 controls the current flowing through the signal input transistor 12 and the reference input transistor 157 forming a differential pair. A predetermined bias voltage is supplied to the gate of the MOS transistor 158 through the bias signal line Vb. In this way, the MOS transistor 158 operates as a constant current power supply.

In this manner, the comparator 150 in the figure can compare the pixel signal input to the gate of the signal input transistor 12 and the reference signal input to the gate of the reference input transistor 157.

[Selection Method]

First, the voltage of the reference signal line REF is set to 0 V. In this way, the reference input transistor 157 becomes non-conductive. Then, the voltage at the drain of the signal input transistor 12 becomes near 0 V due to the action of a differential amplifier circuit composed of the signal input transistor 12, the reference input transistor 157 and the MOS transistor 158. Next, the reset signal RST is set to a high level to turn on the MOS transistor 13. As a result, a feedback circuit is formed, and the drain of the signal input transistor 12 has a voltage of approximately 0 V. Then, the floating diffusion FD of the photoelectric converter connected to the signal line 102 is discharged, and the voltage of the signal line 102 becomes 0 V.

A current mirror circuit composed of the MOS transistors 151 and 152 can further enhance the effect of setting the drain of the signal input transistor 12 to 0 V. That is, when the voltage of the reference signal line REF is set to 0 V, the current flowing through the MOS transistor 152 becomes approximately 0 A. Since the MOS transistor 151 forms a current mirror circuit together with the MOS transistor 152, the current flowing through the MOS transistor 151 is also approximately 0 A. Therefore, the drain voltage of the signal input transistor 12 can be more accurately set to 0 V.

The MOS transistor 13 further has a function of resetting the floating diffusion FD. This reset can be done as follows. First, a voltage corresponding to the reset voltage of the floating diffusion FD is applied to the reference signal line REF. In this way, the reference input transistor 157 becomes conductive. Due to the action of the differential amplifier circuit and the current mirror circuit described above, the drain voltage of the MOS transistor 13 also becomes a value substantially equal to the reset voltage. Next, the reset signal RST is set to a high level to make the MOS transistor 13 conductive. As a result, a reset voltage is applied to the floating diffusion FD of the photoelectric converter, and resetting can be performed.

Thus, in one embodiment of the present technology, the MOS transistor 13 resets the floating diffusion FD. In this way, the configuration of the AD converter 190 can be simplified. By using the current mirror circuit, the gain in the differential amplifier circuit can be improved, and the floating diffusion FD can be reset more accurately.

Note that the configuration of the comparator 150 is not limited to this example. For example, instead of the MOS transistors 151 and 152 forming the current mirror circuit, a resistive load or a constant current power supply can be used. In this case, a resistive load or the like can be connected to either one or both of the signal input transistor 12 and the reference input transistor 157 of the differential pair.

[Configuration of Comparison Output Processor]

Figure 7:
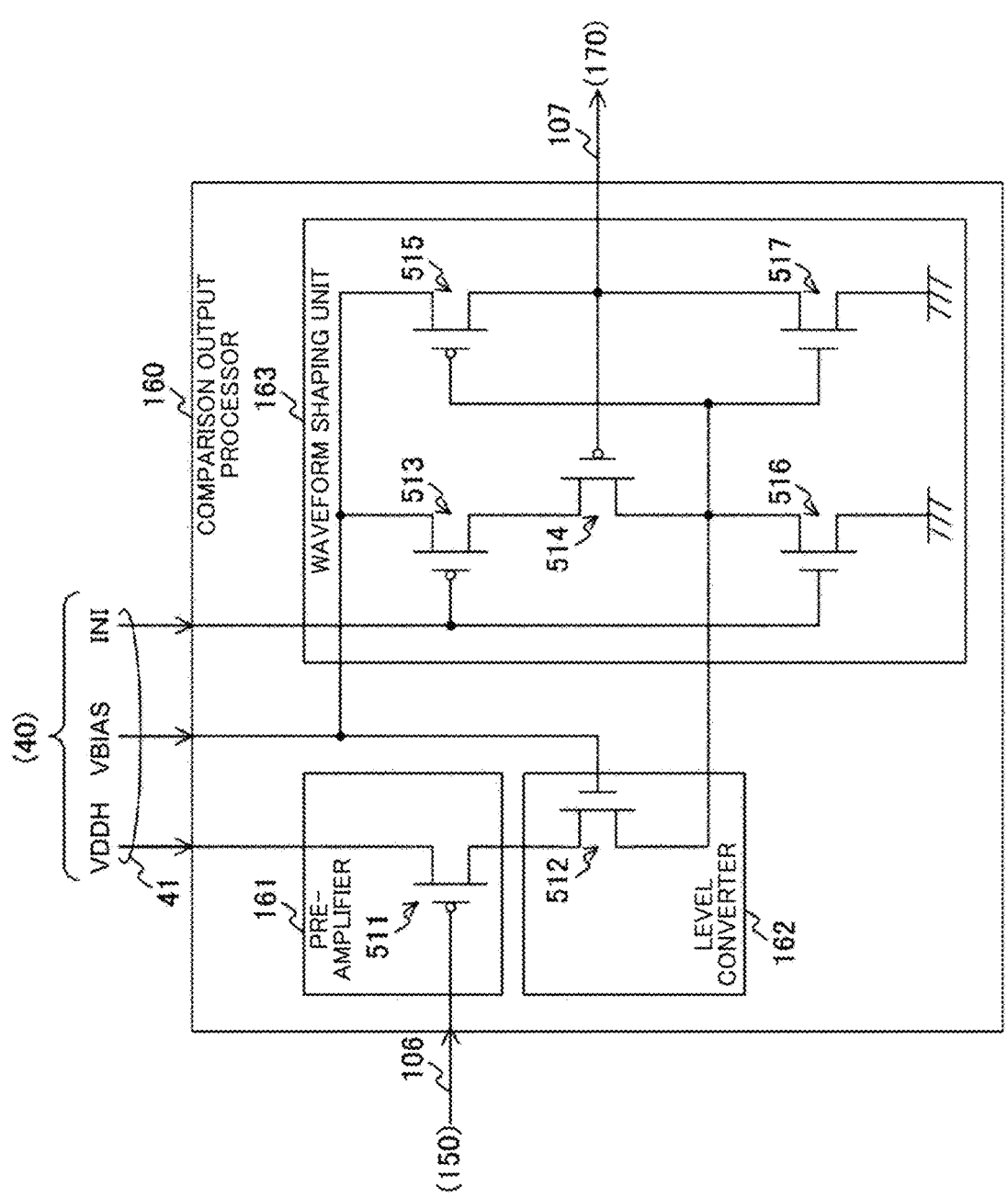
FIG. 7 is a diagram illustrating a configuration example of a comparison output processor according to an embodiment of the present technology.

FIG. 7 is a diagram illustrating a configuration example of the comparison output processor 160 according to an embodiment of the present technology. The comparison output processor 160 has MOS transistors 511 to 517. Here, the MOS transistors 511, 513 and 515 can be configured of P-channel MOS transistors. Further, the MOS transistors 512, 514, 516 and 517 can be configured of N-channel MOS transistors. Note that the MOS transistor 511 forms a pre-amplifier 161. The MOS transistor 512 forms a level converter 162. The MOS transistors 513 to 517 form a waveform shaping unit 163. In addition to the signal lines 106 and 107 described above, an initialization signal line INI (Initialize) and power supply lines (VDDH and VBIAS) are connected to the comparison output processor 160. The initialization signal line INI is a signal line for transmitting a control signal to the MOS transistors 513 and 516. The power supply lines VDDH and VBIAS are power supply lines for supplying power to the comparison output processor 160.

The source and gate of the MOS transistor 511 are connected to the power supply line VDDH and the signal line 106, respectively. The drain of the MOS transistor 511 is connected to the drain of the MOS transistor 512. The MOS transistor 512 has a gate connected to the power supply line VBIAS and a source connected to the drains of the MOS transistors 514 and 516 and the gates of the MOS transistors 515 and 517. The gates of the MOS transistors 513 and 516 are commonly connected to the initialization signal line INI. The source and drain of the MOS transistor 513 are connected to the power supply line VBIAS and the source of the MOS transistor 514, respectively. The source of the MOS transistor 516 is grounded. The gate of the MOS transistor 514 is connected to the drains of the MOS transistors 515 and 517 and the signal line 107. The source of the MOS transistor 515 is connected to the power supply line VBIAS, and the source of the MOS transistor 517 is grounded.

The pre-amplifier 161 amplifies the signal corresponding to the comparison result output from the comparator 150. The pre-amplifier 161 outputs the amplified signal to the level converter 162. This amplification is performed by the MOS transistor 511.

The level converter 162 converts the level of the signal output from the pre-amplifier 161. The power supply line VDDH is connected to the comparator 150 and the pre-amplifier 161 described with reference to FIG. 6. In order to obtain a high gain in the comparator 150 and the pre-amplifier 161, the power supplied by the power supply line VDDH needs to have a relatively high voltage. On the other hand, since the conversion result holding unit 170 and the like in the subsequent stage handle digital signals, they can be supplied with relatively low-voltage power. This relatively low power is supplied by the power supply line VBIAS. In this way, it is possible to reduce power consumption in the conversion result holding unit 170 and the like and to use a low-withstand-voltage transistor for the conversion result holding unit 170 and the like. In this way, the level converter 162 is arranged in order to transmit signals between circuits to which power supplies of different voltages are supplied. As a result, the level-converted signal is output to the waveform shaping unit 163. The level converter 162 in the figure can limit the signal level to a voltage obtained by subtracting the threshold voltage of the MOS transistor 512 from the power supply voltage supplied by the power supply line VBIAS.

The waveform shaping unit 163 shapes the signal output from the level converter 162 into a sharply changing signal. The operation of this waveform shaping unit 163 will be described. In the initial state, the output of the level converter 162 has a value "0". In this state, a signal of value "1" is input from the initialization signal line INI, and the MOS transistor 516 becomes conductive. As a result, the MOS transistor 517 becomes non-conductive, the MOS transistor 515 becomes conductive, and a value "1" is output to the signal line 107. At this time, the MOS transistors 513 and 514 become non-conductive. After that, a signal of value "O" is input to the initialization signal line INI. As a result, the MOS transistor 513 becomes conductive and the MOS transistor 516 becomes non-conductive. Since the MOS transistor 514 is non-conductive and the output signal of the level converter 162 is "0", the states of the MOS transistors 515 and 517 do not change.

Next, when the output signal of the level converter 162 changes from "0" to "1", the MOS transistor 517 transitions to the conductive state and the MOS transistor 515 transitions to the non-conductive state. As a result, the voltage of the signal line 107 drops. As a result, the MOS transistor 514 transitions to the conductive state, and the gate voltages of the MOS transistors 515 and 517 further rise. Due to such a positive feedback action, the voltage of the signal line 107 drops rapidly. In this way, waveform shaping can be performed.

[Configuration of Conversion Result Holding Unit]

Figure 8:
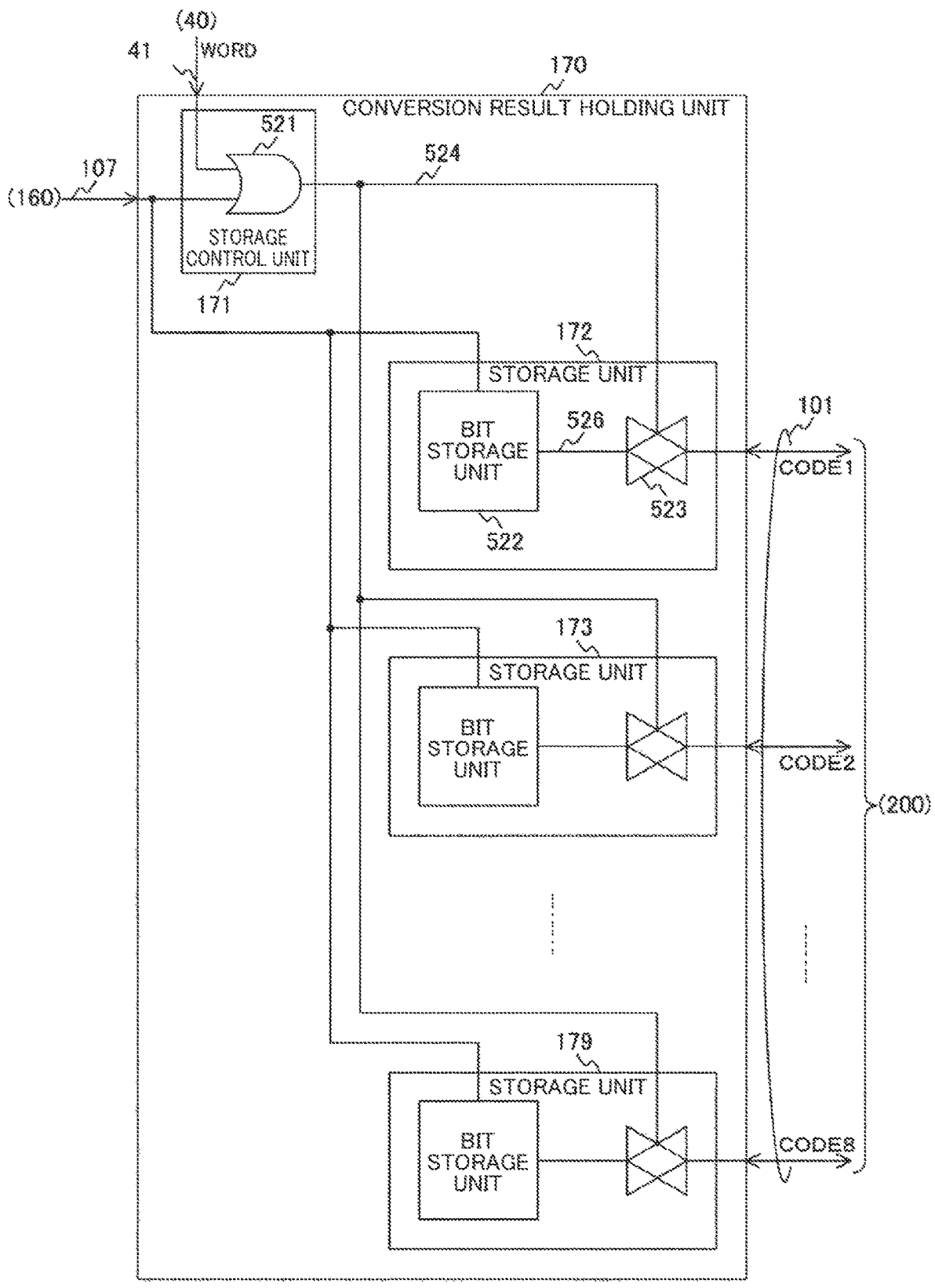
FIG. 8 is a diagram illustrating a configuration example of a conversion result holding unit according to an embodiment of the present technology.

FIG. 8 is a diagram illustrating a configuration example of the conversion result holding unit 170 according to an embodiment of the present technology. The conversion result holding unit 170 includes a storage control unit 171 and storage units 172 to 179. Here, for the sake of convenience, 8-bit data is assumed as a digital pixel signal after AD conversion. Therefore, the size of the time code is also 8 bits. The size of the converted digital pixel signal and time code can be changed according to the requirements of the system. For example, the size can be 15 bits.

In addition to the signal line 107, a plurality of signal lines (WORD, CODE1 to CODE8) are connected to the conversion result holding unit 170. A word signal line WORD (Word) is a signal line for transmitting control signals for the storage units 172 to 179. Code signal lines CODE (Code) 1 to CODE8 are signal lines for bi-directionally transmitting time codes. The plurality of code signal lines CODE1 to CODE8 form the signal line 101.

The storage units 172 to 179 store the time codes input from the time code transfer unit 200. The storage units 172 to 179 each store a 1-bit time code. The configuration of the storage units 172 to 179 will be described by taking the storage unit 172 as an example. This storage unit 172 includes a bit storage unit 522 and a bidirectional switch 523.

The bidirectional switch 523 is connected between the signal line 526 and the code signal line CODE1 to bidirectionally transmit data. The bidirectional switch 523 also has a control input terminal. A signal line 524 is connected to this control input terminal. When a value of "1" is input to the control input terminal through the signal line 524, the bidirectional switch 523 becomes conductive, and data is transmitted bidirectionally between the signal line 526 and the code signal line CODE1. On the other hand, when the value "0" is input to the control input terminal, the bidirectional switch 523 becomes non-conductive.

The bit storage unit 522 is a storage device that stores 1-bit data. The bit storage unit 522 has an input/output terminal and a control input terminal to which signal lines 526 and 107 are connected respectively. When a signal having a value of "1" is input to the control input terminal via the signal line 107, the bit storage unit 522 stores the 1-bit time code which is the signal transmitted from the bidirectional switch 523 via the signal line 526. At that time, when the 1-bit time code changes, the data stored in the bit storage unit 522 is rewritten. After that, when the signal input to the control input terminal changes from "1" to "0", the data stored in the bit storage unit 522 is held as it is. That is, the rewriting of the above data is not performed until the next signal input to the control input terminal becomes "1". The bit storage unit 522 outputs the held data to the signal line 526 when the signal input to the control input terminal is "0".

The storage control unit 171 outputs control signals via the signal line 524 to control the storage units 172 to 179. The storage control unit 171 can generate and output a signal obtained by ORing two signals input from the word signal line WORD and the signal line 107 as a control signal for the bidirectional switch 523. This can be done by an OR gate 521.

[Configuration of Time Code Transfer Unit]

Figure 9:
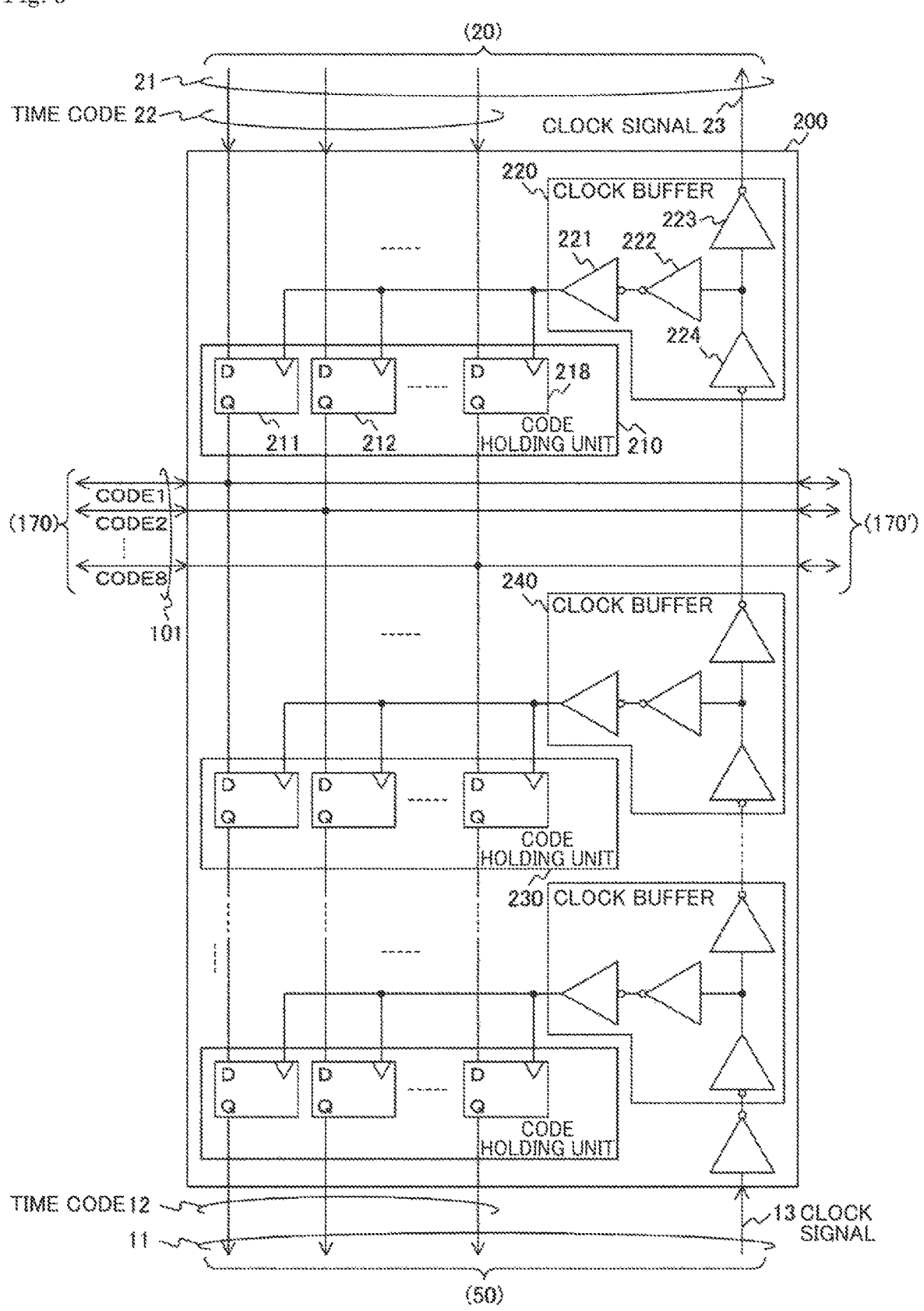
FIG. 9 is a diagram illustrating a configuration example of a time code transfer unit according to an embodiment of the present technology.

FIG. 9 is a diagram illustrating a configuration example of the time code transfer unit 200 in one embodiment of the present technology. The time code transfer unit 200 includes code holding units 210 and 230 and clock buffers 220 and 240. The time code transfer unit 200 has the same number of code holding units and clock buffers as the number of rows of the area pixels 100 arranged in the pixel array unit 10 described with reference to FIG. 1. For convenience, the code holding units 210 and 230 and the clock buffers 220 and 240 will be described as an example.

The code holding unit 210 holds time codes. This code holding unit 210 is configured of flip-flops 211 to 218. The flip-flop 211 and the like hold one bit of the time code based on the clock signal output from the clock buffer 220. Specifically, when the clock signal is "0", the time code output from the time code generator 20 and input to the D-input terminal in the figure is held in the internal node, and the Q-output terminal is put into a high impedance state. Next, when the clock signal becomes "1", the time code held in the internal node is output from the Q-output terminal. This output time code is input to the code holding unit 230 via the signal line 101. In this manner, the time code transfer unit 200 transfers the time code by causing the plurality of time code holding units to operate as shift registers.

The clock buffer 220 outputs the clock signal generated by the clock signal generator 54 described in FIG. 3 to the code holding unit 210 and outputs the same to the next-stage clock buffer. The clock buffer 220 is configured of a plurality of inverting gates 221 to 224 and operates as a repeater that shapes a degraded clock signal. The clock buffer 220 sequentially transfers the clock signal in the direction opposite to the time code in the time code transfer unit 200. That is, the clock buffer 240 outputs a clock signal to the code holding unit 230 and also outputs a clock signal to the clock buffer 220. As a result, the clock signal input to the code holding unit 210 has a time delay corresponding to the propagation delay time for two inverting gates and the delay due to the wiring up to the inverting gate 224 as compared to the clock signal input to the code holding unit 230. Thus, the clock buffer 220 further has the function of delaying the clock signal.

As described above, the flip-flop 211 and the like hold the input time code in the internal node when the clock signal is "0". At the time of this holding, it is necessary to secure a predetermined time, a so-called setup time. Due to the clock signal delay caused by the clock buffer 220, when the clock signal transitions to the value "0" in the code holding unit 230, the clock signal input to the code holding unit 210 remains at the value "1". That is, it remains in a state in which the time code held in the internal node is output. As a result, the setup time can be secured in the code holding unit 230, and the time code can be transferred.

The code signal lines CODE1 to CODE8 are connected to the output of the code holding unit 210 and the input of the code holding unit 230, respectively. As a result, the time code generated by the time code generator 20 and held in the code holding unit 210 is output to the conversion result holding unit 170 via these code signal lines CODE1 to CODE8. The time code held in the conversion result holding unit 170 after AD conversion is output to the code holding unit 230 via these code signal lines CODE1 to CODE8. Thus, the time code transfer unit 200 transfers the time code.

Next, the internal configuration of the area pixel 100 will be described. Since there are various candidates for the internal configuration of the area pixel 100, representative internal configurations will be described in order below.

(Imaging Timing of Imaging Device)

Figure 10:
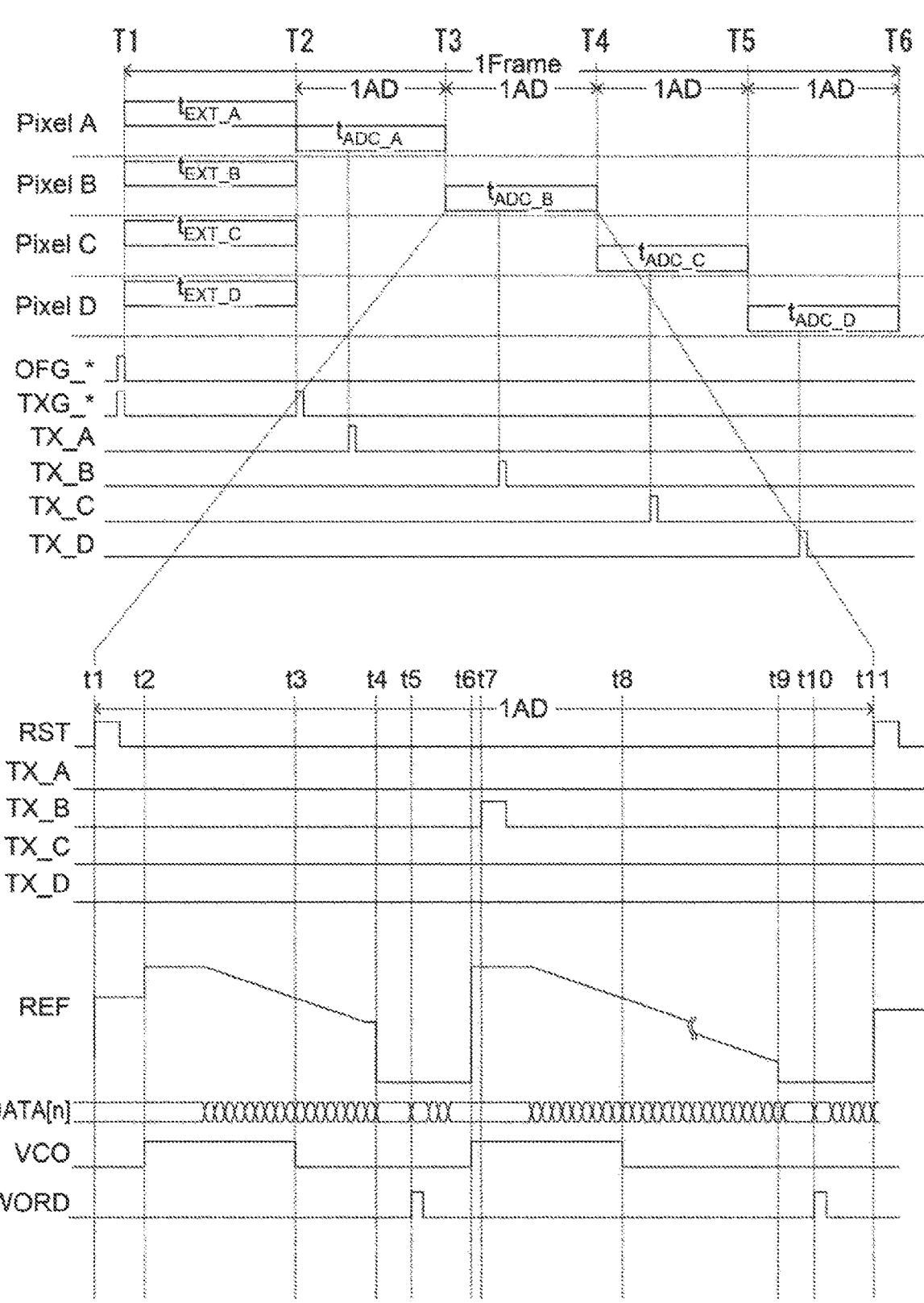
FIG. 10 is a timing chart of one frame period of the imaging device according to the present disclosure.

FIG. 10 is a timing chart of one frame period of the imaging device according to the present disclosure. FIG. 10 shows a timing chart of the imaging device 1 of the global shutter method (the imaging device 1 including the area pixels 100 in FIG. 4B and the photoelectric converter 110 in FIG. 5B). The upper half of FIG. 10 shows the timing of one frame period (time T1 to T6) after the start of exposure at time T1. The lower half of FIG. 10 is a timing chart illustrating in detail the operation from time T3 to T4.

Time T1 to T2 is an exposure period. Immediately before time T1, the OFG signal becomes high level, the transistor 502 is turned on, and the charge in the photodiode 501 is discharged through the overflow drain signal line OFD. During the exposure period T1 to T2, the photodiode 501 continuously performs photoelectric conversion and stores charge. At time T2, the transfer signal TXG becomes high level, the transistor 503 is turned on, and the charge photoelectrically converted by the photodiode 501 is held in the storage unit 113. The charge holding operation to the storage unit 113 is performed simultaneously for all pixels.

After that, four pixels in the area pixel are read out sequentially. In FIG. 10, pixel A in the area pixel is read out at time T2 to T3, pixel B in the area pixel is read out at time T3 to T4, pixel C in the area pixel is read out at time T4 to T5, and pixel D in the area pixel is read out at time T5 to T6. Signals TX_A, TX_B, TX_C, and TX_D are gate signals for the transistors 504 of pixels A, B, C, and D within the area pixel, respectively. When this gate signal becomes high level, the transistor 504 is turned on, and the charge corresponding to the pixel signal stored in the storage unit 113 is transferred to the floating diffusion FD.

The readout operation of the pixel B will be described in detail below. The signal RST in the timing chart in the lower half of FIG. 10 is the reset signal RST input to the gate of the transistor 13 in pixel B.

When the reset signal RST becomes high level at time t1, the transistor 13 in the AD converter 190 becomes conductive and the voltage of the floating diffusion FD is reset. A period from time t1 to t6 is a period for comparing the P-phase signal with the reference signal and converting the P-phase signal into a digital signal.

A reference signal REF composed of a ramp wave whose signal level linearly changes is input to the gate of the transistor 157 between times t2 and t4. When the signal level of the P-phase signal exceeds the signal level of the reference signal REF, the drain voltage of the differential pair of transistors 12 decreases, the drain voltage of the transistor 511 increases, and the output signal VCO of the AD converter 190 becomes low level (time t3).

Time t7 to t11 is a period for comparing the D-phase signal with the reference signal and converting the D-phase signal into a digital signal. At time t7, when the transfer signal TX_B becomes high level, the transistor 504 is turned on, and the charges held in the storage unit 113 are transferred to the floating diffusion FD. The charge of the floating diffusion FD is supplied to the gate of the transistor 12 in the AD converter 190 as a D-phase signal through the signal transmitter 91.

During this period, the reference signal REF, which is a ramp wave whose signal level changes linearly, is input to the gate of the transistor 157. When the signal level of the D-phase signal exceeds the signal level of the reference signal REF, the drain voltage of the differential pair of transistors 12 decreases, the drain voltage of the transistor 151 increases, and the output signal VCO of the AD converter 190 becomes low level (time t8).

In this manner, the AD converter 190 compares the P-phase signal or the D-phase signal stored in the storage unit 113 with the reference signal, and outputs the signal VCO indicating the timing at which the P-phase or D-phase signal matches the reference signal. The signal VCO is input to the conversion result holding unit 170 illustrated in FIG. 8 to generate a time code.

(First Example of Area Pixel 100)

Figure 11:
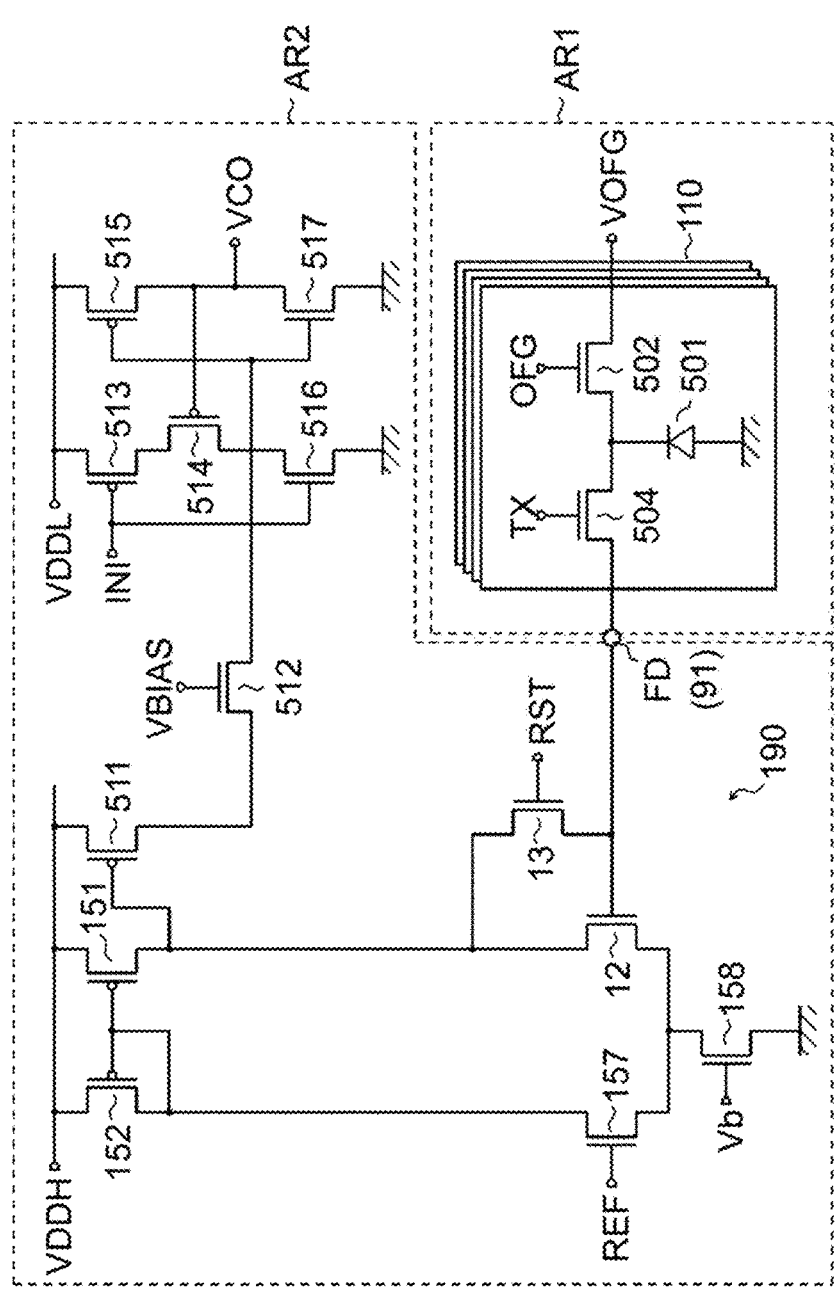
FIG. 11 is a circuit diagram of an area pixel according to the first example.
Figure 12:
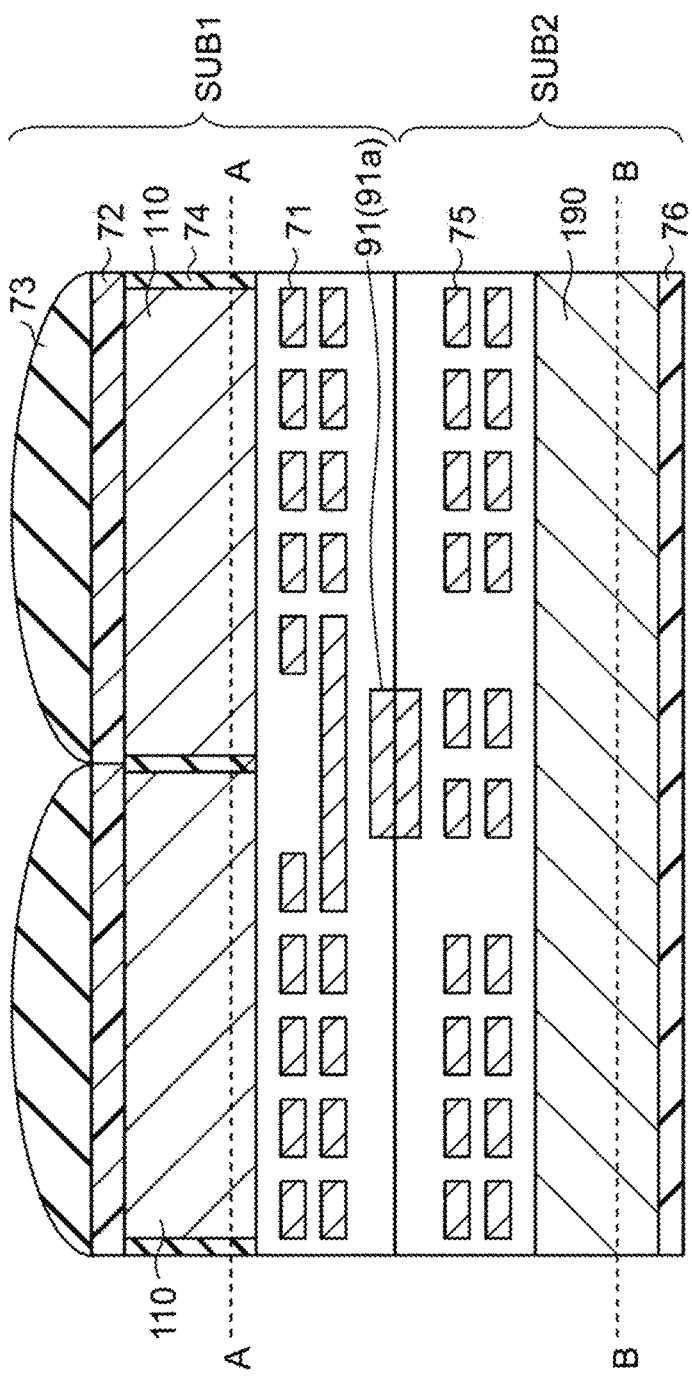
FIG. 12 is a cross-sectional view of an area pixel according to the first example.
Figure 13A:
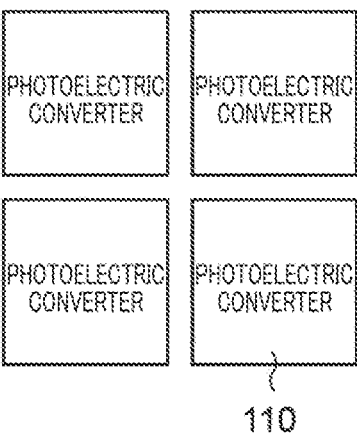
FIG. 13A is a plan view taken along line A-A in FIG. 12.
Figure 13B:
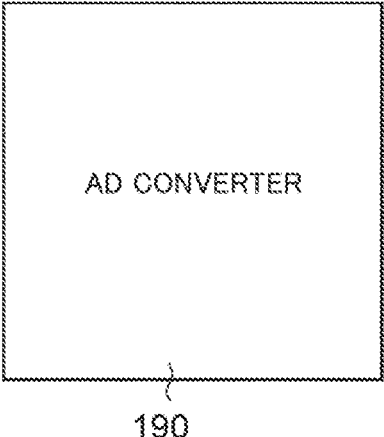
FIG. 13B is a plan view taken along line B-B in FIG. 12.

FIG. 11 is a circuit diagram of the area pixel 100 according to the first example, FIG. 12 is a cross-sectional view of the area pixel 100 according to the first example, FIG. 13A is a plan view taken along line A-A in FIG. 12, and FIG. 13B is a plan view taken along line B-B in FIG. 12. FIGS. 11, 12, 13A and 13B show an example where the area pixel 100 has four pixels.

The area pixel 100 according to the first example has four pixels, and each pixel does not have a storage unit. Therefore, the imaging device 1 having the area pixels 100 according to the first example performs imaging according to the rolling shutter method. As illustrated in FIG. 11, the photoelectric converter 110 has transistors 502 and 504 and a photodiode 501.

The imaging device 1 having the area pixels 100 according to the first example includes a first area AR1 and a second area AR2, as illustrated in FIG. 11. A photoelectric converter 110 made of silicon is arranged in the first area AR1. Four photoelectric converters 110 corresponding to four pixels are provided in the area pixel 100, and all of them are arranged in the first area AR1. An AD converter 190 made of silicon is arranged in the second area AR2.

The imaging device 1 having the area pixels 100 according to the first example stacks the first area AR1 and the second area AR2 so that the number of signal lines through which signals are transmitted and received between the first area AR1 and the second area AR2 is reduced as much as possible.

In the area pixel 100 according to the first example, the charges of the floating diffusions FD of all the photoelectric converters 110 in the area pixel 100 are supplied to the AD converters 190 via the same signal transmitter 91. Therefore, only one differential pair of transistors 12 is required to receive this charge. The gate of this transistor 12 is connected to a transistor 13 for setting the gate voltage to the reset voltage. The transistor 13 short-circuits the drain of the transistor 12 to the gate when the reset signal RST is at high level. The drain of the transistor 12 is connected to the power supply voltage VDDH through the transistor 151, and the gate voltage of the transistor 12 is set to a predetermined reset voltage when the reset signal RST is at high level.

A wiring layer 71, a photoelectric converter 110, a color filter 72, and an on-chip lens 73 are stacked on a first substrate SUB1. An element isolation layer 74 is arranged between the pixels. A wiring layer 75, an AD converter 190, and a protective layer 76 are stacked on a second substrate SUB2. The layer structure of the first substrate SUB1 and the second substrate SUB2 illustrated in FIG. 12 is an example, and various modifications are conceivable.

As illustrated in FIG. 12, the first area AR1 is arranged on the first substrate SUB1. The second area AR2 is arranged on the second substrate SUB2. The first area AR1 and the second area AR2 transmit and receive the charge of the floating diffusion FD of the photoelectric converter 110 through the signal transmitter 91 composed of, for example, a Cu—Cu connection 91*a*. The four photoelectric converters 110 in the area pixel 100 transmit and receive the charge of the floating diffusion FD of each photoelectric converter 110 via the same signal transmitter 91. The first area AR1 has the area of the entire substrate surface of the first substrate SUB1, and the second area AR2 has the area of the entire substrate surface of the second substrate SUB2. The first area AR1 and the second area AR2 have the same area.

As illustrated in FIGS. 13A and 13B, the photoelectric converters 110 are arranged over the entire first area AR1, and the AD converters 190 are arranged over the entire second area AR2. As described above, the first area AR1 and the second area AR2 transmit and receive the charge of the floating diffusion FD of each photoelectric converter 110 in the area pixel 100 through the signal transmitter 91 extending in the stacking direction. Thus, the number of signal transmitters 91 can be reduced. As a result, the arrangement area of the photoelectric converter 110 and the AD converter 190 can be increased, the aperture ratio of the photoelectric converter 110 can be increased, the area pixel 100 can be made finer, and the number of pixels of the imaging device 1 can be increased.

(Second Example of Area Pixel 100)

Figure 14:
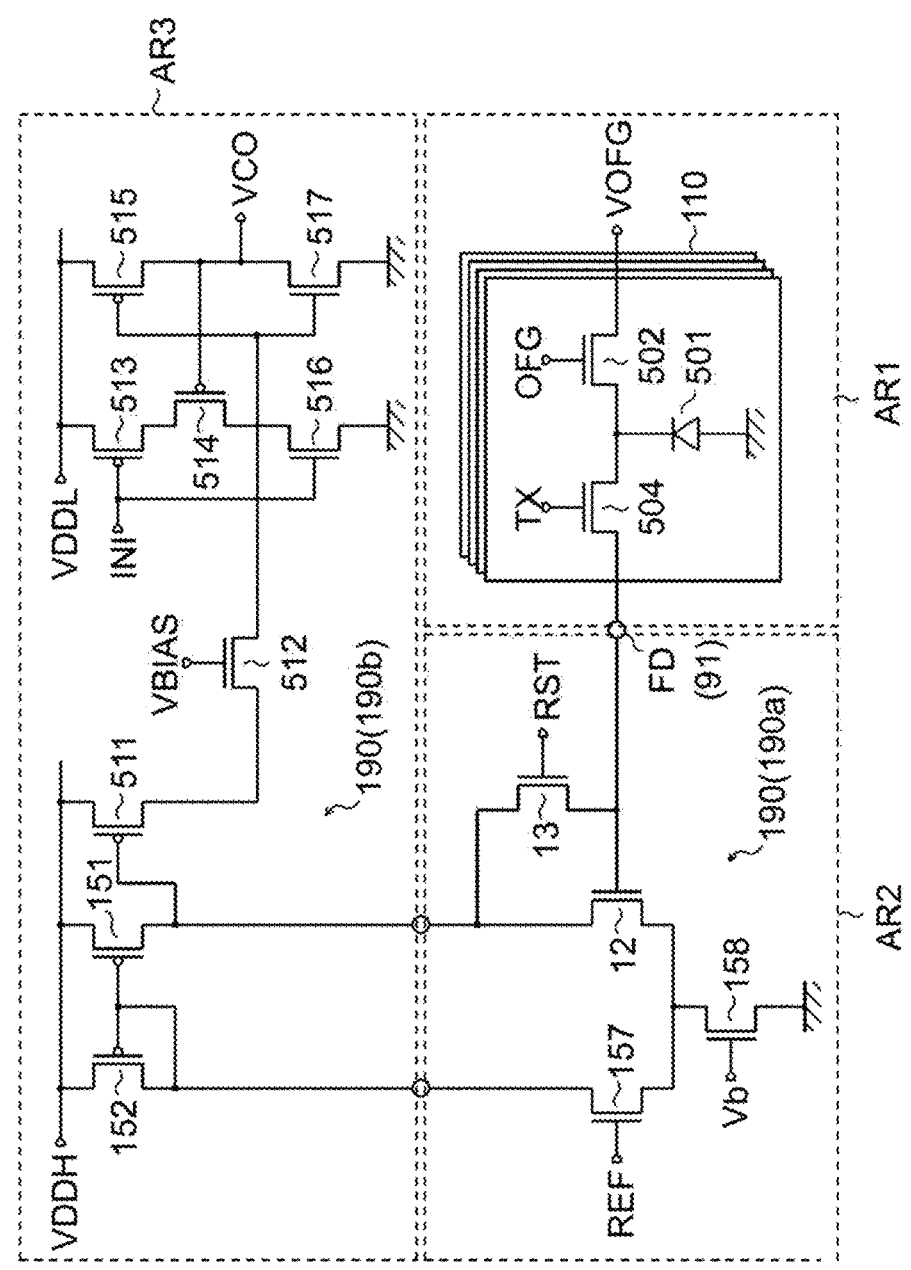
FIG. 14 is a circuit diagram of an area pixel according to the second example.
Figure 15:
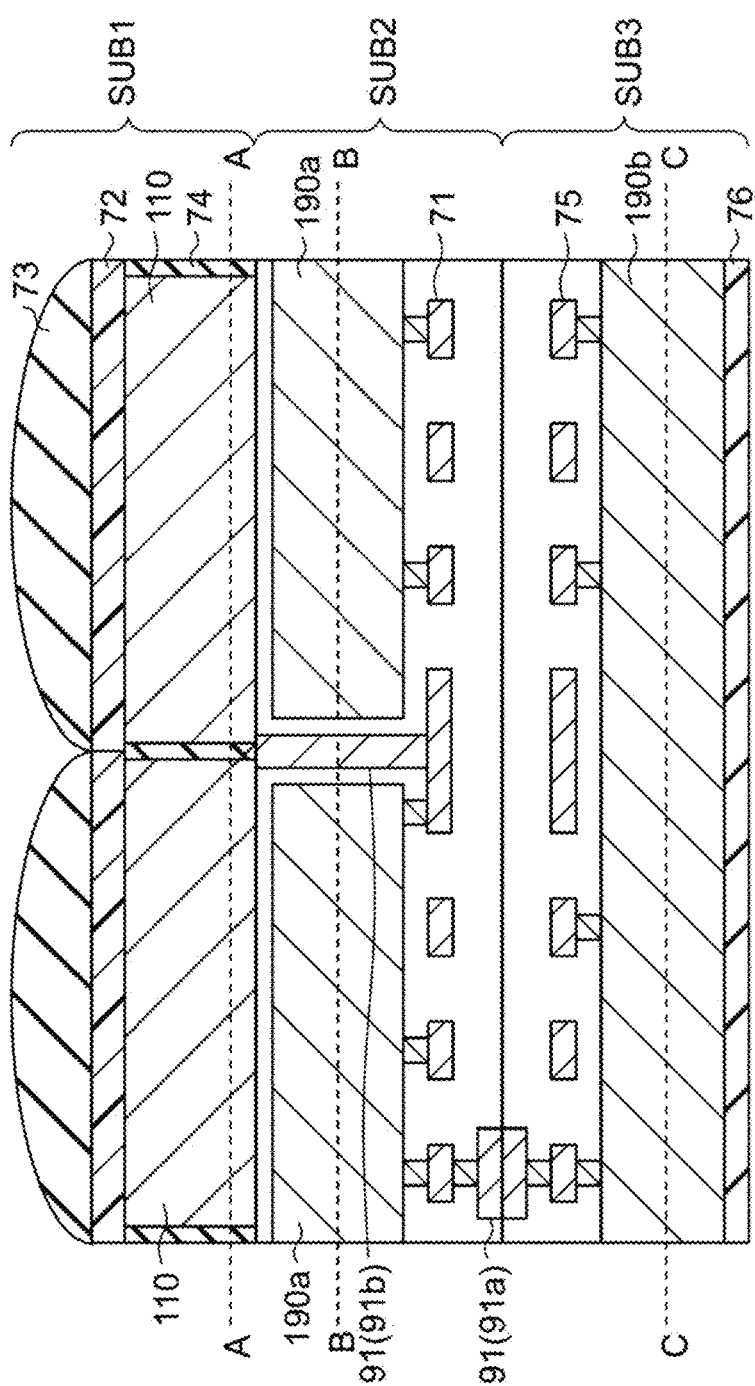
FIG. 15 is a cross-sectional view of an area pixel according to the second example.
Figure 16A:
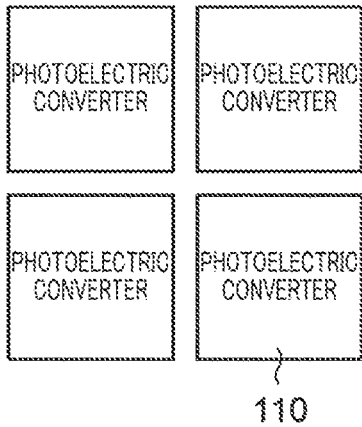
FIG. 16A is a plan view taken along line A-A in FIG. 15.
Figure 16B:
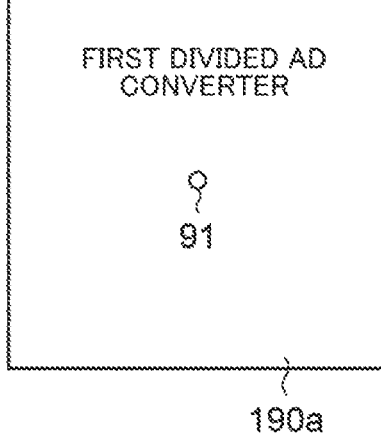
FIG. 16B is a plan view taken along line B-B in FIG. 15.
Figure 16C:
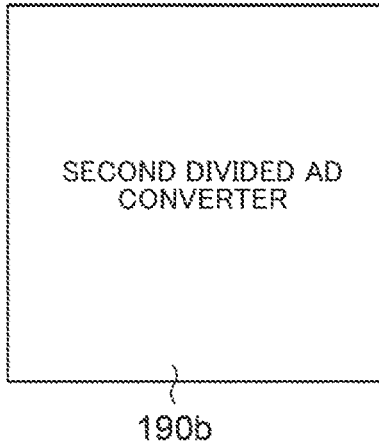
FIG. 16C is a plan view taken along line C-C of FIG. 15.

FIG. 14 is a circuit diagram of the area pixel 100 according to the second example, FIG. 15 is a cross-sectional view of the area pixel 100 according to the second example, FIG. 16A is a plan view taken along line A-A in FIG. 15, FIG. 16B is a plan view taken along line B-B of FIG. 15, and FIG. 16C is a plan view taken along line C-C of FIG. 15. The following description focuses on the differences from the area pixel 100 according to the first example.

The imaging device 1 having the area pixels 100 according to the second example includes a first area AR1, a second area AR2 and a third area AR3. The area pixel 100 according to the second example differs from the first example in that the AD converter 190 is divided and arranged in the second area AR2 and the third area AR3.

A photoelectric converter 110 is arranged in the first area AR1. The AD converter 190 is divided and arranged in the second area AR2 and the third area AR3. Hereinafter, a part of the AD converter 190 arranged in the second area AR2 is referred to as a first divided AD converter 190*a*, and a part of the AD converter 190 arranged in the third area AR3 is referred to as a second divided AD converter 190b.

The first divided AD converter 190a has transistors 12, 13, 157 and 158 in the AD converter 190. The second divided AD converter 190b has the rest of the AD converter 190, specifically transistors 151, 152, and 511 to 517. The first divided AD converter 190a and the second divided AD converter 190b transmit and receive both drain signals of the transistors 12 and 157, which form a differential pair.

The first area AR1 and the second area AR2 sequentially transmit and receive the charges of the four floating diffusions FD in the four pixels using the same signal transmitter 91 composed of vias 91b. The second area AR2 and the third area AR3 transmit and receive drain signals of the differential pair in the AD converter 190 using the signal transmitter 91 composed of Cu—Cu connections 91a. The first area AR1 is arranged on the first substrate SUB1, the second area AR2 is arranged on the second substrate SUB2, and the third area AR3 is arranged on the third substrate SUB3.

As illustrated in FIGS. 16B and 16C, since the AD converter 190 is divided and arranged in the second area AR2 and the third area AR3, a sufficient area for arranging the AD converters 190 can be secured.

(Third Example of Area Pixel 100)

Figure 17:
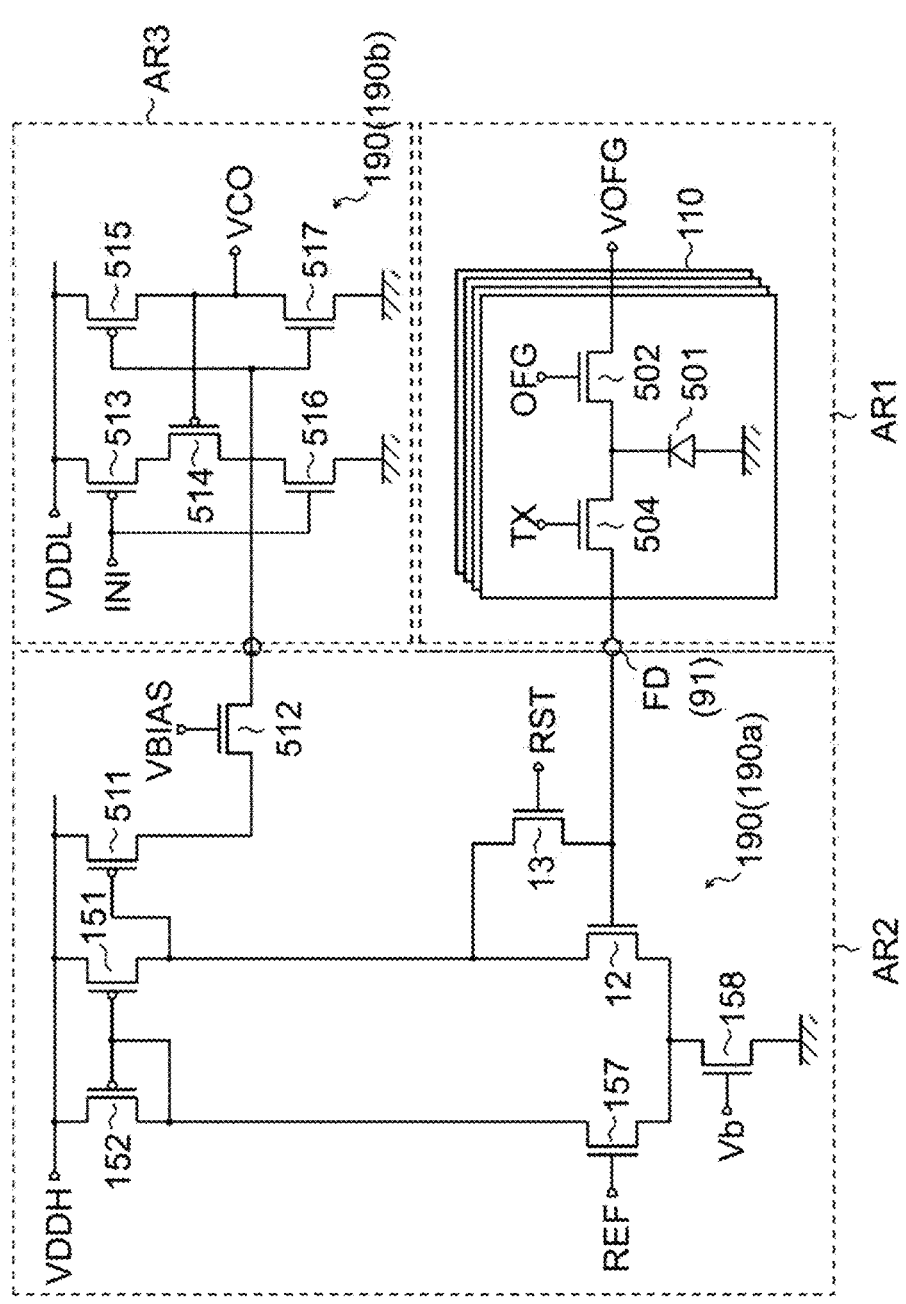
FIG. 17 is a circuit diagram of an area pixel according to the third example.
Figure 18:
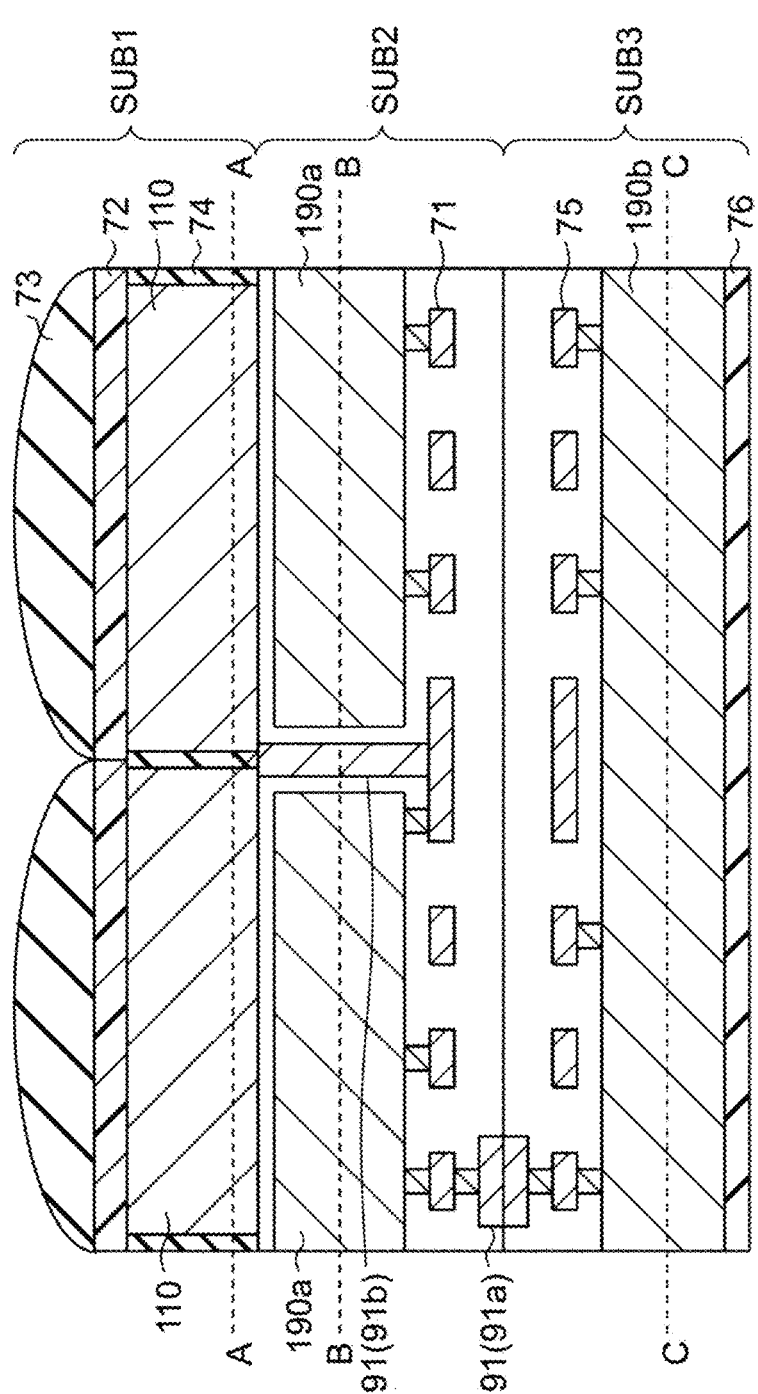
FIG. 18 is a cross-sectional view of an area pixel according to the third example.
Figure 19A:
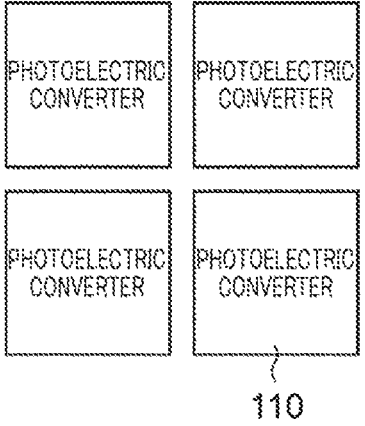
FIG. 19A is a plan view taken along line A-A in FIG. 18.
Figure 19B:
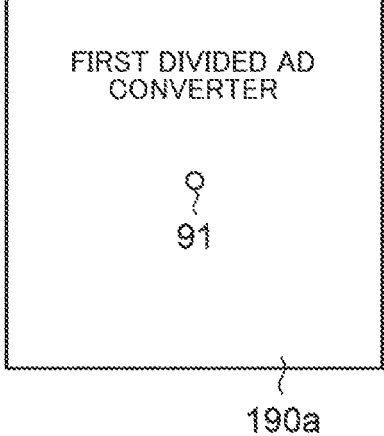
FIG. 19B is a plan view taken along line B-B in FIG. 18.
Figure 19C:
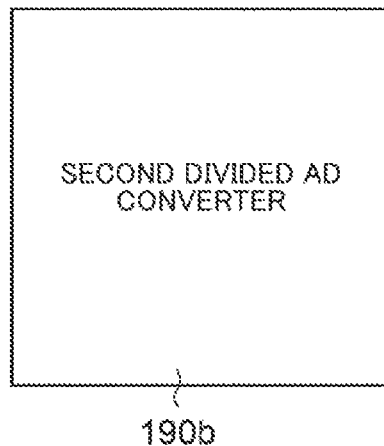
FIG. 19C is a plan view taken along line C-C of FIG. 18.

FIG. 17 is a circuit diagram of the area pixel 100 according to the third example, FIG. 18 is a cross-sectional view of the area pixel 100 according to the third example, FIG. 19A is a plan view taken along line A-A in FIG. 18, FIG. 19B is a plan view taken along line B-B of FIG. 18, and FIG. 19C is a plan view taken along line C-C of FIG. 18. The following description will focus on the differences from the area pixel 100 according to the second example.

The area pixel 100 according to the third example differs from the second example in the method of dividing the AD converter 190, and the first divided AD converter 190a including the transistor 512 that outputs the comparison result output signal in the AD converter 190 is arranged in the second area AR2, and the second divided AD converter 190b on the downstream side of the transistor 512 is arranged in the third area AR3. Others are the same as in the second example, the first divided AD converter 190a is arranged in the second area AR2, and the second divided AD converter 190b is arranged in the third area AR3. Therefore, the cross-sectional view of the third example illustrated in FIG. 18 is the same as the cross-sectional view of the second example illustrated in FIG. 15, and the plan view of the third example illustrated in FIG. 19 is the same as the plan view of the second example illustrated in FIG. 16.

As will be described later, the method of dividing the AD converter 190 into two is not limited to that illustrated in FIGS. 14 and 17. It is desirable to minimize the number of signals transmitted and received between the first divided AD converter 190a and the second divided AD converter 190b.

(Summary of First to Third Examples of Area Pixel 100)

FIG. 20 is a diagram summarizing the features of the area pixels 100 according to the first to third examples described above. In each of the first to third examples, the back side is the light irradiation surface. In the first to third examples, the photoelectric converter 110 is made of silicon, and the photoelectric converter 110 is arranged in the first area AR1. In the first example, the AD converter 190 is arranged in the second area AR2. In the second and third examples, the AD converter 190 is divided and arranged in the second area AR2 and the third area AR3. In the first example, the first area AR1 and the second area AR2 transmit and receive the charge of the floating diffusion FD of the photoelectric converter 110 through the signal transmitter 91 composed of the Cu—Cu connection 91a. In the first area AR1 and the second area AR2 in the second and third examples, the charge of the floating diffusion FD of the photoelectric converter 110 is transmitted and received through the signal transmitter 91 composed of the via 91b. In the second area AR2 and the third area AR3 in the second example, the drain signals of the differential pair in the AD converter 190 are transmitted and received through the signal transmitter 91 composed of the Cu—Cu connections 91a. In the second area AR2 and the third area AR3 in the third example, the comparison result signal in the AD converter 190 is transmitted and received through the signal transmitter 91 composed of the Cu—Cu connection 91a.

(Fourth Example of Area Pixel 100)

Figure 21:
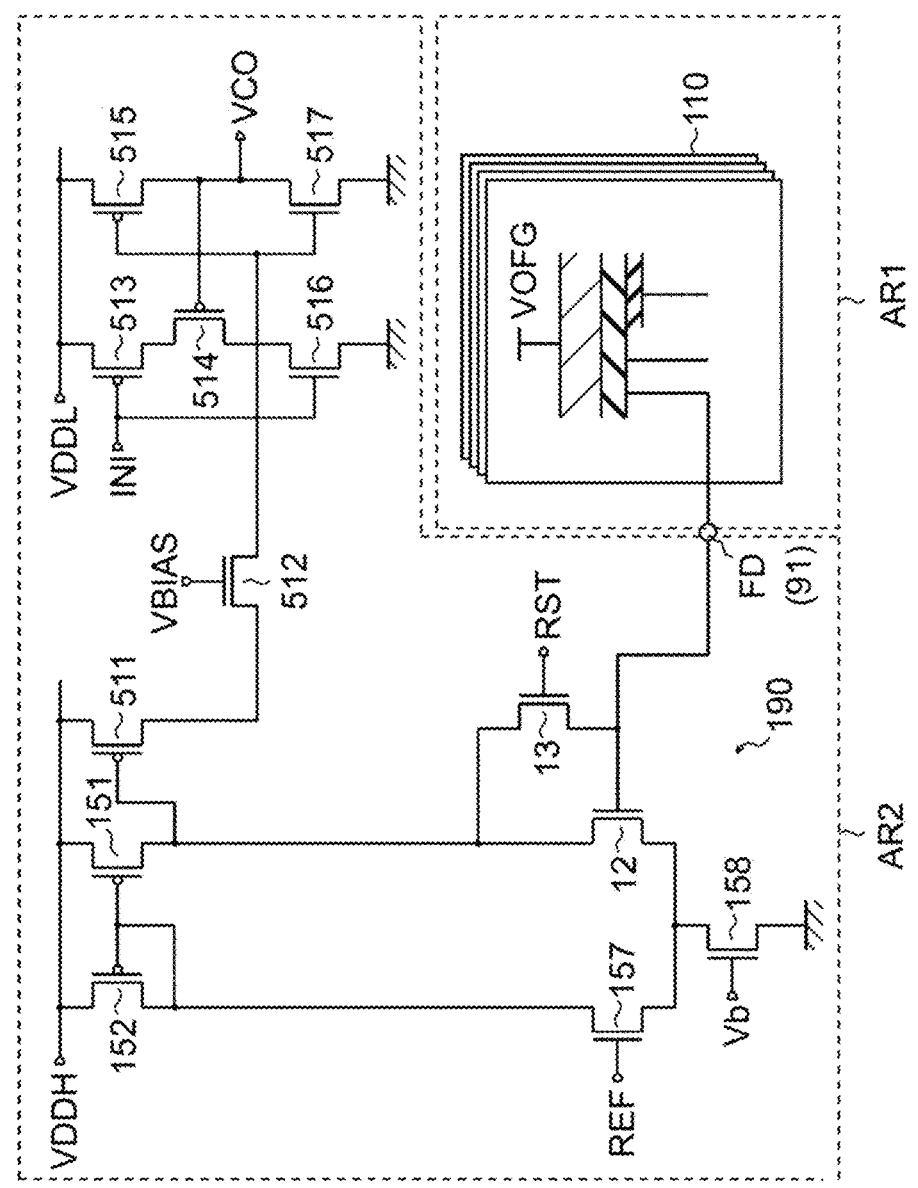
FIG. 21 is a circuit diagram of an area pixel according to the fourth example.
Figure 22:
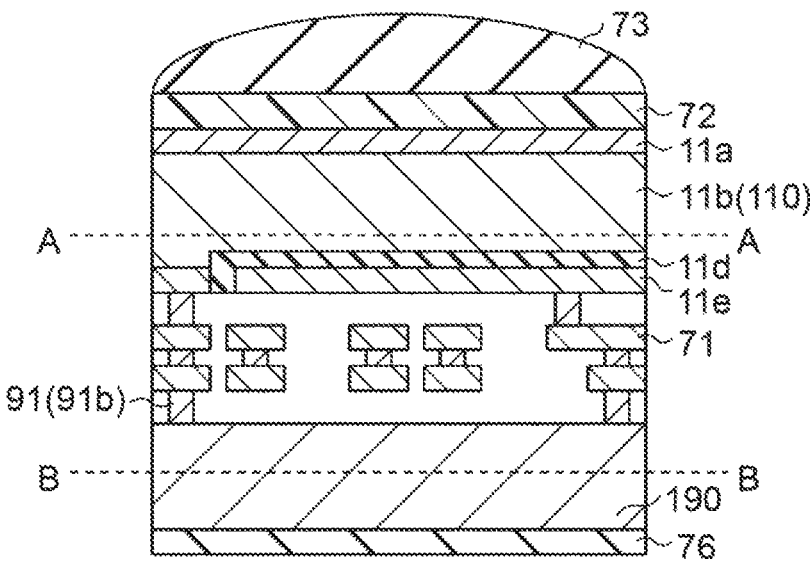
FIG. 22 is a cross-sectional view of an area pixel according to the fourth example.
Figure 23A:
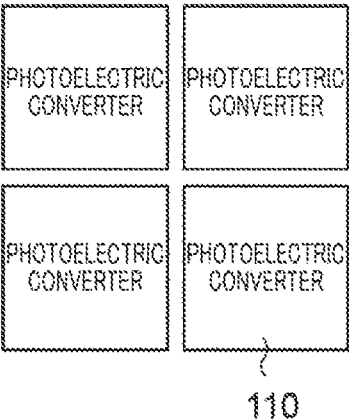
FIG. 23A is a plan view taken along line A-A in FIG. 22.
Figure 23B:
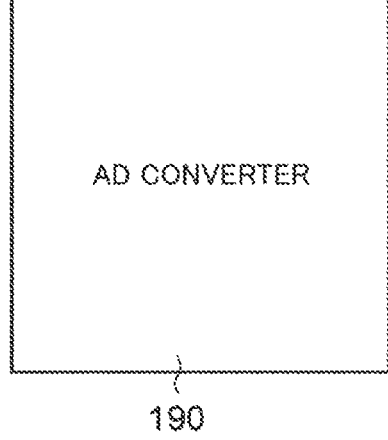
FIG. 23B is a plan view taken along line B-B in FIG. 22.

FIG. 21 is a circuit diagram of the area pixel 100 according to the fourth example, FIG. 22 is a cross-sectional view of the area pixel 100 according to the fourth example, FIG. 23A is a plan view taken along line A-A in FIG. 22, and FIG. 23B is a plan view taken along line B-B in FIG. 22. FIGS. 21, 22, 23A and 23B show an example where the area pixel 100 has four pixels.

The area pixel 100 according to the fourth example does not have a storage unit connected to the photoelectric converter 110 as in the first to third examples, and is used in the imaging device 1 of the rolling shutter method.

The area pixel 100 according to the fourth example has a photoelectric converter 110 made of a material other than silicon. Materials other than silicon are, for example, organic semiconductor materials. Thus, the photoelectric converter 110 of the fourth example has a semiconductor layer containing a material other than silicon (hereinafter also referred to as non-silicon). More specifically, the photoelectric converter 110 of the fourth example has a structure in which an upper electrode layer 11a, a photoelectric conversion layer 11b, an insulating layer 11d, and a lower electrode layer 11e are stacked.

The imaging device 1 having the area pixels 100 according to the fourth example includes a first area AR1 and a second area AR2 that are stacked as illustrated in FIGS. 21 and 22. The first area AR1 and the second area AR2 are arranged in different layers on the same substrate. The photoelectric converter 110 is arranged in the first area AR1. A layer in which the photoelectric converter 110 is arranged is a semiconductor layer made of a material other than silicon. More specifically, the upper electrode layer 11a, the photoelectric conversion layer 11b, the insulating layer 11d, and the lower electrode layer 11e made of a material other than silicon are stacked in the first area AR1. Materials for the upper electrode layer 11a and the lower electrode layer 11e are, for example, ITO (Indium Tin Oxide) and IZO (Indium Zinc Oxide).

In the second area AR2, the wiring layer 71 and the AD converter 190 are arranged in different layers. The layer in which the AD converter 190 is arranged is a semiconductor layer made of silicon. The AD converter 190 and the wiring layer 71 are arranged in the second area AR2.

The first area AR1 and the second area AR2 transmit and receive the charge of the floating diffusion FD through the signal transmitter 91 composed of the via 91b.

In the imaging device 1 having the area pixels 100 according to the fourth example, a semiconductor layer made of silicon is arranged on a support substrate in a pre-process to sequentially form the AD converter 190 and the wiring layer 71. In a post-process, a non-silicon semiconductor layer is formed to form the photoelectric converter 110.

As described above, the area pixel 100 according to the fourth example has a structure in which the AD converter 190 made of silicon and the photoelectric converter 110 made of a material other than silicon are stacked on the same substrate. Since the four photoelectric converters 110 and the AD converters 190 in the area pixel 100 sequentially transmit and receive the charge of the floating diffusion FD via the same signal transmitter 91 composed of vias 91*b*, the number of vias 91*b* can be reduced, and the area of the photoelectric converter 110 and the AD converter 190 can be increased accordingly, and the area pixel 100 can be made finer.

(Fifth Example of Area Pixel 100)

Figure 24:
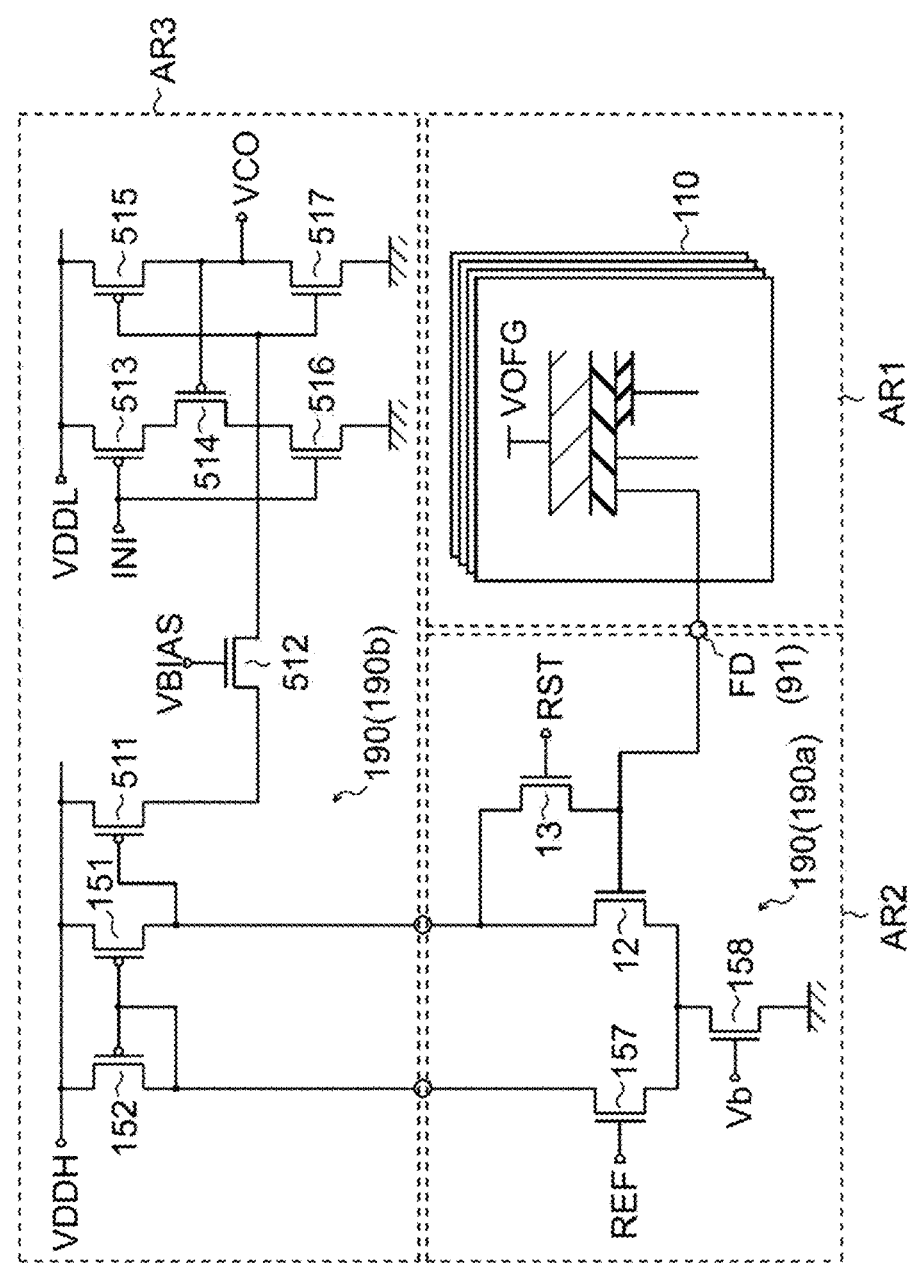
FIG. 24 is a circuit diagram of an area pixel according to the fifth example.
Figure 25:
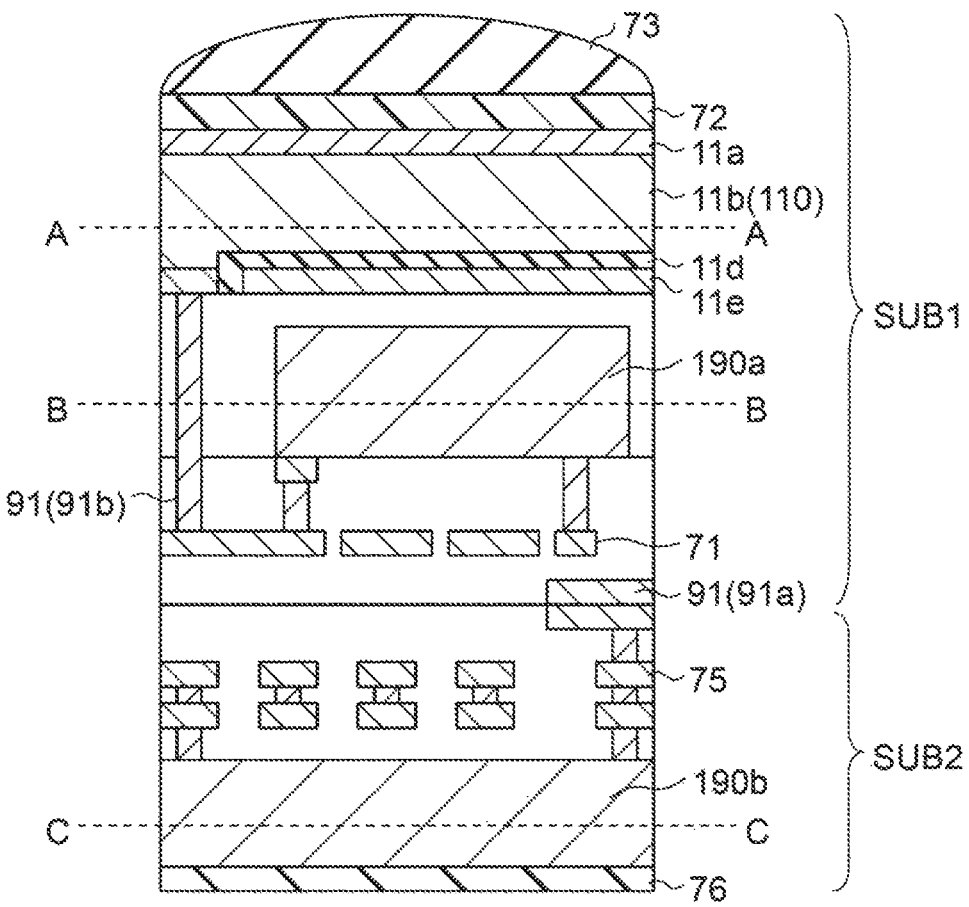
FIG. 25 is a cross-sectional view of an area pixel according to the fifth example.
Figure 26A:
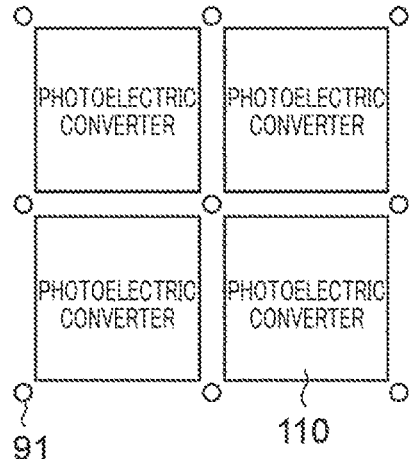
FIG. 26A is a plan view taken along line A-A in FIG. 25.
Figure 26B:
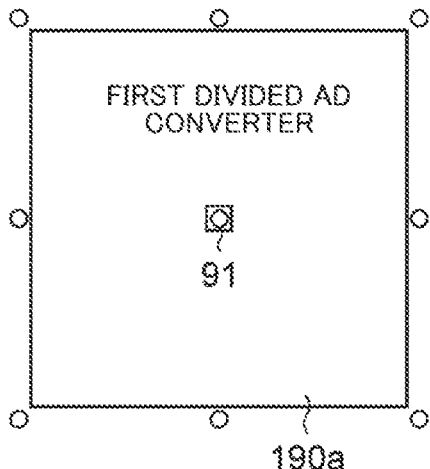
FIG. 26B is a plan view taken along line B-B in FIG. 25.
Figure 26C:
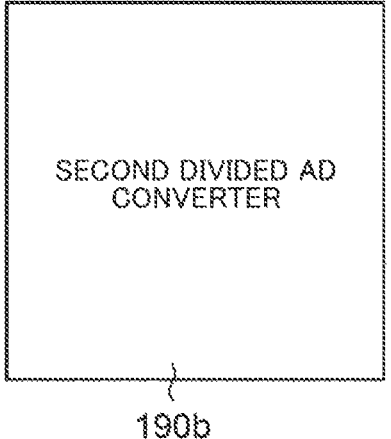
FIG. 26C is a plan view taken along line C-C of FIG. 25.

FIG. 24 is a circuit diagram of the area pixel 100 according to the fifth example, FIG. 25 is a cross-sectional view of the area pixel 100 according to the fifth example, FIG. 26A is a plan view taken along the line A-A in FIG. 25, FIG. 26B is a plan view taken along line B-B of FIG. 25, and FIG. 26C is a plan view taken along line C-C of FIG. 25. FIGS. 24, 25, 26A and 26B show an example where the area pixel 100 has four pixels. The following description focuses on the differences from the area pixel 100 according to the fourth example.

As in the third example, the area pixel 100 according to the fifth example does not have a storage unit connected to the photoelectric converter 110, and is used in the imaging device 1 of the rolling shutter method.

As illustrated in FIGS. 24 and 25, the imaging device 1 having the area pixels 100 according to the fifth example includes a first area AR1, a second area AR2 and a third area AR3 which are stacked. A photoelectric converter 110 made of a material other than silicon is arranged in the first area AR1. The AD converter 190 is divided into a first divided AD converter 190*a* and a second divided AD converter 190*b*. The first divided AD converter 190*a* and the photoelectric converter 110 transmit and receive the charge of the floating diffusion FD. The first divided AD converter 190*a* has differential pairs of transistors 12, 157 and transistors 13, 158 in the AD converter 190. The second divided AD converter 190*b* has the rest of the AD converter 190, specifically transistors 151, 152, and 511 to 517. The first divided AD converter 190*a* is arranged in the second area AR2, and the second divided AD converter 190*b* is arranged in the third area AR3. The first area AR1 and the second area AR2 are stacked on the first substrate SUB1. The third area AR3 is arranged on the second substrate SUB2.

The first area AR1 and the second area AR2 transmit and receive the charge of the floating diffusion FD through the signal transmitter 91 composed of the via 91*b*. The second area AR2 and the third area AR3 transmit and receive drain signals of the differential pair of transistors 12 and 157 through the signal transmitter 91 composed of a Cu—Cu connection 91*a*.

As illustrated in FIGS. 26B and 26C, the first divided AD converter 190*a* and the second divided AD converter 190*b* are arranged over the entire areas of the respective areas, respectively, so that a sufficient area required for arranging the AD converter 190 can be secured, and microfabrication becomes possible.

(Sixth Example of Area Pixel 100)

Figure 27:
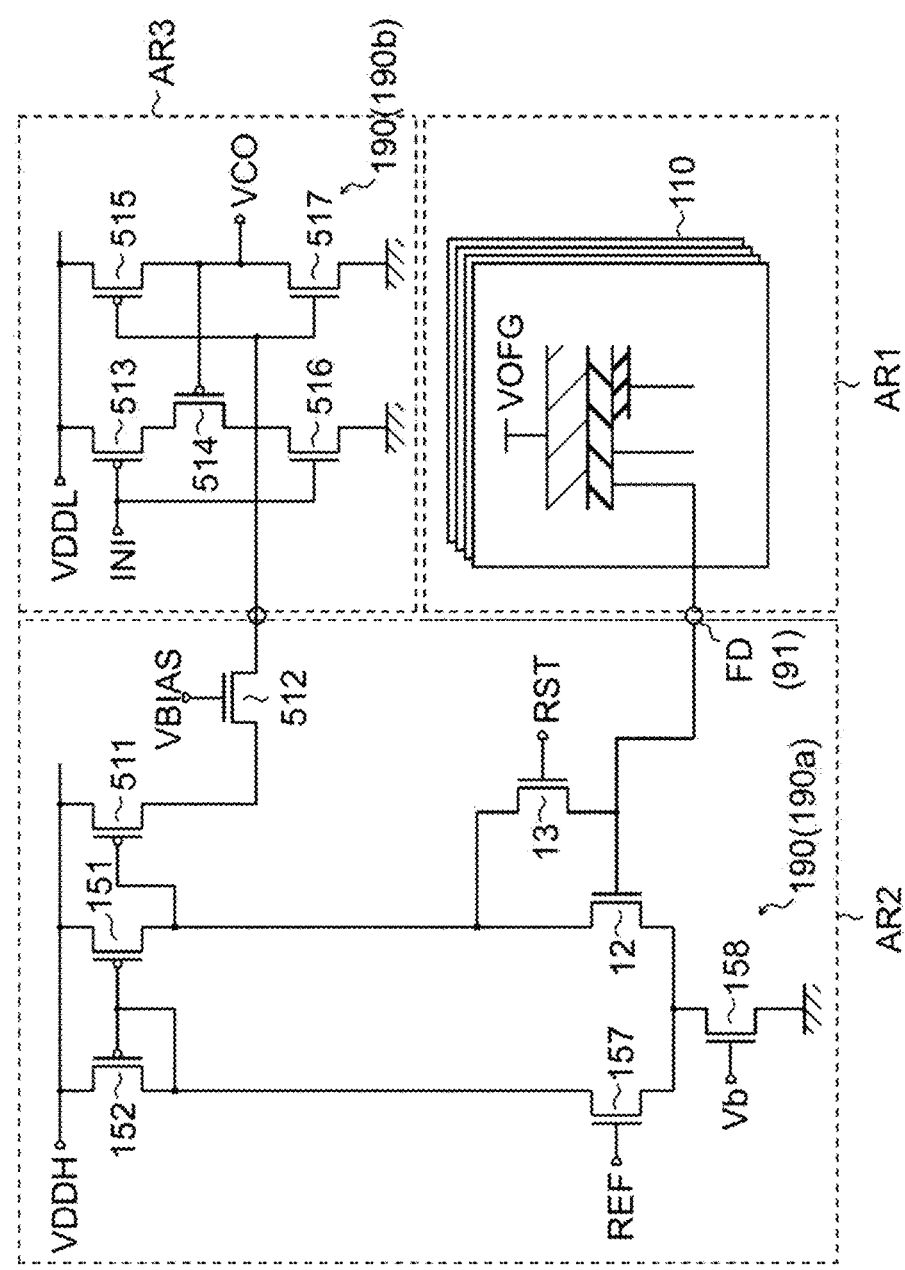
FIG. 27 is a circuit diagram of an area pixel according to the sixth example.
Figure 28:
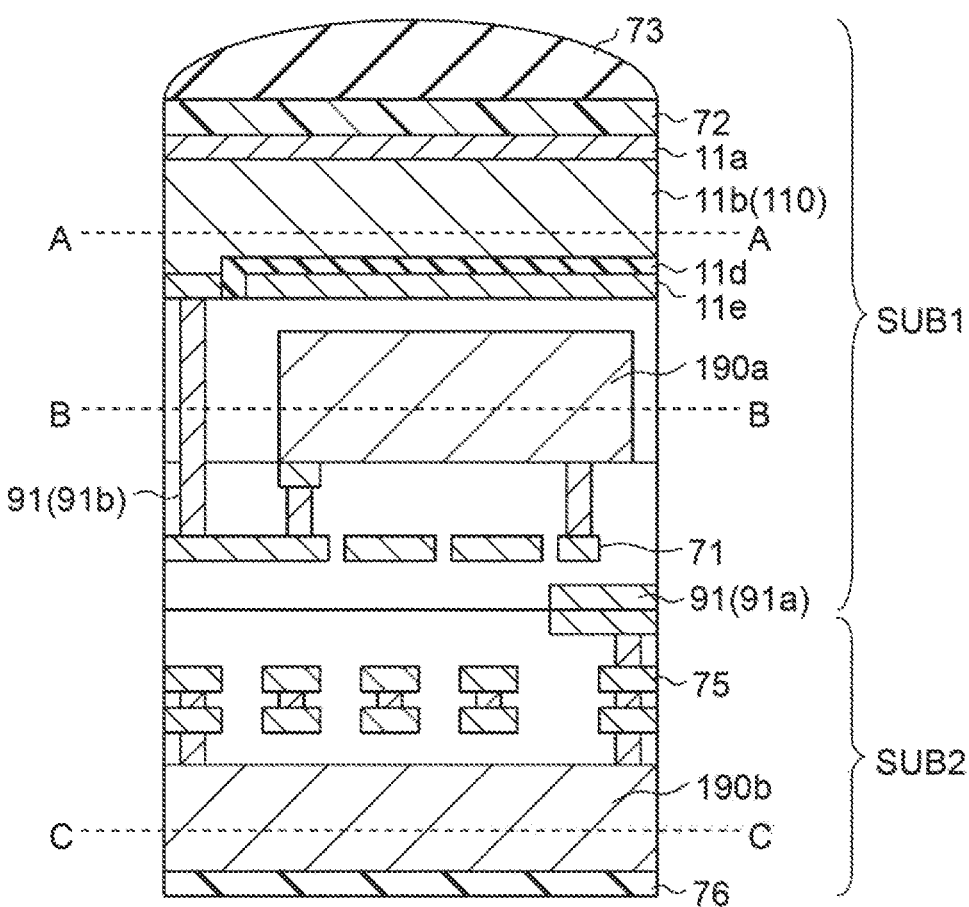
FIG. 28 is a cross-sectional view of an area pixel according to the sixth example.
Figure 29A:
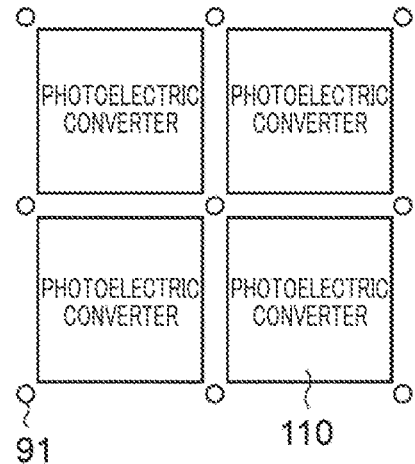
FIG. 29A is a plan view taken along line A-A in FIG. 28.
Figure 29B:
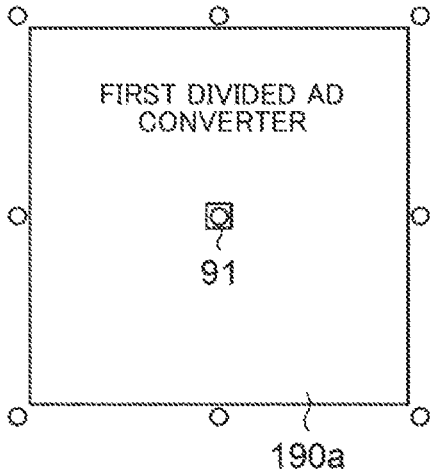
FIG. 29B is a plan view taken along line B-B in FIG. 28.
Figure 29C:
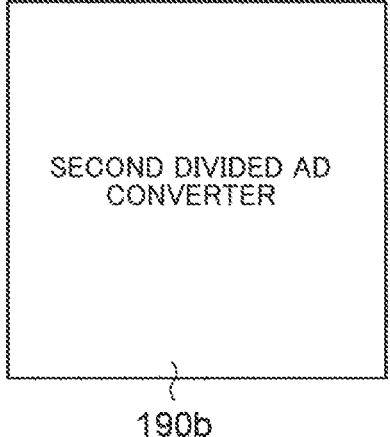
FIG. 29C is a plan view taken along line C-C of FIG. 28.

FIG. 27 is a circuit diagram of the area pixel 100 according to the sixth example, FIG. 28 is a cross-sectional view of the area pixel 100 according to the sixth example, FIG. 29A is a plan view in the direction of line A-A in FIG. 28, and FIG. 29B is a plan view taken along line B-B of FIG. 28, and FIG. 29C is a plan view taken along line C-C of FIG. 28. FIGS. 27, 28, 29A and 29B show an example where the area pixel 100 has four pixels. The following description focuses on the differences from the area pixel 100 according to the fourth example.

As in the third example, the area pixel 100 according to the sixth example does not have a storage unit connected to the photoelectric converter 110, and is used in the imaging device 1 of the rolling shutter method.

The first divided AD converter 190*a* in the sixth example has transistors 12, 13, 151, 152, 157, 158, 511, 512 in the AD converter 190. The second divided AD converter 190*b* has transistors 513 to 517 in the AD converter 190. That is, the AD converter 190 is divided at the source node of the transistor 512 that outputs the comparison result signal between the pixel signal and the reference signal. The first divided AD converter 190*a* and the second divided AD converter 190*b* transmit and receive the comparison result output signal through the signal transmitter 91 composed of the Cu—Cu connection 91*a*. The transistor 512 that outputs the comparison result output signal forms a level converter.

(Summary of Fourth to Sixth Examples of Area Pixel 100)

FIG. 30 is a diagram summarizing the features of the area pixels 100 according to the fourth to sixth examples described above. In the fourth to sixth examples, the photoelectric converter 110 is formed of a non-silicon semiconductor layer, and the AD converter 190 is formed of a silicon semiconductor layer. In the fourth to sixth examples, the photoelectric converter 110 is arranged in the first area AR1. The AD converter 190 in the fourth example is arranged in the second area AR2. The AD converters 190 in the fifth and sixth examples are divided and arranged in the second area AR2 and the third area AR3. In the fourth to sixth examples, the first area AR1 and the second area AR2 transmit and receive the charge of the floating diffusion FD through the signal transmitter 91 composed of the via 91*b*. The second area AR2 and the third area AR3 in the fifth example transmit and receive drain signals of a differential pair in the AD converter 190 through the signal transmitter 91 composed of the Cu—Cu connection 91*a*. The second area AR2 and the third area AR3 in the sixth example transmit and receive the comparison result signal in the AD converter 190 through the signal transmitter 91 composed of the Cu—Cu connection 91*a*.

(Seventh Example of Area Pixel 100)

Figure 31:
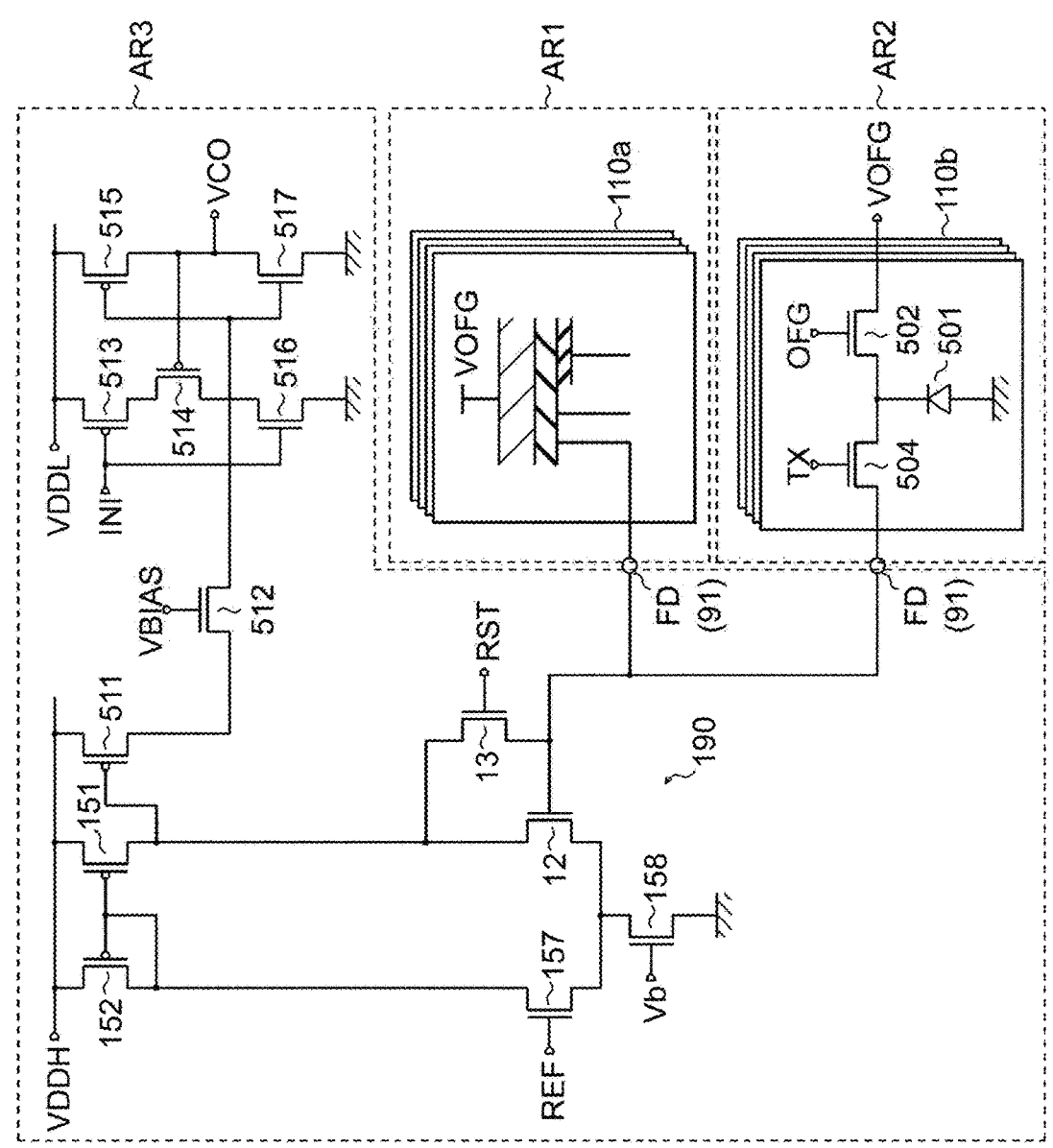
FIG. 31 is a circuit diagram of an area pixel according to the seventh example.
Figure 32:
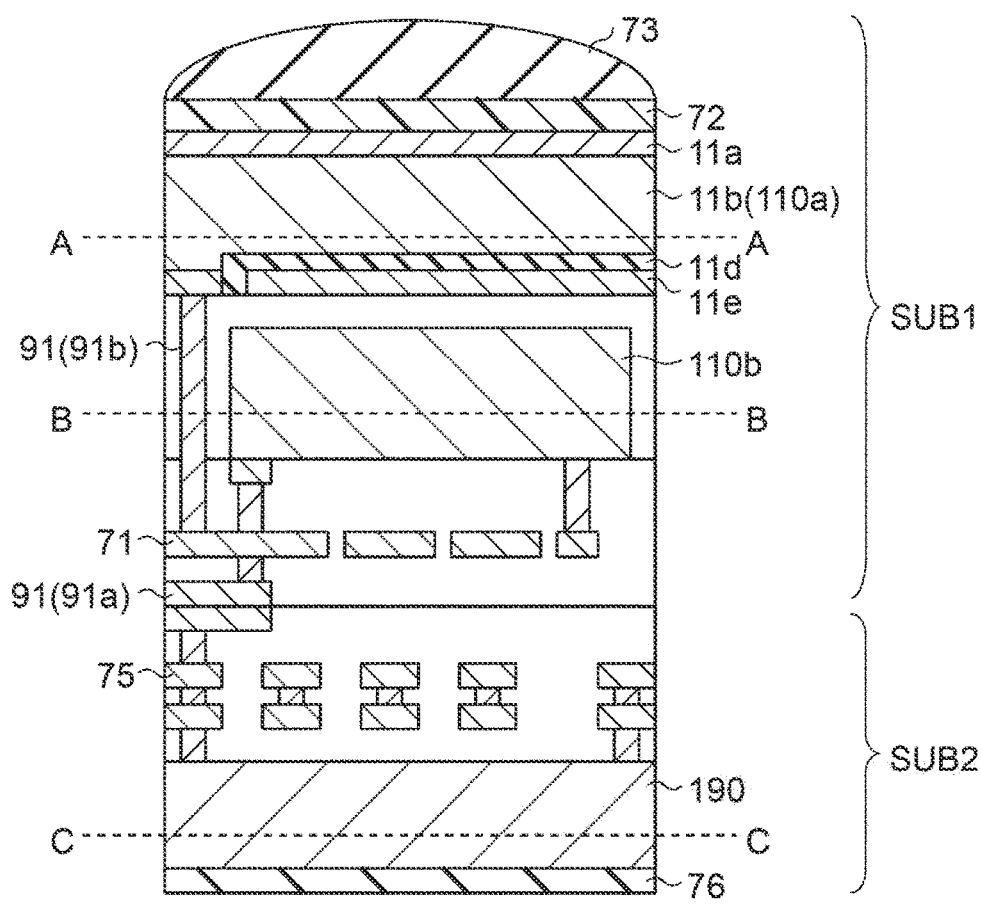
FIG. 32 is a cross-sectional view of an area pixel according to the seventh example.
Figure 33A:
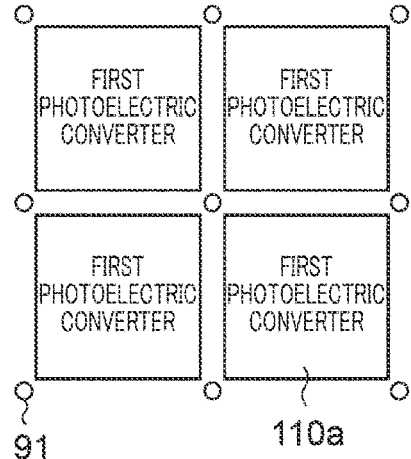
FIG. 33A is a plan view in the direction of line A-A in FIG. 32.
Figure 33B:
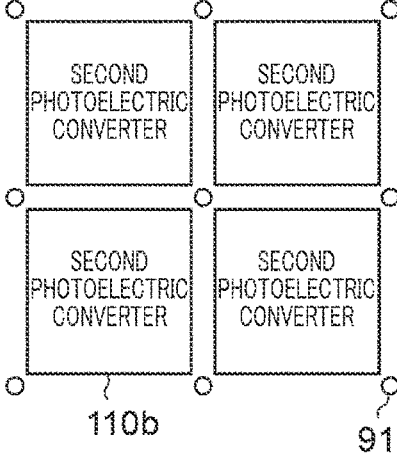
FIG. 33B is a plan view taken along line B-B in FIG. 32.
Figure 33C:
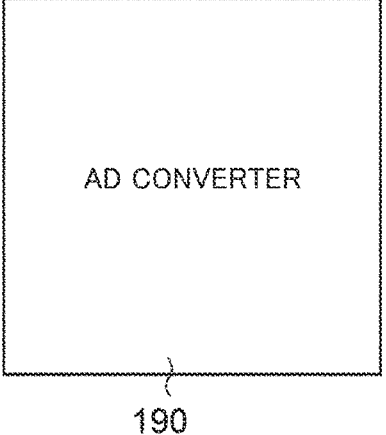
FIG. 33C is a plan view taken along line C-C of FIG. 32.

FIG. 31 is a circuit diagram of the area pixel 100 according to the seventh example, FIG. 32 is a cross-sectional view of the area pixel 100 according to the seventh example, FIG. 33A is a plan view in the direction of line A-A in FIG. 32, FIG. 33B is a plan view taken along line B-B of FIG. 32, and FIG. 33C is a plan view taken along line C-C of FIG. 32. FIGS. 31, 32, 33A and 33B show an example where the area pixel 100 has four pixels.

As in the fourth example, the area pixel 100 according to the seventh example does not have a storage unit connected to the photoelectric converter 110, and is used in the imaging device 1 of the rolling shutter method.

The area pixel 100 according to the seventh example has a photoelectric converter 110 (first photoelectric converter 110*a*) made of a material other than silicon and a photoelectric converter 110 (second photoelectric converter 110*b*) made of silicon. Materials other than silicon include, for example, organic semiconductor materials. The first photoelectric converter 110*a* performs, for example, green photoelectric conversion, and the second photoelectric converter 110*b* performs, for example, red and blue photoelectric conversion.

As illustrated in FIG. 31, the floating diffusion FD of the first photoelectric converter 110*a* and the floating diffusion FD of the second photoelectric converter 110*b* are connected to the gate of the transistor 12 and the source of the transistor 13 in the AD converter 190.

The imaging device 1 having the area pixels 100 according to the seventh example includes a first area AR1, a second area AR2 and a third area AR3 which are stacked as illustrated in FIGS. 31 and 32. The first area AR1 and the second area AR2 are stacked on the first substrate SUB1. The third area AR3 is arranged on the second substrate SUB2. The first photoelectric converter 110*a* is arranged in the first area AR1 using a material other than silicon. The second photoelectric converter 110*b* made of silicon is arranged in the second area AR2. The AD converter 190 made of silicon is arranged in the third area AR3.

The first area AR1 and the third area AR3 transmit and receive the charge of the floating diffusion FD of the first photoelectric converter 110*a* through the signal transmitter 91 composed of the via 91*b* and the Cu—Cu connection 91*a*. The second area AR2 and the third area AR3 transmit and receive the charge of the floating diffusion FD of the second photoelectric converter 110*b* through the signal transmitter 91 composed of the Cu—Cu connection 91*a*.

As illustrated in FIGS. 33A and 33B, the first photoelectric converter 110*a* and the second photoelectric converter 110*b* are arranged over the entire areas of the respective areas, so that the aperture ratio can be increased and the area pixels 100 can be made finer.

As described above, the area pixel 100 according to the seventh example has two types of photoelectric converters 110 (110*a*, 110*b*), and the charge of the floating diffusion FD of each of the photoelectric converters 110 (110*a*, 110*b*) is transferred to the AD converter 190 via the via 91*b* and the Cu—Cu connection 91*a*. Since the photoelectric converters 110 (110*a*, 110*b*) are arranged over the entire areas of separate layers, a sufficient arrangement area for each photoelectric converter 110 can be secured even if two types of photoelectric converters 110 (110*a*, 110*b*) are provided.

(Eighth Example of Area Pixel 100)

Figure 34:
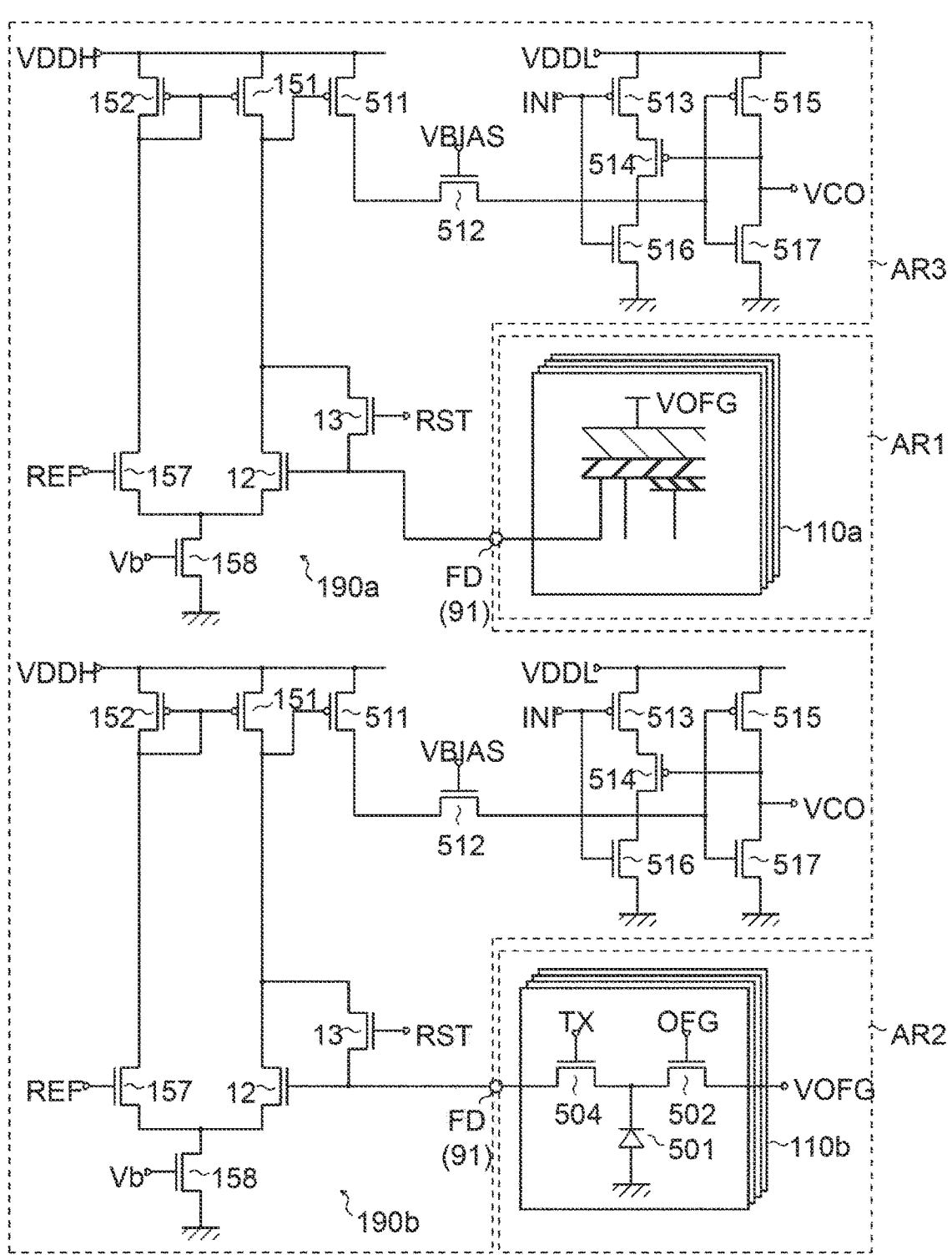
FIG. 34 is a circuit diagram of an area pixel according to the eighth example.
Figure 35:
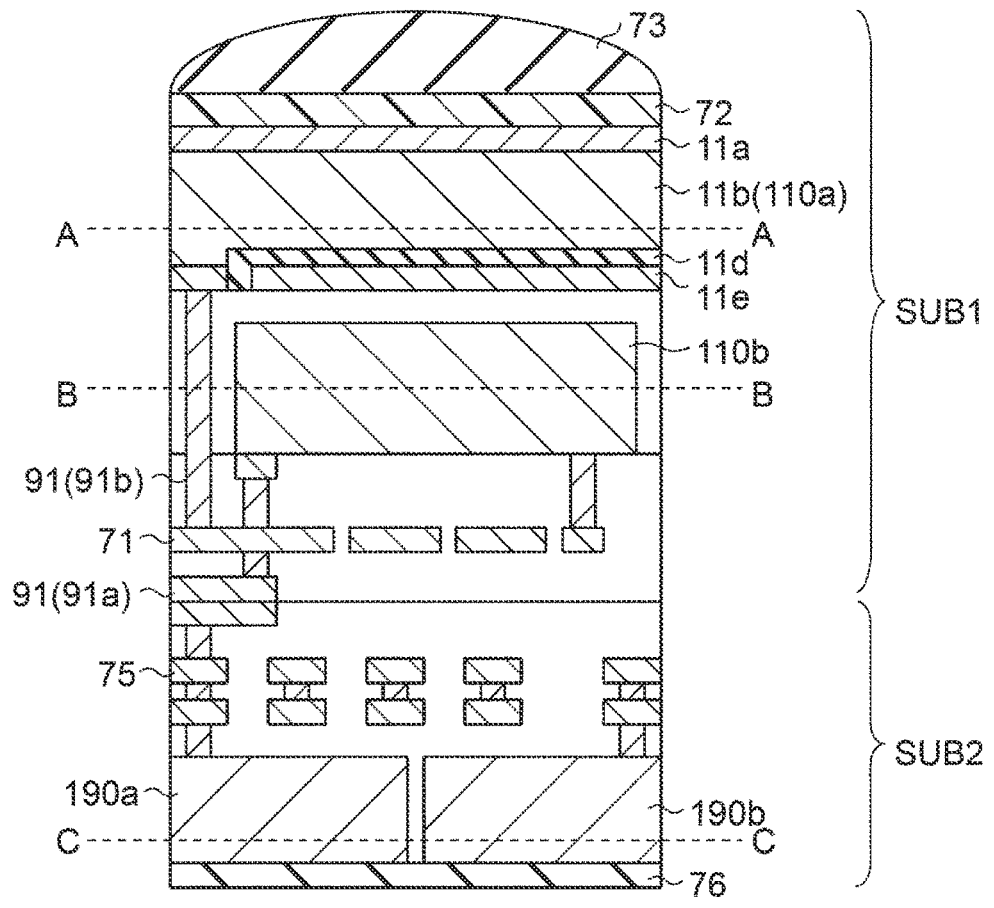
FIG. 35 is a cross-sectional view of an area pixel according to the eighth example.
Figure 36A:
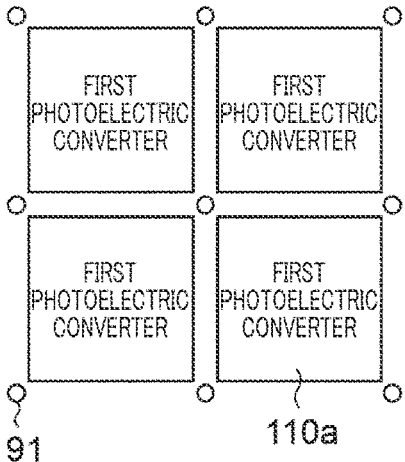
FIG. 36A is a plan view taken along line A-A in FIG. 35.
Figure 36B:
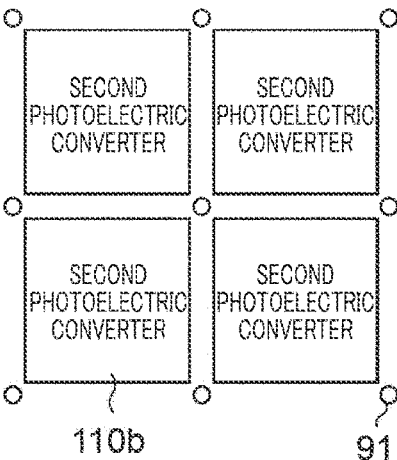
FIG. 36B is a plan view taken along line B-B of FIG. 35.
Figure 36C:
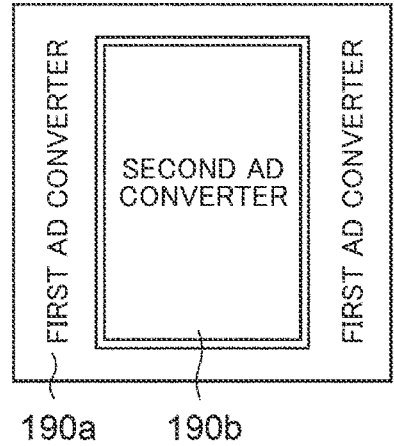
FIG. 36C is a plan view taken along line C-C of FIG. 35.

FIG. 34 is a circuit diagram of the area pixel 100 according to the eighth example, FIG. 35 is a cross-sectional view of the area pixel 100 according to the eighth example, FIG. 36A is a plan view in the direction of line A-A in FIG. 35, FIG. 36B is a plan view taken along line B-B of FIG. 35, and FIG. 36C is a plan view taken along line C-C of FIG. 35. FIGS. 34, 35, 36A and 36B show an example where the area pixel 100 has four pixels.

The area pixel 100 according to the eighth example does not have a storage unit connected to the photoelectric converter 110 as in the seventh example, and is used in the imaging device 1 of the rolling shutter method.

Unlike the seventh example, the area pixel 100 according to the eighth example has a first AD converter 190*a* that receives the charge of the floating diffusion FD of the first photoelectric converter 110*a* and a second AD converter 190*b* that receives the charge of the floating diffusion FD of the second photoelectric converter 110*b*. Thus, the area pixel 100 according to the eighth example has more AD converters 190 than the seventh example.

As illustrated in FIGS. 34 and 35, the first photoelectric converter 110*a* made of a material other than silicon is arranged in the first area AR1. The second photoelectric converter 110*b* made of silicon is arranged in the second area AR2. In the third area AR3, the first AD converter 190*a* and the second AD converter 190*b* made of silicon are arranged in the same layer. The first area AR1 and the second area AR2 are stacked on the first substrate SUB1, and the third area AR3 is arranged on the second substrate SUB2. The first area AR1 and the third area AR3 transmit and receive the charge of the floating diffusion FD of the first photoelectric converter 110*a* through the signal transmitter 91 composed of the via 91*b* and the Cu—Cu connection 91*a*. The second area AR2 and the third area AR3 transmit and receive the charge of the floating diffusion FD of the second photoelectric converter 110*b* through the signal transmitter 91 composed of the Cu—Cu connection 91*a*.

As illustrated in FIG. 36A, the first photoelectric converters 110*a* are arranged over the entire first area AR1. As illustrated in FIG. 36B, the second photoelectric converters 110*b* are arranged over the entire second area AR2. Further, as illustrated in FIG. 36C, the first AD converter 190*a* and the second AD converter 190*b* are arranged in the third area AR3, and the first AD converter 190*a* is arranged so as to surround the second AD converter 190*b*.

Since the area pixel 100 according to the eighth example includes the first AD converter 190*a* for the first photoelectric converter 110*a* and the second AD converter 190*b* for the second photoelectric converter 110*b*, the first AD converter 190*a* and the second AD converter 190*b* can perform AD conversion in parallel, and the AD conversion processing time can be shortened.

(Summary of Seventh to Eighth Examples of Area Pixel 100)

FIG. 37 is a diagram summarizing the features of the area pixels 100 according to the seventh and eighth examples described above. In the seventh and eighth examples, the back side is the light irradiation surface, the first photoelectric converter 110*a* is formed of a non-silicon semiconductor layer, and the second photoelectric converter 110*b* is formed of a silicon semiconductor layer. The first photoelectric converter 110*a* is arranged in the first area AR1, and the second photoelectric converter 110*b* is arranged in the second area AR2. The AD converter 190 of the seventh example is arranged in the third area AR3. The eighth example has two AD converters 190 (a first AD converter 190*a* and a second AD converter 190*b*). The first AD converter 190*a* and the second AD converter 190*b* are arranged in the third area AR3. In the seventh example and the eighth example, the first area AR1 and the third area AR3 transmit and receive the charge of the floating diffusion FD of the first photoelectric converter 110*a* through the signal transmitter 91 composed of the via 91*b* and the Cu—Cu connection 91*a*. Further, the second area AR2 and the third area AR3 transmit and receive the charge of the floating diffusion FD of the second photoelectric converter 110*b* through the signal transmitter 91 composed of the Cu—Cu connection 91*a*.

(Ninth Example of Area Pixel 100)

Figure 38:
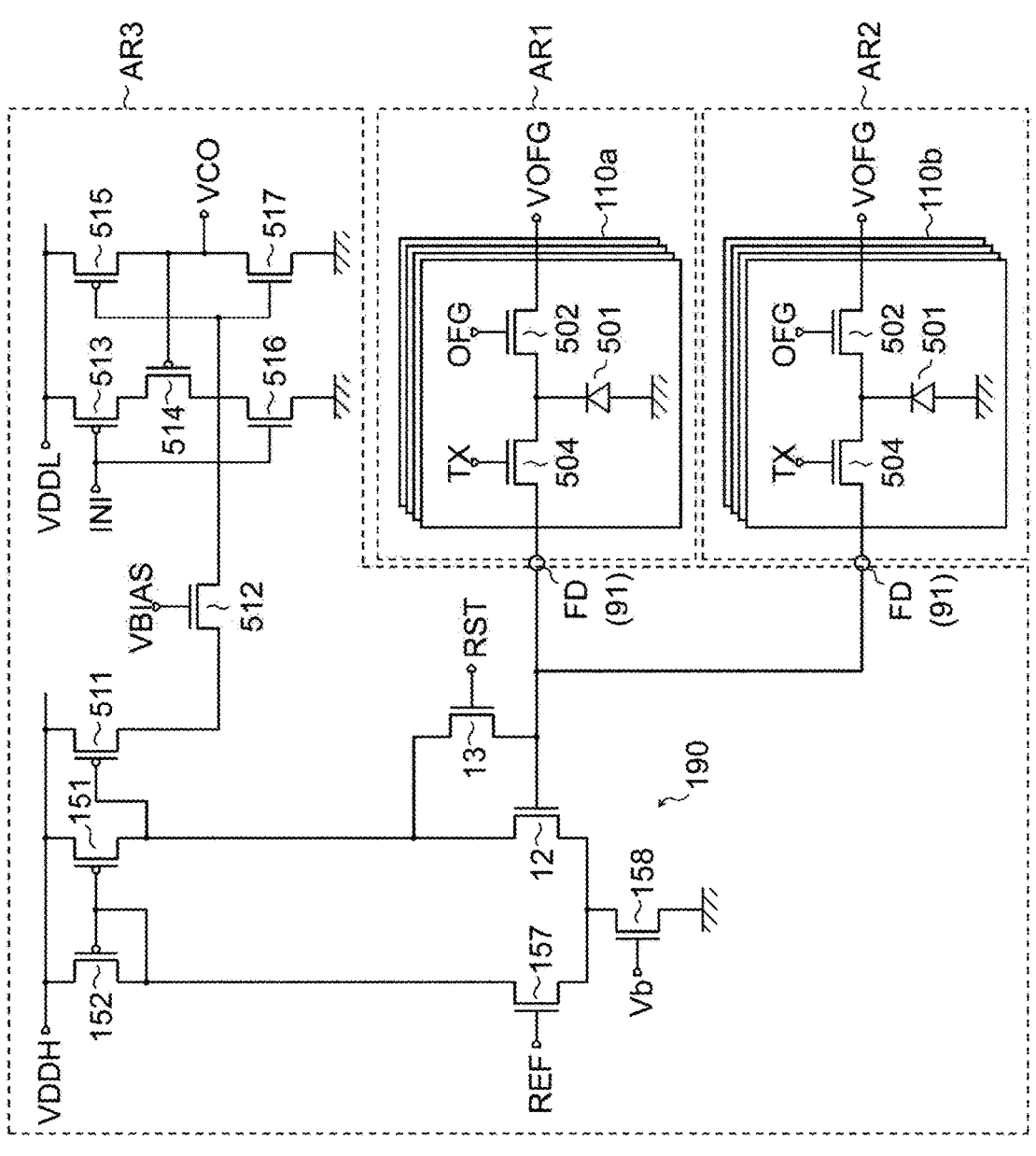
FIG. 38 is a circuit diagram of an area pixel according to the ninth example.
Figure 39:
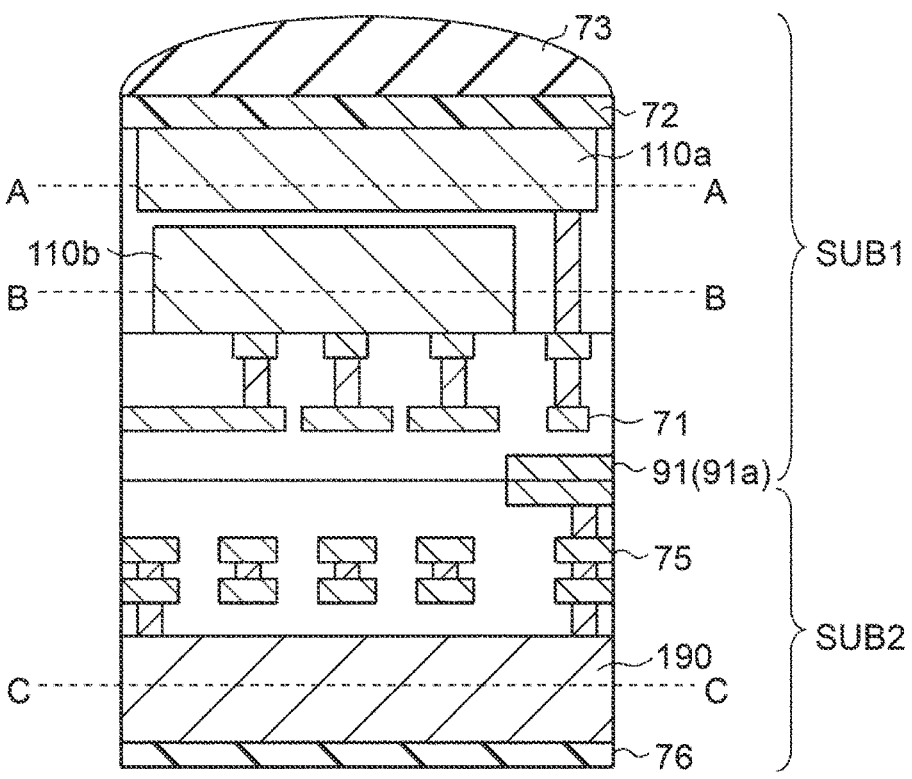
FIG. 39 is a cross-sectional view of an area pixel according to the ninth example.
Figure 40A:
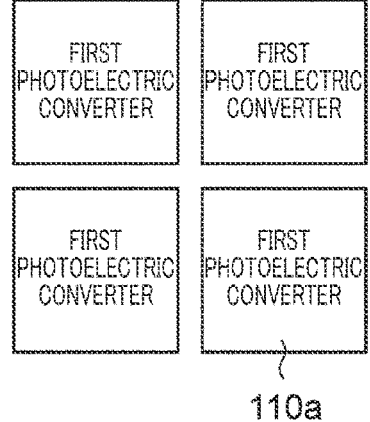
FIG. 40A is a plan view in the direction of line A-A in FIG. 39.
Figure 40B:
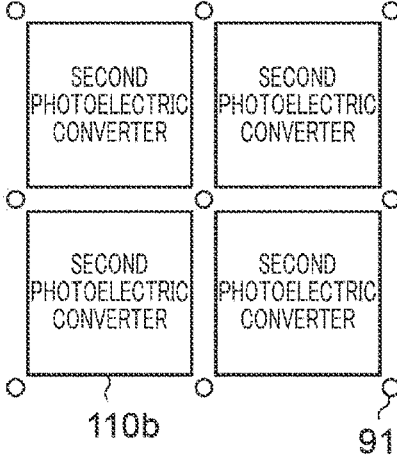
FIG. 40B is a plan view taken along line B-B of FIG. 39.
Figure 40C:
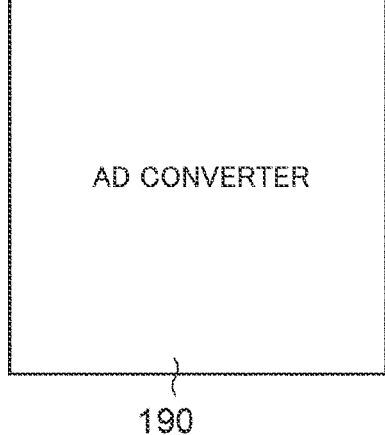
FIG. 40C is a plan view taken along line C-C in FIG. 39.

FIG. 38 is a circuit diagram of the area pixel 100 according to the ninth example, FIG. 39 is a cross-sectional view of the area pixel 100 according to the ninth example, FIG. 40A is a plan view in the direction of line A-A in FIG. 39, FIG. 40B is a plan view taken along the line B-B of FIG. 39, and FIG. 40C is a plan view taken along the line C-C of FIG. 39. FIGS. 38, 39, 40A and 40B show an example where the area pixel 100 has four pixels.

Since the area pixel 100 according to the ninth example does not have a storage unit connected to the photoelectric converter 110 of each pixel, the imaging device 1 having the area pixel 100 according to the ninth example performs imaging using the rolling shutter method.

As illustrated in FIG. 38, the area pixel 100 according to the ninth example has a first photoelectric converter 110*a* and a second photoelectric converter 110*b* for each pixel.

Both the first photoelectric converter 110*a* and the second photoelectric converter 110*b* have a semiconductor layer made of silicon.

The imaging device 1 having the area pixels 100 according to the ninth example includes a first area AR1, a second area AR2 and a third area AR3. The first photoelectric converter 110*a* is arranged in the first area AR1. The second photoelectric converter 110*b* is arranged in the second area AR2. The AD converter 190 is arranged in the third area AR3.

The first area AR1 and the second area AR2 are stacked on the first substrate SUB1. The third area AR3 is arranged on the second substrate SUB2.

The first substrate SUB1 and the second substrate SUB2 transmit the charge of the floating diffusion FD of the first photoelectric converter 110*a* and the charge of the floating diffusion FD of the second photoelectric converter 110*b* through the signal transmitter 91 composed of the Cu—Cu connection 91*a*.

(Tenth Example of Area Pixel 100)

Figure 41:
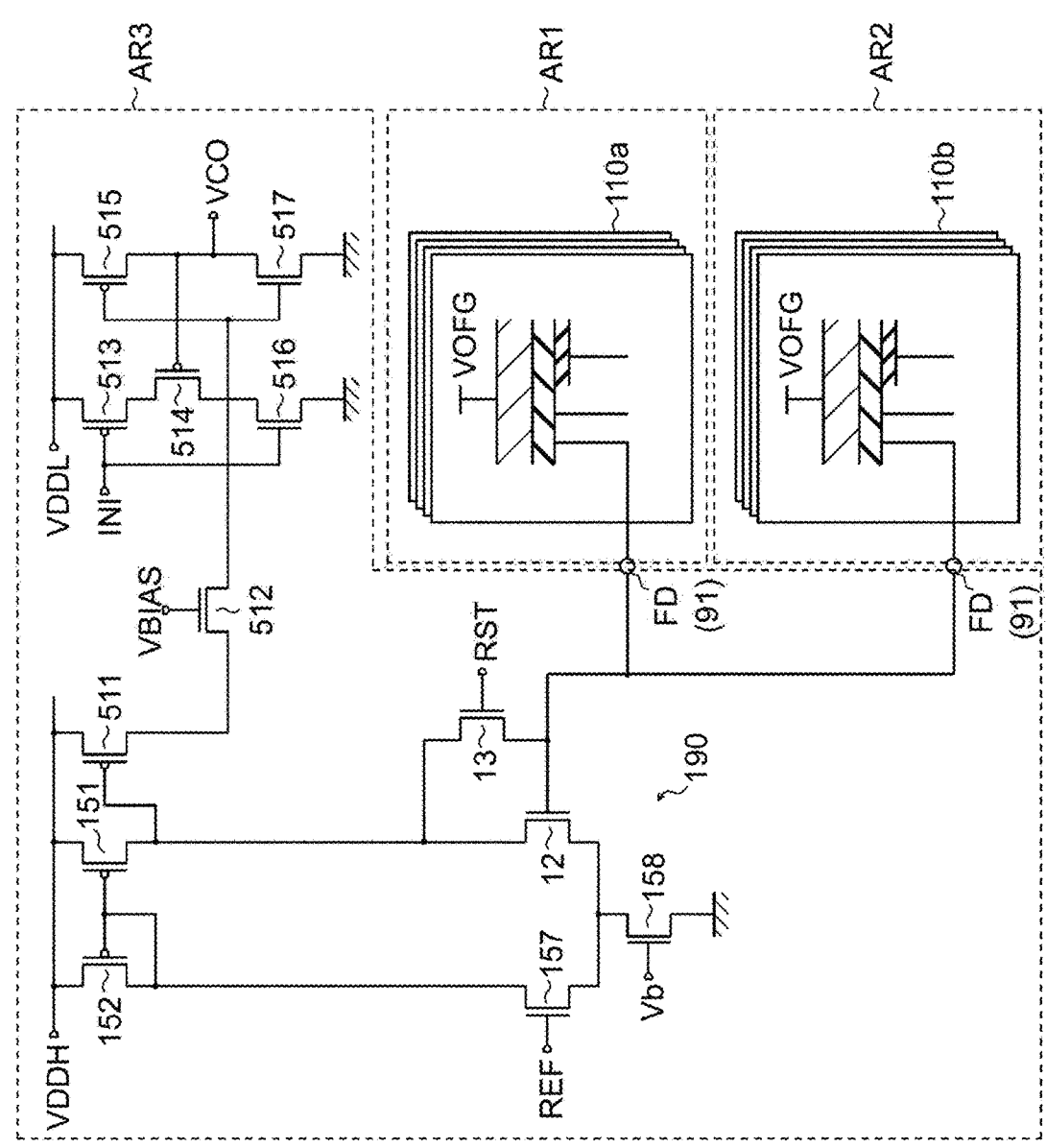
FIG. 41 is a circuit diagram of an area pixel according to the 10th example.
Figure 42:
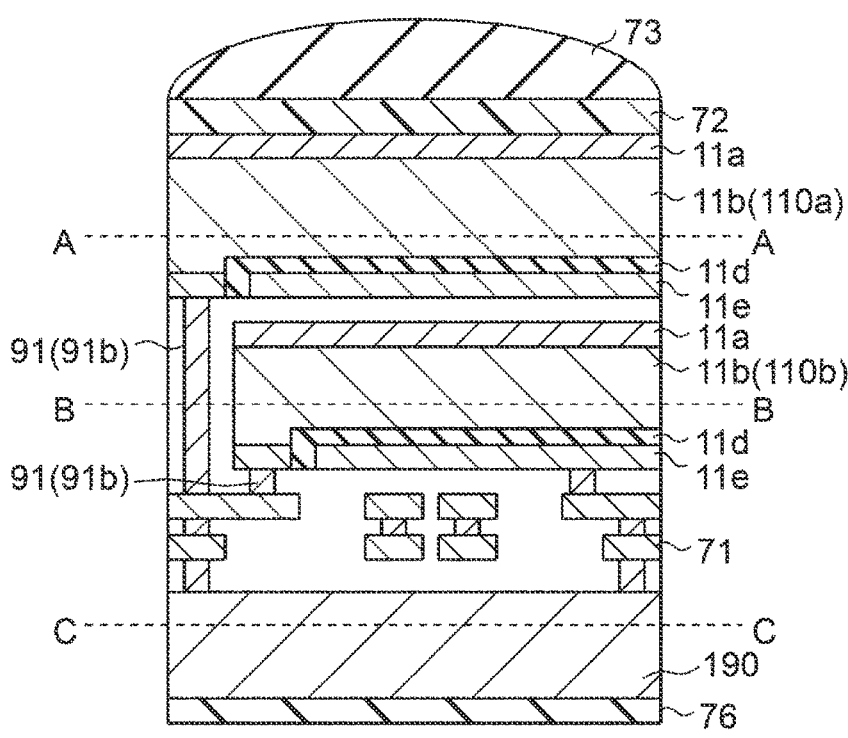
FIG. 42 is a cross-sectional view of an area pixel according to the 10th example.
Figure 43A:
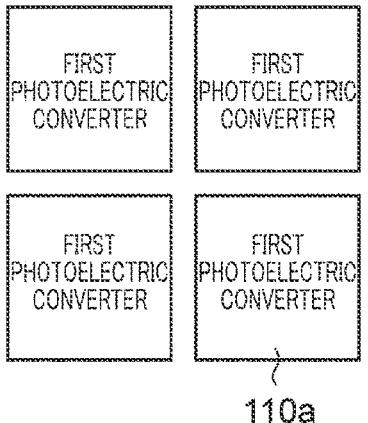
FIG. 43A is a plan view in the direction of line A-A in FIG. 42.
Figure 43B:
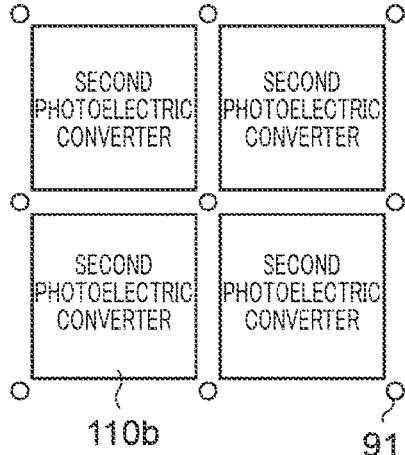
FIG. 43B is a plan view taken along line B-B in FIG. 42.
Figure 43C:
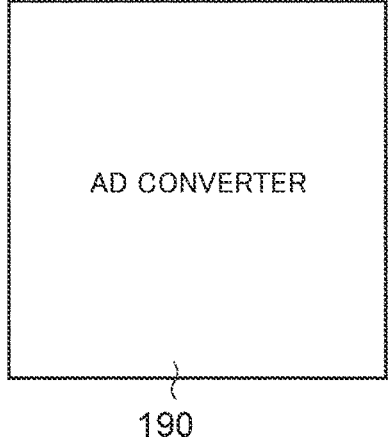
FIG. 43C is a plan view taken along the line C-C in FIG. 42.

FIG. 41 is a circuit diagram of the area pixel 100 according to the 10th example, FIG. 42 is a cross-sectional view of the area pixel 100 according to the 10th example, FIG. 43A is a plan view in the direction of line A-A in FIG. 42, FIG. 43B is a plan view taken along line B-B of FIG. 42, and FIG. 43C is a plan view taken along line C-C of FIG. 42. The following description will focus on the differences from the ninth example.

The area pixel 100 according to the 10th example is common to the ninth example in that each pixel has a first photoelectric converter 110*a* and a second photoelectric converter 110*b*, but the first photoelectric converter 110*a* and the second photoelectric converter 110*b* according to the 10th example each have a semiconductor layer made of a material other than silicon, and are made of, for example, an organic semiconductor material. The first photoelectric converter 110*a* and the second photoelectric converter 110*b* perform photoelectric conversion of different color wavelengths, for example.

As illustrated in FIG. 41, the first photoelectric converter 110*a* is arranged in the first area AR1. The second photoelectric converter 110*b* is arranged in the second area AR2. Both the first area AR1 and the second area AR2 have semiconductor layers made of a material other than silicon.

The AD converter 190 made of silicon is arranged in the third area AR3. The first area AR1, the second area AR2 and the third area AR3 are stacked on the same substrate. The first area AR1 and the third area AR3 transmit and receive the charge of the floating diffusion FD of the first photoelectric converter 110*a* through the signal transmitter 91 composed of the vias 91*b*. Similarly, the second area AR2 and the third area AR3 transmit and receive the charge of the floating diffusion FD of the second photoelectric converter 110*b* through the signal transmitter 91 composed of the via 91*b*.

As illustrated in FIGS. 43A, 43B, and 43C, the first photoelectric converter 110*a* is arranged in the entire first area AR1, the second photoelectric converter 110*b* is arranged in the entire second area AR2, and the AD converter 190 is arranged over the entire third area AR3. Thus, even if two types of photoelectric converters 110*a* and 110*b* are provided, a sufficient arrangement area for each photoelectric converter can be secured.

(Eleventh Example of Area Pixel 100)

Figure 44:
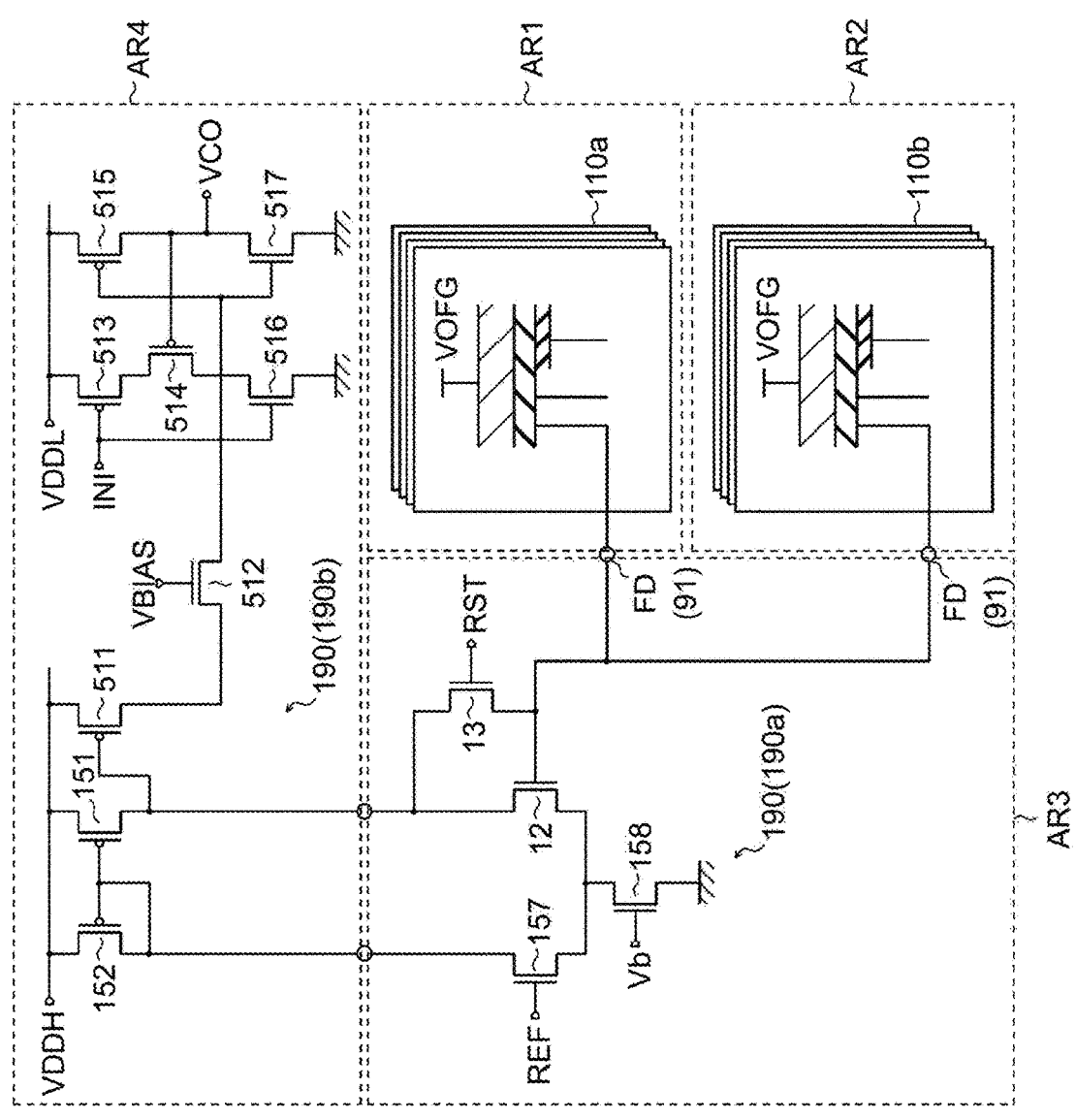
FIG. 44 is a circuit diagram of an area pixel according to the 11th example.
Figure 45:
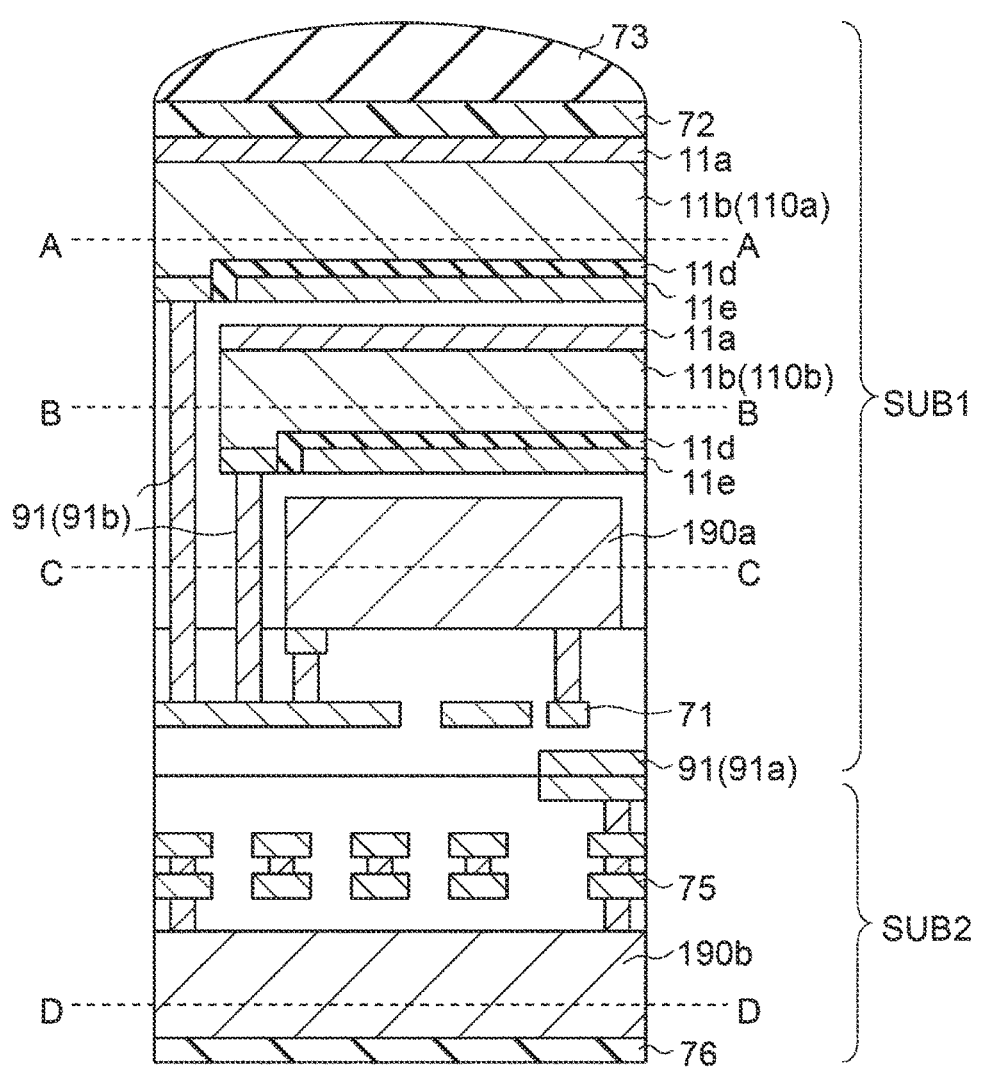
FIG. 45 is a cross-sectional view of an area pixel according to the 11th example.
Figure 46A:
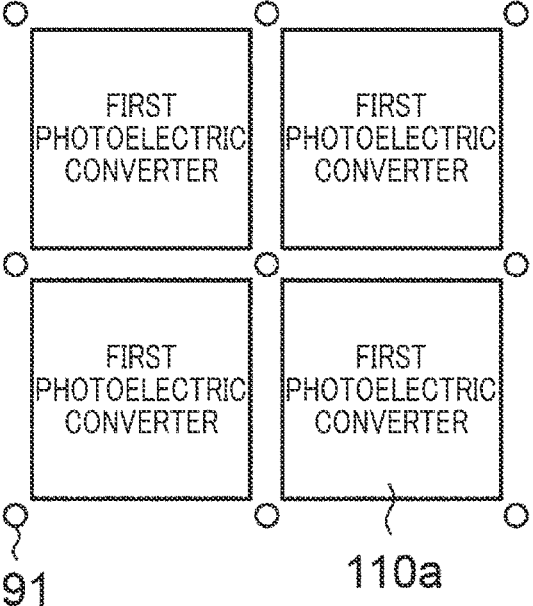
FIG. 46A is a plan view taken along line A-A in FIG. 45.
Figure 46B:
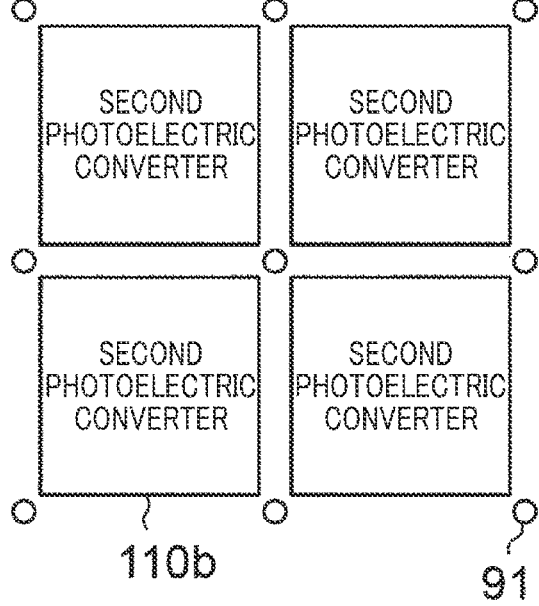
FIG. 46B is a plan view taken along line B-B of FIG. 45.
Figure 46C:
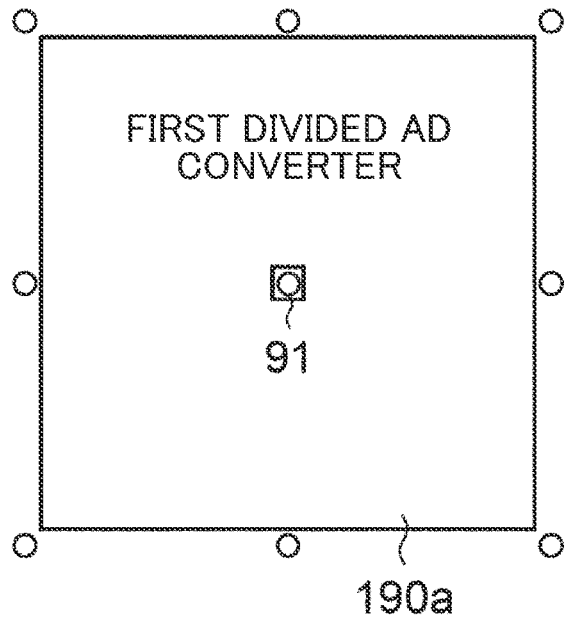
FIG. 46C is a plan view taken along line C-C in FIG. 45.
Figure 46D:
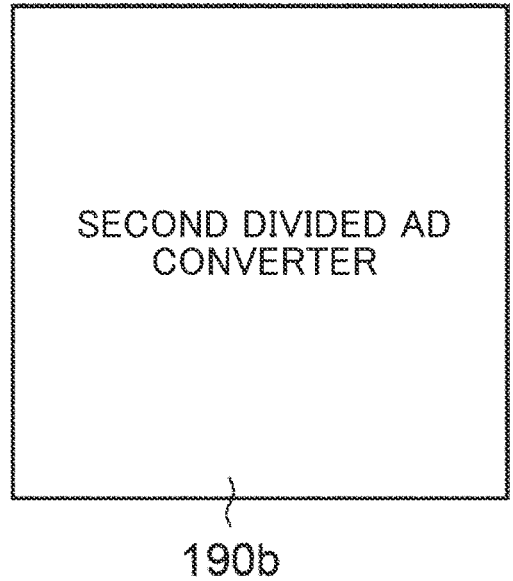
FIG. 46D is a plan view taken along line D-D in FIG. 45.

FIG. 44 is a circuit diagram of the area pixel 100 according to the 11th example, FIG. 45 is a cross-sectional view of the area pixel 100 according to the 11th example, FIG. 46A is a plan view taken along line A-A in FIG. 45, FIG. 46B is a plan view taken along line B-B of FIG. 45, FIG. 46C is a plan view taken along line C-C of FIG. 45, and FIG. 46D is a plan view taken along line D-D of FIG. 45. The following description focuses on the differences from the area pixel 100 according to the 10th example.

Since each pixel of the area pixel 100 according to the 11th example does not have a storage unit, the imaging device 1 having the area pixel 100 according to the 11th example performs imaging according to the rolling shutter method.

A first photoelectric converter 110*a* made of a material other than silicon is arranged in the first area AR1. A second photoelectric converter 110*b* made of a material other than silicon is arranged in the second area AR2.

The area pixel 100 according to the 11th example differs from the 10th example in that the AD converter 190 is divided into two. The AD converter 190 in the 11th example is divided into a first divided AD converter 190*a* and a second divided AD converter 190*b*. The first divided AD converter 190*a* and the second divided AD converter 190*b* transmit and receive drain signals of the differential pair of transistors 12 and 157 in the AD converter 190. The first divided AD converter 190*a* is arranged in the third area AR3, and the second divided AD converter 190*b* is arranged in the fourth area AR4.

The first area AR1, the second area AR2 and the third area AR3 are stacked on the first substrate SUB1. The fourth area AR4 is arranged on the second substrate SUB2.

The first photoelectric converter 110*a* and the first divided AD converter 190*a* in the first area AR1 transmit and receive the charge of the floating diffusion FD of the first photoelectric converter 110*a* through the signal transmitter 91 composed of the via 91*b*. In addition, the second photoelectric converter 110*b* and the first divided AD converter 190*a* in the second area AR2 transmit and receive the charge of the floating diffusion FD of the second photoelectric converter 110*b* through the signal transmitter 91 composed of the via 91*b*. The third area AR3 and the fourth area AR4 transmit and receive the drain signals of the differential pair in the AD converter 190 through the signal transmitter 91 composed of the Cu—Cu connection 91*a*.

(Summary of Ninth to 11th Examples of Area Pixel 100)

FIG. 47 is a diagram summarizing the features of the area pixels 100 according to the ninth to 11th examples described above. In the ninth and 11th examples, the back side is the light irradiation surface, while in the 10th example, the front side is the light irradiation surface. In the ninth example, both the first photoelectric converter 110 and the second photoelectric converter 110 have semiconductor layers made of silicon, whereas in the 10th and 11th examples, the first photoelectric converter 110 and the second photoelectric converter 110 have semiconductor layers made of a material other than silicon. In the ninth to 11th examples, the first photoelectric converter 110 and the second photoelectric converter 110 are arranged on the first substrate SUB1. In the ninth and 10th examples, the AD converter 190 is arranged in the second area AR2. In the 11th example, the first divided AD converter 190*a* is arranged in the first area AR1, and the second divided AD converter 190*b* is arranged in the second area AR2.

In the ninth example, the first area AR1 and the second area AR2 transmit and receive the charge of the floating diffusion FD of the first photoelectric converter 110 and the second photoelectric converter 110 through the signal transmitter 91 composed of the Cu—Cu connection 91*a*. In the 10th example, the first area AR1 and the second area AR2 transmit and receive the charge of the floating diffusion FD of the first photoelectric converter 110 and the second photoelectric converter 110 through the signal transmitter 91 composed of the vias 91*b*. In the 11th example, the third area AR3 and the fourth area AR4 transmit and receive drain signals of a differential pair in the AD converter 190 through the signal transmitter 91 composed of the Cu—Cu connection 91*a*.

As described above, the imaging device 1 having the area pixels 100 according to the ninth to 11th examples includes, for each area pixel 100, the plurality of pixels having the plurality of photoelectric converters 110, the floating diffusion FD, and the AD converter 190. The AD converter 190 is provided for each area pixel 100 including two or more pixels among a plurality of pixels, and converts signals corresponding to the charge photoelectrically converted by the two or more pixels into digital signals. The floating diffusion FD outputs the charge photoelectrically converted by the photoelectric converter 110 in the pixel.

The plurality of photoelectric converters 110, the plurality of AD converters 190, and the plurality of floating diffusions FD in the plurality of pixels are arranged in a plurality of stacked areas. The signal transmitter 91 transmits and receives signals between a plurality of areas. Among the plurality of areas, the area in which the plurality of photoelectric converters 110 are arranged is provided separately from the area in which the AD converters 190 are arranged. An area in which the plurality of photoelectric converters 110 are arranged and an area in which the AD converters 190 are arranged in the area pixel 100 transmit and receive the charge of the plurality of floating diffusions FD via the same signal transmitter 91.

(Twelfth Example of Area Pixel 100)

Figure 48:
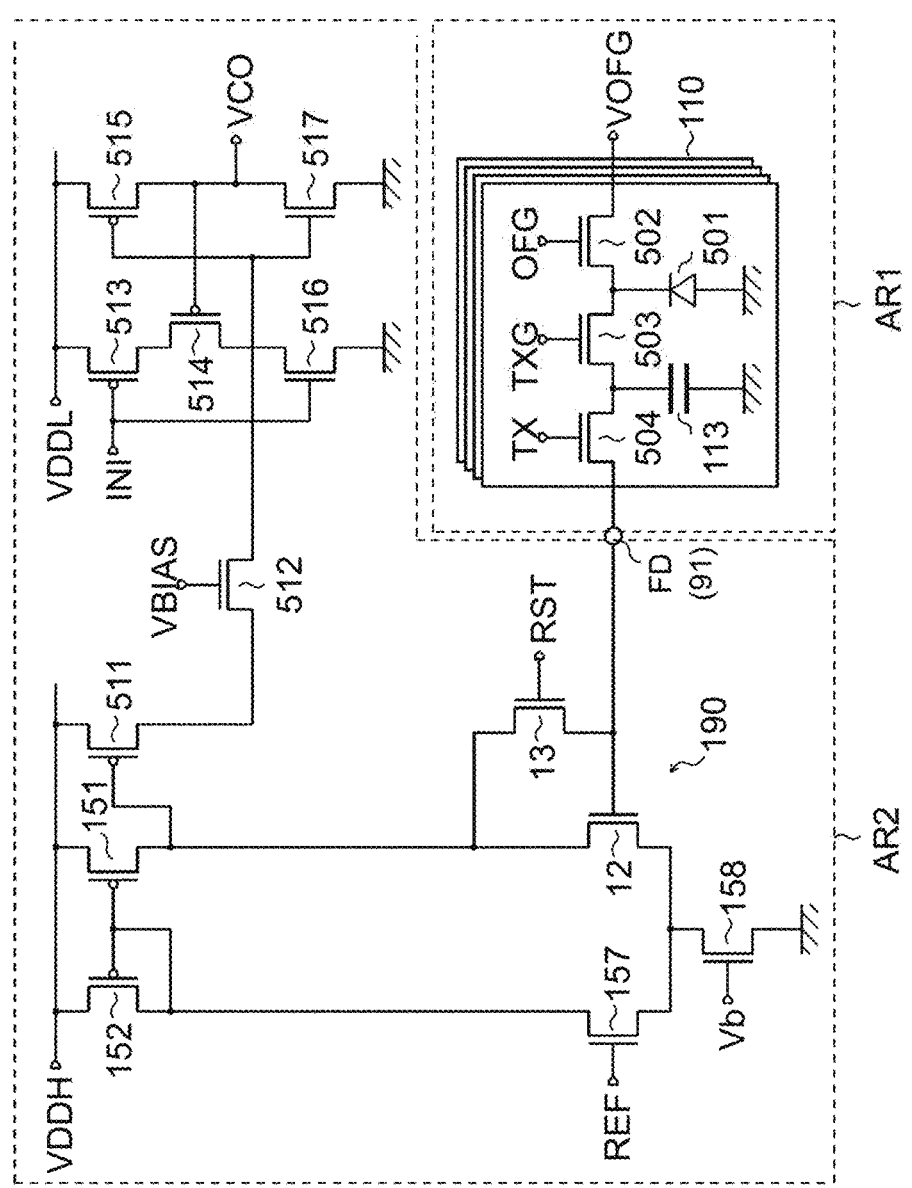
FIG. 48 is a circuit diagram of an area pixel according to the 12th example.
Figure 49:
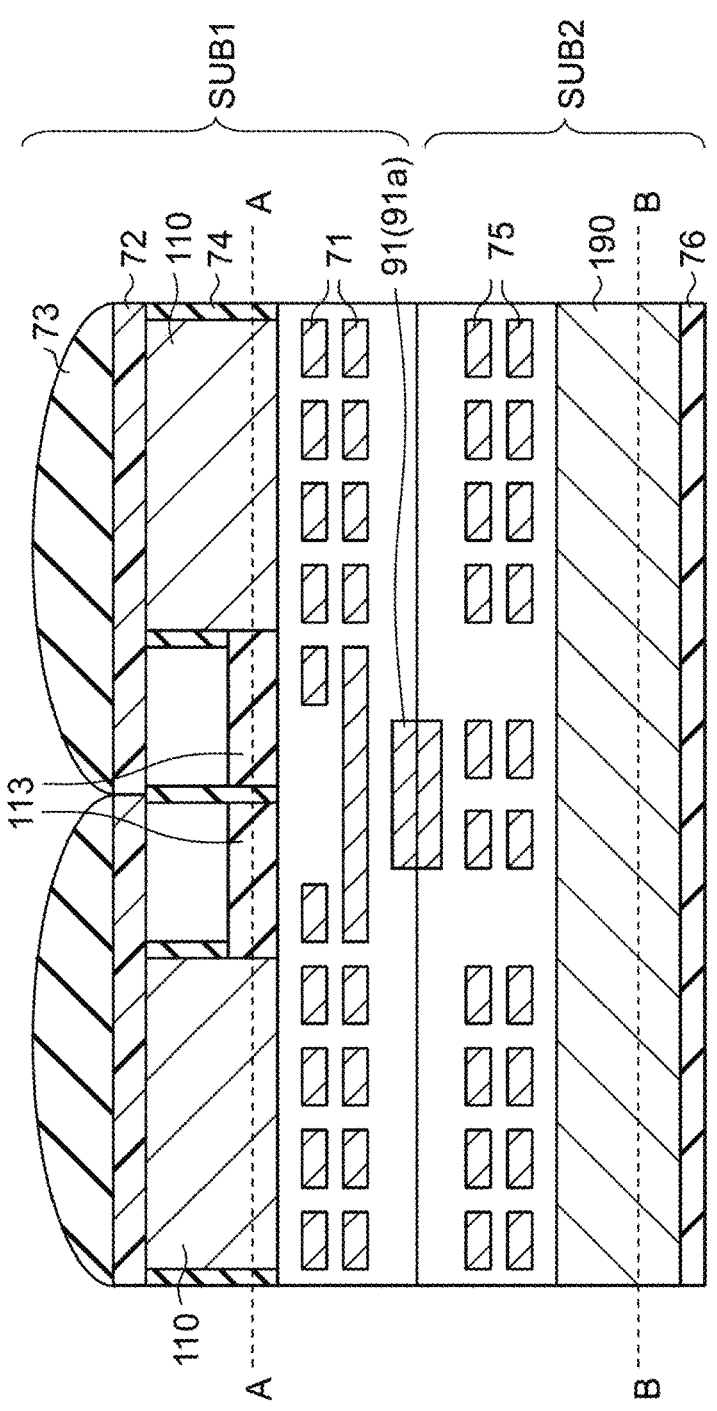
FIG. 49 is a cross-sectional view of an area pixel according to the 12th example.
Figure 50A:
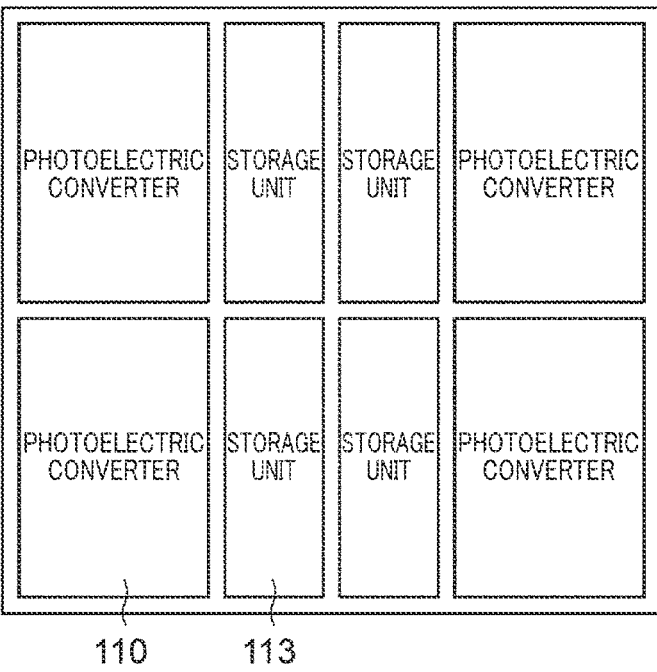
FIG. 50A is a plan view in the direction of line A-A in FIG. 49.
Figure 50B:
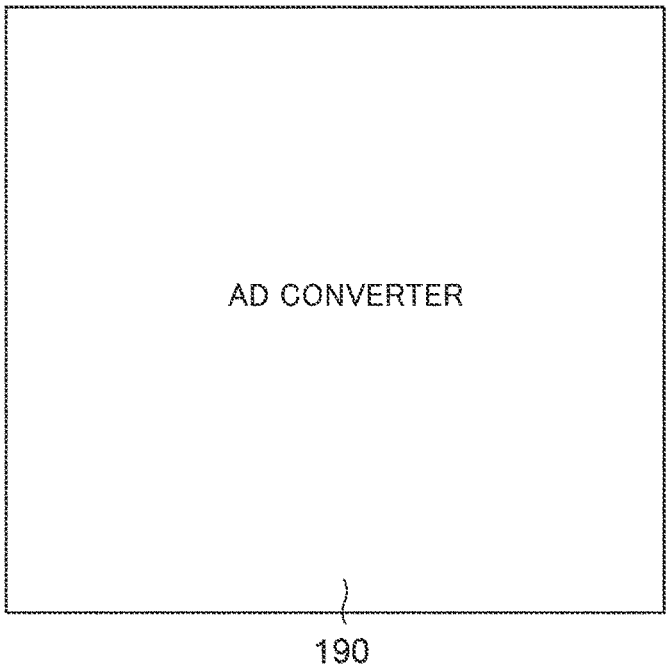
FIG. 50B is a plan view taken along line B-B in FIG. 49.

FIG. 48 is a circuit diagram of the area pixel 100 according to the twelfth example, FIG. 49 is a cross-sectional view of the area pixel 100 according to the twelfth example, FIG. 50A is a plan view taken along line A-A in FIG. 49, and FIG. 50B is a plan view taken along line B-B in FIG. 49. FIGS. 48, 49, 50A and 50B show an example where the area pixel 100 has four pixels. The imaging device 1 having the area pixels 100 according to the twelfth example employs the global shutter method, and the storage unit 113 is connected to the photoelectric converter 110 in each pixel. In this specification and part of the drawings, the photoelectric converter 110 and the storage unit 113 are described as separate units, but the storage unit 113 can also be considered as a component forms a part of the photoelectric converter 110 as illustrated in FIG. 48. The following description focuses on the differences from the area pixel 100 according to the first example.

As illustrated in FIG. 48, the photoelectric converter 110 has a storage unit 113 and a transistor 503 in addition to the configuration of the photoelectric converter 110 illustrated in FIG. 11. The pixel signals photoelectrically converted by the photodiodes 501 are stored in the corresponding storage units 113 at the same timing by turning on the transistors 503 of all the pixels at the same time. The charges corresponding to the pixel signals stored in the storage unit 113 are transferred to the AD converter 190 via the floating diffusion FD and are converted to time codes by sequentially turning on the corresponding transistors 504 according to the read-out timing of each pixel.

The area pixel 100 according to the twelfth example includes a first area AR1 and a second area AR2. A plurality of photoelectric converters 110 and a plurality of storage units 113 made of silicon are arranged in the first area AR1. An AD converter 190 made of silicon is arranged in the second area AR2. The first area AR1 is arranged on the first substrate SUB1, and the second area AR2 is arranged on the second substrate SUB2. The first substrate SUB1 and the second substrate SUB2 transmit and receive the charge of the floating diffusion FD of the photoelectric converter 110 through the signal transmitter 91 composed of Cu—Cu connections 91*a*, for example.

As illustrated in FIG. 48, the floating diffusions FD of the plurality of photoelectric converters 110 within the area pixel 100 are connected to the same signal transmitter 91. Therefore, the first area AR1 and the second area AR2 transmit and receive the charge of the floating diffusions FD of the plurality of photoelectric converters 110 in each area pixel 100 through one signal transmitter 91 for each area pixel 100 in the first area AR1. More specifically, the signal transmitter 91 sequentially transmits the charge of the four floating diffusions FD of the four pixels in the area pixel 100 to the AD converter 190.

As illustrated in FIG. 49, the imaging device 1 includes the first substrate SUB1 and the second substrate SUB2 which are stacked. The first substrate SUB1 and the second substrate SUB2 transmit and receive the charge of the floating diffusion FD through the signal transmitter 91 composed of the Cu—Cu connection 91*a*. A wiring layer 71, a photoelectric converter 110, a storage unit 113, a color filter 72, and an on-chip lens 73 are stacked on the first substrate SUB1. An element isolation layer 74 is arranged between the pixels. A wiring layer 75, an AD converter 190, and a protective layer 76 are stacked on the second substrate SUB2.

In the example of FIG. 49, the photoelectric converter 110 and the storage unit 113 are arranged in the same layer on the first substrate SUB1, and the wiring layer 71 is arranged in the lower layer. The AD converter 190 is arranged below the wiring layer 75 in the second substrate SUB2. The wiring layer 71 of the first substrate SUB1 and the wiring layer 75 of the second substrate SUB2 are arranged to face each other, and various signals are transmitted and received by the signal transmitter 91 composed of the Cu—Cu connection 91*a*.

FIGS. 50A and 50B show a planar layout of one area pixel 100. As illustrated in FIG. 50A, four photoelectric converters 110 and four storage units 113 in four pixels in the area pixel 100 are arranged on the first substrate SUB1. The four photoelectric converters 110 are arranged along the four corners in the area of the area pixel 100, and the four storage units 113 are arranged in the portion sandwiched between the four photoelectric converters 110.

As illustrated in FIG. 50B, the AD converters 190 are arranged over the entire area of the area pixels 100 on the second substrate SUB2.

As described above, in the area pixel 100 according to the twelfth example, since the photoelectric converter 110 and the storage unit 113 are arranged on the first substrate SUB1, and the AD converter 190 is arranged on the second substrate SUB2, the area of the photoelectric converter 110 can be increased, and the aperture ratio and resolution can be increased. In addition, since the first substrate SUB1 transmits the charge of the floating diffusions FD of the plurality of photoelectric converters 110 to the second substrate SUB2 through the same signal transmitter 91, the number of signal transmitters 91 on the first substrate SUB1 and the second substrate SUB2 can be reduced, and the number of wirings on the first substrate SUB1 and the second substrate SUB2 can be reduced accordingly. Further, since the Cu—Cu connection 91*a* is used as the signal transmitter 91, signal propagation loss can be suppressed.

(Thirteenth Example of Area Pixel 100)

Figure 51:
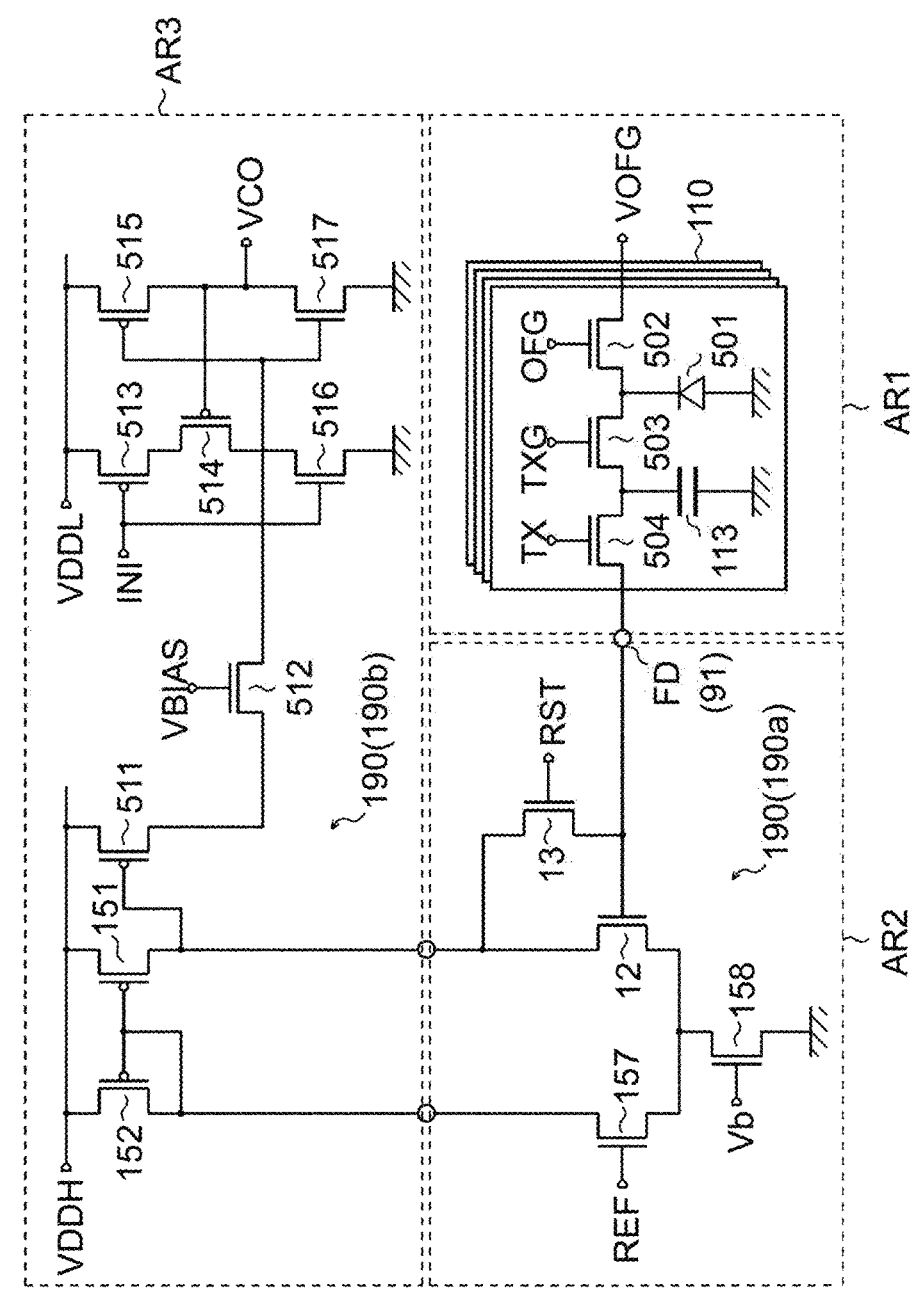
FIG. 51 is a circuit diagram of an area pixel according to the 13th example.
Figure 52:
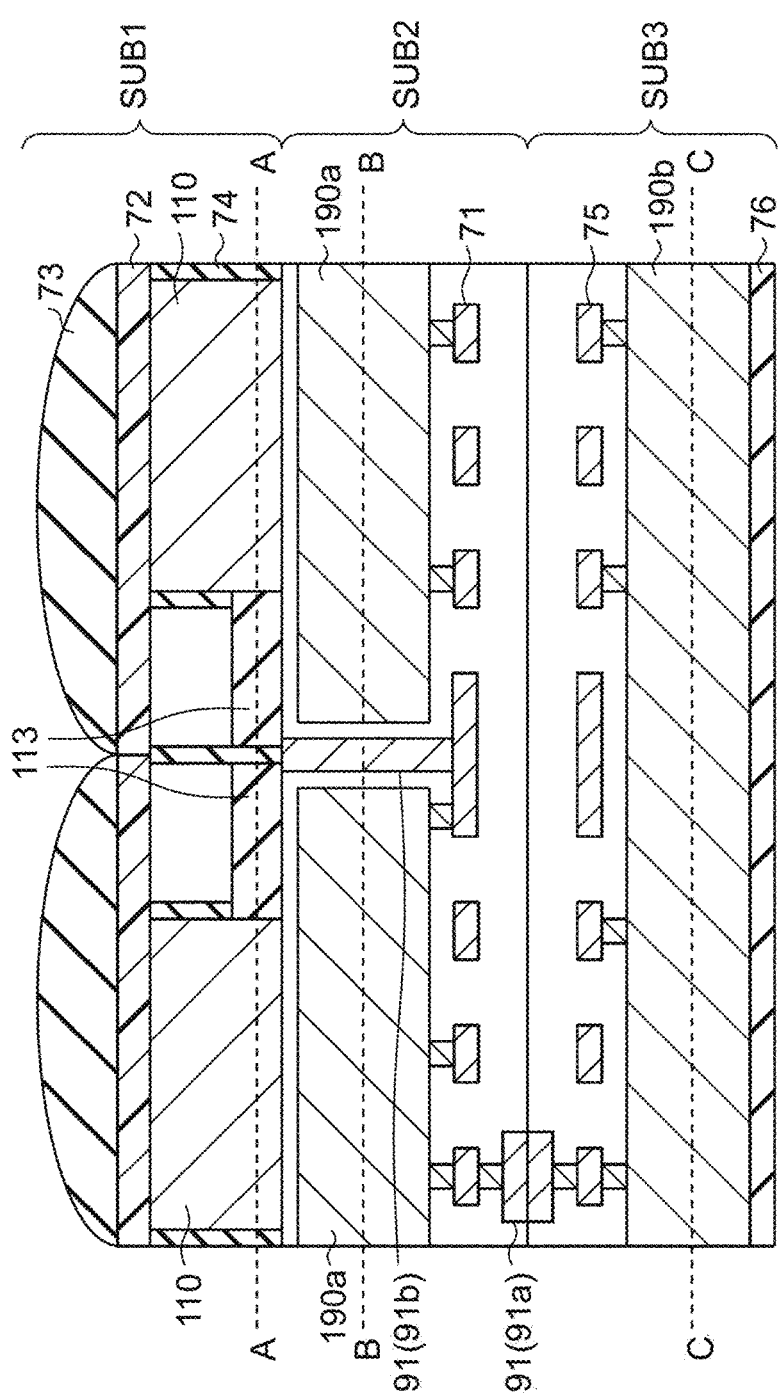
FIG. 52 is a cross-sectional view of an area pixel according to the 13th example.
Figure 53A:
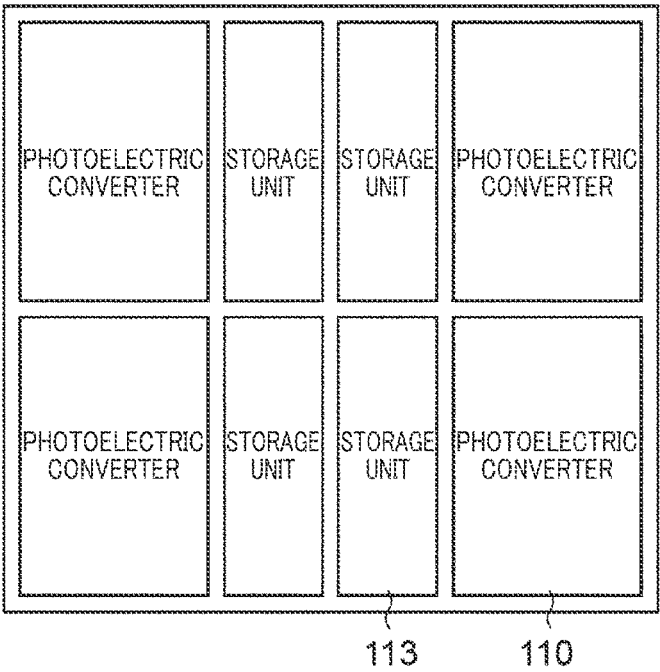
FIG. 53A is a plan view taken along the line A-A in FIG. 52.
Figure 53B:
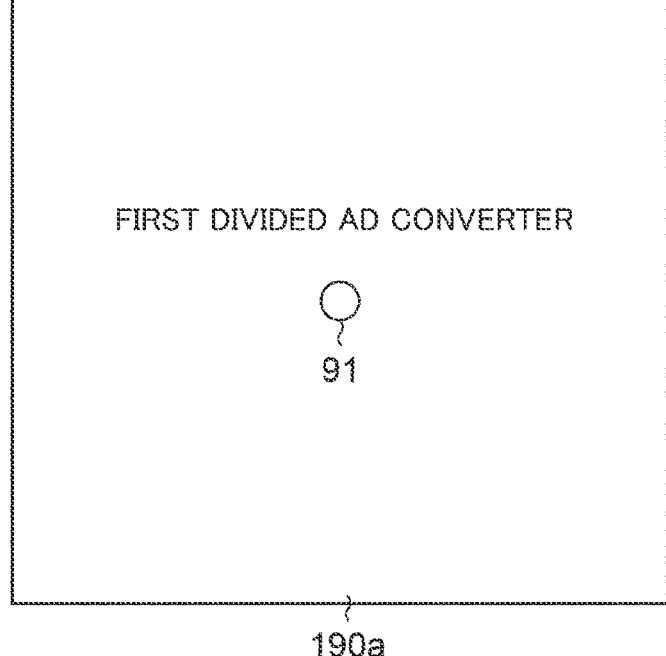
FIG. 53B is a plan view taken along line B-B in FIG. 52.
Figure 53C:
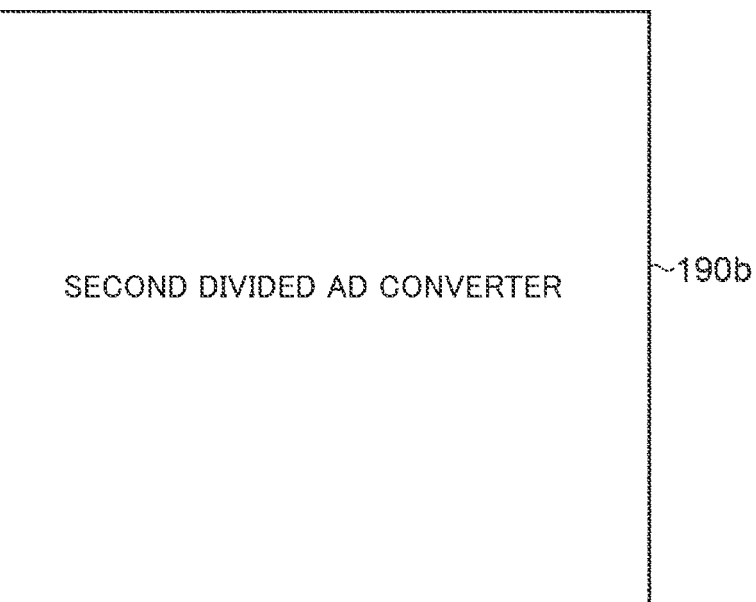
FIG. 53C is a plan view taken along line C-C of FIG. 52.

FIG. 51 is a circuit diagram of the area pixel 100 according to the 13th example, FIG. 52 is a cross-sectional view of the area pixel 100 according to the 13th example, FIG. 53A is a plan view taken along line A-A of FIG. 52, FIG. 53B is a plan view taken along line B-B of FIG. 52, and FIG. 53C is a plan view taken along line C-C of FIG. 52. The following description focuses on the differences from the area pixel 100 according to the twelfth example.

The imaging device 1 having the area pixels 100 according to the 13th example includes, as illustrated in FIG. 52, a first area AR1, a second area AR2 and a third area AR3 which are stacked. A photoelectric converter 110 and a storage unit 113 are arranged in the first area AR1. In the second area AR2 and the third area AR3, the AD converter 190 is divided into two parts, a first divided AD converter 190a and a second divided AD converter 190b.

The first divided AD converter 190a has transistors 12, 13, 157 and 158 in the AD converter 190. The second divided AD converter 190b has the rest of the AD converter 190, specifically transistors 151, 152, and 511 to 517. The first divided AD converter 190a and the second divided AD converter 190b transmit and receive both drain signals of the transistors 12 and 157, which are a differential pair.

The first area AR1 and the second area AR2 sequentially transmit and receive the charge of the four floating diffusions FD in the four pixels through the signal transmitter 91 composed of the vias 91b. The second area AR2 and the third area AR3 transmit and receive drain signals of a differential pair in the AD converter 190 through the signal transmitter 91 composed of Cu—Cu connections 91a. The first area AR1 is arranged on the first substrate SUB1, the second area AR2 is arranged on the second substrate SUB2, and the third area AR3 is arranged on the third substrate SUB3.

The planar layout within the first area AR1 illustrated in FIG. 53A is the same as in FIG. 50A. A first divided AD converter 190a is arranged over the entire second area AR2 illustrated in FIG. 53B. A via for transmitting and receiving the charge of the floating diffusion FD between the first area AR1 and the second area AR2 is arranged in a substantially central portion of the second area AR2. A second divided AD converter 190b is arranged over the entire third area AR3 illustrated in FIG. 53C.

As described above, in the area pixel 100 according to the 13th example, since the AD converter 190 is divided and arranged in the second area AR2 and the third area AR3, the arrangement area of the AD converter 190 can be increased.

Signals are transmitted and received between the second area AR2 and the third area AR3 through the Cu—Cu connection 91a, so signals can be transmitted and received at a high speed. The first area AR1 is arranged on the first substrate SUB1 and the second area AR2 is arranged on the second substrate SUB2, and signals are transmitted and received through the signal transmitter 91 composed of the via 91b. In this way, the arrangement area of the photoelectric converter 110 and the AD converter 190 (190a, 190b) can be increased.

(Fourteenth Example of Area Pixel 100)

Figure 54:
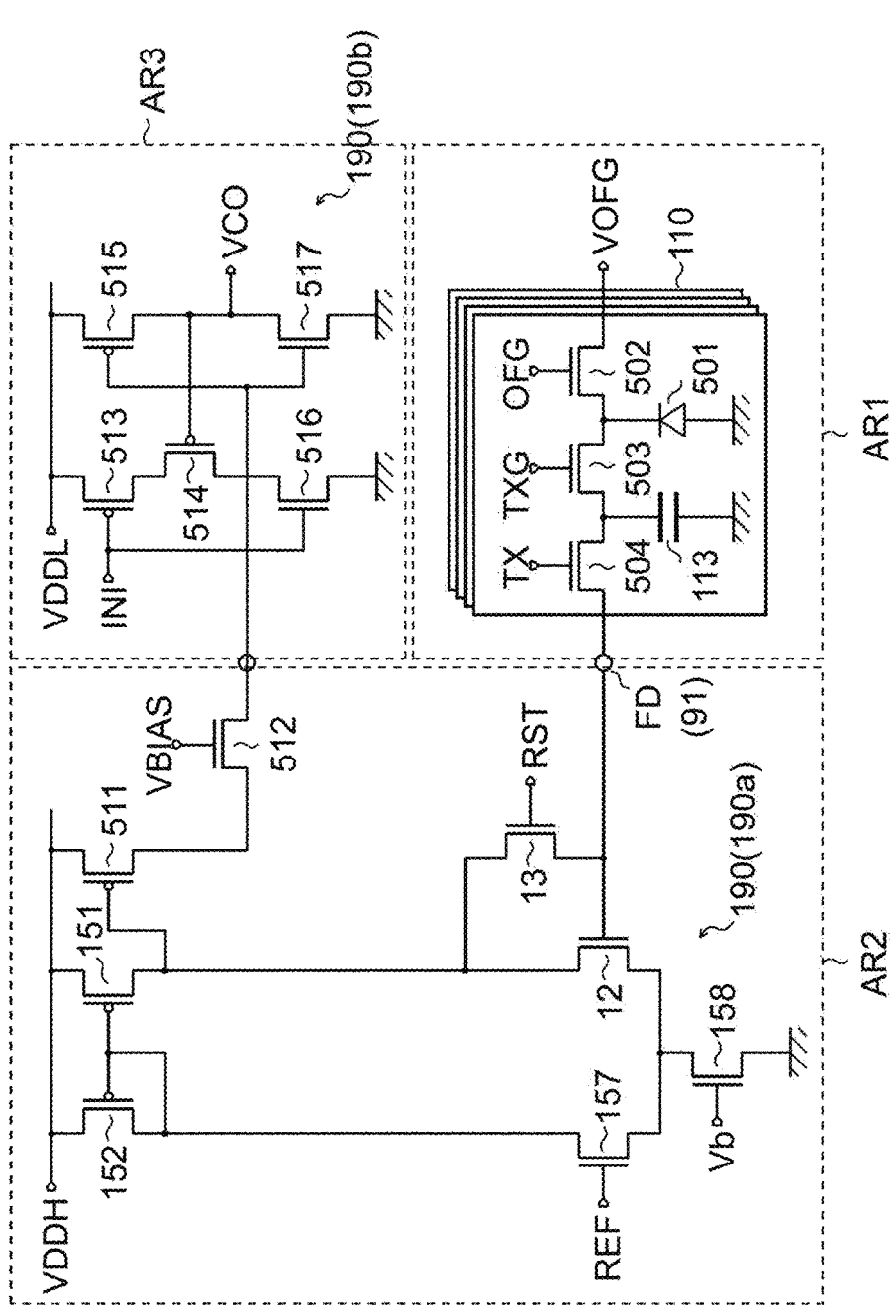
FIG. 54 is a circuit diagram of an area pixel according to the 14th example.
Figure 55:
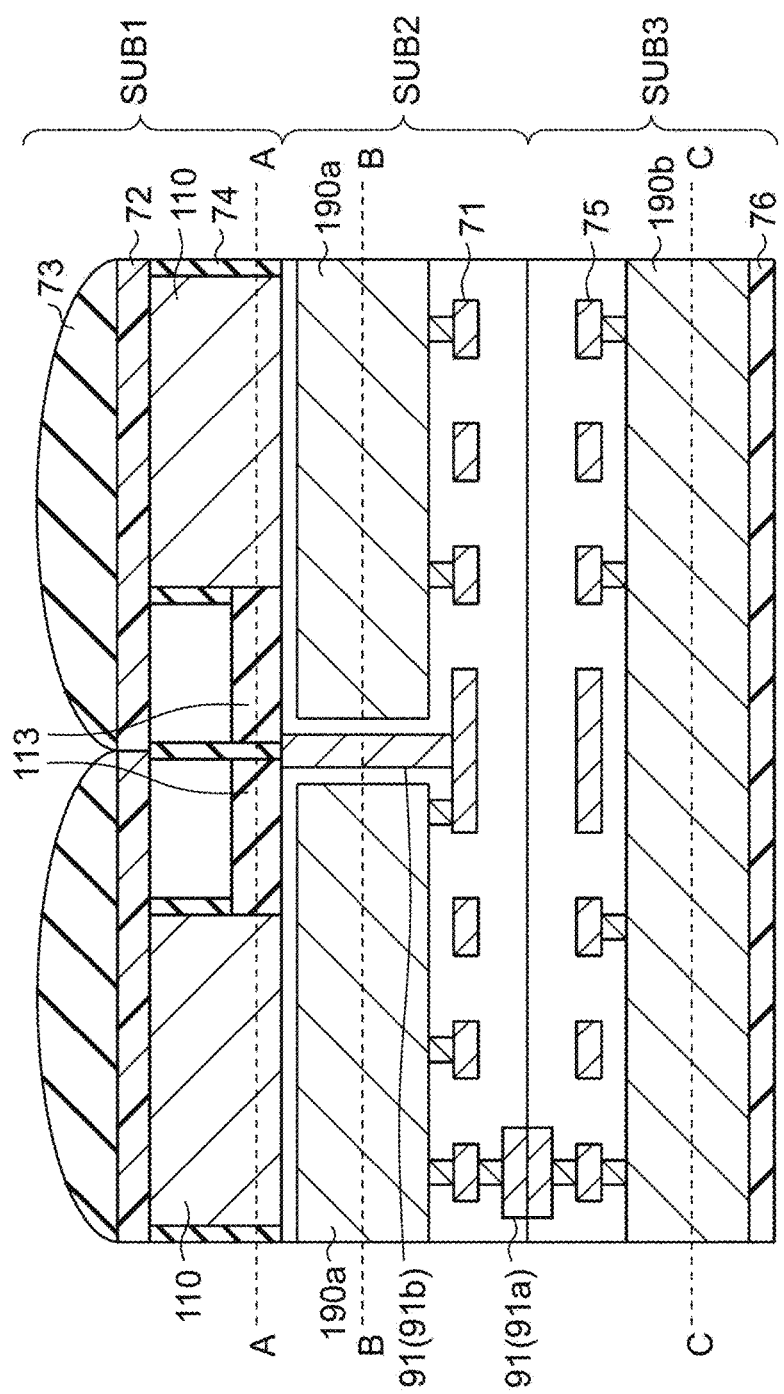
FIG. 55 is a cross-sectional view of an area pixel according to the 14th example.
Figure 56A:
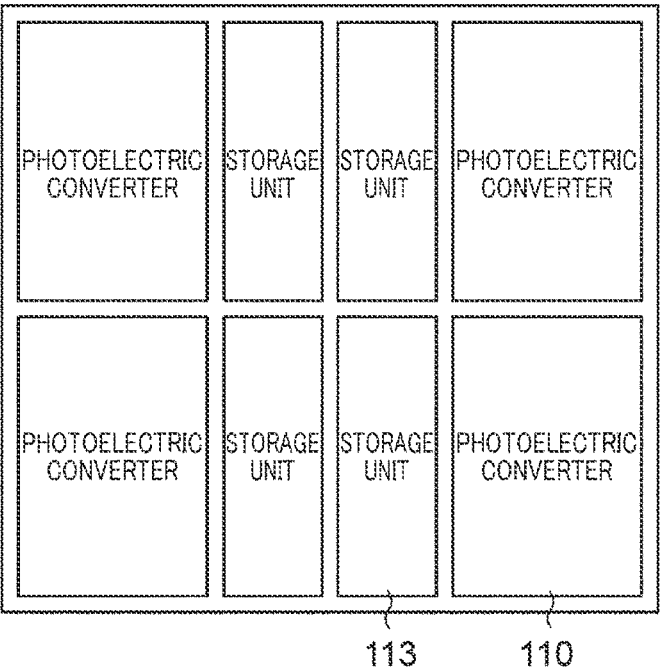
FIG. 56A is a plan view taken along line A-A in FIG. 55.
Figure 56B:
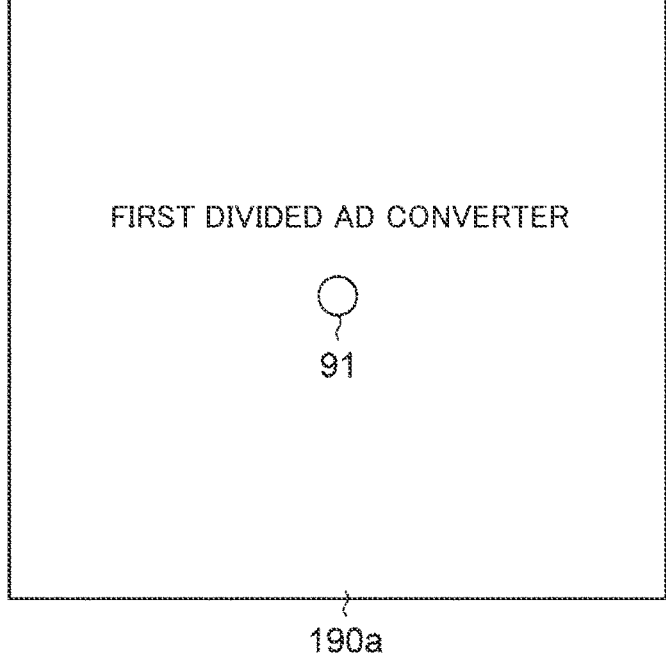
FIG. 56B is a plan view taken along line B-B in FIG. 55.

FIG. 54 is a circuit diagram of the area pixel 100 according to the 14th example, FIG. 55 is a cross-sectional view of the area pixel 100 according to the 14th example, FIG. 56A is a plan view taken along line A-A in FIG. 55, and FIG. 56B is a plan view taken along the line B-B of FIG. 55, and FIG. 56C is a plan view taken along the line C-C of FIG. 55. The following description focuses on the differences from the area pixel 100 according to the 14th example.

The imaging device 1 having the area pixels 100 according to the 14th example includes a first area AR1, a second area AR2 and a third area AR3 which are stacked, as illustrated in FIG. 55. The area pixel 100 according to the 14th example differs from the 13th example in the method of dividing the AD converters 190 arranged in the second area AR2 and the third area AR3.

The first divided AD converter 190a in the 14th example has transistors 12, 13, 151, 152, 157, 158, 511, and 512 in the AD converter 190. The second divided AD converter 190b has transistors 513 to 517 in the AD converter 190. That is, the AD converter 190 is divided at the source node of the transistor 512 that outputs the comparison result signal between the pixel signal and the reference signal. The first divided AD converter 190a and the second divided AD converter 190b transmit and receive the comparison result output signal through the signal transmitter 91 composed of the Cu—Cu connection 91a. The transistor 512 that outputs a comparison result output signal forms a level converter.

The sectional view illustrated in FIG. 55 and the plan views illustrated in FIGS. 56A and 56B of the area pixel 100 according to the 14th example are the same as those of the area pixel 100 according to the 13th example.

(Summary of 12th to 14th Examples of Area Pixel 100)

FIG. 57 is a diagram summarizing the features of the area pixels 100 according to the 12th to 14th examples described above. In the 12th to 14th examples, the back side is the light irradiation surface. The photoelectric converter 110 and the storage unit 113 in the area pixel 100 according to the 12th to 14th examples are arranged in the first area AR1 made of silicon. The AD converter 190 in the area pixel 100 according to the twelfth example is arranged in the second area AR2 made of silicon. The AD converters 190 in the area pixels 100 according to the 13th and 14th examples are divided and arranged in the second area AR2 and the third area AR3 made of silicon. The first area AR1 and the second area AR2 in the area pixel 100 according to the 12th to 14th examples transmit and receive the charge of the floating diffusion FD through the signal transmitter 91. The signal transmitter 91 in the area pixel 100 according to the twelfth example is the Cu—Cu connection 91a. The first area AR1 and the second area AR2 in the imaging device 1 according to the 13th example and the 14th example transmit and receive the charge of the four floating diffusions FD in the four pixels through the signal transmitter 91 composed of the vias 91b for each area pixel 100. The second area AR2 and the third area AR3 in the imaging device 1 according to the 13th example transmit the drain signals of the differential pair in the AD converter 190 through the signal transmitter 91 composed of the Cu—Cu connection 91a for each area pixel 100. The second area AR2 and the third area AR3 in the imaging device 1 according to the 14th example transmit and receive the comparison result output signal in the AD converter 190 through the signal transmitter 91 composed of the Cu—Cu connection 91a for each area pixel 100.

(Fifteenth Example of Area Pixel 100)

Figure 58:
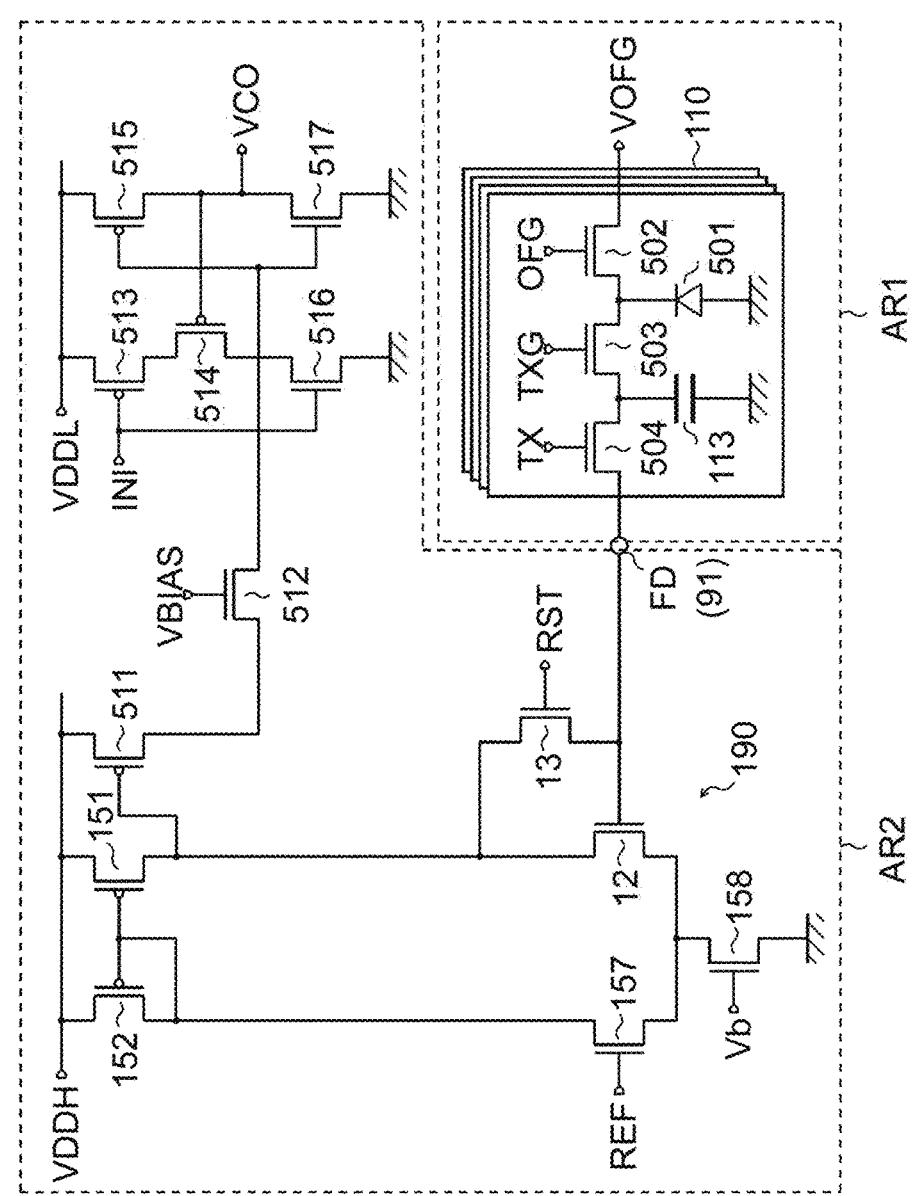
FIG. 58 is a circuit diagram of an area pixel according to the 15th example.
Figure 59:
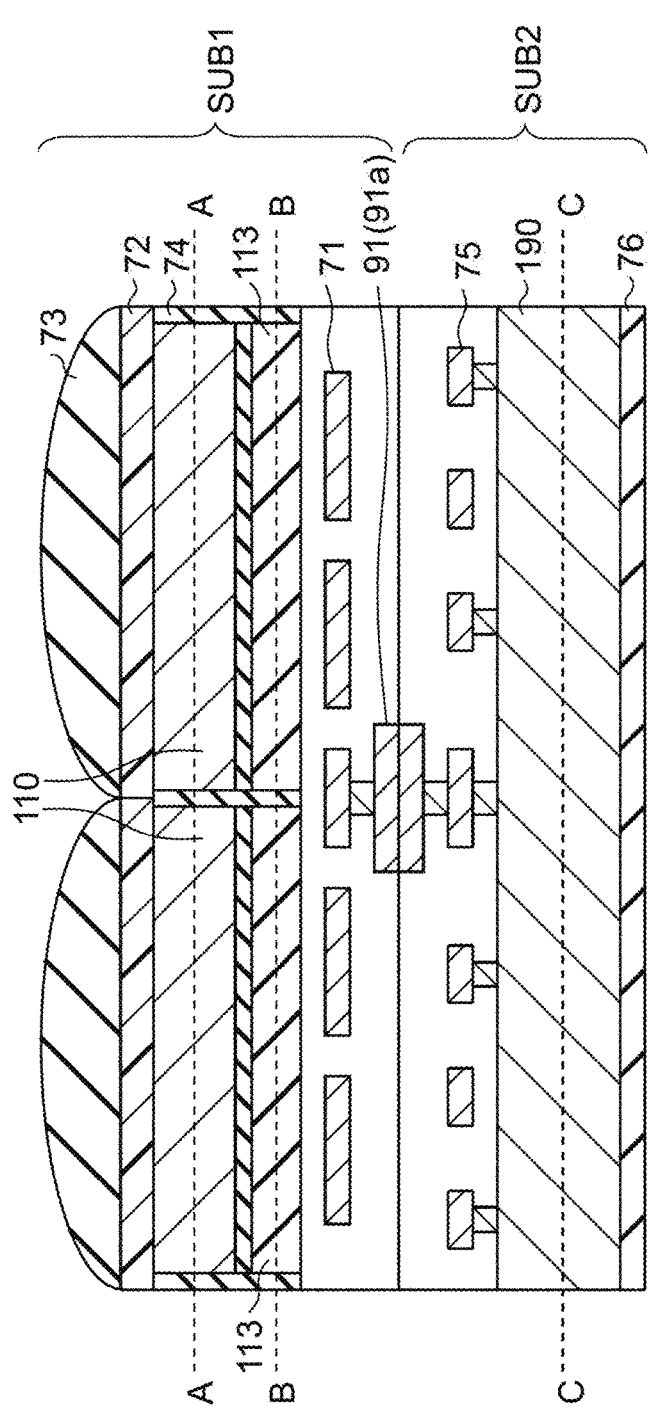
FIG. 59 is a cross-sectional view of an area pixel according to the 15th example.
Figure 60A:
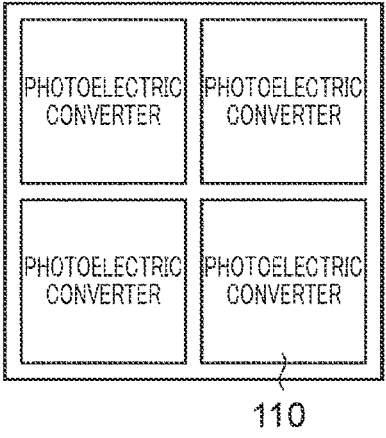
FIG. 60A is a plan view taken along line A-A in FIG. 59.
Figure 60B:
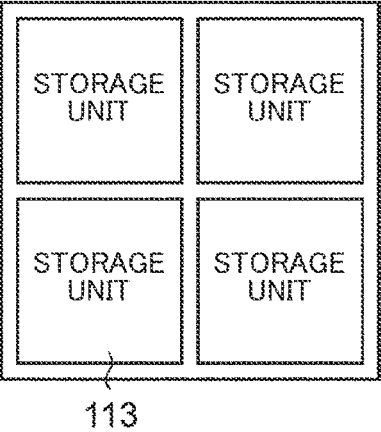
FIG. 60B is a plan view taken along line B-B in FIG. 59.
Figure 60C:
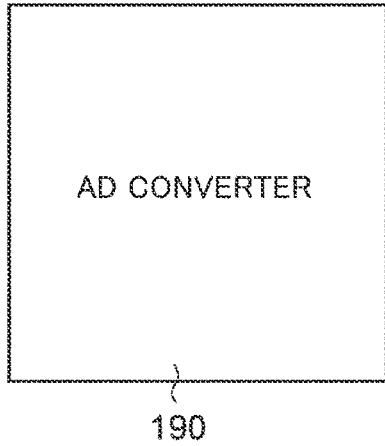
FIG. 60C is a plan view taken along line C-C of FIG. 59.

FIG. 58 is a circuit diagram of the area pixel 100 according to the 15th example, FIG. 59 is a cross-sectional view of the area pixel 100 according to the 15th example, FIG. 60A is a plan view taken along line A-A in FIG. 59, and FIG. 60B is a plan view taken along line B-B of FIG. 59, and FIG. 60C is a plan view taken along line C-C of FIG. 59. FIGS. 58, 59, 60A, 60B and 60C show examples where the area pixel 100 has four pixels.

The imaging device 1 having the area pixels 100 according to the 15th example includes a first area AR1 and a second area AR2 that are stacked as illustrated in FIGS. 58 and 59. The first area AR1 is the first substrate SUB1 made of silicon, and the second area AR2 is the second substrate SUB2 made of silicon. A photoelectric converter 110, a storage unit 113, and a wiring layer are stacked in the first area AR1. A wiring layer and an AD converter 190 are stacked in the second area AR2.

As illustrated in FIGS. 60A and 60B, the photoelectric converter 110 and the storage unit 113 are arranged over the entire areas of different layers in the first area AR1. As a result, the arrangement area of the photoelectric converter 110 and the storage unit 113 can be increased as compared with the 12th to 14th examples. In addition, the AD converter 190 is arranged over the entire layer different from the wiring layer of the second area AR2.

The first area AR1 and the second area AR2 transmit and receive the charge of the floating diffusion FD through the signal transmitter 91 composed of the Cu—Cu connection 91a.

As described above, in the area pixel 100 according to the 15th example, since the storage unit 113 is arranged in a layer different from that of the photoelectric converter 110, the area of the storage unit 113 and the photoelectric converter 110 can be increased, the aperture ratio of the photoelectric converter 110 can be increased, and the storage capacity of the storage unit 113 can be increased. Further, miniaturization is also possible.

(Sixteenth Example of Area Pixel 100)

Figure 61:
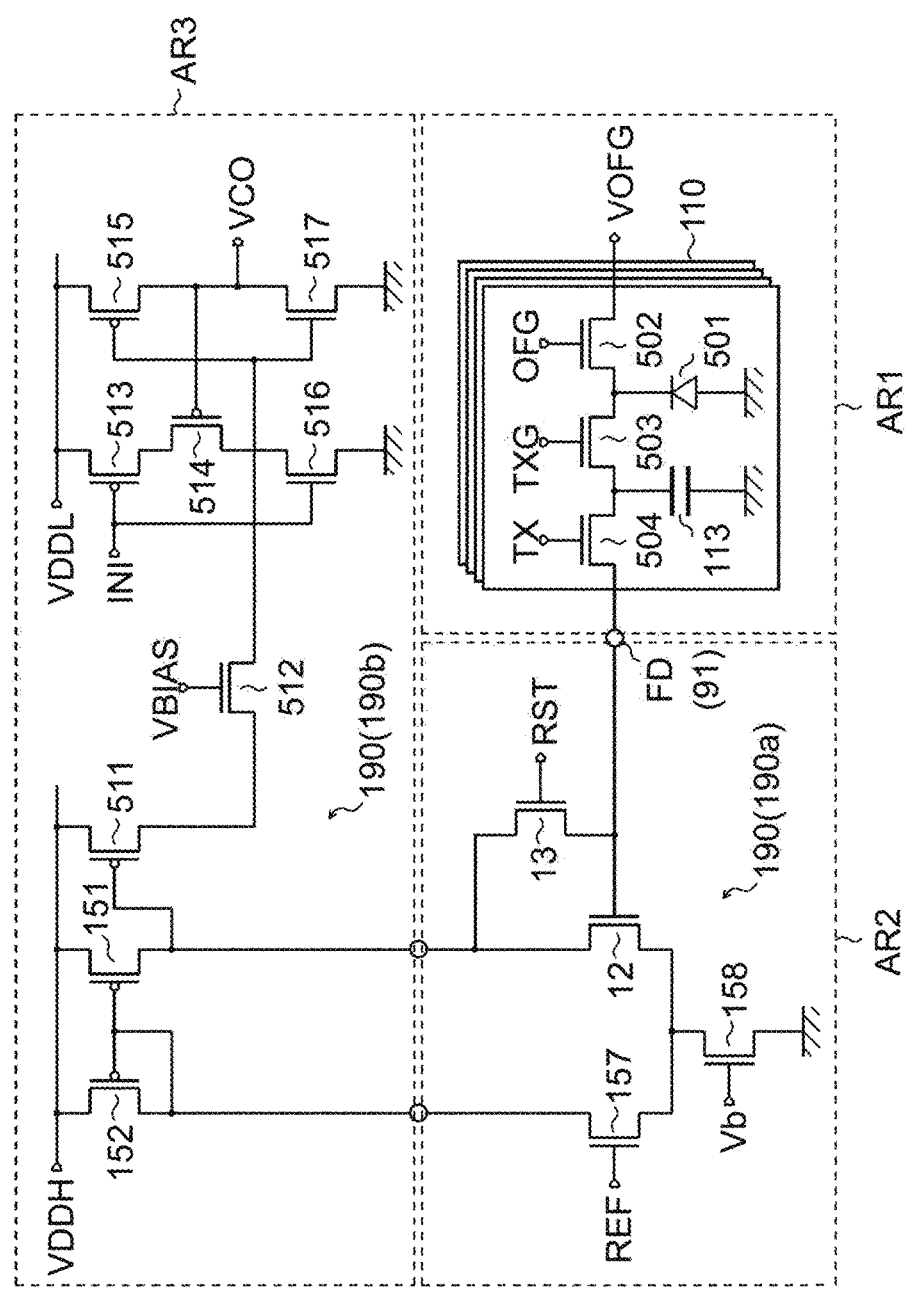
FIG. 61 is a circuit diagram of an area pixel according to the 16th example.
Figure 62:
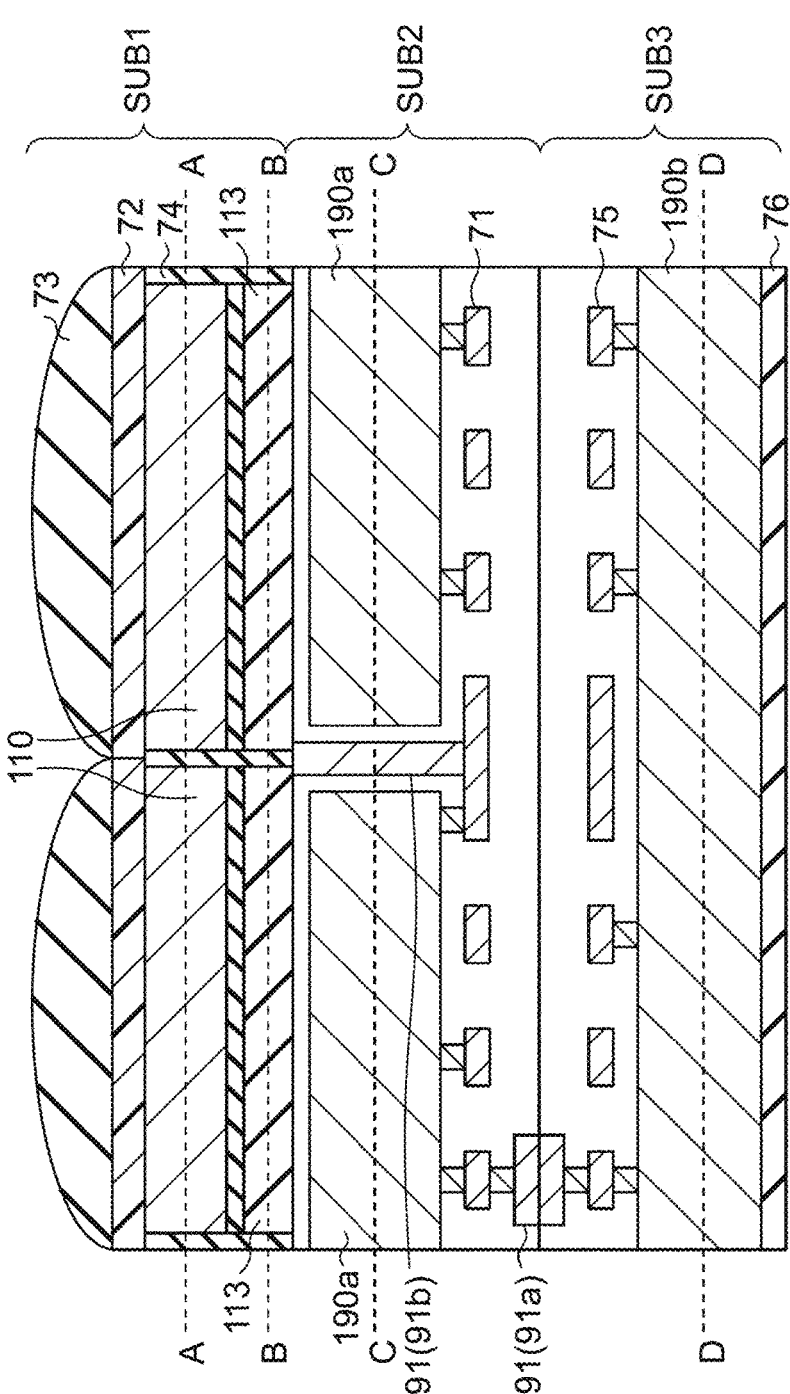
FIG. 62 is a cross-sectional view of an area pixel according to the 16th example.
Figure 63A:
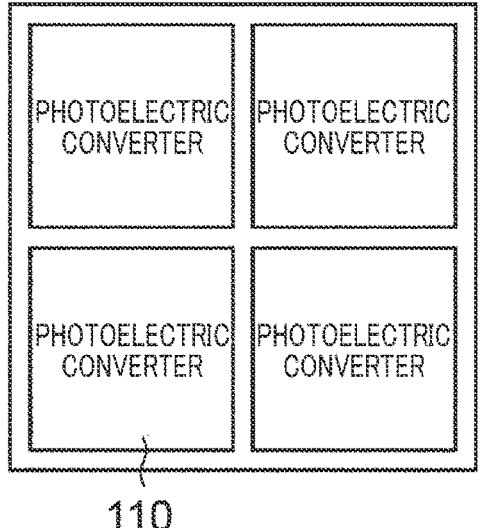
FIG. 63A is a plan view taken along the line A-A in FIG. 62.
Figure 63B:
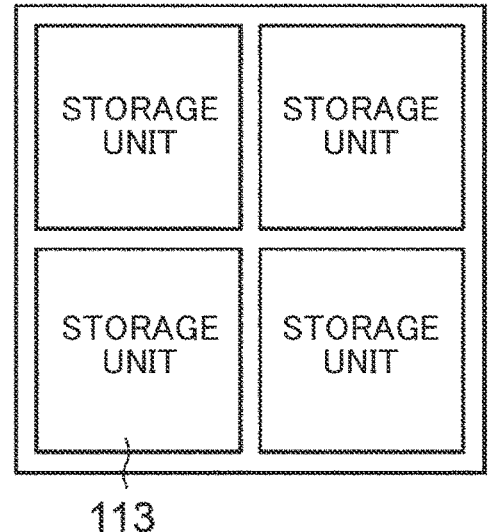
FIG. 63B is a plan view taken along line B-B in FIG. 62.
Figure 63C:
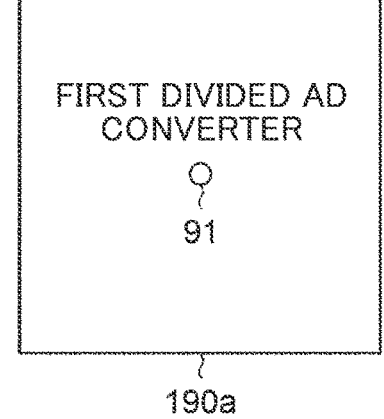
FIG. 63C is a plan view taken along line C-C of FIG. 62.
Figure 63D:
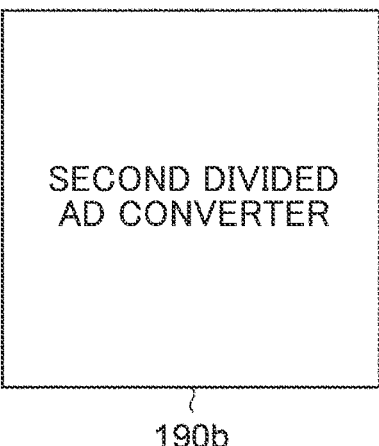
FIG. 63D is a plan view taken along line D-D in FIG. 62.

FIG. 61 is a circuit diagram of the area pixel 100 according to the 16th example, FIG. 62 is a cross-sectional view of the area pixel 100 according to the 16th example, FIG. 63A is a plan view taken along the line A-A of FIG. 62, FIG. 63B is a plan view taken along the line B-B of FIG. 62, FIG. 63C is a plan view taken along the line C-C of FIG. 62, and FIG. 63D is a plan view taken along the line D-D of FIG. 62. The following description focuses on the differences from the area pixels 100 according to the 13th example and the 15th example.

The imaging device 1 having the area pixels 100 according to the 16th example includes a first area AR1, a second area AR2 and a third area AR3 which are stacked as illustrated in FIGS. 61 and 62. A photoelectric converter 110 and a storage unit 113 are stacked in the first area AR1. The AD converter 190 is divided into a first divided AD converter 190a and a second divided AD converter 190b as in FIG. 51. The first divided AD converter 190a is arranged in the second area AR2, and the second divided AD converter 190b is arranged in the third area AR3.

The area pixel 100 according to the 16th example is the same as the area pixel 100 according to the 13th example, except that the layer configuration of the first area AR1 is different.

(Seventeenth Example of Area Pixel 100)

Figure 64:
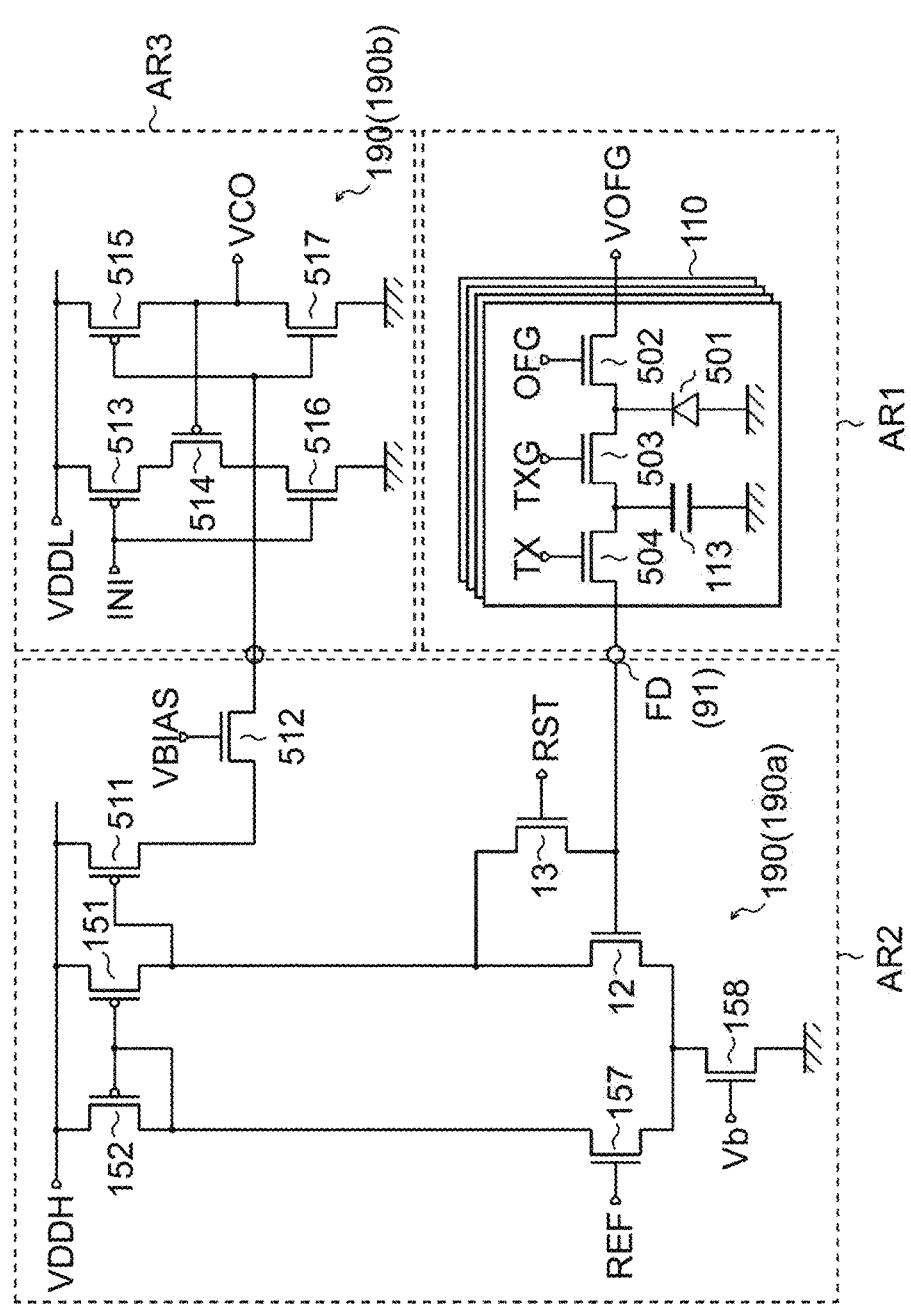
FIG. 64 is a circuit diagram of an area pixel according to the 17th example.
Figure 65:
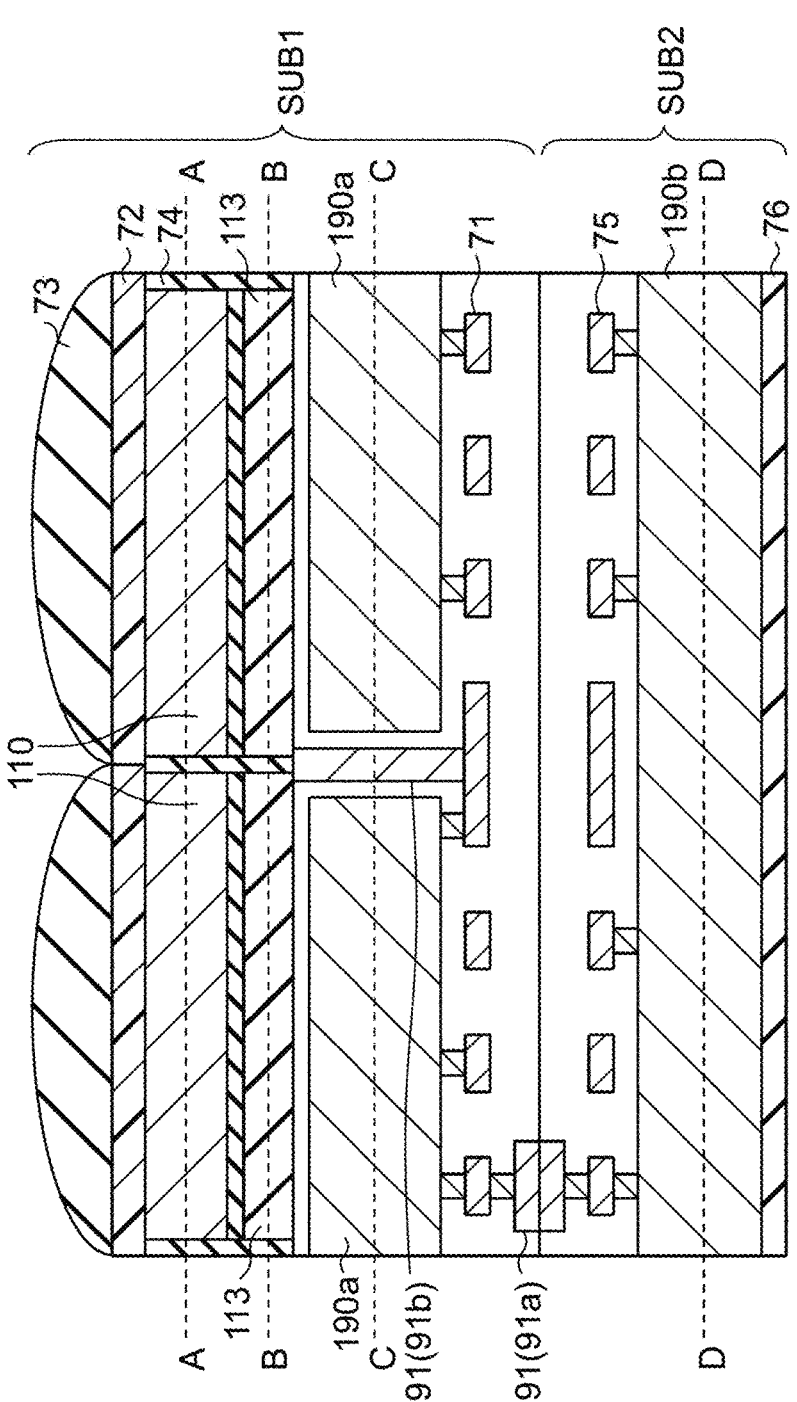
FIG. 65 is a cross-sectional view of an area pixel according to the 17th example.
Figure 66A:
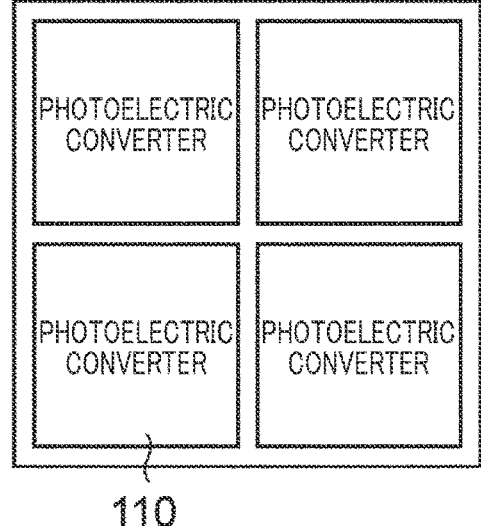
FIG. 66A is a plan view taken along line A-A in FIG. 65.
Figure 66B:
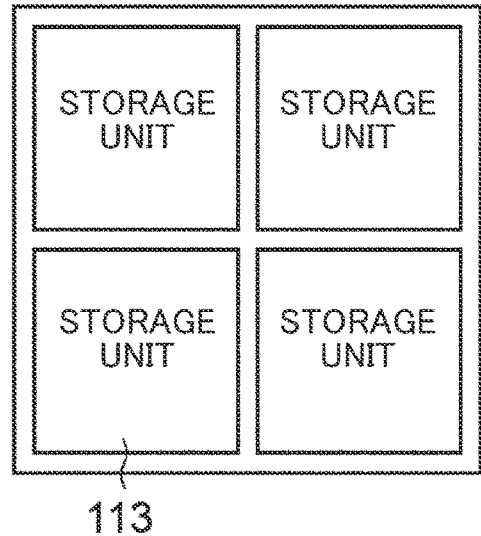
FIG. 66B is a plan view taken along line B-B in FIG. 65.
Figure 66C:
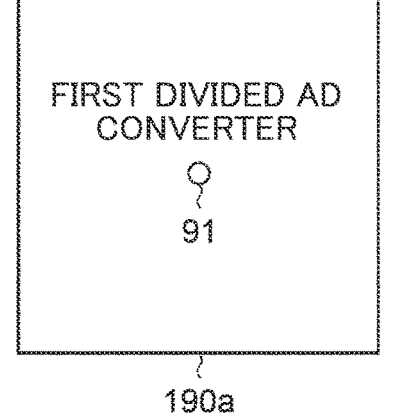
FIG. 66C is a plan view taken along line C-C of FIG. 65.

FIG. 64 is a circuit diagram of the area pixel 100 according to the 17th example, FIG. 65 is a cross-sectional view of the area pixel 100 according to the 17th example, FIG. 66A is a plan view taken along line A-A of FIG. 65, FIG. 66B is a plan view taken along line B-B of FIG. 65, FIG. 66C is a plan view taken along line C-C of FIG. 65, and FIG. 66D is a plan view taken along line D-D of FIG. 65. The following description focuses on the differences from the area pixels 100 according to the 14th example and the 16th example.

The imaging device 1 having the area pixels 100 according to the 17th example includes a first area AR1, a second area AR2 and a third area AR3 which are stacked as illustrated in FIGS. 64 and 65. A photoelectric converter 110 and a storage unit 113 are stacked in the first area AR1. The AD converter 190 is divided into a first divided AD converter 190a and a second divided AD converter 190b as in FIG. 56. The first divided AD converter 190a is arranged in the second area AR2, and the second divided AD converter 190b is arranged in the third area AR3.

The area pixel 100 according to the 17th example is the same as the area pixel 100 according to the 14th example, except that the layer configuration of the first area AR1 is different.

(Summary of 15th to 17th Examples of Area Pixel 100)

FIG. 67 is a diagram summarizing the features of the area pixels 100 according to the 15th to 17th examples described above. In the 15th to 17th examples, the back side is the light irradiation surface. The photoelectric converter 110 and the storage unit 113 in the area pixel 100 according to the 15th to 17th examples are stacked and arranged in the first area AR1 made of silicon. The AD converter 190 in the area pixel 100 according to the 15th example is arranged in the second area AR2 made of silicon. The AD converters 190 in the area pixels 100 according to the 16th and 17th examples are divided and arranged in the second area AR2 and the third area AR3 made of silicon. The first area AR1 and the second area AR2 in the area pixel 100 according to the 15th to 17th examples transmit and receive the charge of the floating diffusion FD through the signal transmitter 91. The signal transmitter 91 in the area pixel 100 according to the 15th example is the Cu—Cu connection 91a. The first area AR1 and the second area AR2 in the area pixel 100 according to the 16th and 17th examples transmit and receive the charge of the floating diffusion FD through the signal transmitter 91 composed of the via 91b. The second area AR2 and the third area AR3 in the area pixel 100 according to the 16th example transmit and receive the drain signals of the differential pair in the AD converter 190 through the signal transmitter 91 composed of the Cu—Cu connection 91a. The second area AR2 and the third area AR3 in the area pixel 100 according to the 17th example transmit and receive the comparison result output signal in the AD converter 190 through the signal transmitter 91 composed of the Cu—Cu connection 91a.

(Eighteenth Example of Area Pixel 100)

Figure 68:
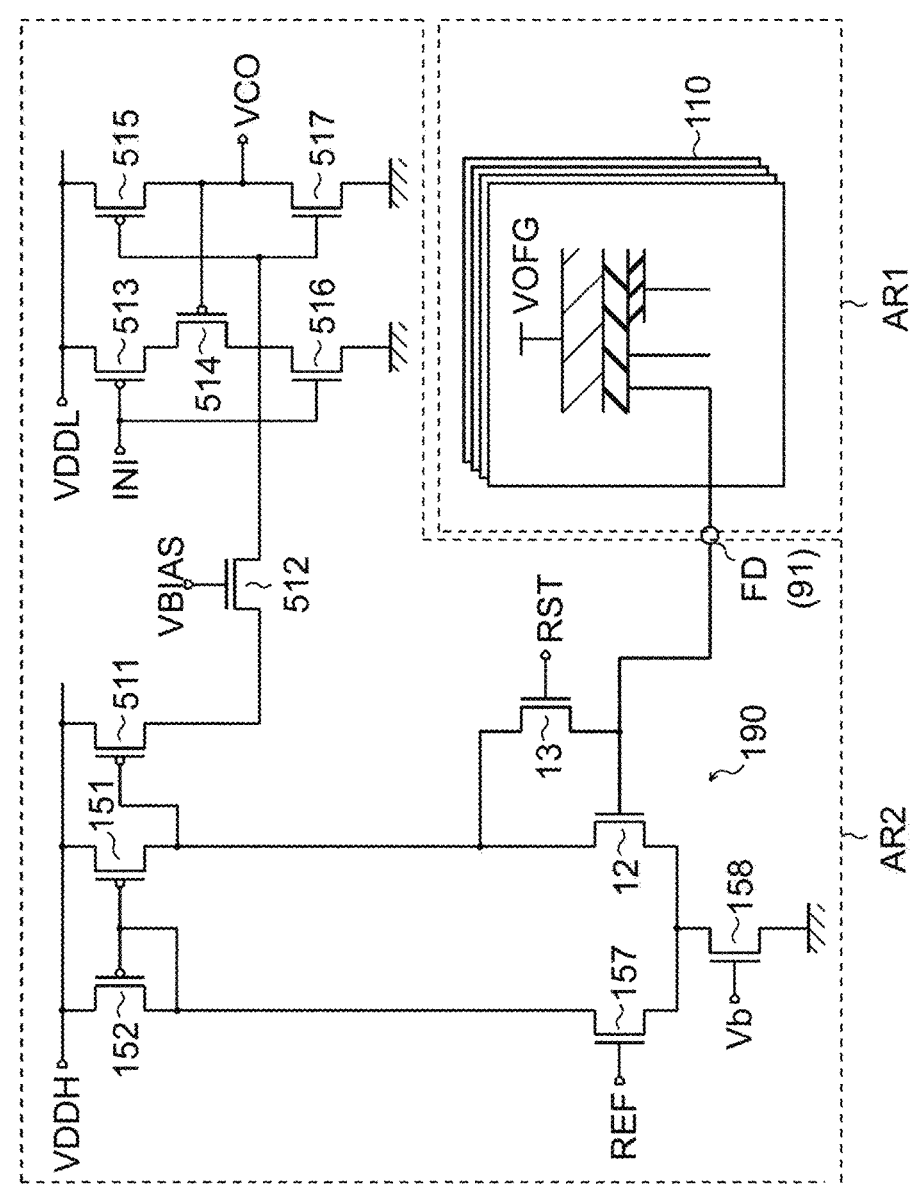
FIG. 68 is a circuit diagram of an area pixel according to the 18th example.
Figure 69:
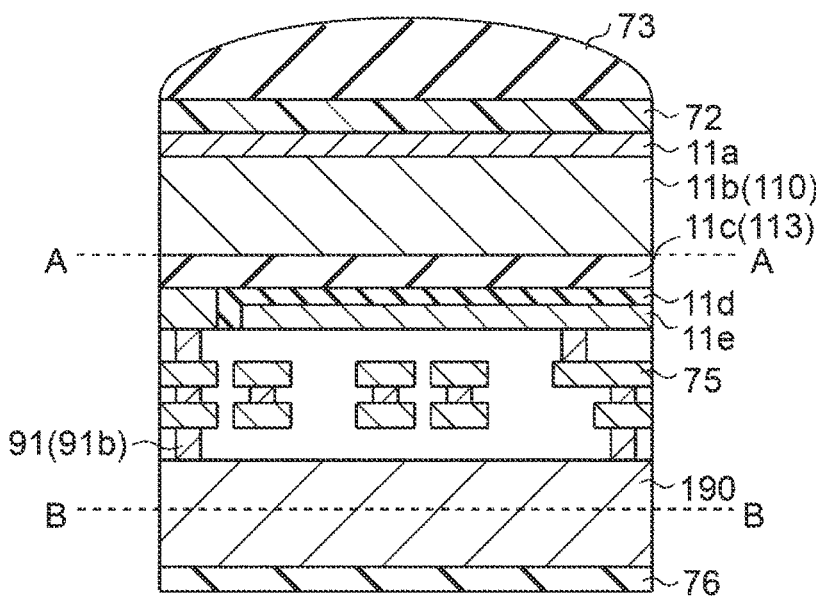
FIG. 69 is a cross-sectional view of an area pixel according to the 18th example.
Figure 70A:
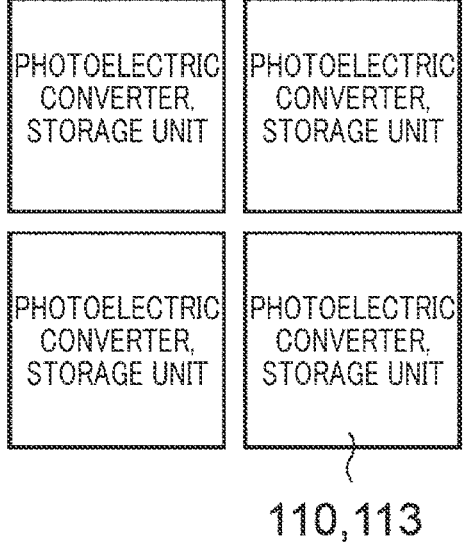
FIG. 70A is a plan view taken along line A-A in FIG. 69.
Figure 70B:
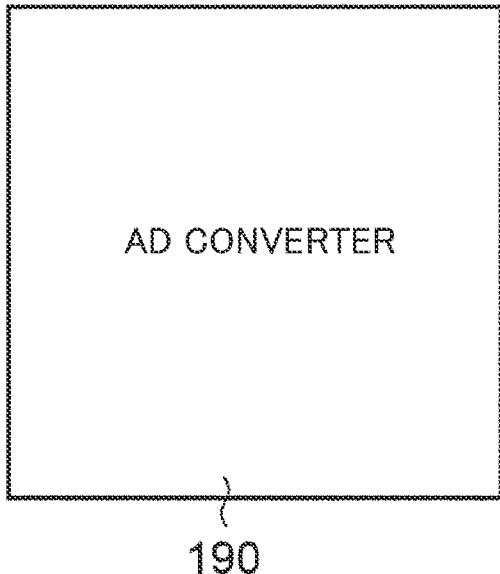
FIG. 70B is a plan view taken along line B-B in FIG. 69.

FIG. 68 is a circuit diagram of the area pixel 100 according to the 18th example, FIG. 69 is a cross-sectional view of the area pixel 100 according to the 18th example, FIG. 70A is a plan view taken along line A-A in FIG. 69, and FIG. 70B is a plan view taken along line B-B in FIG. 69. FIGS. 68, 69, 70A and 70B show an example where the area pixel 100 has four pixels.

The area pixel 100 according to the 18th example has a photoelectric converter 110 made of a material other than silicon. Materials other than silicon are, for example, organic semiconductor materials. Thus, the photoelectric converter 110 of the 18th example has semiconductor layers containing materials other than silicon. More specifically, the photoelectric converter 110 of the 18th example has a structure in which an upper electrode layer 11a, a photoelectric conversion layer 11b, a charge storage layer 11c, an insulating layer 11d, and a lower electrode layer 11e are stacked. The charge storage layer 11c functions as the storage unit 113.

The imaging device 1 having the area pixels 100 according to the 18th example includes a first area AR1 and a second area AR2 that are stacked as illustrated in FIGS. 68 and 69. The first area AR1 and the second area AR2 are arranged in different layers on the same substrate. In the first area AR1, the photoelectric converter 110 and the storage unit 113 are arranged in different layers. Each layer in which the photoelectric converter 110 and the storage unit 113 are arranged is a semiconductor layer made of a material other than silicon. More specifically, in the first area AR1, a photoelectric conversion layer 11*b* and a charge storage layer 11*c* made of a material other than silicon, and an insulating layer 11*d* are stacked.

In the second area AR2, the wiring layer 75 and the AD converter 190 are arranged in different layers. The layer in which the AD converter 190 is arranged is a semiconductor layer made of silicon.

FIG. 70A is a plan view near the boundary between the photoelectric converter 110 and the storage unit 113. As described above, the photoelectric converter 110 and the storage unit 113 are arranged in different layers, but part of at least one of the photoelectric converter 110 and the storage unit 113 may be arranged across two layers.

The first area AR1 and the second area AR2 transmit and receive the charge of the floating diffusion FD through the signal transmitter 91 composed of the via 91*b*.

In the imaging device 1 having the area pixels 100 according to the 18th example, a semiconductor layer made of silicon is arranged on a support substrate in a pre-process to sequentially form an AD converter 190 and a wiring layer. In a post-process, a non-silicon semiconductor layer is formed to sequentially form the storage unit 113 and the photoelectric converter 110.

In this way, the area pixel 100 according to the 18th example has a structure in which the AD converter 190 made of silicon and the storage unit 113 and the photoelectric converter 110 made of a material other than silicon are stacked on the same substrate. Since the photoelectric converter 110 and the AD converter 190 transmit and receive the charge of the floating diffusion FD through the signal transmitter 91 including the vias 91*b*, the number of vias can be reduced, and the area of the photoelectric converter 110 and the AD converter 190 can be increased accordingly.

(Nineteenth Example of Area Pixel 100)

Figure 71:
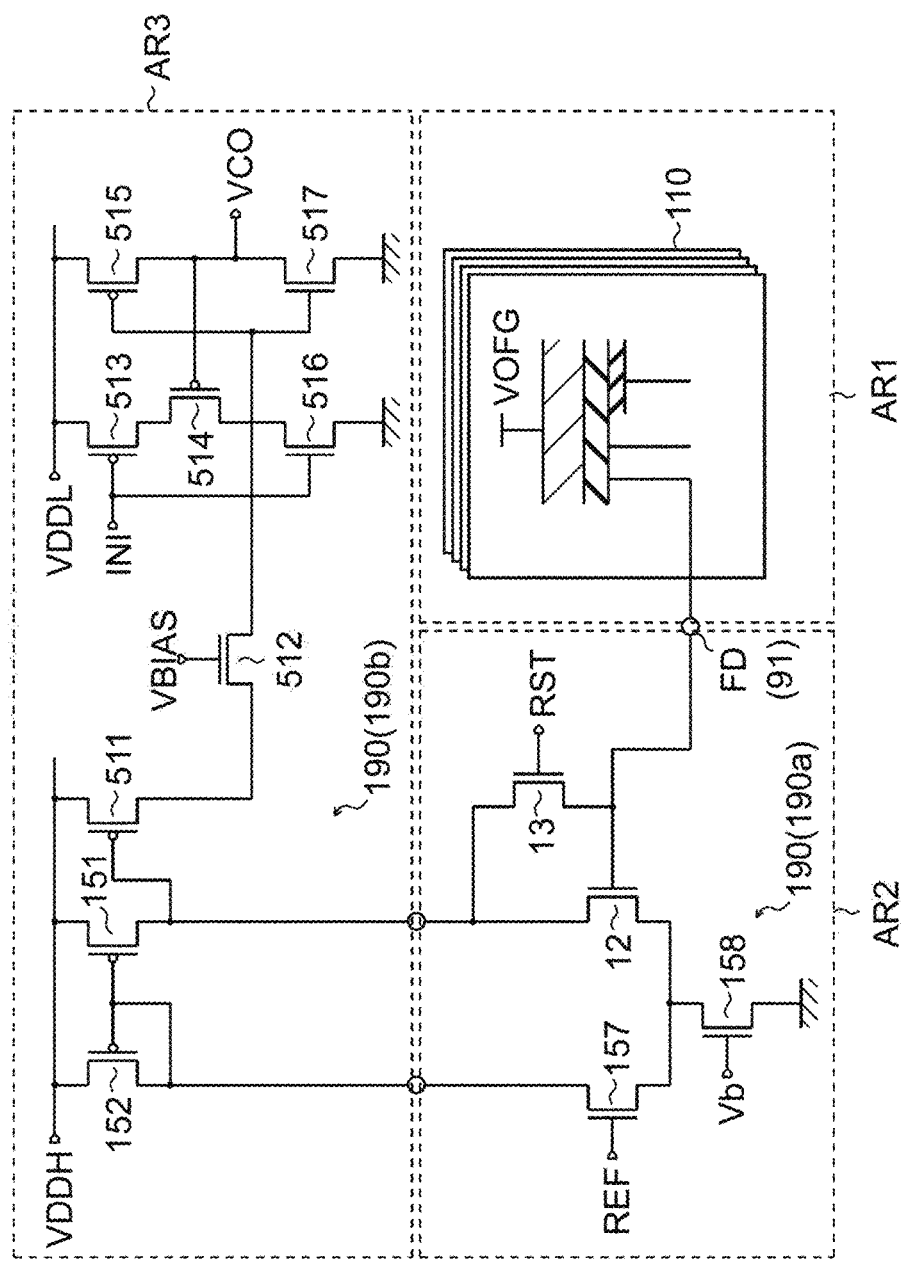
FIG. 71 is a circuit diagram of an area pixel according to the 19th example.
Figure 72:
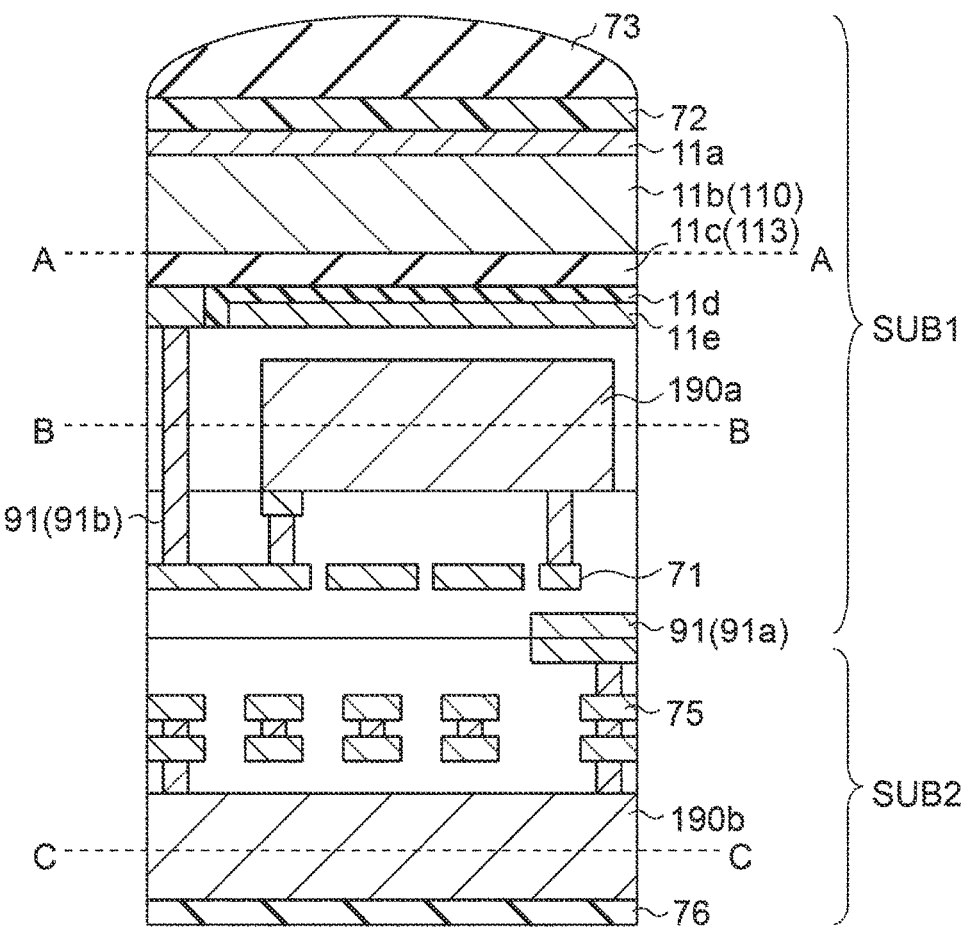
FIG. 72 is a cross-sectional view of an area pixel according to the 19th example.
Figure 73A:
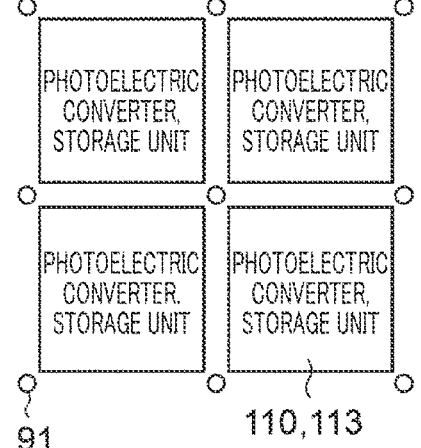
FIG. 73A is a plan view in the direction of line A-A in FIG. 72.
Figure 73B:
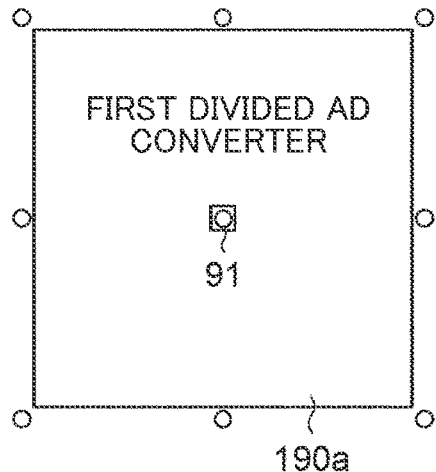
FIG. 73B is a plan view taken along line B-B in FIG. 72.
Figure 73C:
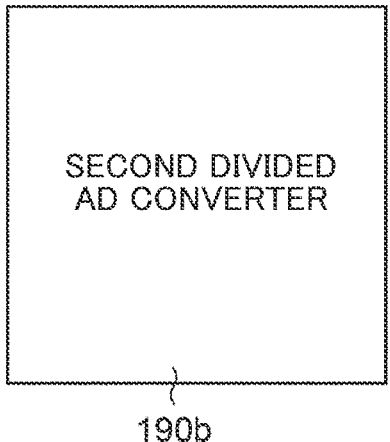
FIG. 73C is a plan view taken along line C-C of FIG. 72.

FIG. 71 is a circuit diagram of the area pixel 100 according to the 19th example, FIG. 72 is a cross-sectional view of the area pixel 100 according to the 19th example, FIG. 73A is a plan view taken along line A-A in FIG. 72, FIG. 73B is a plan view taken along line B-B in FIG. 72, and FIG. 73C is a plan view taken along the line C-C of FIG. 72. The following description focuses on the differences from the area pixels 100 according to the 13th example and the 15th example.

The imaging device 1 having the area pixels 100 according to the 19th example includes a first area AR1, a second area AR2 and a third area AR3 which are stacked as illustrated in FIGS. 71 and 72. A photoelectric converter 110 and a storage unit 113 made of a material other than silicon are stacked in the first area AR1. The AD converter 190 is divided into a first divided AD converter 190*a* and a second divided AD converter 190*b*. The first divided AD converter 190*a* and the photoelectric converter 110 transmit and receive the charge of the floating diffusion FD. The first divided AD converter 190*a* has differential pairs of transistors 12, 157 and transistors 13, 158 in the AD converter 190. The second divided AD converter 190*b* has the rest of the AD converter 190, specifically transistors 151, 152, and 511 to 517. The first divided AD converter 190*a* is arranged in the second area AR2, and the second divided AD converter 190*b* is arranged in the third area AR3. The first area AR1 and the second area AR2 are stacked on the first substrate SUB1. The third area AR3 is arranged on the second substrate SUB2.

The first area AR1 and the second area AR2 transmit and receive the charge of the floating diffusion FD through the signal transmitter 91 composed of the via 91*b*. The second area AR2 and the third area AR3 transmit and receive drain signals of the differential pair of transistors 12 and 157 via the signal transmitter 91 composed of a Cu—Cu connection 91*a*.

As illustrated in FIGS. 73B and 73C, the first divided AD converter 190*a* and the second divided AD converter 190*b* are respectively arranged in the entire areas of the respective areas, so that the arrangement area of the AD converter 190 can be increased.

(20th Example of Area Pixel 100)

Figure 74:
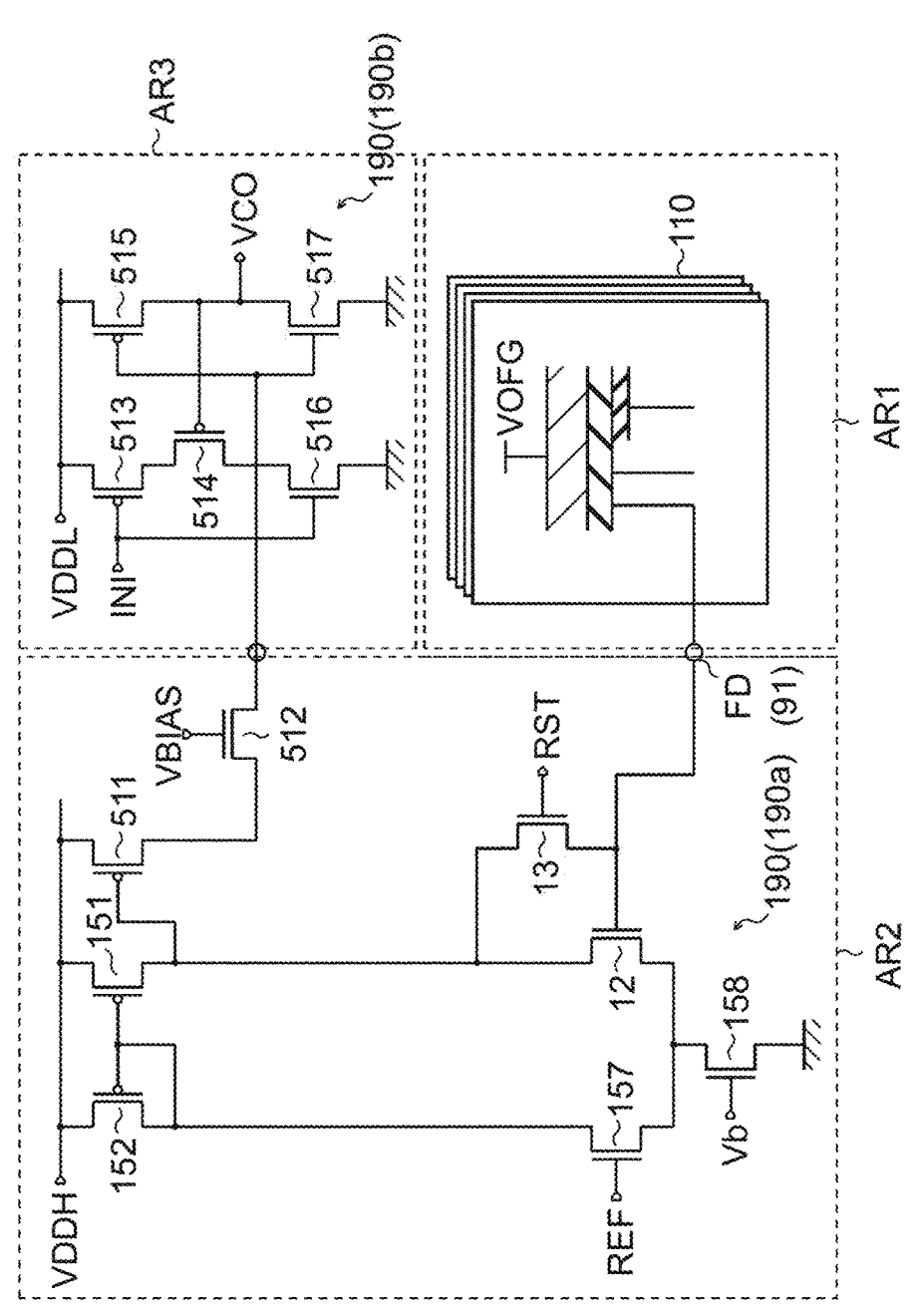
FIG. 74 is a circuit diagram of an area pixel according to the 20th example.
Figure 75:
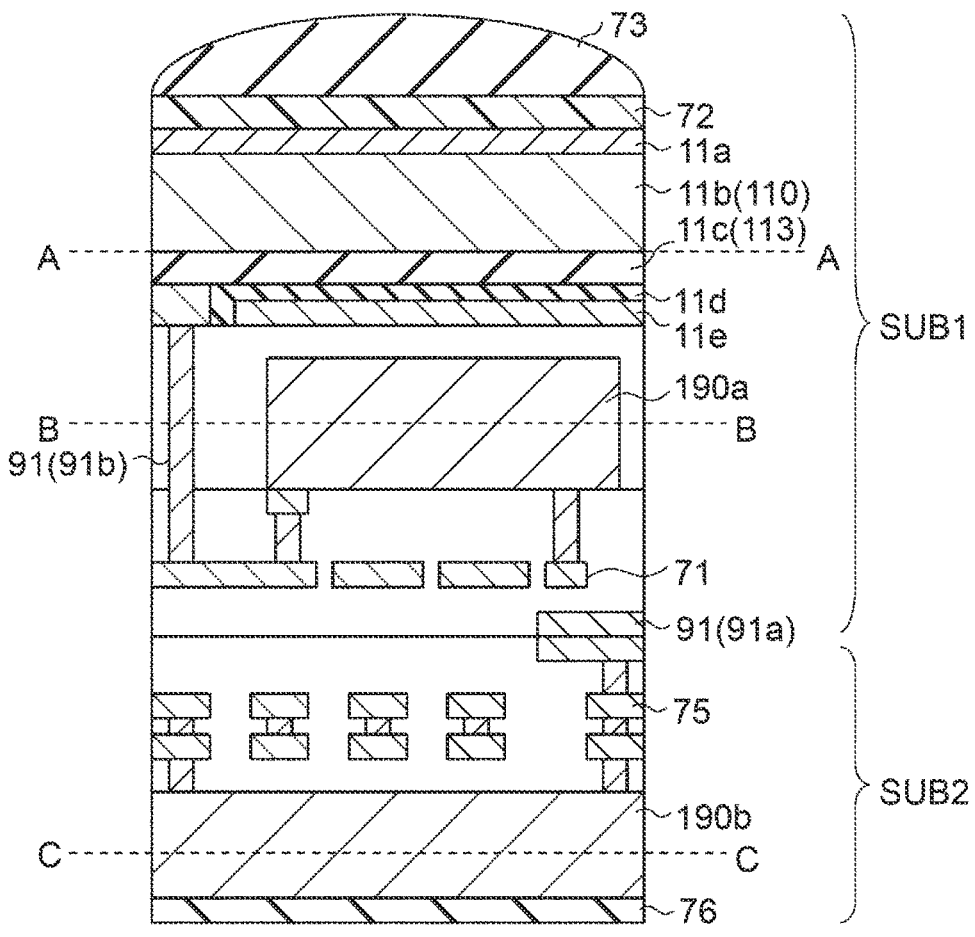
FIG. 75 is a cross-sectional view of an area pixel according to the 20th example.
Figure 76A:
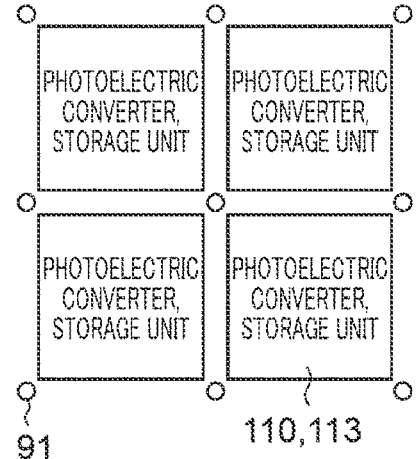
FIG. 76A is a plan view in the direction of line A-A in FIG. 75.
Figure 76B:
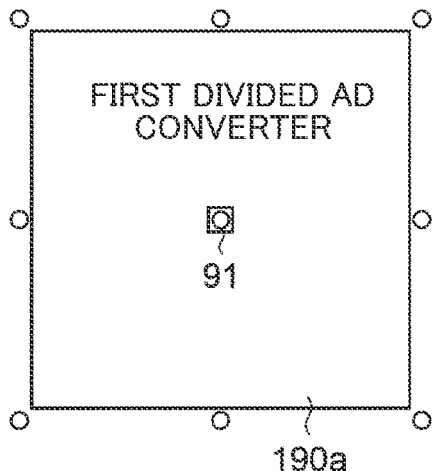
FIG. 76B is a plan view taken along line B-B in FIG. 75.
Figure 76C:
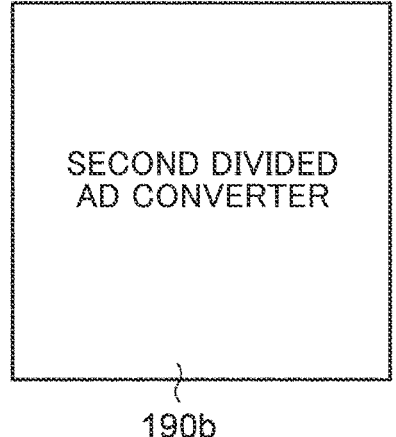
FIG. 76C is a plan view taken along line C-C of FIG. 75.

FIG. 74 is a circuit diagram of the area pixel 100 according to the 20th example, FIG. 75 is a cross-sectional view of the area pixel 100 according to the 20th example, FIG. 76A is a plan view taken along line A-A in FIG. 75, FIG. 76B is a plan view taken along line B-B in FIG. 75, and FIG. 76C is a plan view taken along line C-C of FIG. 75. The following description focuses on the differences from the area pixel 100 according to the 19th example.

The area pixel 100 according to the 20th example differs from the 19th example in the division location in the AD converter 190. The AD converter 190 of the 20th example is divided into a first divided AD converter 190*a* and a second divided AD converter 190*b* similar to those in FIG. 64. Others are the same as the 19th example, and the cross-sectional view of FIG. 75 and the plan views of FIGS. 76A to 76C are the same as the cross-sectional view of FIG. 72 and the plan views of FIGS. 73A to 73C.

(Summary of 18th to 20th Examples of Area Pixel 100)

FIG. 77 is a diagram summarizing the features of the area pixels 100 according to the 18th to 20th examples described above. In the 18th example, the front side is the light irradiation surface, while in the 19th and 20th examples, the back side is the light irradiation surface. The photoelectric converter 110 and the storage unit 113 in the area pixel 100 according to the 18th to 20th examples are stacked and arranged in the first area AR1 made of a material other than silicon. The AD converter 190 in the area pixel 100 according to the 18th example is arranged in the second area AR2 made of silicon. The AD converters 190 in the area pixels 100 according to the 19th and 20th examples are divided and arranged in the second area AR2 and the third area AR3 made of silicon. The first area AR1 and the second area AR2 in the area pixel 100 according to the 18th to 20th examples transmit and receive the charge of the floating diffusion FD through the signal transmitter 91 composed of the via 91*b*. The second area AR2 and the third area AR3 in the area pixel 100 according to the 19th example transmit and receive the drain signals of the differential pair in the AD converter 190 through the signal transmitter 91 composed of the Cu—Cu connection 91*a*. The second area AR2 and the third area AR3 in the area pixel 100 according to the 20th example transmit and receive the comparison result output signal in the AD converter 190 through the signal transmitter 91 composed of the Cu—Cu connection 91*a*.

(21st Example of Area Pixel 100)

Figure 78:
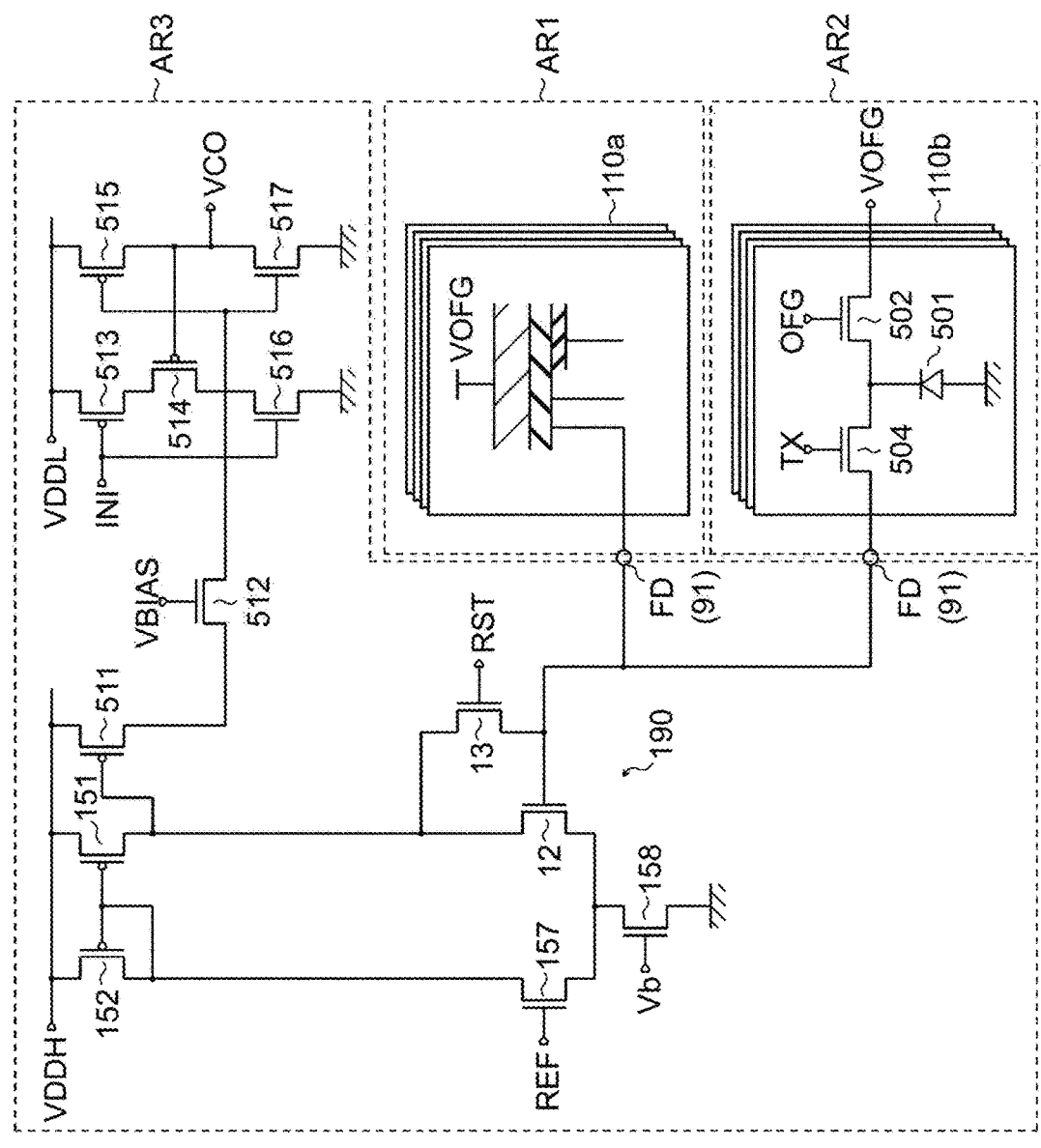
FIG. 78 is a circuit diagram of an area pixel according to the 21st example.
Figure 79:
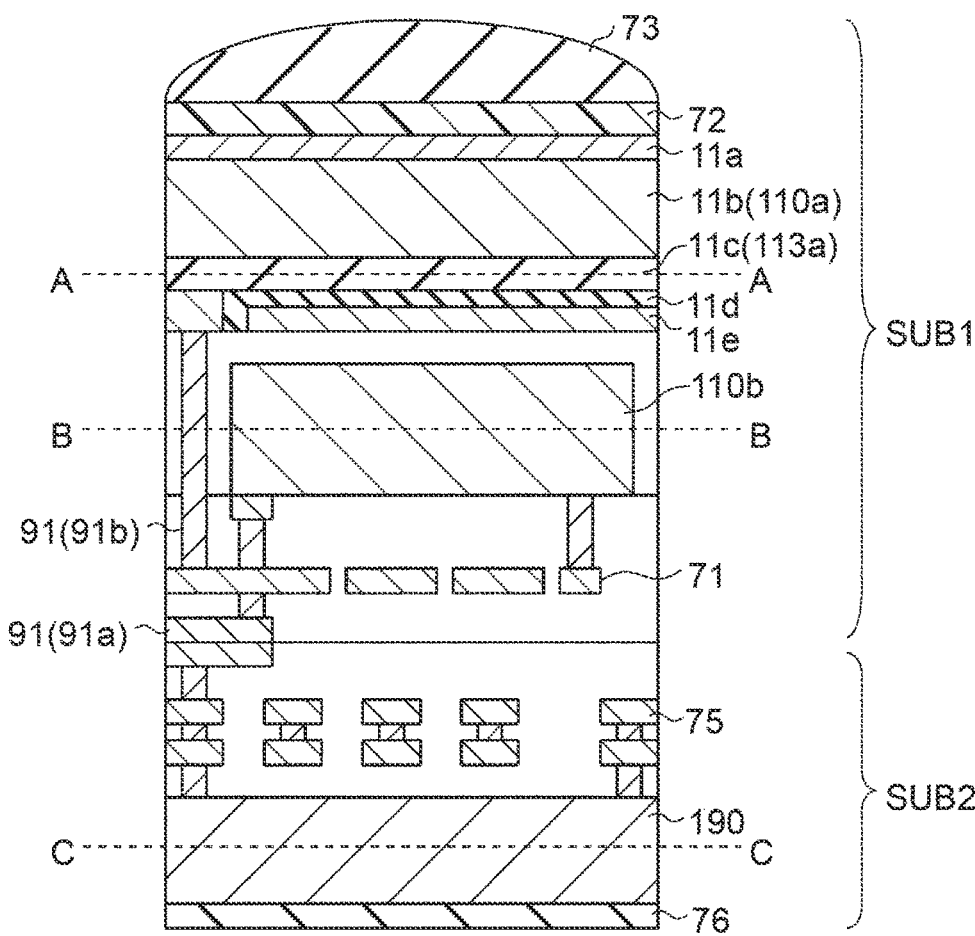
Figure 80A:
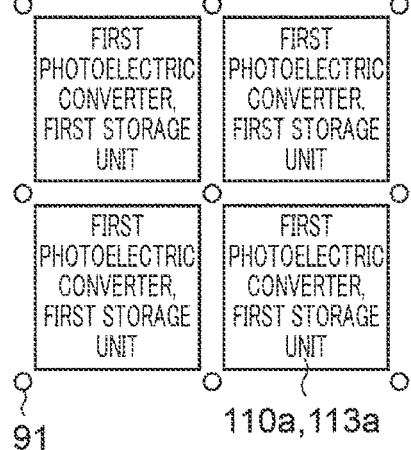
Figure 80B:
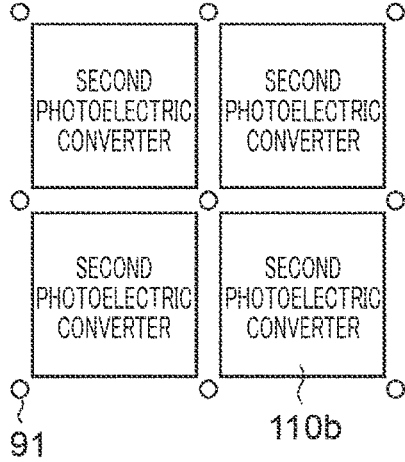
Figure 80C:
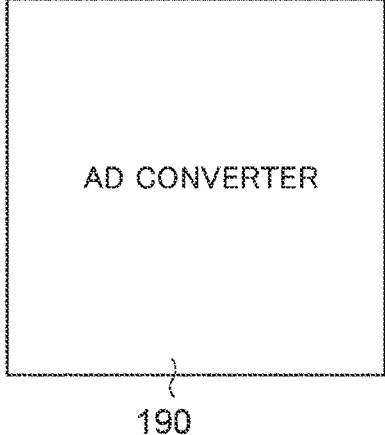

FIG. 78 is a circuit diagram of the area pixel 100 according to the 21st example, FIG. 79 is a cross-sectional view of the area pixel 100 according to the 21st example, FIG. 80A is a plan view in the direction of line A-A in FIG. 79, FIG. 80B is a plan view taken along line B-B of FIG. 79, and FIG. 80C is a plan view taken along line C-C of FIG. 79. FIGS. 78, 79, 80A, 80B and 80C show examples where the area pixel 100 has four pixels.

The area pixel 100 according to the 21st example has a photoelectric converter 110 (first photoelectric converter 110a) made of a material other than silicon and a photoelectric converter 110 (second photoelectric converter 110b) made of silicon. Materials other than silicon include, for example, organic semiconductor materials. The first photoelectric converter 110a performs, for example, green photoelectric conversion, and the second photoelectric converter 110b performs, for example, red and blue photoelectric conversion.

As illustrated in FIG. 78, the floating diffusion FD of the first photoelectric converter 110a and the floating diffusion FD of the second photoelectric converter 110b are connected to the gate of the transistor 12 and the source of the transistor 13 in the AD converter 190.

The imaging device 1 having the area pixels 100 according to the 21st example includes a first area AR1, a second area AR2 and a third area AR3 which are stacked, as illustrated in FIGS. 78 and 79. The first area AR1 and the second area AR2 are stacked on the first substrate SUB1. The third area AR3 is arranged on the second substrate SUB2. In the first area AR1, the first photoelectric converter 110a and the storage unit 113 are stacked using a material other than silicon. The second photoelectric converter 110b made of silicon is arranged in the second area AR2. The AD converter 190 made of silicon is arranged in the third area AR3.

The first area AR1 and the third area AR3 transmit and receive the charge of the floating diffusion FD of the first photoelectric converter 110a through the signal transmitter 91 composed of the via 91b and the Cu—Cu connection 91a. The second area AR2 and the third area AR3 transmit and receive the charge of the floating diffusion FD of the second photoelectric converter 110b through the signal transmitter 91 composed of the Cu—Cu connection 91a.

As illustrated in FIGS. 80A and 80B, the first photoelectric converter 110a and the second photoelectric converter 110b are arranged over the entire areas of the respective areas, so that the aperture ratio can be increased.

As described above, the area pixel 100 according to the 21st example has two types of photoelectric converters 110 (110a and 110b), and the charge of the floating diffusion FD of each photoelectric converter 110 is transferred to the AD converter 190 through the via 91b and the Cu—Cu connection 91a. Since the photoelectric converters 110 are arranged over the entire areas of separate layers, a sufficient area for arranging the photoelectric converters 110 can be secured.

(22nd Example of Area Pixel 100)

Figure 81:
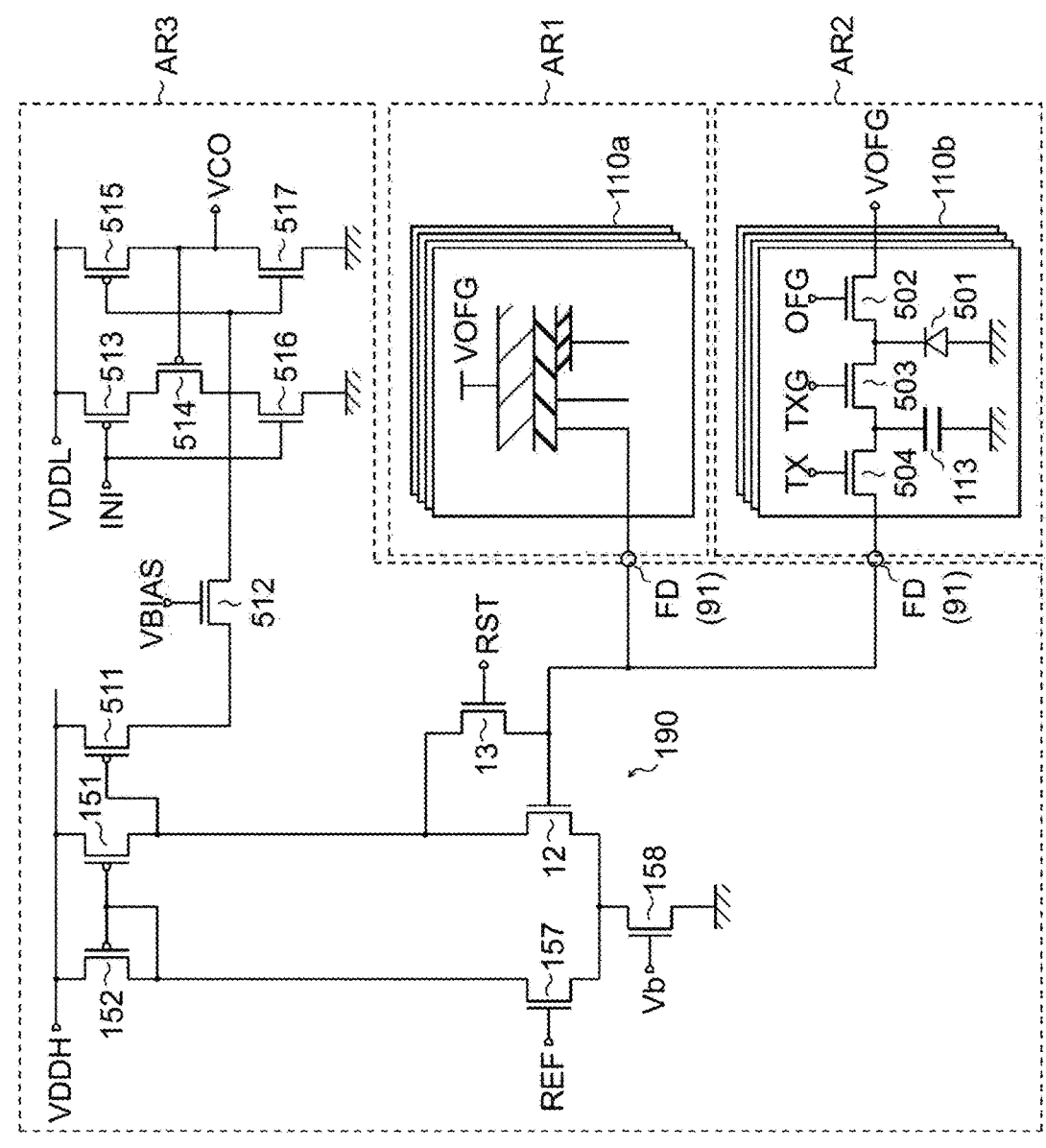
Figure 82:
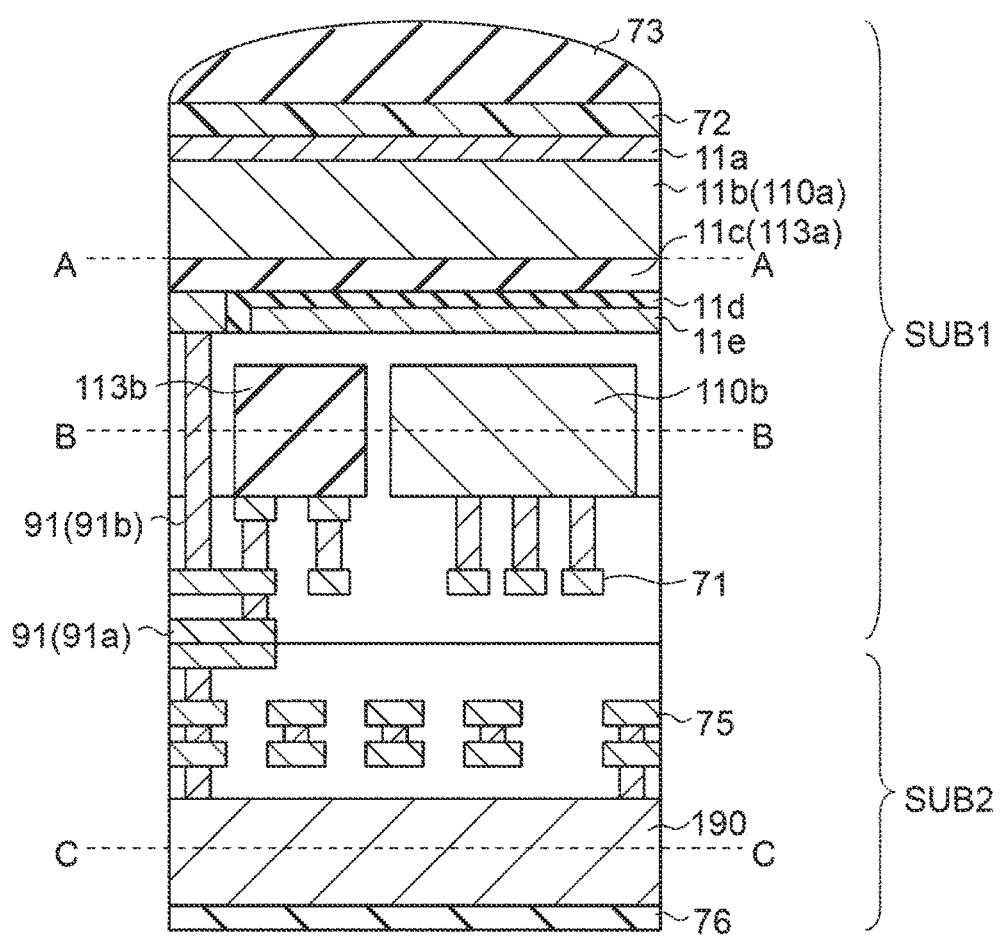
Figure 83A:
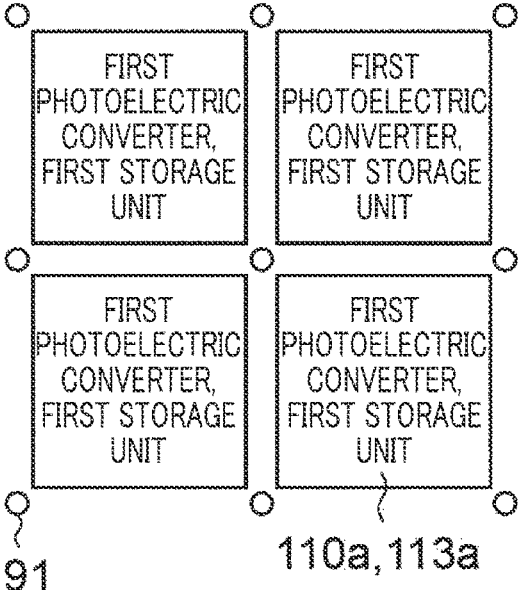
Figure 83B:
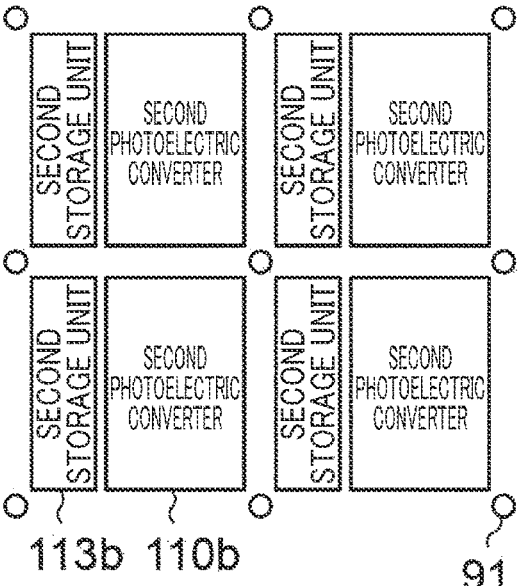
Figure 83C:
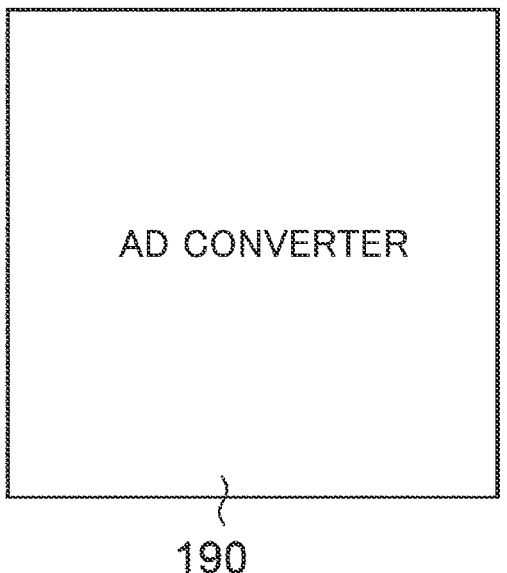

FIG. 81 is a circuit diagram of the area pixel 100 according to the 22nd example, FIG. 82 is a cross-sectional view of the area pixel 100 according to the 22nd example, FIG. 83A is a plan view taken along the line A-A of FIG. 82, FIG. 83B is a plan view taken along the line B-B of FIG. 82, and FIG. 83C is a plan view taken along the line C-C of FIG. 82. The following description focuses on the differences from the area pixels 100 according to the 13th example and the 15th example.

The imaging device 1 having the area pixels 100 according to the 22nd example includes a first area AR1, a second area AR2 and a third area AR3 which are stacked as illustrated in FIGS. 81 and 82. The area pixel 100 according to the 22nd example has a first photoelectric converter 110a made of a material other than silicon and a second photoelectric converter 110b made of silicon, as in the 21st example. A storage unit is not connected to the second photoelectric converter 110b according to the 21st example, but a second storage unit 113b is connected to the second photoelectric converter 110b according to the 22nd example. Here, the storage unit 113 connected to the first photoelectric converter 110a is referred to as a first storage unit 113a, and the storage unit 113 connected to the second photoelectric converter 110b is referred to as a second storage unit 113b.

The first photoelectric converter 110a and the first storage unit 113a made of a material other than silicon are stacked in the first area AR1. In the second area AR2, the second photoelectric converter 110b and the second storage unit 113b made of silicon are arranged in the same layer. An AD converter 190 made of silicon is arranged in the third area AR3. The first area AR1 and the second area AR2 are stacked on the first substrate SUB1, and the third area AR3 is arranged on the second substrate SUB2.

The first area AR1 and the third area AR3 transmit and receive the charge of the floating diffusion FD of the first photoelectric converter 110a through the signal transmitter 91 composed of the via 91b and the Cu—Cu connection 91a. The second area AR2 and the third area AR3 transmit and receive the charge of the floating diffusion FD of the second photoelectric converter 110b through the signal transmitter 91 composed of the Cu—Cu connection 91a.

Thus, in the area pixel 100 according to the 22nd example, since the first storage unit 113a is connected to the first photoelectric converter 110a, and the second storage unit 113b is connected to the second photoelectric converter 110b, imaging can be performed according to the global shutter method.

(23rd Example of Area Pixel 100)

Figure 84:
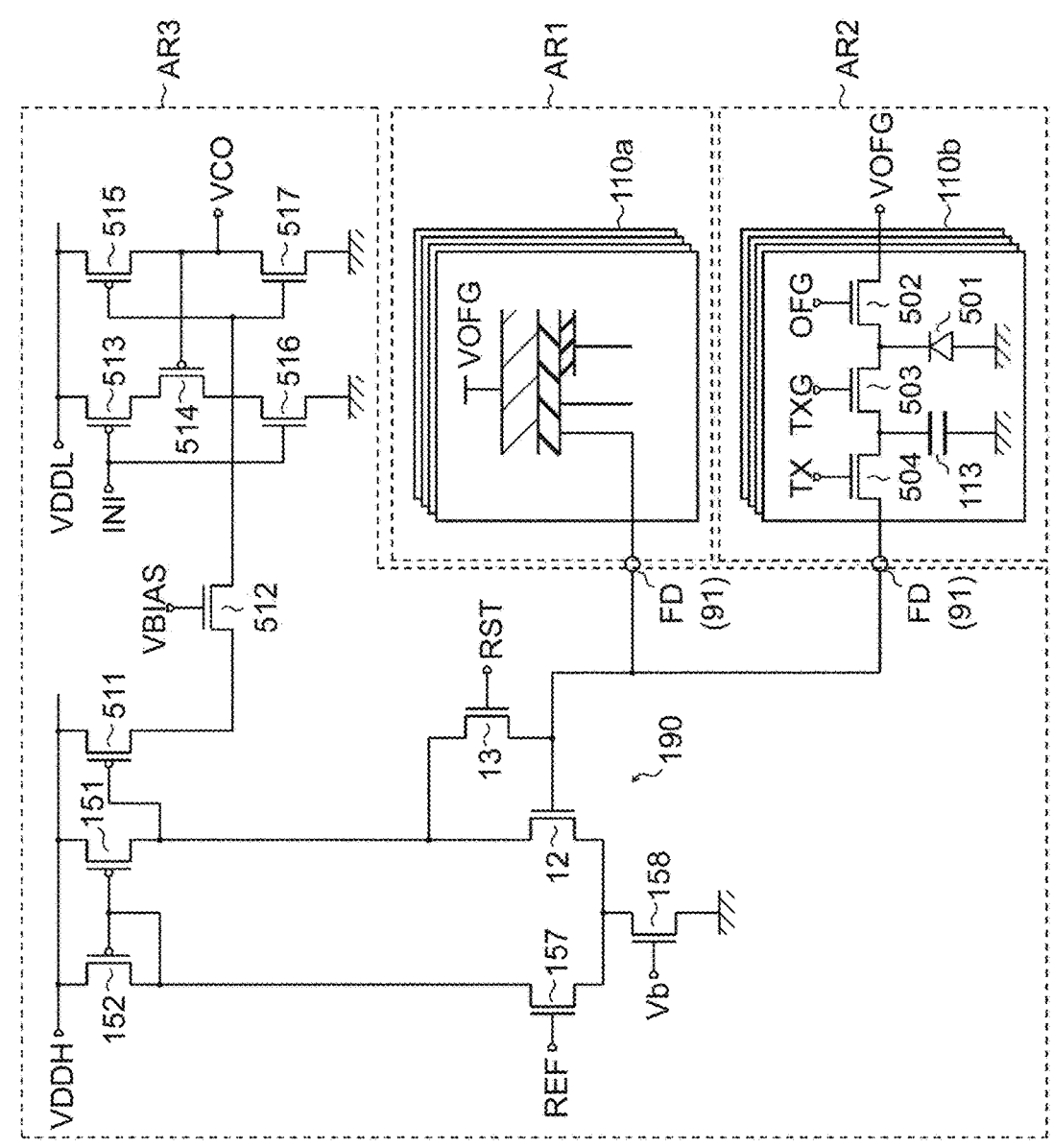

FIG. 84 is a circuit diagram of the area pixel 100 according to the 23rd example, FIG. 85 is a cross-sectional view of the area pixel 100 according to the 23rd example, FIG. 86A is a plan view taken along line A-A of FIG. 85, FIG. 86B is a plan view taken along line B-B of FIG. 85, and FIG. 86C is a plan view taken along line C-C of FIG. 85. The following description focuses on the differences from the area pixel 100 according to the 23rd example.

The area pixel 100 according to the 23rd example differs from the 22nd example in that, as illustrated in FIG. 85, the second photoelectric converter 110b and the second storage unit 113b are stacked in the second area AR2. The plan view of FIG. 86B is a plan view near the boundary between the second photoelectric converter 110b and the second storage unit 113b, and the second photoelectric converter 110b and the second storage unit 113b are arranged over the entire areas of the respective areas. The configuration of the 23rd example other than the second area AR2 is the same as that of the 22nd example.

(Summary of 21st to 23rd Examples of Area Pixel 100)

FIG. 87 is a diagram summarizing the features of the area pixels 100 according to the 21st to 23rd examples described above. In the 21st to 23rd examples, the back side is the light irradiation surface. In the 21st to 23rd examples, the first photoelectric converter 110a and the first storage unit 113a are arranged in the first area AR1 made of a material other than silicon. The second photoelectric converter 110b and the second storage unit 113b in the 22nd and 23rd examples are arranged in the second area AR2 made of silicon. The AD converter 190 in the 21st to 23rd examples is arranged in the third area AR3 made of silicon. In the 21st to 23rd examples, the first area AR1 and the third area AR3 transmit and receive the charge of the floating diffusion FD of the first photoelectric converter 110a through the signal transmitter 91 composed of the via 91b and the Cu—Cu connection 91a. In the 21st to 23rd examples, the second area AR2 and the third area AR3 transmit and receive the charge of the floating diffusion FD of the second photoelectric converter 110*b* through the signal transmitter 91 composed of the Cu—Cu connection 91*a*.

(24th Example of Area Pixel 100)

FIG. 88 is a circuit diagram of the area pixel 100 according to the 24th example, FIG. 89 is a cross-sectional view of the area pixel 100 according to the 24th example, FIG. 90A is a plan view taken along line A-A in FIG. 89, FIG. 90B is a plan view taken along line B-B of FIG. 89, and FIG. 90C is a plan view taken along line C-C of FIG. 89. FIGS. 88, 89, 90A, 90B and 90C show examples where the area pixel 100 has four pixels.

The area pixel 100 according to the 24th example, as in the 23rd example, includes the first photoelectric converter 110*a* made of a material other than silicon, the second photoelectric converter 110*b* made of silicon, the first storage unit 113*a* made of a material other than silicon and connected to the first photoelectric converter 110*a*, and the second storage unit 113*b* made of silicon and connected to the second photoelectric converter 110*b*.

Unlike the 23rd example, the area pixel 100 according to the 24th example has a first AD converter 190*a* that receives the charge of the floating diffusion FD of the first photoelectric converter 110*a* and a second AD converter 190*b* that receives the charge of the floating diffusion FD of the second photoelectric converter 110*b*. Thus, the area pixel 100 according to the 24th example has more AD converters 190 than the 23rd example.

As illustrated in FIGS. 88 and 89, the first photoelectric converter 110*a* and the first storage unit 113*a* made of a material other than silicon are stacked in the first area AR1. In the second area AR2, the second photoelectric converter 110*b* and the second storage unit 113*b* made of silicon are arranged in the same layer. In the third area AR3, the first AD converter 190*a* and the second AD converter 190*b* made of silicon are arranged in the same layer. The first area AR1 and the second area AR2 are stacked on the first substrate SUB1, and the third area AR3 is arranged on the second substrate SUB2. The first area AR1 and the third area AR3 transmit and receive the charge of the floating diffusion FD of the first photoelectric converter 110*a* through the signal transmitter 91 composed of the via 91*b* and the Cu—Cu connection 91*a*. The second area AR2 and the third area AR3 transmit and receive the charge of the floating diffusion FD of the second photoelectric converter 110*b* through the signal transmitter 91 composed of the Cu—Cu connection 91*a*.

As illustrated in FIG. 90A, the first photoelectric converter 110*a* and the first storage unit 113*a* are arranged over the entire areas of the respective areas. As illustrated in FIG. 90B, the second photoelectric converter 110*b* and the second storage unit 113*b* are arranged in the same layer, so that the arrangement area of the second photoelectric converter 110*b* is smaller than that of the first photoelectric converter 110*a*, and the arrangement area of the second storage unit 113*b* is smaller than that of the second storage unit 113*b*. As illustrated in FIG. 90C, the first AD converter 190*a* is arranged to surround the second AD converter 190*b*.

Since the area pixel 100 according to the 24th example includes the first AD converter 190*a* for the first photoelectric converter 110*a* and the second AD converter 190*b* for the second photoelectric converter 110*b*, the first AD converter 190*a* and the second AD converter 190*b* can simultaneously perform AD conversion, thereby shortening the AD conversion processing time.

(25th Example of Area Pixel 100)

FIG. 91 is a circuit diagram of the area pixel 100 according to the 25th example, FIG. 92 is a cross-sectional view of the area pixel 100 according to the 25th example, FIG. 93A is a plan view taken along the line A-A in FIG. 92, and FIG. 93B is a plan view taken along line B-B of FIG. 92, and FIG. 93C is a plan view taken along line C-C of FIG. 92. The following description focuses on the differences from the 24th example.

The area pixel 100 according to the 25th example differs from the 24th example in the configuration of the second area AR2. In the second area AR2 of the 25th example, as illustrated in FIG. 92, a second photoelectric converter 110*b* and a second storage unit 113*b* are stacked. Therefore, as illustrated in FIG. 93B, the second photoelectric converter 110*b* and the second storage unit 113*b* are arranged over the entire areas of the respective areas.

(Summary of 24th and 25th Examples of Area Pixel 100)

FIG. 94 is a diagram summarizing the features of the area pixels 100 according to the 24th and 25th examples described above. In the 24th and 25th examples, the back side is the light irradiation surface. In the 24th and 25th examples, the first photoelectric converter 110*a* and the first storage unit 113*a* are made of a material other than silicon, and the second photoelectric converter 110*b* and the second storage unit 113*b* are made of silicon. In the 24th and 25th examples, the first photoelectric converter 110*a* and the first storage unit 113*a* are arranged in the first area AR1, and the second photoelectric converter 110*b* and the second storage unit 113*b* are arranged in the second area AR2. The first photoelectric converter 110*a* and the first storage unit 113*a* are arranged in the same layer in the first area AR1 in the 24th example, and stacked in the first area AR1 in the 25th example. In the 24th and 25th examples, the first area AR1 and the second area AR2 transmit and receive the charge of the floating diffusion FD of the first photoelectric converter 110*a* through the signal transmitter 91 composed of the via 91*b* and the Cu—Cu connection 91*a*. The second area AR2 and the third area AR3 transmit and receive the charge of the floating diffusion FD of the second photoelectric converter 110*b* through the signal transmitter 91 composed of the Cu—Cu connection 91*a*.

(23rd Example of Area Pixel 100)

FIG. 95 is a circuit diagram of the area pixel 100 according to the 23rd example, FIG. 96 is a cross-sectional view of the area pixel 100 according to the 23rd example, FIG. 97A is a plan view taken along line A-A in FIG. 96, and FIG. 97B is a plan view taken along line B-B of FIG. 96, and FIG. 97C is a plan view taken along line C-C of FIG. 96. FIGS. 95, 96, 97A and 97B show examples where the area pixel 100 has four pixels.

As illustrated in FIG. 95, the area pixel 100 according to the 23rd example has a first photoelectric converter 110*a* and a second photoelectric converter 110*b* for each pixel. Both the first photoelectric converter 110*a* and the second photoelectric converter 110*b* have a semiconductor layer made of silicon. A first storage unit 113*a* is connected to the first photoelectric converter 110*a*, and a second storage unit 113*b* is connected to the second photoelectric converter 110*b*. Therefore, the imaging device 1 having the area pixels 100 according to the 23rd example performs imaging according to the global shutter method.

The imaging device 1 having the area pixels 100 according to the 23rd example includes a first area AR1 and a second area AR2. In the first area AR1, the first photoelectric converter 110*a* and the first storage unit 113*a* are stacked, and the second photoelectric converter 110*b* and the second storage unit 113*b* are stacked. FIG. 96 illustrates an example in which the second photoelectric converter 110*b* is arranged in the layer below the first photoelectric converter 110*a*, the second storage unit 113*b* is arranged in the layer below the second photoelectric converter 110*b*, and the first storage unit 113*a* is arranged across the layer of the second photoelectric converter 110*b* and the layer of the second photoelectric converter 110*b*. The order and place of arrangement of the first photoelectric converter 110*a*, the first storage unit 113*a*, the second photoelectric converter 110*b*, and the second storage unit 113*b* are arbitrary. The first area AR1 is arranged on the first substrate SUB1.

An AD converter 190 is arranged in the second area AR2. The second area AR2 is arranged on the second substrate SUB2.

The first substrate SUB1 and the second substrate SUB2 transmit and receives the charge of the floating diffusion FD of the first photoelectric converter 110*a* and the charge of the floating diffusion FD of the second photoelectric converter 110*b* through the signal transmitter 91 composed of the Cu—Cu connection 91*a*.

(27th Example of Area Pixel 100)

FIG. 98 is a circuit diagram of the area pixel 100 according to the 27th example, FIG. 99 is a cross-sectional view of the area pixel 100 according to the 27th example, FIG. 100A is a plan view taken along line A-A of FIG. 99, FIG. 100B is a plan view taken along line B-B of FIG. 99, and FIG. 100C is a plan view taken along line C-C of FIG. 99. The following description focuses on the differences from the 23rd example.

The area pixel 100 according to the 27th example is common to the 23rd example in that each pixel has the first photoelectric converter 110*a* and the second photoelectric converter 110*b*. However, the first photoelectric converter 110*a* and the second photoelectric converter 110*b* according to the 27th example each have a semiconductor layer made of a material other than silicon, and are made of, for example, an organic semiconductor material.

As illustrated in FIG. 99, in the first area AR1, the first photoelectric converter 110*a* and the first storage unit 113*a* are stacked and the second photoelectric converter 110*b* and the second storage unit 113*b* are stacked. In FIG. 99, the first photoelectric converter 110*a*, the first storage unit 113*a*, the second photoelectric converter 110*b*, and the second storage unit 113*b* are stacked in this order from top to bottom, but the stacking order is arbitrary.

An AD converter 190 made of silicon is arranged in the second area AR2. The first area AR1 and the second area AR2 are stacked on the same substrate. The first area AR1 and the second area AR2 transmit and receive the charge of the floating diffusion FD of the first photoelectric converter 110*a* through the signal transmitter 91 composed of the via 91*b*, and transmit and receive the charge of the floating diffusion FD of the second photoelectric converter 110*b* through the signal transmitter 91 made of another via 91*b*.

As illustrated in FIGS. 100A, 100B, and 100C, the first photoelectric converter 110*a*, the first storage unit 113*a*, the second photoelectric converter 110*b*, the second storage unit 113*b*, and the AD converter 190 are arranged over the entire areas of the respective areas. Thus, even if each pixel has the first photoelectric converter 110*a* and the second photoelectric converter 110*b*, there is no possibility that the aperture ratio will decrease.

(28th Example of Area Pixel 100)

FIG. 101 is a circuit diagram of the area pixel 100 according to the 28th example, FIG. 102 is a cross-sectional view of the area pixel 100 according to the 28th example, FIG. 103A is a plan view taken along line A-A of FIG. 102, FIG. 103B is a plan view taken along line B-B of FIG. 102, FIG. 103C is a plan view taken along line C-C of FIG. 102, and FIG. 103D is a plan view taken along line D-D of FIG. 102. The following description focuses on the differences from the 27th example.

The area pixel 100 according to the 28th example includes a first photoelectric converter 110*a* and a second photoelectric converter 110*b* having non-silicon semiconductor layers, as in the 27th example. The area pixel 100 according to the 28th example is different from the 27th example in that the AD converter 190 is divided into a first divided AD converter 190*a* and a second divided AD converter 190*b*, and arranged separately in the third area AR3 and the fourth area AR4.

The first photoelectric converter 110*a* and the first storage unit 113*a* are stacked in the first area AR1. The second photoelectric converter 110*b* and the second storage unit 113*b* are stacked in the second area AR2. The first area AR1, the second area AR2 and the third area AR3 are stacked on the first substrate SUB1. The fourth area AR4 is arranged on the second substrate SUB2.

The first photoelectric converter 110*a* and the first divided AD converter 190*a* in the first area AR1 transmit and receive the charge of the floating diffusion FD of the first photoelectric converter 110*a* through the signal transmitter 91 composed of the via 91*b*. In addition, the second photoelectric converter 110*b* and the first divided AD converter 190*a* in the second area AR2 transmit and receive the charge of the floating diffusion FD of the second photoelectric converter 110*b* through the signal transmitter 91 composed of the via 91*b*. The third area AR3 and the fourth area AR4 transmit and receive the drain signals of the differential pair in the AD converter 190 through the signal transmitter 91 composed of the Cu—Cu connection 91*a*.

In the area pixel 100 according to the 28th example, since the AD converter 190 is divided into two and arranged in different layers, the arrangement area of the AD converter 190 can be increased more than in the 27th example.

(Summary of 23rd to 28th Examples of Area Pixel 100)

FIG. 104 is a diagram summarizing the features of the area pixels 100 according to the 26th to 28th examples described above. In the 26th and 28th examples, the back side is the light irradiation surface, while in the 27th example, the front side is the light irradiation surface. In the 26th example, both the first photoelectric converter 110*a* and the second photoelectric converter 110*b* have semiconductor layers made of silicon. In the 27th and 28th examples, both the first photoelectric converter 110*a* and the second photoelectric converter 110*b* have semiconductor layers made of a material other than silicon. In the 26th to 28th examples, the first photoelectric converter 110*a*, the first storage unit 113*a*, the second photoelectric converter 110*b*, and the first storage unit 113*a* are arranged on the first substrate SUB1. In the 26th and 27th examples, the AD converter 190 is arranged in the second area AR2. In the 28th example, the first divided AD converter 190*a* is arranged in the first area AR1, and the second divided AD converter 190*b* is arranged in the second area AR2.

In the 26th example, the first area AR1 and the second area AR2 transmit and receive the charge of the floating diffusions FD of the first photoelectric converter 110*a* and the second photoelectric converter 110*b* through the signal transmitter 91 composed of the Cu—Cu connection 91*a*. In the 27th example, the first area AR1 and the second area AR2 transmit and receive the charge of the floating diffusion FD of the first photoelectric converter 110*a* and the second photoelectric converter 110*b* through the signal transmitter 91 composed of the vias 91*b*. In the 28th example, the third area AR3 and the fourth area AR4 transmit and receive drain signals of a differential pair in the AD converter 190 through the signal transmitter 91 composed of the Cu—Cu connection 91*a*.

(Other Modifications of Area Pixel 100)

In the area pixel 100 according to the 26th to 28th examples described above, the first photoelectric converter 110*a* and the second photoelectric converter 110*b* share one AD converter 190. However, as illustrated in the 24th or 25th example, a first AD converter 190*a* corresponding to the first photoelectric converter 110*a* and a second AD converter 190*b* corresponding to the second photoelectric converter 110*b* may be provided.

In the 11th and 28th examples, the first area AR1 and the second area AR2 transmit and receive the drain signals of the differential pair in the AD converter 190. However, the first area AR1 and the second area may transmit and receive the comparison result output signal in the AD converter 190.

In the third, sixth, ninth, 14th, and 17th examples described above, as illustrated in the upper-half circuit diagram of FIG. 105, the AD converter 190 may be divided into two, a first divided AD converter 190*a* provided up to the transistor 512 that outputs the comparison result signal in the AD converter 190 and a second divided AD converter 190*b* on the rear end side of the transistor 512, and the two divided AD converters are arranged in different areas. The boundary between the first divided AD converter 190*a* and the second divided AD converter 190*b* need not be the drain node of the transistor 512. For example, as illustrated in the lower-half circuit diagram of FIG. 105, the boundary may be the drain node of the transistor 152 in the AD converter 190.

<Application to Mobile Object>

The technology of the present disclosure (the present technology) can be applied to various products. For example, the technique according to the present disclosure may be realized as a device mounted on any type of moving body such as an automobile, an electric automobile, a hybrid electric automobile, a motorcycle, a bicycle, a personal mobility device, an airplane, a drone, a ship, a robot, or the like.

FIG. 106 is a block diagram illustrating a schematic configuration example of a vehicle control system, which is an example of a moving body control system to which the technique according to the present disclosure can be applied.

The vehicle control system 12000 includes a plurality of electronic control units connected to each other via a communication network 12001. In the example illustrated in FIG. 106, the vehicle control system 12000 includes a drive system control unit 12010, a body system control unit 12020, a vehicle exterior information detection unit 12030, a vehicle interior information detection unit 12040, and an integrated control unit 12050. As a functional configuration of the integrated control unit 12050, a microcomputer 12051, an audio/image output unit 12052, and an in-vehicle network I/F (interface) 12053 are illustrated.

The drive system control unit 12010 controls an operation of an apparatus related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The vehicle exterior information detection unit 12030 detects information on the outside of the vehicle having the vehicle control system 12000 mounted thereon. For example, an imaging unit 12031 is connected to the vehicle exterior information detection unit 12030. The vehicle exterior information detection unit 12030 causes the imaging unit 12031 to capture an image of the outside of the vehicle and receives the captured image. The vehicle exterior information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The vehicle interior information detection unit 12040 detects information on the inside of the vehicle. For example, a driver state detection unit 12041 that detects a driver's state is connected to the vehicle interior information detection unit 12040. The driver state detection unit 12041 includes, for example, a camera that captures an image of a driver, and the vehicle interior information detection unit 12040 may calculate a degree of fatigue or concentration of the driver or may determine whether or not the driver is dozing on the basis of detection information input from the driver state detection unit 12041.

The microcomputer 12051 can calculate control target values for the driving force generation device, the steering mechanism, or the braking device based on the information on the inside and outside of the vehicle acquired by the vehicle exterior information detection unit 12030 or the vehicle interior information detection unit 12040, and output control commands to the drive system control unit 12010. For example, the microcomputer 12051 can perform cooperative control for the purpose of implementing functions of an advanced driver assistance system (ADAS) including vehicle collision avoidance, impact mitigation, following traveling based on an inter-vehicle distance, vehicle speed maintenance driving, vehicle collision warning, and vehicle lane deviation warning.

Further, the microcomputer 12051 can perform cooperative control for the purpose of automated driving or the like in which autonomous travel is performed without depending on operations of the driver, by controlling the driving force generator, the steering mechanism, or the braking device and the like on the basis of information about the surroundings of the vehicle, the information being acquired by the vehicle exterior information detection unit 12030 or the vehicle interior information detection unit 12040.

In addition, the microcomputer 12051 can output a control command to the body system control unit 12030 based on the information outside the vehicle acquired by the vehicle exterior information detection unit 12030. For example, the microcomputer 12051 can perform coordinated control for the purpose of antiglare such as switching a high beam to a low beam by controlling a headlamp according to a position of a preceding vehicle or an oncoming vehicle detected by the vehicle exterior information detection unit 12030.

The audio/image output unit 12052 transmits an output signal of at least one of sound and an image to an output device capable of visually or audibly notifying a passenger or the outside of the vehicle of information. In the example of FIG. 106, an audio speaker 12061, a display unit 12062, and an instrument panel 12063 are illustrated as examples of the output device. The display unit 12062 may include at least one of an on-board display and a head-up display, for example.

FIG. 107 is a diagram illustrating an example of an installation position of the imaging unit 12031.

In FIG. 107, the imaging unit 12031 includes imaging units 12101, 12102, 12103, 12104, and 12105.

The imaging units 12101, 12102, 12103, 12104, and 12105 are provided at, for example, positions of a front nose, side mirrors, a rear bumper, a back door, an upper portion of a vehicle internal front windshield, and the like of the vehicle 12100. The imaging unit 12101 provided on a front nose and the imaging unit 12105 provided in an upper portion of the vehicle internal front windshield mainly acquire images in front of the vehicle 12100. The imaging units 12102 and 12103 provided in the side mirrors mainly acquire images on the lateral sides of the vehicle 12100. The imaging unit 12104 included in the rear bumper or the back door mainly acquires an image of an area behind the vehicle 12100. The imaging unit 12105 included in the upper portion of the windshield inside the vehicle is mainly used for detection of a preceding vehicle, a pedestrian, an obstacle, a traffic signal, a traffic sign, a lane, or the like.

FIG. 107 illustrates an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function for obtaining distance information. For example, at least one of the imaging units 12101 to 12104 may be a stereo camera constituted by a plurality of imaging elements or may be an imaging element that has pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by acquiring a distance to each three-dimensional object in the imaging ranges 12111 to 12114 and temporal change in the distance (a relative speed with respect to the vehicle 12100) on the basis of distance information obtained from the imaging units 12101 to 12104. The microcomputer 12051 can also set an inter-vehicle distance to the preceding vehicle to be secured in advance and perform automatic brake control (including following stop control) and automatic acceleration control (including following start control). Thus, it is possible to perform cooperative control for the purpose of, for example, automated driving in which the vehicle travels in an automated manner without requiring the driver to perform operations.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging units 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display unit 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging units 12101 to 12104 and the pedestrian is recognized, the audio/image output unit 12052 controls the display unit 12062 so that a square contour line for emphasis is superimposed and displayed with the recognized pedestrian. In addition, the audio/image output unit 12052 may control the display unit 12062 so that an icon indicating a pedestrian or the like is displayed at a desired position.

An example of the vehicle control system to which the technology according to the present disclosure can be applied has been described above. The technique according to the present disclosure may be applied to the imaging unit 12031 and the like among the above-described configurations. Specifically, the imaging device 1 of the present disclosure can be applied to the imaging unit 12031. By applying the technique according to the present disclosure to the imaging unit 12031, a clearer captured image can be obtained, which makes it possible to reduce driver fatigue.

The present technique can also take on the following configurations.

(1) An imaging device comprising: a plurality of pixels each having a photoelectric converter;

an analog-to-digital converter provided for each area pixel composed of two or more of the pixels in the plurality of pixels to convert a signal corresponding to a charge photoelectrically converted by the two or more pixels into a digital signal:

a floating diffusion that outputs the charge photoelectrically converted by the photoelectric converter in the pixels a plurality of stacked areas in which the plurality of photoelectric converters, the plurality of the analog-to-digital converters, and the plurality of the floating diffusions in the plurality of pixels are arranged; and a signal transmitter that transmits and receives signals between the plurality of areas, wherein among the plurality of areas, an area in which the plurality of photoelectric converters are arranged is provided separately from an area in which the analog-to-digital converter is arranged, and the area in which the plurality of photoelectric converters in the area pixel are arranged and the area in which the analog-to-digital converter is arranged transmit and receive a charge of the plurality of floating diffusions via the same signal transmitter.

(2) The imaging device according to (1), wherein the photoelectric converter has a silicon semiconductor layer or a non-silicon semiconductor layer.

(3) The imaging device according to (2), wherein the non-silicon semiconductor layer is a semiconductor layer containing an organic semiconductor material.

(4) The imaging device according to any one of (1) to (3), further comprising: a storage unit provided for each of the pixels to store the charge photoelectrically converted by the photoelectric converter;

a first transfer transistor provided for each of the pixels to perform switching control of whether or not to store the charge photoelectrically converted by the photoelectric converter in the storage unit; and a second transfer transistor provided for each of the pixels to perform switching control of whether or not to transfer the charge stored in the storage unit to the floating diffusion.

(5) The imaging device according to (4), wherein the storage unit is arranged in the area in which the photoelectric converter is arranged among the plurality of areas.

(6) The imaging device according to (5), wherein the storage unit is arranged in the same layer as the photoelectric converter, or arranged in a layer stacked on a layer in which the photoelectric converter is arranged.

(7) The imaging device according to (4), wherein the storage unit is arranged in an area different from the area in which the analog-to-digital converter is arranged among the plurality of areas.

(8) The imaging device according to (7), wherein the different area has a wiring layer electrically connected to the floating diffusion, and the storage unit is arranged in the same layer as the wiring layer.

(9) The imaging device according to any one of (1) to (8), wherein the analog-to-digital converter includes:

a comparator that compares an analog signal corresponding to the charge with a reference signal;

a comparison output processor that outputs a comparison result of the comparator;

a waveform shaping unit that shapes a waveform of an output signal of the comparison output processor; and the comparator, the comparison output processor, and the waveform shaping unit are arranged in the same area among the plurality of areas.

(10) The imaging device according to any one of (1) to (8), wherein the analog-to-digital converter includes:

a comparator that compares an analog signal corresponding to the charge with a reference signal;

a comparison output processor that outputs a comparison result of the comparator; and a waveform shaping unit that shapes a waveform of an output signal of the comparison output processor, and the comparator, the comparison output processor, and the waveform shaping unit are arranged in mutually different areas among the plurality of areas.

(11) The imaging device according to any one of (1) to (8), wherein the analog-to-digital converter includes:

a comparator that compares an analog signal corresponding to the charge with a reference signal;

a comparison output processor that outputs a comparison result of the comparator; and a waveform shaping unit that shapes a waveform of an output signal of the comparison output processor, and the comparator, the comparison output processor, and the waveform shaping unit are arranged in mutually different areas among the plurality of areas.

(12) The imaging device according to any one of (1) to (11), further comprising: a first area in which the photoelectric converter is arranged; and a second area in which at least a portion of the analog-to-digital converter is arranged, wherein the signal transmitter transmits and receives the charge of the floating diffusion between the first area and the second area.

(13) The imaging device according to any one of (1) to (11), wherein the photoelectric converter includes:

a first photoelectric converter; and a second photoelectric converter, the floating diffusion includes:

a first floating diffusion that stores a charge photoelectrically converted by the first photoelectric converter; and a second floating diffusion that stores a charge photoelectrically converted by the second photoelectric converter, the plurality of areas includes:

a first area in which the first photoelectric converter is arranged;

a second area in which the second photoelectric converter is arranged; and a third area in which at least a portion of the analog-to-digital converter is arranged, and the signal transmitter includes:

a first signal transmitter that transmits and receives the charge of the first floating diffusion between the first area and the third area; and a second signal transmitter that transmits and receives the charge of the second floating diffusion between the second area and the third area.

(14) The imaging device according to (13), wherein one of the first photoelectric converter and the second photoelectric converter has a silicon semiconductor layer, and the other of the first photoelectric converter and the second photoelectric converter has a non-silicon semiconductor layer.

(15) The imaging device according to (13) or (14), further comprising: a first storage unit provided for each of the pixels to store the charge photoelectrically converted by the first photoelectric converter; and a second storage unit provided for each of the pixels to store the charge photoelectrically converted by the second photoelectric converter, wherein the first storage unit is arranged in the first area, the second storage unit is arranged in the second area, the first floating diffusion stores a charge corresponding to the charge stored in the first storage unit, and the second floating diffusion stores a charge corresponding to the charge stored in the second storage unit.

(16) The imaging device according to (13) or (14), further comprising: a storage unit provided for each of the pixels to store the charge photoelectrically converted by either the first photoelectric converter or the second photoelectric converter, wherein the storage unit is arranged in the second area, either one of the first floating diffusion and the second floating diffusion stores the charge corresponding to the charge stored in the storage unit, and the other of the first floating diffusion and the second floating diffusion stores the charge photoelectrically converted by the first photoelectric converter or the second photoelectric converter without storing the charge in the storage unit.

(17) The imaging device according to (13), wherein both the first photoelectric converter and the second photoelectric converter have a silicon semiconductor layer or have a non-silicon semiconductor layer.

(18) The imaging device according to (17), further comprising: a first storage unit provided for each of the pixels to store the charge photoelectrically converted by the first photoelectric converter; and a second storage unit provided for each of the pixels to store the charge photoelectrically converted by the second photoelectric converter.

(19) The imaging device according to (18), wherein at least one of the first storage unit and the second storage unit is provided across the first area and the second area.

(20) An electronic apparatus comprising: an imaging device that outputs a photoelectrically converted digital signal for each pixel: and a signal processor that performs signal processing on the digital signal, wherein the imaging device includes:

a plurality of pixels each having a photoelectric converter;

an analog-to-digital converter provided for each area pixel composed of two or more of the pixels in the plurality of pixels to convert a signal corresponding to a charge photoelectrically converted by the two or more pixels into a digital signal;

a floating diffusion that outputs the charge photoelectrically converted by the photoelectric converter in the pixel;

a plurality of stacked areas in which the plurality of pixels, the plurality of the analog-to-digital converters, and the plurality of the floating diffusions are arranged; and a signal transmitter that transmits and receives signals between the plurality of areas, wherein among the plurality of areas, an area in which the plurality of photoelectric converters are arranged is provided separately from an area in which the analog-to-digital converter is arranged, and the signal transmitter transmits and receives a charge of the floating diffusion between the area in which the photoelectric converter is arranged and the area in which the analog-to-digital converter is arranged.

Aspects of the present disclosure are not limited to the afore-mentioned individual embodiments and include various modifications that those skilled in the art can achieve, and effects of the present disclosure are also not limited to the details described above. In other words, various additions, modifications, and partial deletion can be made without departing from the conceptual idea and the gist of the present disclosure that can be derived from the details defined in the claims and the equivalents thereof.

REFERENCE SIGNS LIST

1 Imaging device
10 Pixel array unit

11 Signal line
11a Upper electrode layer
11a Upper electrode
11b Photoelectric conversion layer
11c Charge storage layer
11d Insulating layer
11e Lower electrode layer
11e Lower electrode
12 Signal input transistor
13 MOS transistor
20 Time code generator
21 Signal line
30 Reference signal generator
31 Signal line
40 Vertical driver
41 Signal line
42 Control signal generator
43 Power supply unit
50 Horizontal control unit
52 Time code decoder
53 Column signal processor
54 Clock signal generator
71 Wiring layer
72 Color filter
73 On-chip lens
74 Element separation layer
75 Wiring layer
76 Protective layer
91 Signal transmitter
91a Cu—Cu connection
91b Via
100 Area pixel
110 Photoelectric converter
111 Charge generator
113 Storage unit
150 Comparator
160 Comparison output processor
161 Pre-amplifier
162 Level converter
163 Waveform shaping unit
170 Conversion result holding unit
171 Storage control unit
172 Storage unit
190 AD converter
190a First AD converter
190b Second AD converter
200 Time code transfer unit
210 Code holding unit

The invention claimed is:

1. An imaging device comprising:

pixels respectively including photoelectric converters;

analog-to-digital converters respectively provided for pixel areas composed of two or more of the pixels to convert a signal corresponding to a charge photoelectrically converted by the two or more of the pixels into a digital signal;

floating diffusions that respectively output the charge photoelectrically converted by the photoelectric converters in the pixels;

a plurality of stacked areas in which the photoelectric converters, the analog-to-digital converters, and the floating diffusions are arranged;

a signal transmitter that transmits and receives signals between the pixel areas, wherein

51

52 among the pixel areas, an area in which the photoelectric converters are arranged is provided separately from an area in which the analog-to-digital converters are arranged, wherein the area in which the photoelectric converters are arranged and the area in which the analog-to-digital converters are arranged transmit and receive a charge of the floating diffusions via a same signal transmitter, wherein each of the photoelectric converters includes:

a first photoelectric converter, and a second photoelectric converter, wherein each of the floating diffusions includes:

a first floating diffusion that stores a charge photoelectrically converted by the first photoelectric converter, and a second floating diffusion that stores a charge photoelectrically converted by the second photoelectric converter, wherein the pixel areas include:

a first area in which a corresponding first photoelectric converter is arranged, a second area in which a corresponding second photoelectric converter is arranged, and a third area in which at least a portion of a corresponding analog-to-digital converter is arranged, wherein the signal transmitter includes a first signal transmitter that transmits and receives the charge of the first floating diffusion between the first area and the third area, and a second signal transmitter that transmits and receives the charge of the second floating diffusion between the second area and the third area; and a memory provided for each of the pixels to store the charge photoelectrically converted by either the corresponding first photoelectric converter or the corresponding second photoelectric converter, wherein the memory is arranged in the second area, one of the first floating diffusion or the second floating diffusion stores the charge corresponding to the charge stored in the memory, and an other of the first floating diffusion or the second floating diffusion stores the charge photoelectrically converted by the corresponding first photoelectric converter or the corresponding second photoelectric converter without storing the charge in the memory.

2. The imaging device according to claim 1, wherein the photoelectric converters respectively have a silicon semiconductor layer or a non-silicon semiconductor layer.

3. The imaging device according to claim 2, wherein the non-silicon semiconductor layer is a semiconductor layer containing an organic semiconductor material.

4. The imaging device according to claim 1, wherein each of the analog-to-digital converters includes:

a comparator that compares an analog signal corresponding to the charge with a reference signal;

a comparison output processor that outputs a comparison result of the comparator;

a waveform shaping circuit that shapes a waveform of an output signal of the comparison output processor; and the comparator, the comparison output processor, and the waveform shaping circuit are arranged in a same area among the pixel areas.

5. The imaging device according to claim 1, wherein each of the analog-to-digital converters includes:

a comparator that compares an analog signal corresponding to the charge with a reference signal;

a comparison output processor that outputs a comparison result of the comparator; and a waveform shaping circuit that shapes a waveform of an output signal of the comparison output processor, and the comparator, the comparison output processor, and the waveform shaping circuit are arranged in mutually different areas among the pixel areas.

6. The imaging device according to claim 1, further comprising:

a first area in which a corresponding photoelectric converter is arranged; and a second area in which at least a portion of a corresponding analog-to-digital converter is arranged, wherein the signal transmitter transmits and receives the charge of a corresponding floating diffusion between the first area and the second area.

7. The imaging device according to claim 1, wherein one of the first photoelectric converter and the second photoelectric converter has a silicon semiconductor layer, and the other of the first photoelectric converter and the second photoelectric converter has a non-silicon semiconductor layer.

8. The imaging device according to claim 1, further comprising:

a first memory provided for each of the pixels to store the charge photoelectrically converted by the first photoelectric converter; and a second memory provided for each of the pixels to store the charge photoelectrically converted by the second photoelectric converter, wherein the first memory is arranged in the first area, the second memory is arranged in the second area, the first floating diffusion stores a charge corresponding to the charge stored in the first memory, and the second floating diffusion stores a charge corresponding to the charge stored in the second memory.

9. The imaging device according to claim 1, wherein both the first photoelectric converter and the second photoelectric converter have a silicon semiconductor layer or have a non-silicon semiconductor layer.

10. An electronic apparatus comprising the imaging device according to claim 1.

11. An imaging device comprising:

pixels respectively including photoelectric converters;

analog-to-digital converters respectively provided for pixel areas composed of two or more of the pixels to convert a signal corresponding to a charge photoelectrically converted by the two or more of the pixels into a digital signal;

floating diffusions that respectively output the charge photoelectrically converted by the photoelectric converters in the pixels;

a plurality of stacked areas in which the photoelectric converters, the analog-to-digital converters, and the floating diffusions are arranged;

a signal transmitter that transmits and receives signals between the pixel areas, wherein among the pixel areas, an area in which the photoelectric converters are arranged is provided separately from an area in which the analog-to-digital converters are arranged, and the area in which the photoelectric converters are arranged and the area in which the analog-to-digital converters are arranged transmit and receive a charge of the floating diffusions via a same signal transmitter, wherein each of the photoelectric converters includes:

a first photoelectric converter, and a second photoelectric converter, wherein each of the floating diffusions includes:

a first floating diffusion that stores a charge photoelectrically converted by the first photoelectric converter, and a second floating diffusion that stores a charge photoelectrically converted by the second photoelectric converter, wherein the pixel areas include:

a first area in which a corresponding first photoelectric converter is arranged, a second area in which a corresponding second photoelectric converter is arranged, and a third area in which at least a portion of a corresponding analog-to-digital converter is arranged, wherein the signal transmitter includes a first signal transmitter that transmits and receives the charge of the first floating diffusion between the first area and the third area, and a second signal transmitter that transmits and receives the charge of the second floating diffusion between the second area and the third area, wherein both the first photoelectric converter and the second photoelectric converter have a silicon semiconductor layer or have a non-silicon semiconductor layer;

a first memory provided for each of the pixels to store the charge photoelectrically converted by the first photoelectric converter; and a second memory provided for each of the pixels to store the charge photoelectrically converted by the second photoelectric converter, wherein at least one of the first memory and the second memory is provided across the first area and the second area.

12. An electronic apparatus comprising the imaging device according to claim 11.

* * * * *